(12) United States Patent
Schaumont et al.

(10) Patent No.: US 6,606,588 B1
(45) Date of Patent: *Aug. 12, 2003

(54) DESIGN APPARATUS AND A METHOD FOR GENERATING AN IMPLEMENTABLE DESCRIPTION OF A DIGITAL SYSTEM

(75) Inventors: Patrick Schaumont, Wijgmaal (BE); Serge Vernalde, Heverlee (BE); Johan Cockx, Pellenberg (BE)

(73) Assignee: Interuniversitair Micro-Elecktronica Centrum (IMEC vzw), Leuven (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/237,549

(22) Filed: Jan. 26, 1999

Related U.S. Application Data

(63) Continuation-in-part of application No. 09/041,985, filed on Mar. 13, 1998, now Pat. No. 6,233,540.
(60) Provisional application No. 60/039,079, filed on Mar. 14, 1997, provisional application No. 60/039,078, filed on Mar. 14, 1997, and provisional application No. 60/041,121, filed on Mar. 20, 1997.

(51) Int. Cl.$^7$ ............................................. G06F 17/50
(52) U.S. Cl. ................... 703/15; 716/5; 716/7; 716/18; 717/108
(58) Field of Search ........................... 703/13, 23, 27, 703/20, 14, 15; 716/7, 3, 18, 5, 8, 11, 6, 12; 717/104, 108, 114, 116

(56) References Cited

U.S. PATENT DOCUMENTS

| | | | |
|---|---|---|---|
| 5,544,067 A | * 8/1996 | Rostoker et al. | 703/14 |
| 5,933,356 A | * 8/1999 | Rostoker et al. | 703/15 |
| 6,233,540 B1 | * 5/2001 | Schaumont et al. | 703/14 |
| 6,324,678 B1 | * 11/2001 | Damgelo et al. | 716/18 |

FOREIGN PATENT DOCUMENTS

EP 0 772 140 A1 7/1997

OTHER PUBLICATIONS

Burr et al., 'OPERAS in a DSP CAD Environment', Proceedings of the European Design Automatin Conference, Sep. 1994, pp. 130–135.*
Poechmueller et al., 'A CAD Tool for Designing Large, Fault–Tolerant VLSI Arrays', Proceedings of the First Great Lakes Symposium on VLSI, 1991, pp 132–137.*
Tanerhan et al., 'An approach for Integrated Specification and Design of Real–time Systems', Proceedings of the EURO–VHDL '96 and European Design Automation, Sep. 1996, pp 258–263.*
Vemuri et al., 'An Integrated Multicomponent Synthesis Environment for MCM's', Computer, vol. 26, Issue 4, pp 62–74, Apr. 1993.*
Stoel et al., 'VIOOL for Hardware/Software Codesign', Proc 1995 International Symposium on System Engineering of Computer Based Systems', pp 333–340, Mar. 1995.*
Bredenfeld et al., 'Tool Integrating and Construction using General Graph–Based Design Representations', Proc. Of the 32nd ACM/IEEE Conf. On Design Automation, Jun. 1995.*

(List continued on next page.)

Primary Examiner—Russell Frejd
(74) Attorney, Agent, or Firm—Knobbe, Martens, Olson & Bear, LLP.

(57) ABSTRACT

The present invention is a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

45 Claims, 25 Drawing Sheets

OTHER PUBLICATIONS

Figure 1A:
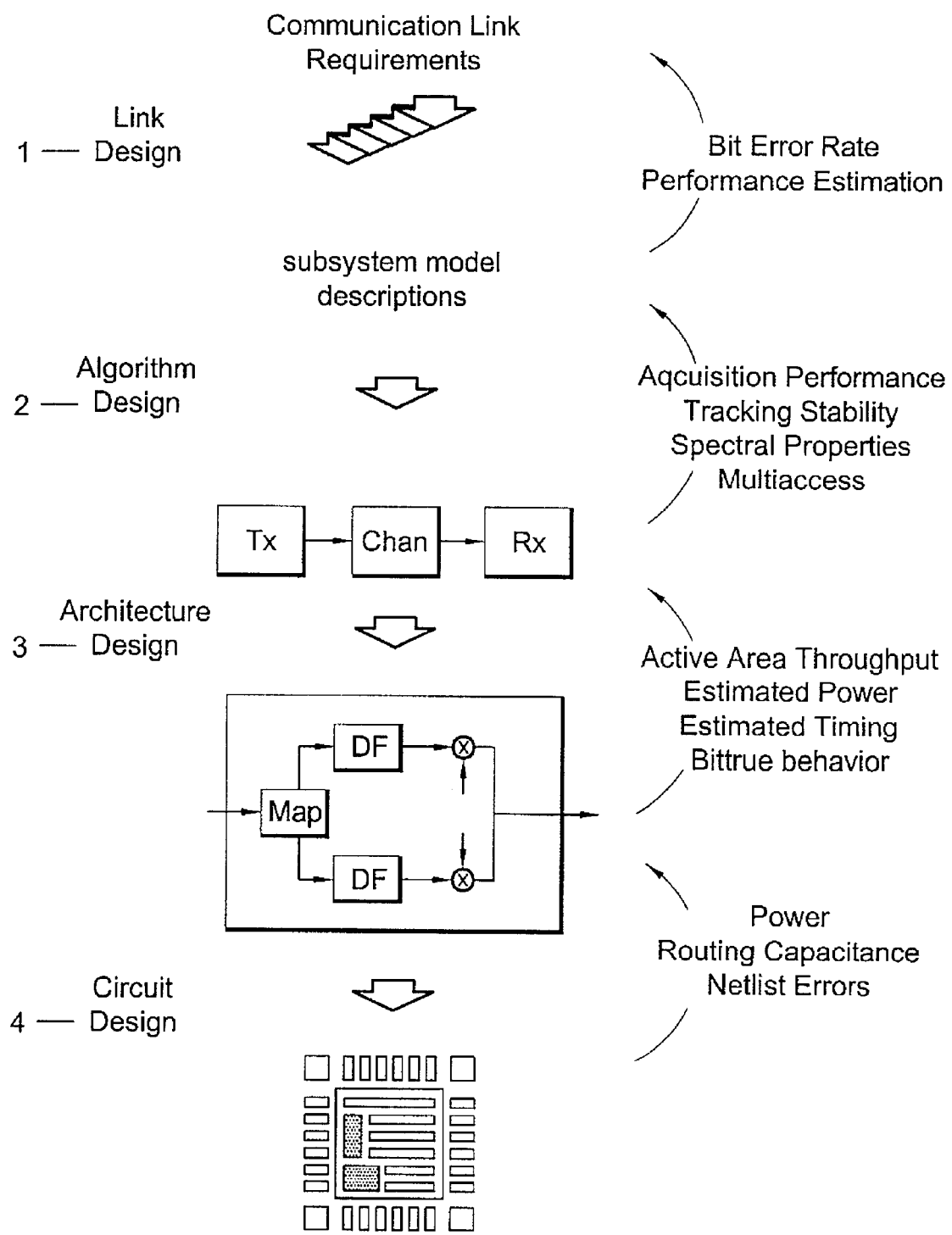

Altmeyer et al., 'Generating ECAD Framework Code from Abstract Models', Proc. Of the 32nd ACM/IEEE Conf. On Design Automation, Jun. 1995, pp 88–93.*

Moon et al., 'An Object–Oriented VHDL Design Environment', Proc. Of the 27nd ACM/IEEE Conf. On Design Automation, Jun. 1990, pp 431–436.*

Swamy, Somitri, et al.; OO–VHDL. Object–oriented extensions to VHDL; *Computer*, vol. 28 (No. 10): pp 18–26; Oct. 1995.

Gupta, Rajesh K., et al.; Using a Programming Language for Digital System Design; *IEEE Design & Test Of Computers*; pp. 72–80; Apr.–Jun. 1997.

* cited by examiner

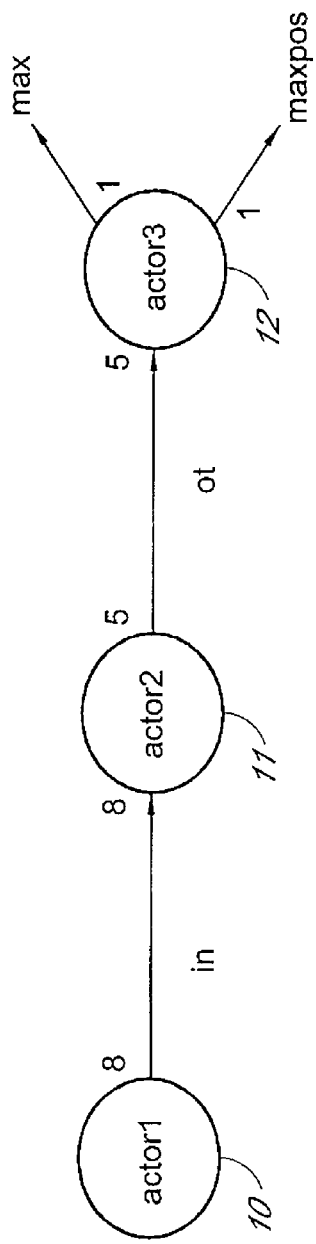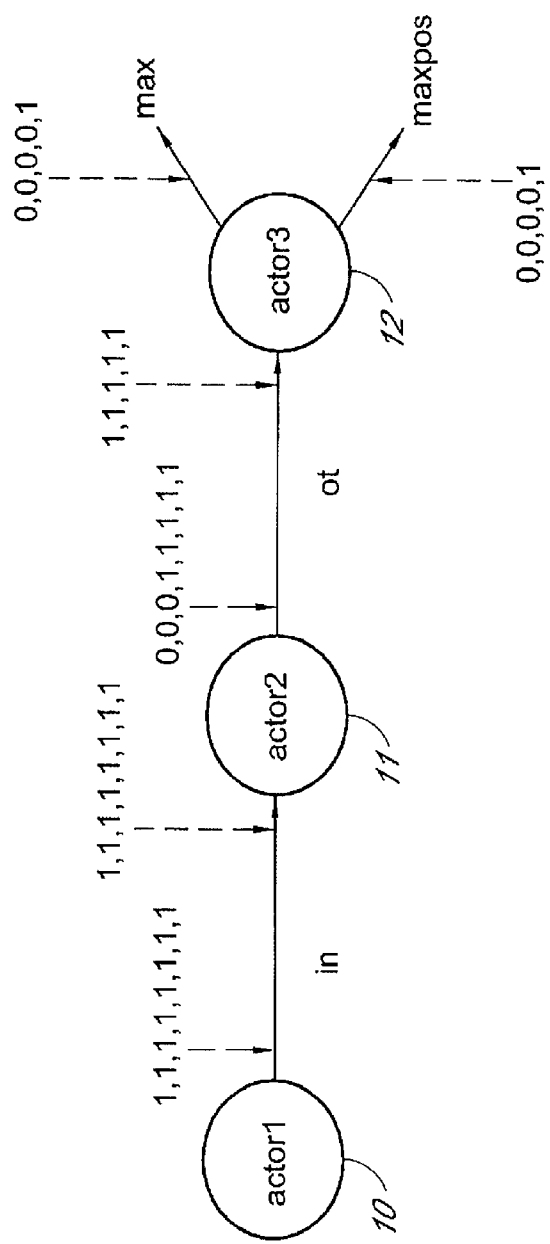

```
dfix  T_sample(8, 6);
dfix  T_acc    (8, 6);
dfix  T_bit    (1, 0, ns);
double hardwired_coef = { 0.5, 0.2, -0.3, 0.15 };

fsm correlator: :define(clk & _ck)
{
    sig_array  coef       (4, ck, T_sample);
    sig_array  sample     (4, ck, T_sample);
    sig        accu       (ck, T_accu     );
    sig        sample_in  (T_sample       );
    sig        coef_in    (T_sample       );
    sig        corr_out   (T_sample       );
    sig        load       (ck, T_bit      );
    sig        load_ctr   (T_bit          );

sfg initialize_coefs;
    for (i = 0; i < 4; i++)
       coef[i] = W(T_sample, hardwired_coef[i] );

sfg load_coef_0;
    input(coef_in);
    coef[0] = in_coef_in;

sfg correl_1;
    accu  = cast(T_acc, coef[0] * sample[0] + coef[1] * sample[1]);

sfg correl_2;
    corr  = accu + cast(T_acc, coef[2] * sample[2] + coef[3] * sample[3] );
    output(corr);

sfg read_sample;
    input(sample_in);
    for (i = 3; i >=0; i--)
      if (i)
        sample[i] = sample[i-1];
      else
        sample[i] = sample_in;

sfg read_control;
    input(load_ctr);
    load = load_ctr;

fsm myfsm;
    initial rst;
    state phase_1
    state phase_2
       rst    <<  always      << initialize_coefs    << phase1;
       phase1 <<  always      << read_control
                              << correl_1            << phase2;
       phase2 <<  !cnd(load)  << correl_2
                              << read_sample         << phase1;
       phase2 <<  cnd(load)   << correl_2
                              << read_sample
                              << load_coef_0         << phase1;
    return mysfm;
}
```

FIG. 11

Sig Class

```
class sig {
    Value value;
    char  *name;
public:
    sig(value v);
    sig operator + (sig v);
    virtual Value simulate ();
    virtual void gen_code (ostream &os);
};

sig sig::operator + (sig v) {
    sigadd s;
    add.left = &v;
    add.right = this;
    return add;
}

Value sig::simulate() {
    return value;
} sig::gen_code (ostream &os) {
    os << name;
}
```

Derived Operator Class

```
class sigadd : public sig {
    sig *left;
    sig *right;
public:
    Value simulate();
    void gen_code (ostream &os);
};

Value sigadd::simulate() {
    return left->eval() +
           right->eval();
} sigadd::gen_code (ostream & os) {
    os << left->cg()
       << " + "
       << right->cg();
}
```

FIG. 16

```
fsm f;
initial s0;
state s1;

s0 <<  allways           << sfg1 << s1;
s1 <<  cnd(eof)          << sfg2 << s1;
s1 <<  !cnd(eof)         << sfg3 << s0;
```

DESIGN APPARATUS AND A METHOD FOR GENERATING AN IMPLEMENTABLE DESCRIPTION OF A DIGITAL SYSTEM

COPYRIGHT NOTICE

A portion of the disclosure of this patent document contains material which is subject to copyright protection. The copyright owner has no objection to the facsimile reproduction by one of the patent disclosure, as it appears in the Patent and Trademark Office patent files or records, but otherwise reserves all copyright rights whatsoever.

RELATED APPLICATIONS

This application is a continuation-in-part of U.S. patent application Ser. No. 09/041,985, filed on Mar. 13, 1998, now U.S. Pat. No. 6,233,546, which in turn claims priority to the following provisional patent applications: application Ser. No. 60/039,079, filed on Mar. 14, 1997, application Ser. No. 60/039,078, filed on Mar. 14, 1997, application Ser. No. 60/041,121, filed on Mar. 20, 1997.

BACKGROUND OF THE INVENTION

1. Field of the Invention

The present invention is situated in the field of design of systems. More specifically, the present invention is related to a design apparatus for digital systems, generating implementable descriptions of said systems.

The present invention is also related to a method for generating implementable descriptions of said systems.

2. Description of the Related Technology

The current need for digital systems forces contemporary system designers with ever increasing design complexities in most applications where dedicated processors and other digital hardware are used, demand for new systems is rising and development time is shortening. As an example, currently there is a high interest in digital communication equipment for public access networks. Examples are modems for Asymmetric Digital Subscriber Loop (ADSL) applications, and up- and downstream Hybrid Fiber-Coax (HFC) communication. These modems are preferably implemented in all-digital hardware using digital signal processing (DSP) techniques. This is because of the complexity of the data processing that they require. Besides this, these systems also need short development cycles. This calls for a design methodology that starts at high level and that provides for design automation as much as possible.

One frequently used modeling description language is VHDL (VHSIC Hardware Description Language), which has been accepted as an IEEE® standard since 1987. VHDL is a programming environment that produces a description of a piece of hardware. Additions to standard VHDL can be to implement features of Object Oriented Programming Languages into VHDL. This was described in the paper OO-VHDL (Computer, October 1995, pages 18–26). Another frequently used modeling description language is VERILOG®.

A number of commercially available system environments support the design of complex DSP systems.

MATLAB® of Mathworks Inc offers the possibility of exploration at the algorithmic level. It uses the data-vector as the basic semantical feature. However, the developed MATLAB® description has no relationship to a digital hardware implementation, nor does MATLAB® support the synthesis of digital circuits.

SPW of Alta Group offers a toolkit for the simulation of these kinds of systems. SPW is typically used to simulate data-flow semantics. Data-flow semantics define explicit algorithmic iteration, whereas data-vector semantics do not. SPW relies on an extensive library and toolkit to develop systems. Unlike MATLAB®, the initial description is a block-based description. Each block used in the systems appears in two different formats, (a simulatable and a synthesizable version) which results in possible inconsistency.

COSSAR® of Synopsys performs the same kind of system exploration as SPW.

DC and BC are products of Synopsys that support system synthesis. These products do not provide sufficient algorithm exploration functions.

Because all of these tools support only part of the desired functionality, contemporary digital systems are designed typically with a mix of these environments. For example, a designer might do algorithmic exploration in MATLAB, then do architecture definition with SPW, and finally map the architecture definition to an implementation in DC.

AIMS OF THE INVENTION

It is an aim of the present invention to disclose a design apparatus that allows to generate from a behavioral description of a digital system, an implementable description for said system.

It is another aim of the present invention to disclose a design apparatus that allows for designing digital systems, starting from a data vector or data flow description, and generating an implementable level such as VHDL. A further aim is to perform such design tasks within one object oriented environment.

Another aim is to provide a means comprised in said design apparatus for simulating the behavior of the system at any level of the design stage or trajectory.

SUMMARY OF THE INVENTION

A first aspect of the present invention concerns a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

A behavioral description is a description which substantiates the desired behavior of a system in a formal way. In general, a behavioral description is not readily implementable since it is a high-level description, and it only describes an abstract version of the system that can be simulated. An implementable description is a more concrete description that is, in contrast to a behavioral description, detailed enough to be implemented in software to provide an approximative simulation of real-life behavior or in hardware to provide a working semiconductor circuit.

With design environment is meant an environment in which algorithms can be produced and run by interpretation or compilation.

With objects is meant a data structure which shows all the characteristics of an object from an object oriented programming language, such as described in "Object Oriented Design" (G. Booch, Benjamin/cummings Publishing, Redwood City, Calif., 1991).

Said first and second set of objects are preferably part of a single design environment.

Said design environment comprises preferably an Object Oriented Programming Language (OOPL). Said OOPL can be C++.

Said design environment is preferably an open environment wherein new objects can be created. A closed environment will not provide the flexibility that can be obtained with an open environment and will limit the possibilities of the user.

Preferably, at least part of the input signals and output signals of said first set of objects are at least part of the input signals and output signals of said second set of objects. Essentially all of the input signals and output signals of said first set of objects can be essentially all of the input signals and output signals of said second set of objects.

At least part of the input signals and output signals of said behavioral description are preferably at least part of the input signals and output signals of said implementable description. Essentially all of the input signals and output signals of said behavioral description can be essentially all of the input signals and output signals of said implementable description.

Said first set of objects has preferably first semantics and said second set of objects has preferably second semantics. With semantics is meant the model of computation. Said first semantics is preferably a data-vector model and/or a dataflow model. Said second semantics is preferably a Finite State Machine Data Path (FSMD) data structure, comprising a control part and a data processing part, the data processing part being modeled by a signal flow graph (SFG) data structure and the control part being modeled by a FSM data structure. The terms FSMD and SF are used interchangeably throughout the text.

Preferably, the impact in said implementable description of at least a part of the objects of said second set of objects is essentially the same as the impact in said behavioral description of at least a part of the objects of said first set of objects.

Preferably, the impact in said implementable description of essentially all of the objects of said second set of objects is essentially the same as the impact in said behavioral description of essentially all of the objects of said first set of objects.

With impact is meant not only the function, but also the way the object interacts with its environment from an external point of view. A way of rephrasing this is that the same interface for providing input and collecting output is present. This does not mean that the actual implementation of the data-processing between input and output is the same. The implementation is embodied by objects, which can be completely different but perform a same function. In an OOPL, the use of methods of an object without knowing its actual implementation is referred to as information hiding.

The design apparatus preferably further comprises means for simulating the behavior of said system said means simulating the behavior of said behavioral description, said implementable description or any intermediate description therebetween. Said intermediate description can be obtained after one or several refining steps from said behavioral description.

Preferably, at least part of said second set of objects is derived from objects belonging to said first set of objects. This can be done by using the inheritance functionalities provided in an OOPL. Essentially all of said second set of objects can be derived from objects belonging to said first set of objects.

Said implementable description can be essentially obtained by refining said behavioral description. Preferably, said refining comprises the refining of objects. The design apparatus can further comprise means to derive said first set of objects from a vector description, preferably a MATLAB® description, describing said system as a set of operations on data vectors, means for simulating static or demand-driven scheduled dataflow on said dataflow description and/or means for clock-cycle true simulating said digital system using said dataflow description and/or one or more of said SFG data structures.

The design apparatus can further comprise means to derive said first set of objects from a vector description, preferably a MATLAB description, describing said system as a set of operations on data vectors, means for simulating statically or demand-driven scheduled dataflow on said dataflow description and/or means for clock-cycle true simulating said digital system using said dataflow description and/or one or more of said SFG data structures.

In a preferred embodiment, said implementable description is an architecture description of said system, said system advantageously further comprising means for translating said architecture description into a synthesizable description of said system, said synthesizable description being directly implementable in hardware. Said synthesizable description is preferably a netlist of hardware building blocks. Said hardware is preferably a semiconductor chip or a electronic circuit comprising semiconductor chips.

A synthesizable description is a description of the architecture of a semiconductor that can be synthesized without further processing of the description. An example is a VHDL description.

Said means for translating said architecture description into a synthesizable description can be Cathedral-3 or Synopsys DC.

A second aspect of the present invention is a method for designing a system comprising at least one digital part, comprising a refining step wherein a behavioral description of said system is transformed into an implementable description of said system, said behavioral description being represented as a first set of objects with a first set of relations therebetween and said implementable description being represented as a second set of objects with a second set of relations therebetween.

Said refining step preferably comprises translating behavioral characteristics at least partly into structural characteristics. Said refining step can comprise translating behavioral characteristics completely into structural characteristics.

Said method can further comprise a simulation step in which the behavior of said behavioral description, said implementable description and/or any intermediate description therebetween is simulated.

Said refining step can comprises the addition of new objects, permitting interaction with existing objects, and adjustments to said existing objects allowing said interaction.

Preferably, said refining step is performed in an open environment and comprises expansion of existing objects. Expansion of existing objects can include the addition to an object of methods that create new objects. Said object is said to be expanded with the new objects. The use of expandable objects allows to use meta-code generation: creating expandable objects implies an indirect creation of the new objects.

Said behavioral description and said implementable description are preferably represented in a single design environment, said single design environment advantageously being an Object Oriented Programming Language, preferably C++.

Preferably, said first set of objects has first semantics and said second set of objects has second semantics. Said first semantics is preferably a data-vector model and/or a data-flow model. Said second semantics is preferably an SFG data structure.

The refining step comprises preferably a first refining step wherein said behavioral description being a data-vector model is at least partly transformed into a data-flow model. Advantageously, said data-flow model is an untimed floating point data-flow model.

Said refining step preferably further comprises a second refining step wherein said data-flow model is at least partly transformed into an SFG model. Said data-flow model can be completely transformed into an SFG model.

In a preferred embodiment, said first refining step comprises the steps of determining the input vector lengths of input, output and intermediate signals, determining the amount of parallelism of operations that process input signals under the form of a vector to output signals, determination of objects, connections between objects and signals between objects of said data-flow model, and determining the wordlength of said signals between objects. In the sequel of this application, the term "actors" is also used to denote objects. Connections between objects are denoted as "edges" and signals between objects are denoted as "tokens". Said step of determining the amount of parallelism can preferably comprise determining the amount of parallelism for every data vector and reducing the unspecified communication bandwidth of said data-vector model to a fixed number of communication buses in said data-flow model. Said step of determination of actors, edges and tokens of said data-flow model preferably comprises defining one or a group of data vectors in said first data-vector model as actors; defining data precedences crossing actor bounds, as edges, said edges behaving like queues and transporting tokens between actors; construct a system schedule and run a simulation on a computer environment. Said second refining step comprises preferably transforming said tokens from floating point to fixed point. Preferably, said SFG model is a timed fixed point SFG model.

Said second set of objects with said second set of relations therebetween are preferably at least partly derived from said first set of objects with said first set of relations therebetween. Objects belonging to said second set of objects are preferably new objects, identical with and/or derived by inheritance from objects from said first set of objects, or a combination thereof.

Several of said SFG models can be combined with a finite state machine description resulting in an implementable description. Said implementable description can be transformed to synthesizable code, said synthesizable code preferably being VHDL code.

Another aspect of the present invention is a method for simulating a system, wherein a description of a system is transformed into compilable C++ code.

Preferably, said description is an SFG data structure and said compilable C++ code is used to perform clock cycle true simulations.

Several SFG data structures can be combined with a finite state machine description resulting in an implementable description, said implementable description being said compilable C++ code suitable for simulating said system as software.

A clock-cycle true simulation of a system uses one or more SFG data structures.

Said clock-cycle true simulation can be an expectation-based simulation, said expectation-based simulation comprising the steps of: annotating a token age to every token; annotating a queue age to every queue; increasing token age according to the token aging rules and with the travel delay for every queue that has transported the token; increasing queue age with the iteration time of the actor steering the queue, and; checking whether token age is never smaller than queue age throughout the simulation.

Another aspect of the present invention is a hardware circuit or a software simulation of a hardware circuit designed with the design apparatus as recited higher.

Another aspect of the present invention is a hardware circuit or a software simulation of a hardware circuit designed with the method as recited above.

DETAILED DESCRIPTION OF THE INVENTION

The present invention will be further explained by means of examples, which does not limit the scope of the invention as claimed.

SHORT DESCRIPTION OF THE DRAWINGS

In FIGS. 1A, 1B, 1C and 1D, the overall design methodology according to an embodiment of the invention is described.

Figure 2:
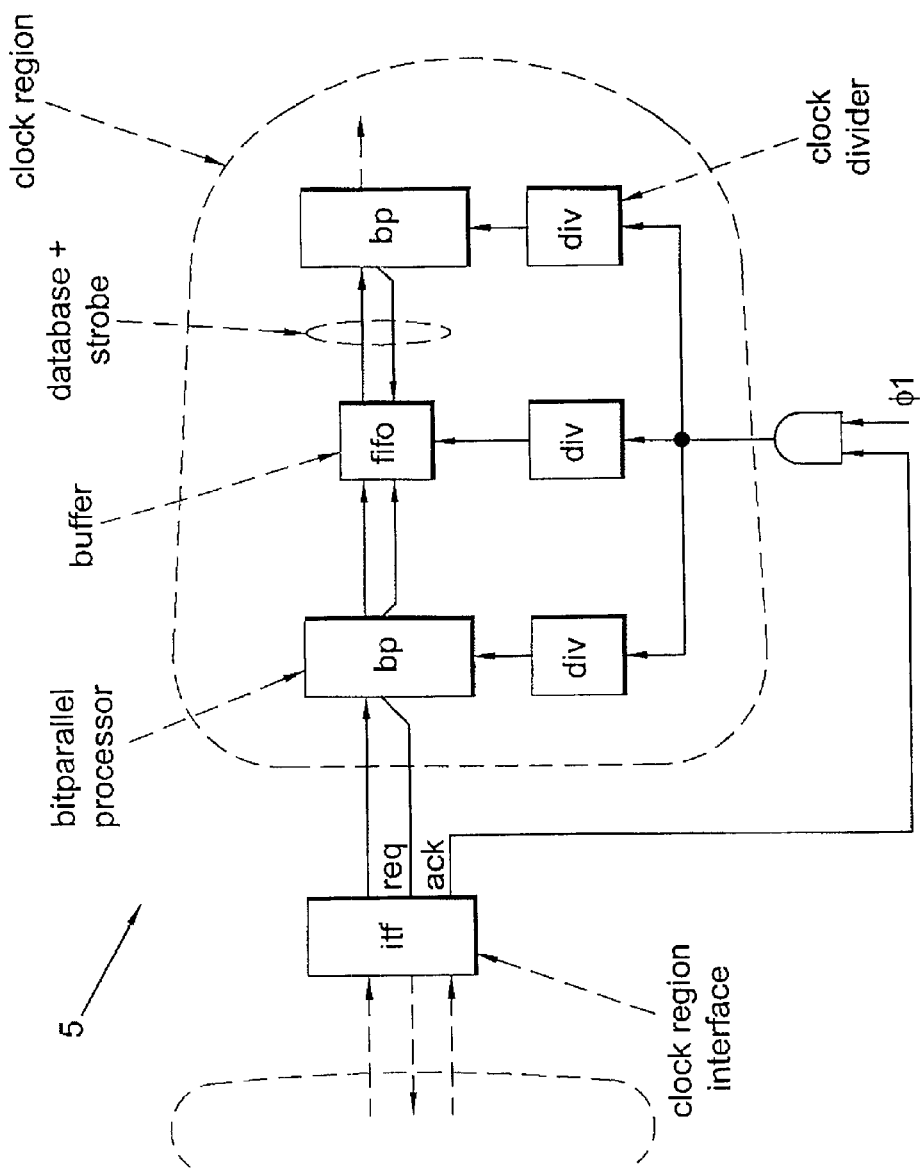

In FIG. 2, a targeted architecture of a system that is to be designed according to the invention is described.

Figure 3:
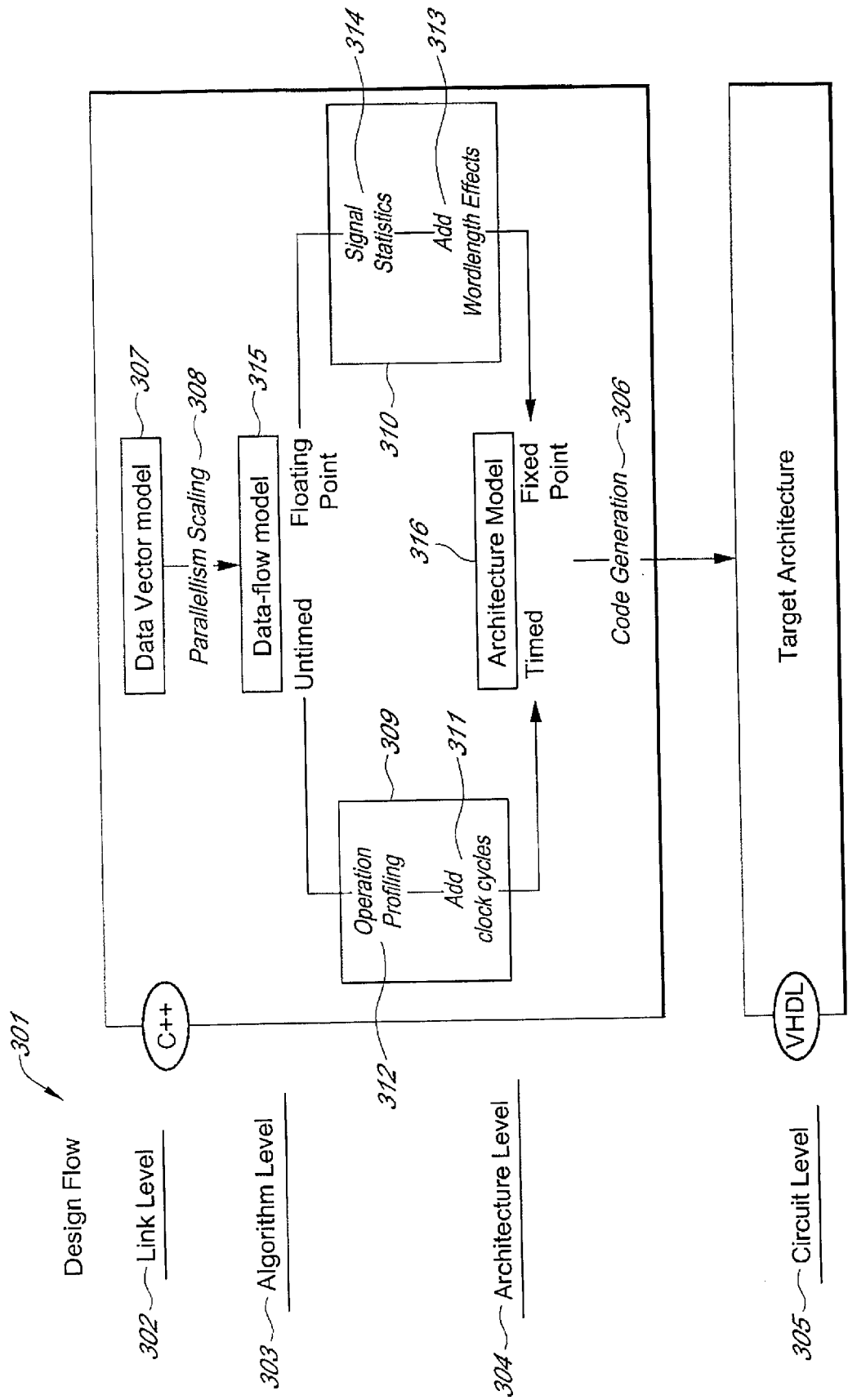

In FIG. 3, the C++ modeling levels of target architecture are depicted.

In FIG. 4, a Synchronous Data Flow (SDF) model of the PN correlator of the target architecture of FIG. 2 is shown.

In FIG. 5, a Cyclo-Static Data Flow (CSDF) model of the PN correlator is described.

Figure 6:
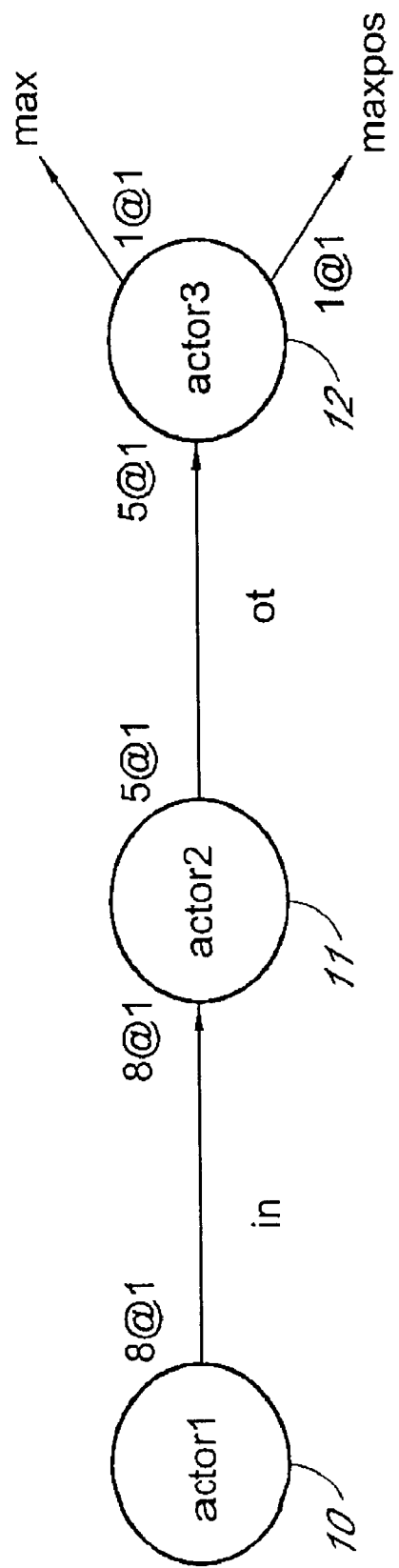

In FIG. 6, a MATLAB® Dataflow model of the PN correlator is shown.

Figure 7:
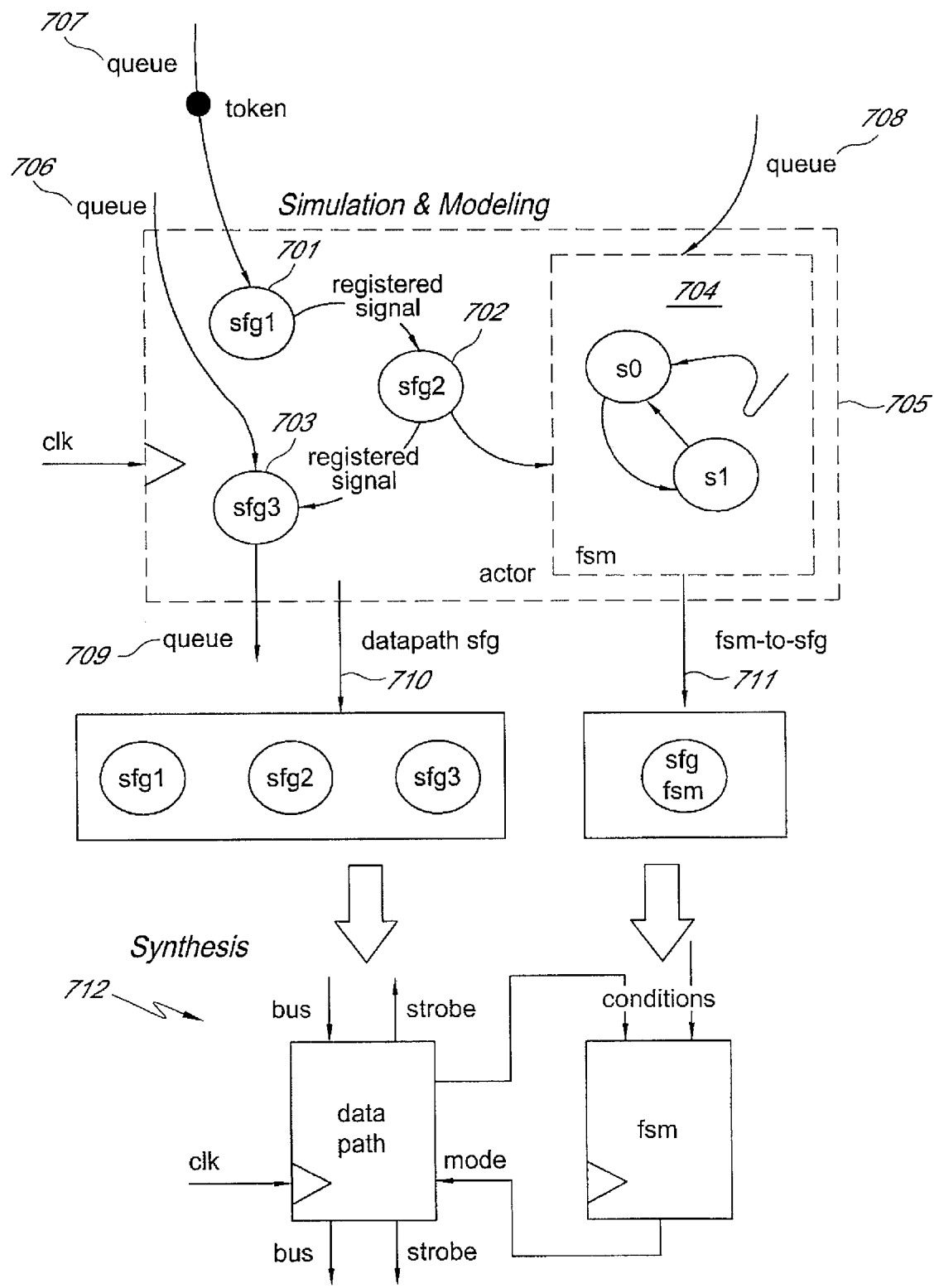

In FIG. 7, the SFG modeling concepts are depicted.

Figure 8:
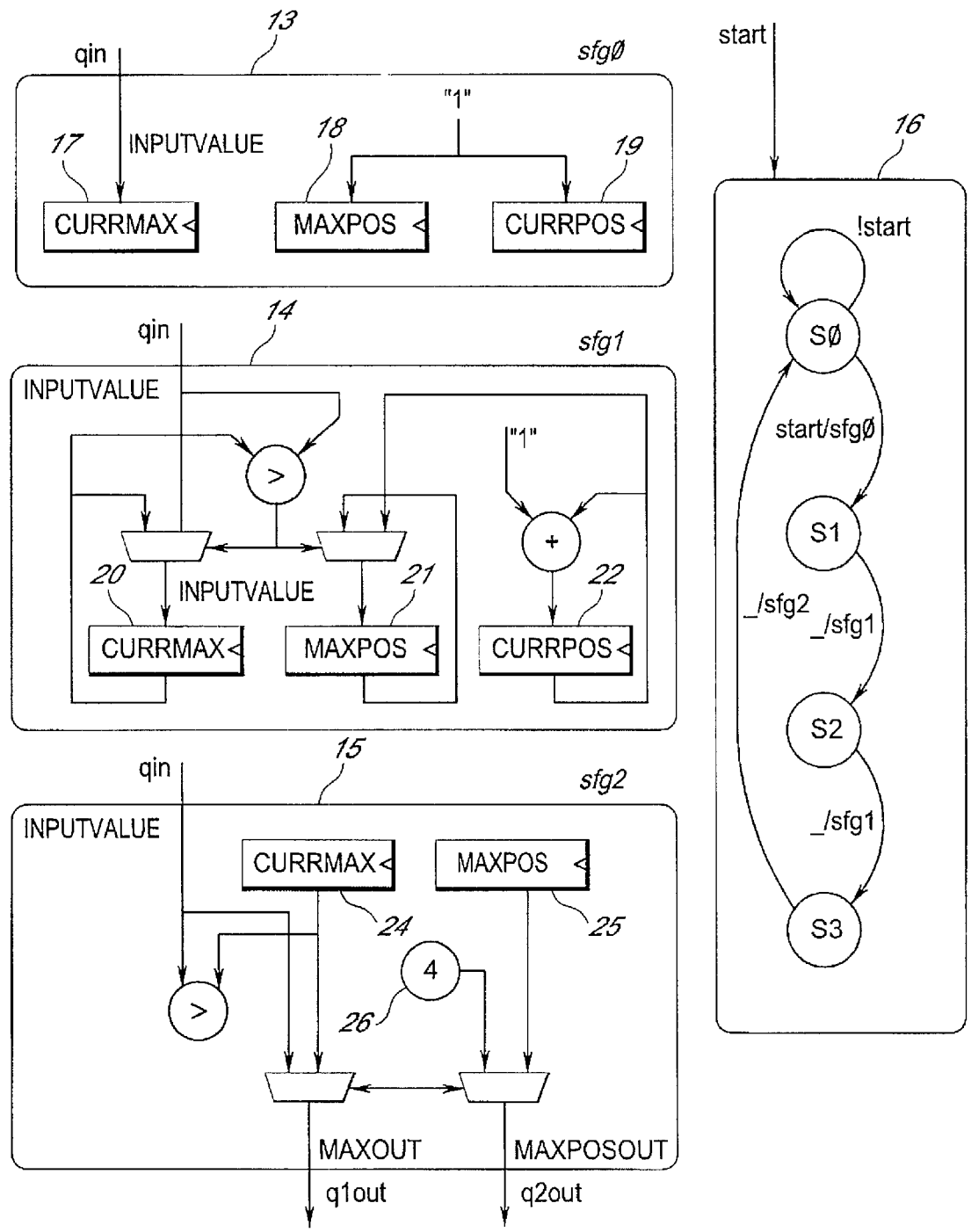

In FIG. 8, the implied description of the max actor is described.

In FIG. 9, example implementations for different expectations are given.

Figure 10:
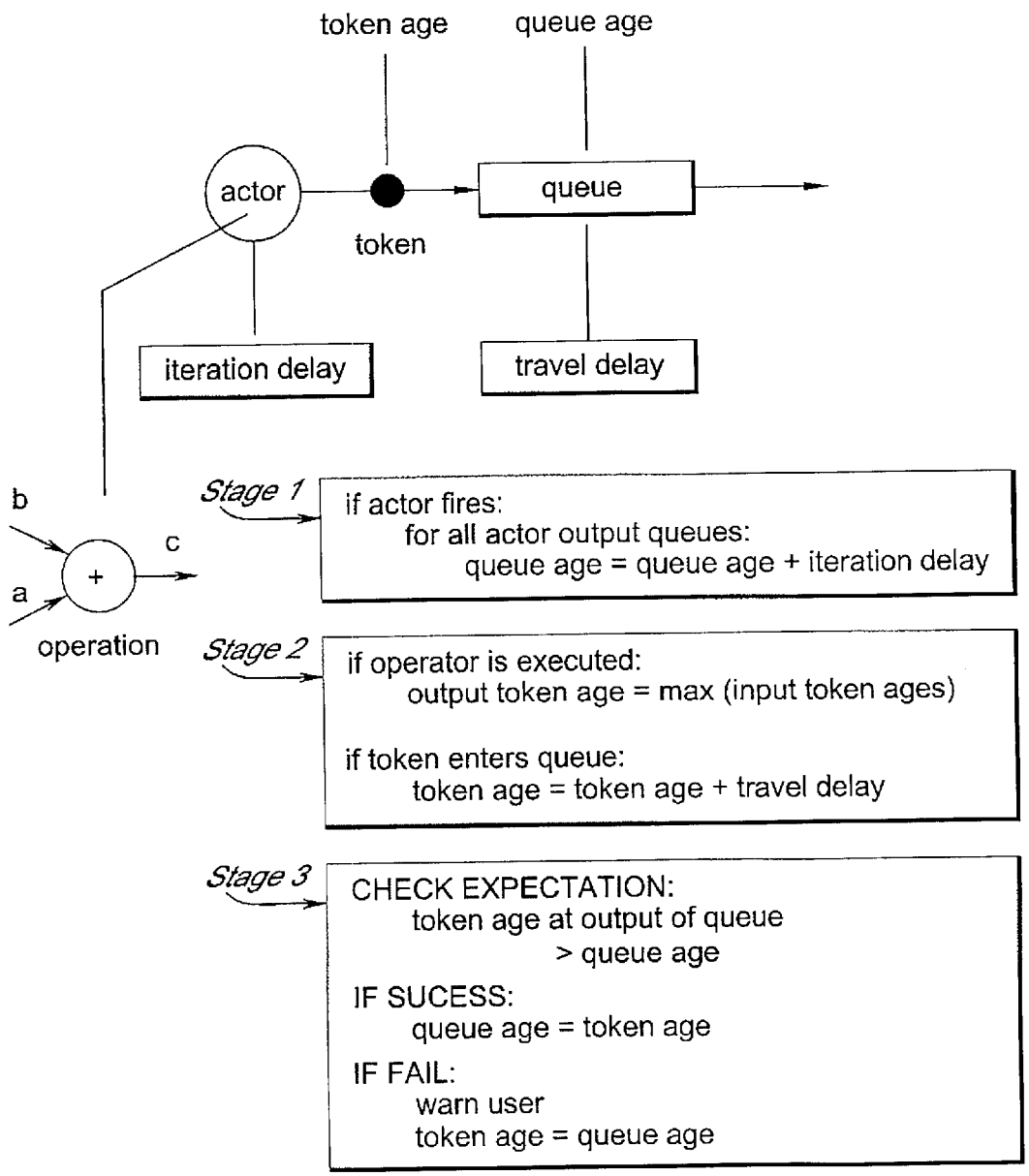

In FIG. 10, an overview of expectation based simulation is shown.

In FIG. 11, the code in OCAPI, or design environment of the invention, for a correlator processor is given.

Figure 12:
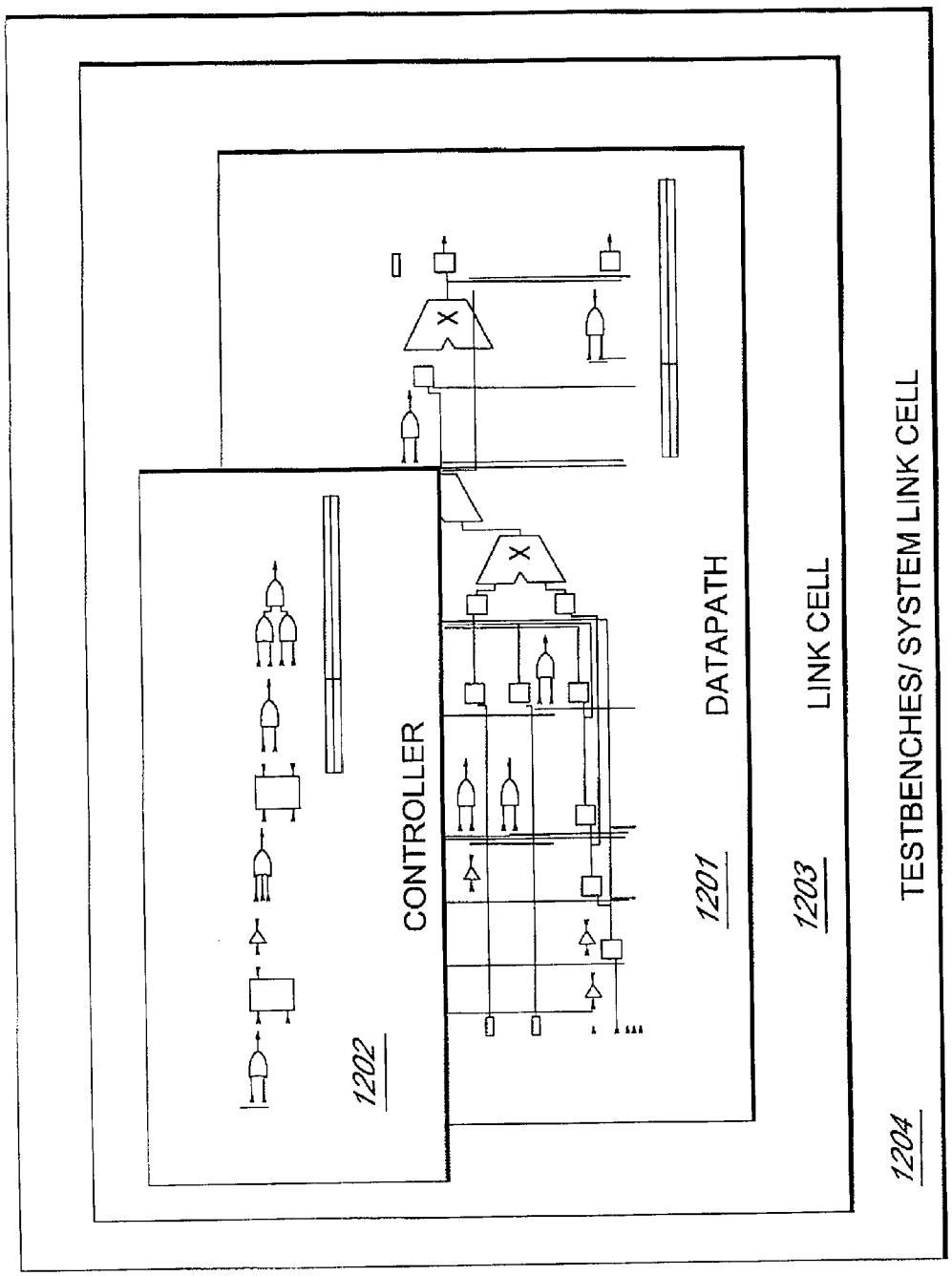

In FIG. 12, the resulting circuit for datapath and controller is hierarchically drawn.

Figure 13:
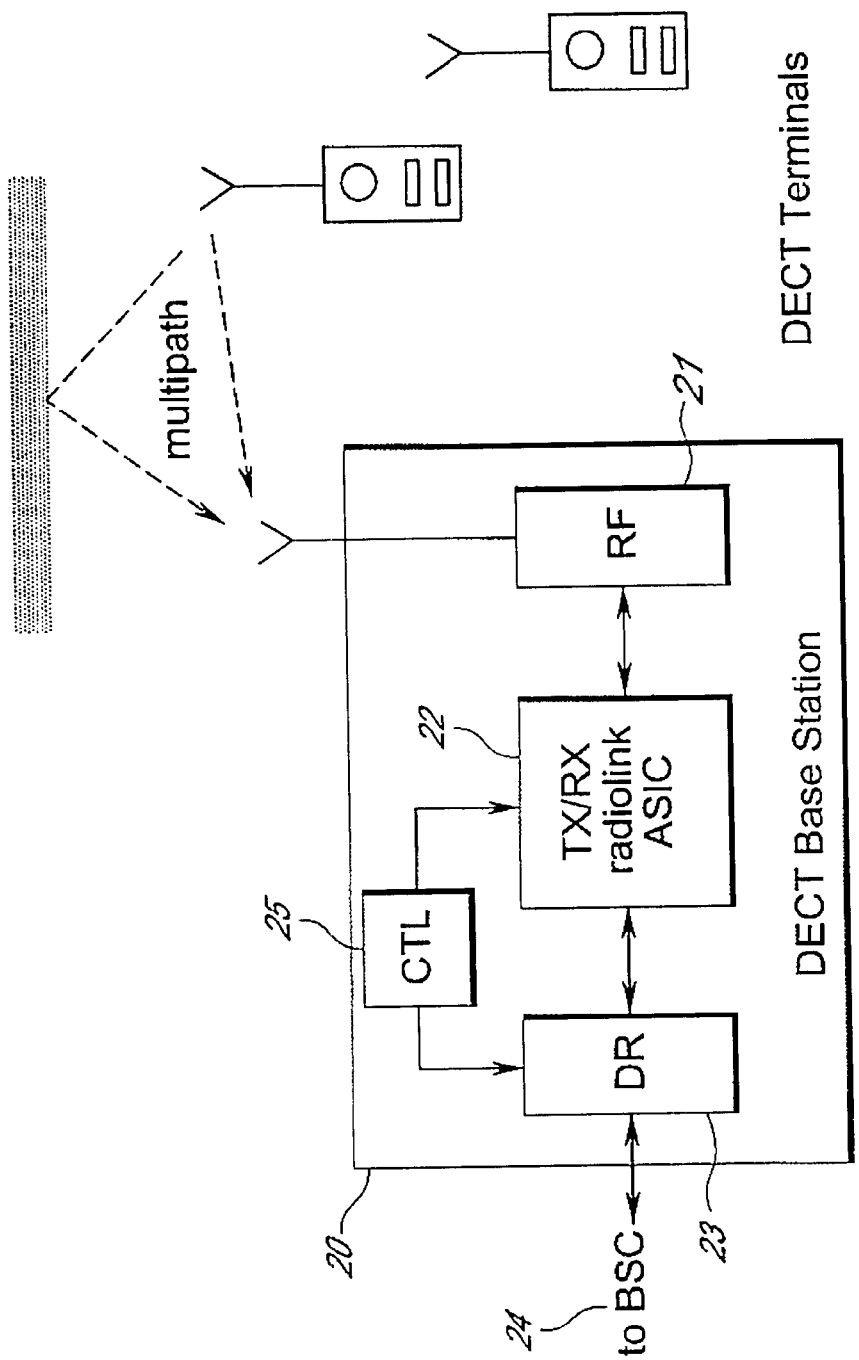

FIG. 13 describes a DECT Base station setup.

Figure 14:
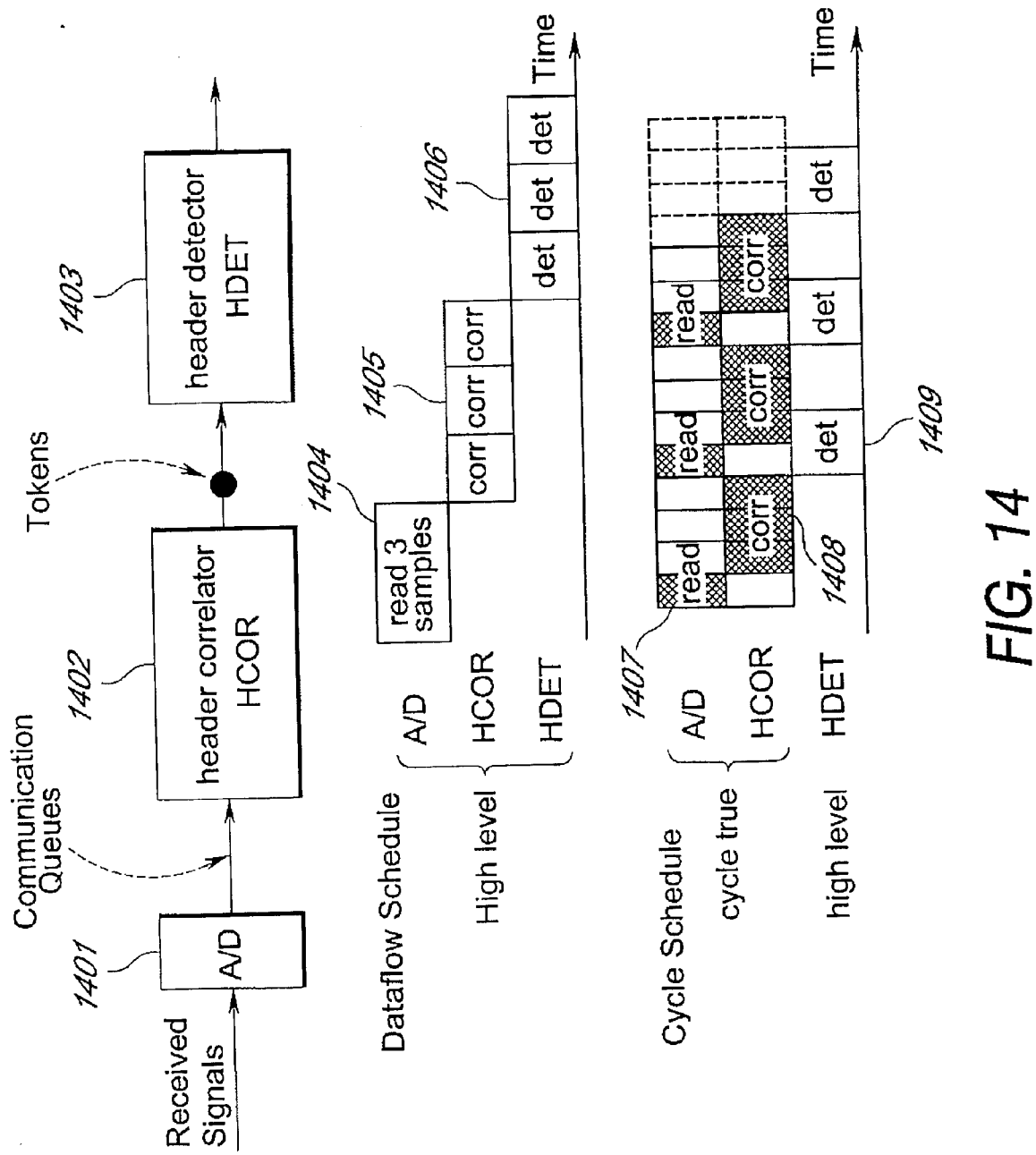

FIG. 14 shows the front-end processing of the DECT transceiver.

Figure 15:
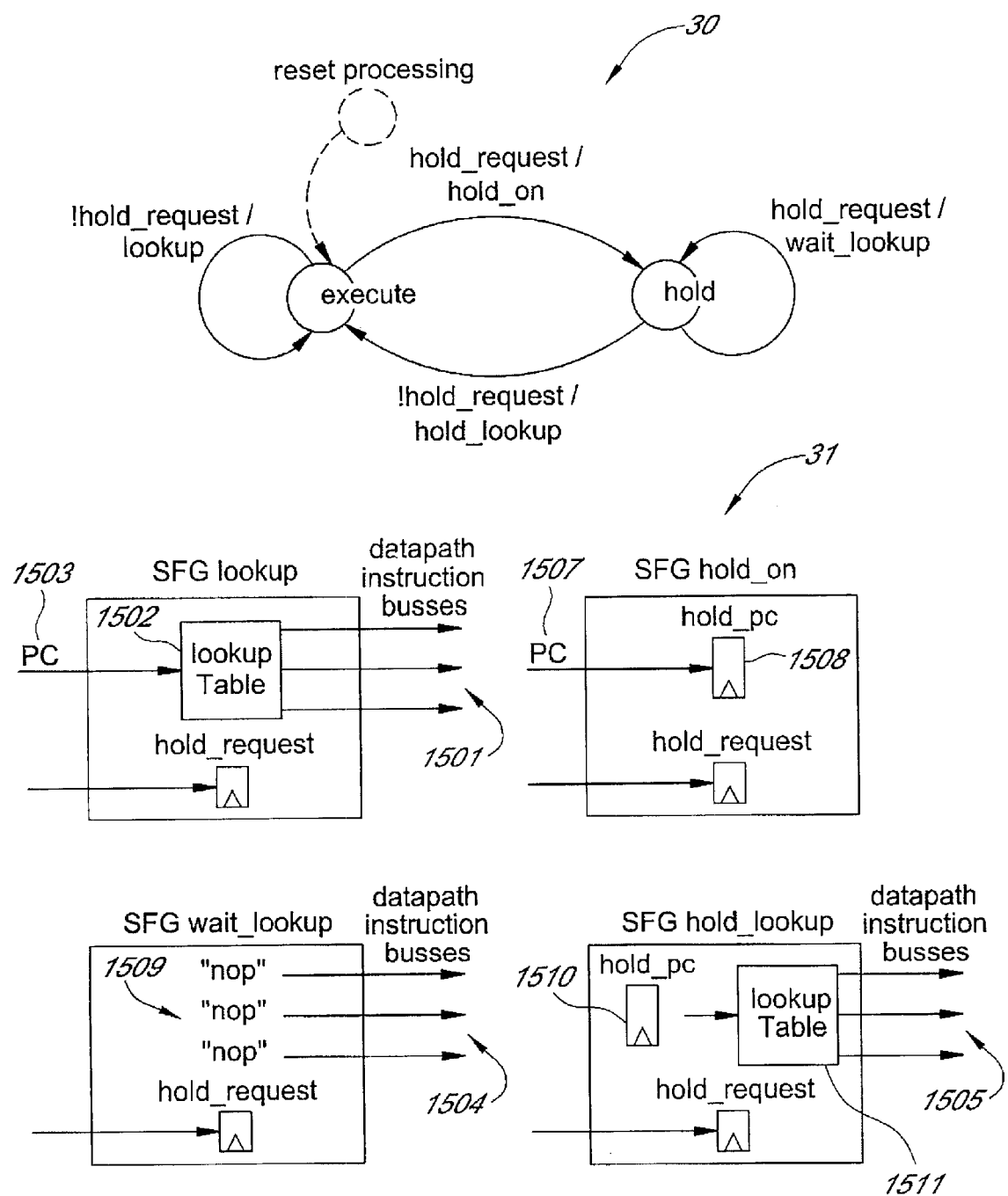

In FIG. 15, a part of the central Very Long Instruction Word (VLIW) controller description for the DECT transceiver ASIC is shown.

In FIG. 16, the use of overloading to construct the signal flowgraph data structure is shown.

Figure 17:
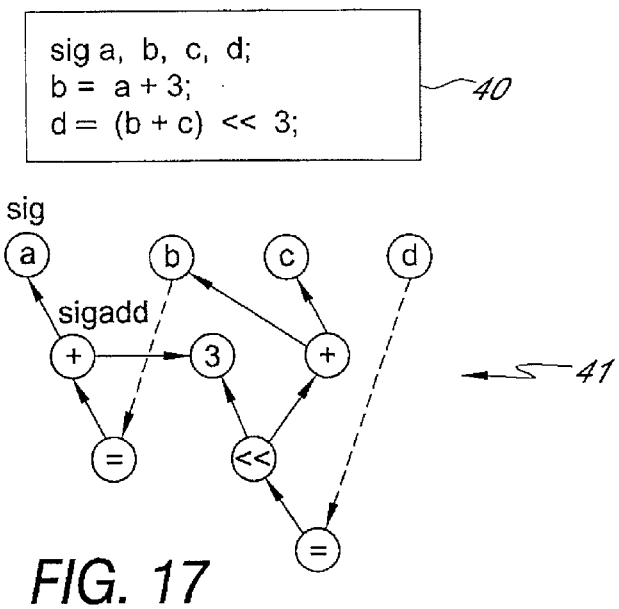

In FIG. 17, an example C++ code fragment and its corresponding data structure is described.

Figure 18:
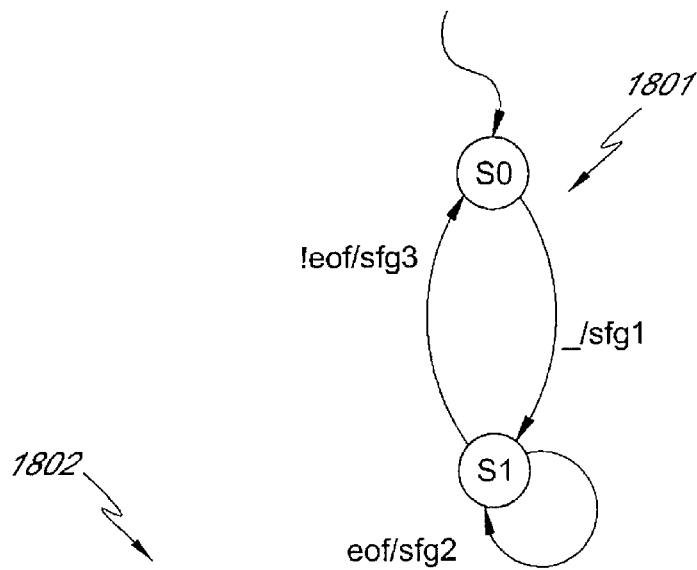

In FIG. 18, a graphical and C++-textual description of the same FSM is shown.

Figure 19:
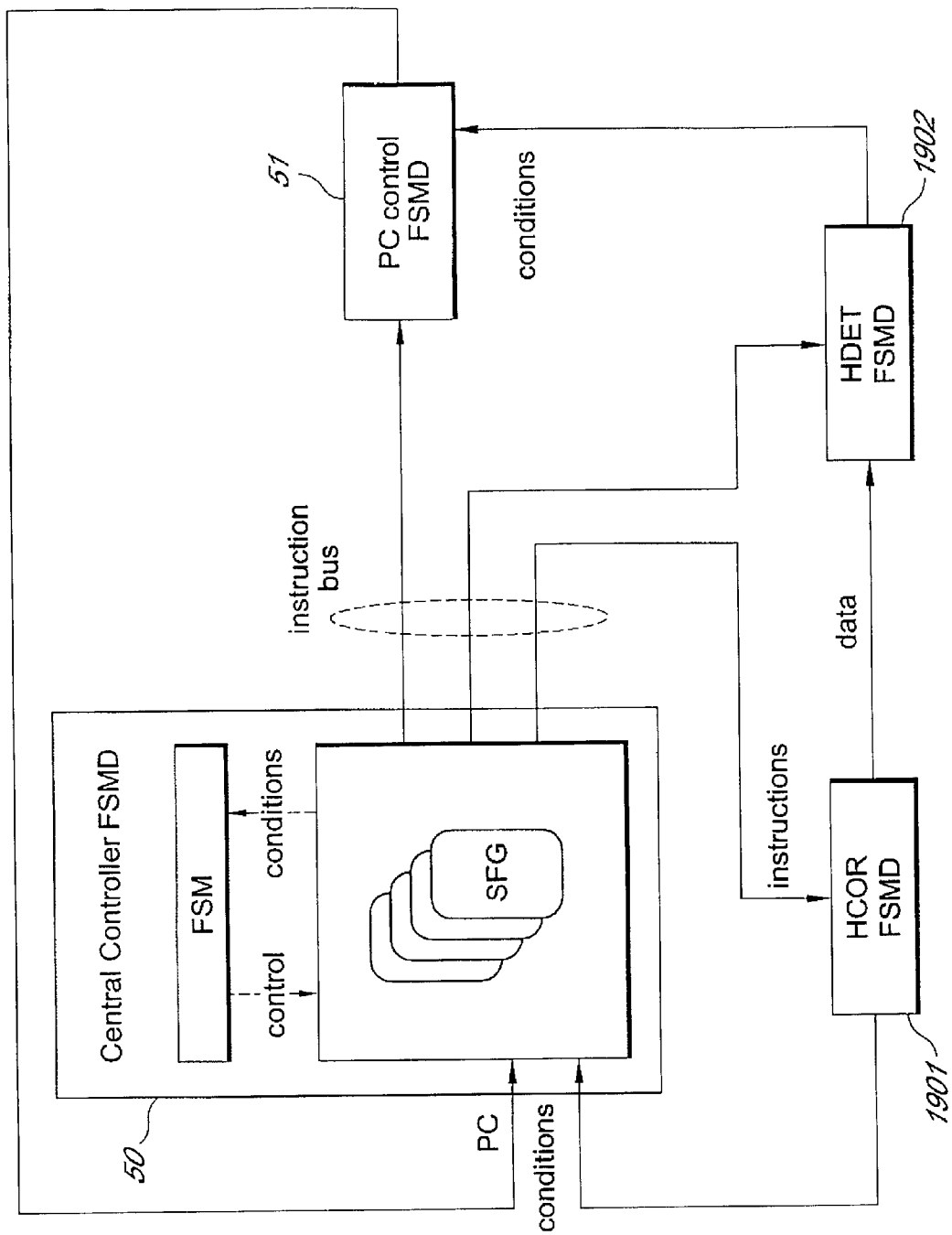

In FIG. 19, the final system architecture of the DECT transceiver is shown.

Figure 20:
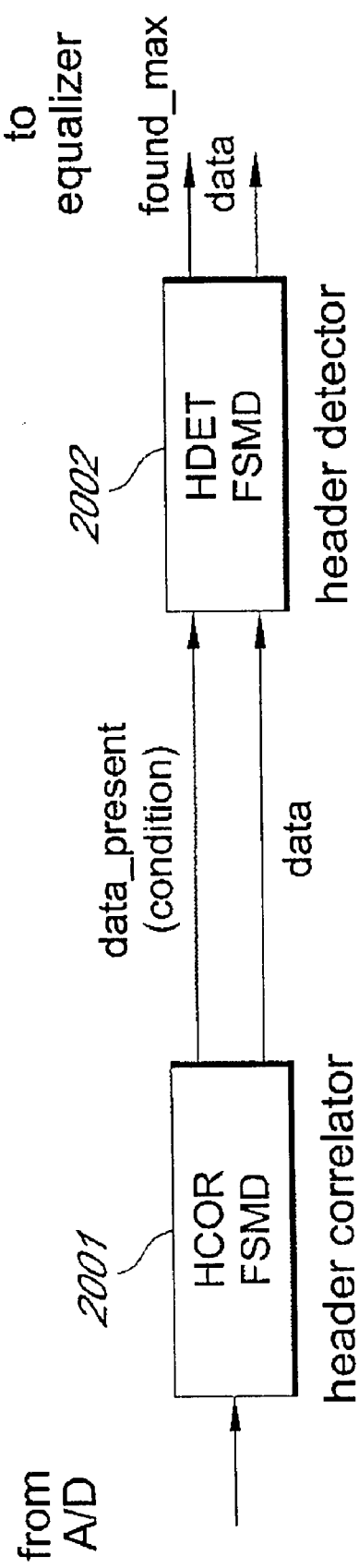

In FIG. 20, a data-flow target architecture is shown.

Figure 21:
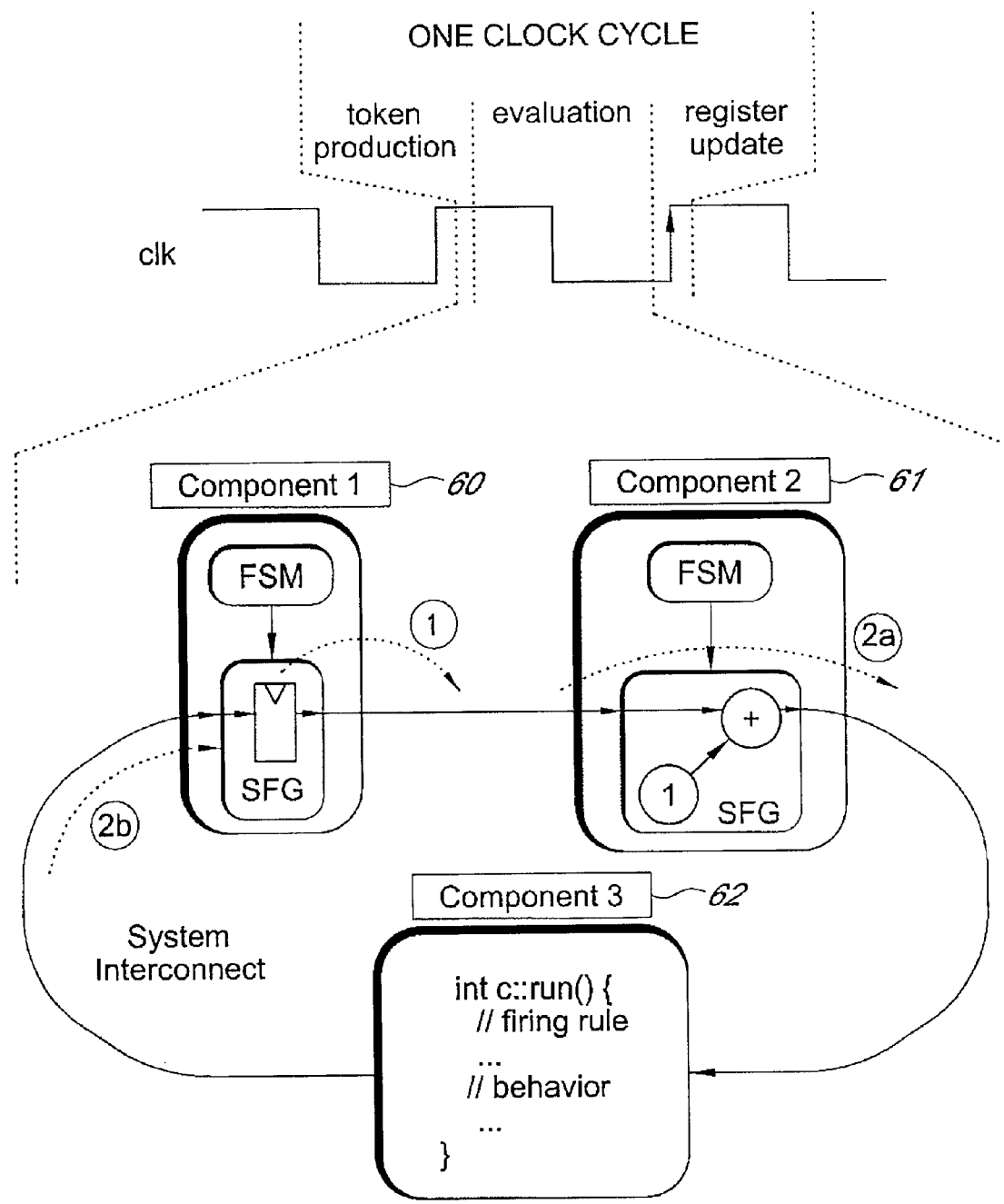

In FIG. 21, the simulation of one cycle in a system with three components is shown.

Figure 22:
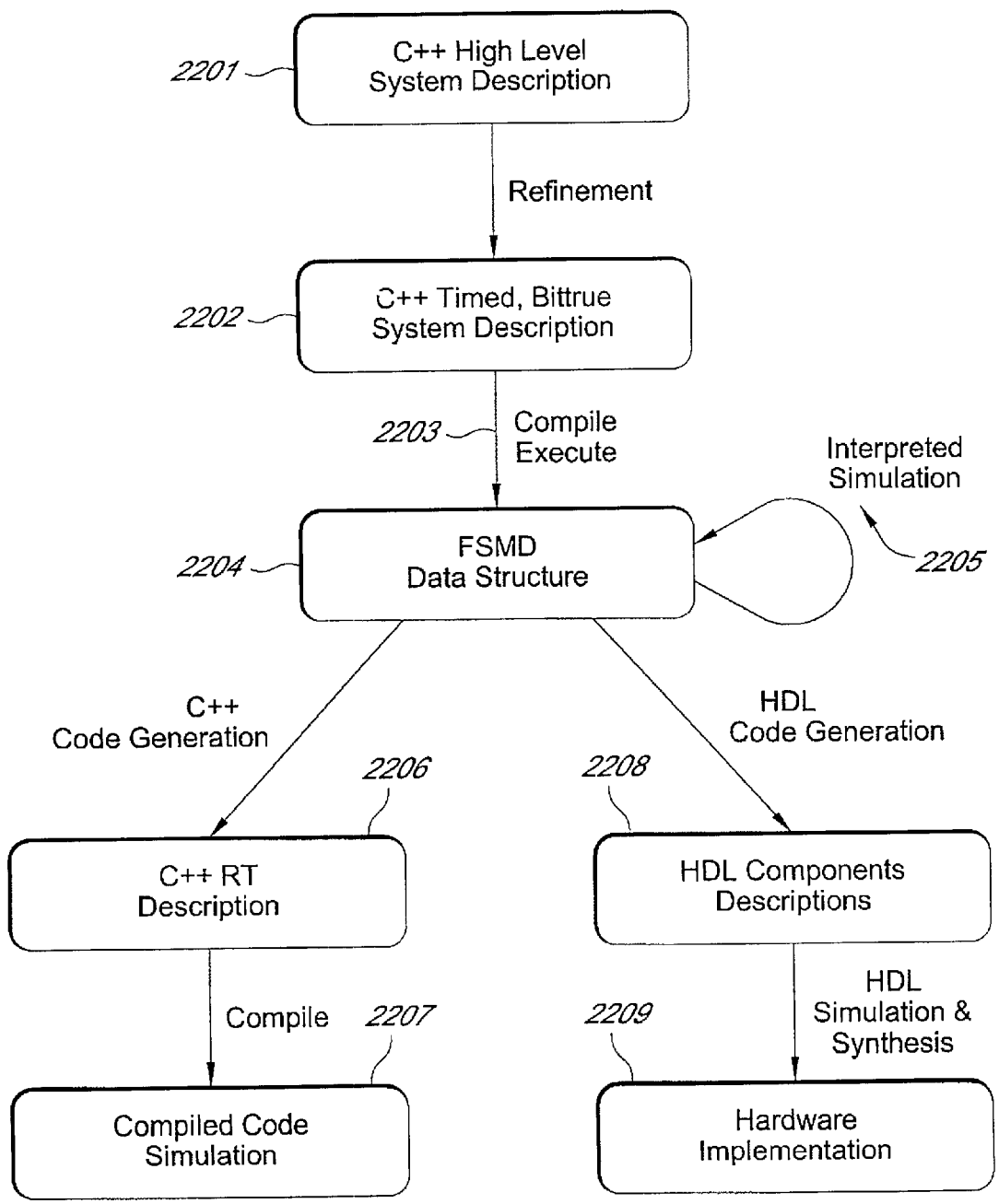

In FIG. 22, the implementation and simulation strategy is depicted.

Figure 23:
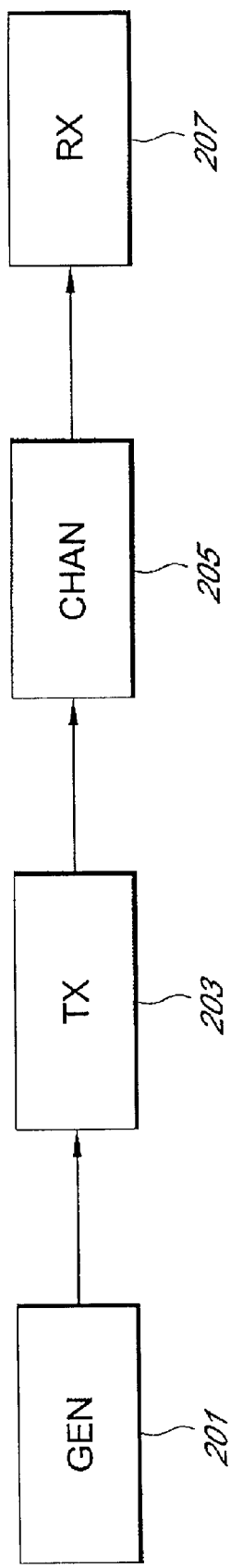

In FIG. 23, an end-to-end model of a QAM transmission system is shown.

Figure 24:
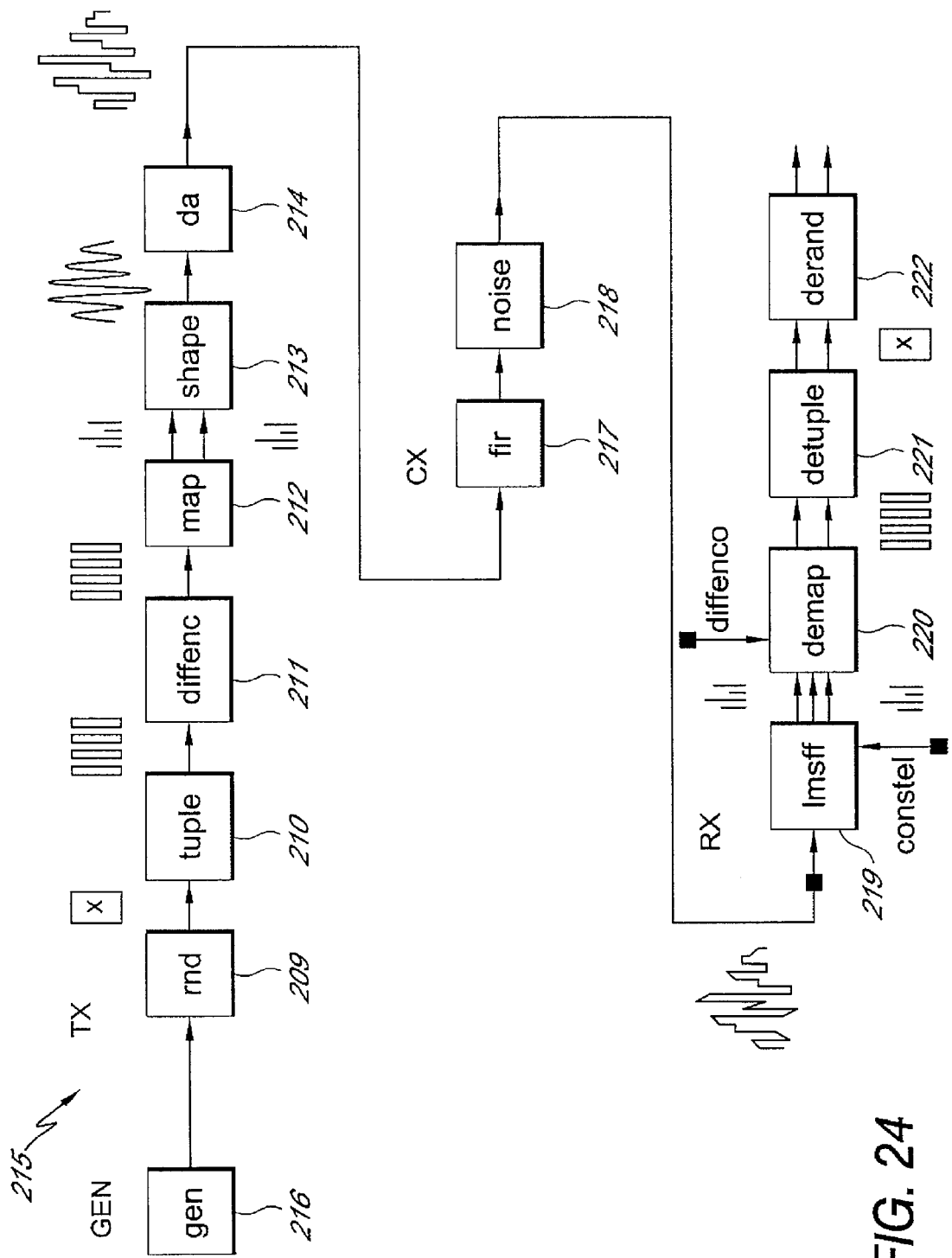

In FIG. 24, the system contents for the QAM transmission system is described.

The present invention can be described as a design environment for performing subsequent gradual refinement of descriptions of digital systems within one and the same object oriented programming language environment. The lowest level is semantically equivalent to a behavioral description at the register transfer (RT) level.

A preferred embodiment of the invention comprising the design method according to the invention is called OCAPI. OCAPI is part of a global design methodology concept SOC++. OCAPI includes both a design environment in an object oriented programming language and a design method. OCAPI differentiates from current systems that support architecture definition (SPW COSSAP®) in the way that a designer is guided from the MATLAB® level to the register transfer level. This way, combined semantic and syntactic translations in the design flow are avoided.

- The designer is offered a single coding framework in an object oriented programming language, such as C++, to express refinements to the behavior. An open environment is used, rather than the usual interface-and-module approach.
- The coding framework is a container of design concepts, used in traditional design practice. Some example design concepts currently supported are simulation queues, finite state machines, signal flowgraphs, hybrid floating/fixed point data types, operation profiling and signal range statistics. The concepts take the form of object oriented programming language objects (referred to as object in the remainder of this text), that can be instantiated and related to each other.
- With this set of objects, a gradual refinement design route is offered: more abstract design concepts can be replaced with more detailed ones in a gradual way. Also, design concepts are combined in an orthogonal way: quantization effects and clock cycles (operation/operator mapping) for instance are two architecture features that can be investigated separately. Next, the different design hierarchies can be freely intermixed because of this object-oriented approach. For instance, it is possible to simulate half of the description at fixed point level, while the other half is still in floating point.
- The use of a single object oriented programming language framework in OCAPI allows fast design iteration, which is not possible in the typical nowadays hybrid approach.
- Comparing to existing data-flow-based systems like SPW and COSSAR® we see that the algorithm iterations can be freely chosen. Comparing to existing hardware design environments like DC or BC, we wee that we can start from a specification level that is more abstract than the connection of blocks.

Two concepts of scaleable parallelism and expectation based simulation are introduced. The designer is given an environment to check the feasibility of what the designer thinks can be done. In the development process, the designer creates his library of Signal FlowGraph (SFG) versions of abstract MATLAB® operations.

DESCRIPTION OF OCAPI, A PREFERRED EMBODIMENT OF THE PRESENT INVENTION

OCAPI is a C++ library intended for the design of digital systems. It provides a short path from a system design description to implementation in hardware. The library is suited for a variety of design tasks, including:
Fixed Point Simulations
System Performance Estimation
System Profiling
Algorithm-to-Architecture Mapping
System Design according to a Dataflow Paradigm
Verification and Testbench Development

Development Flow

The Flow Layout

Figure 1B:
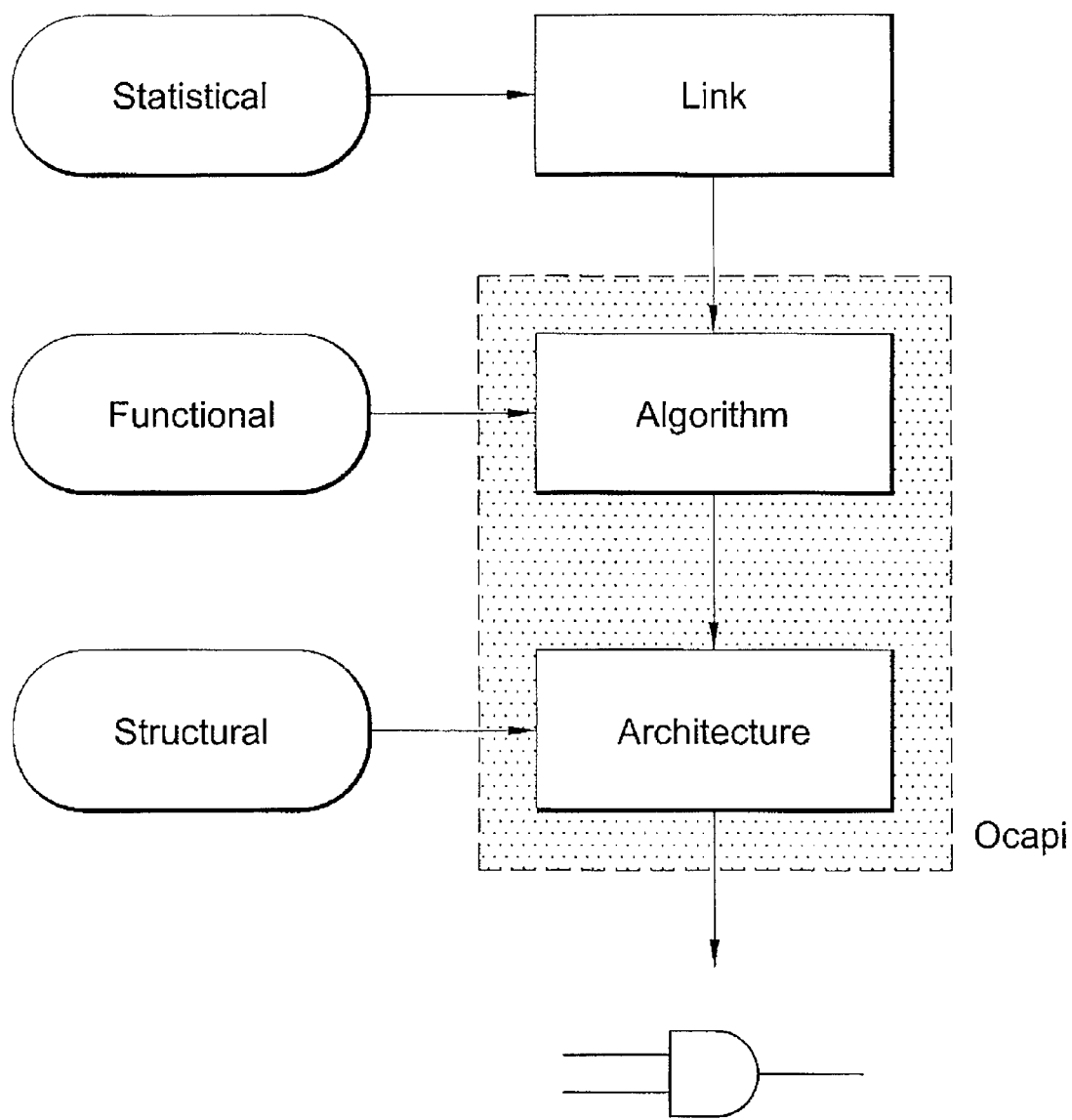
Figure 1C:
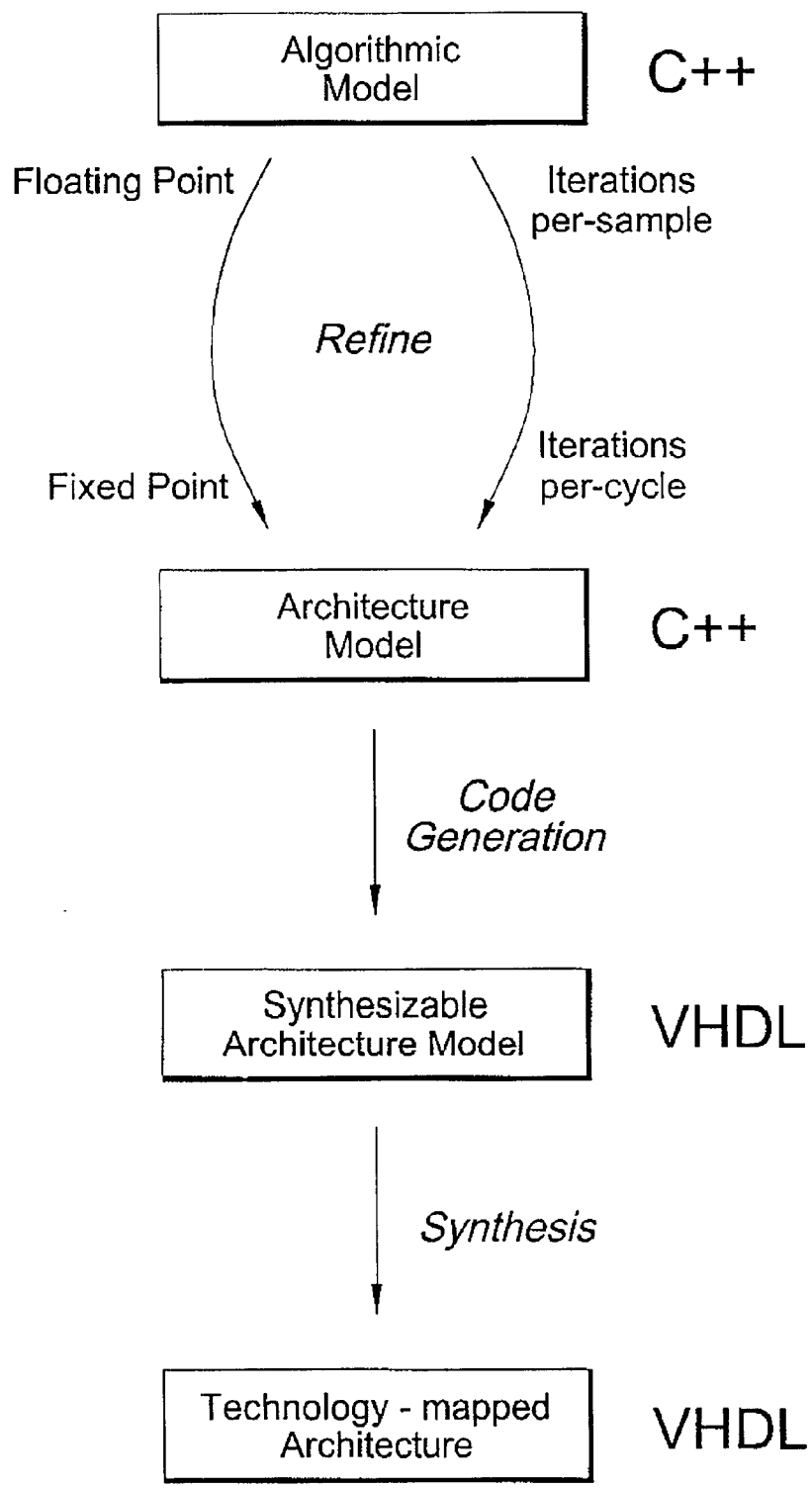
Figure 1D:
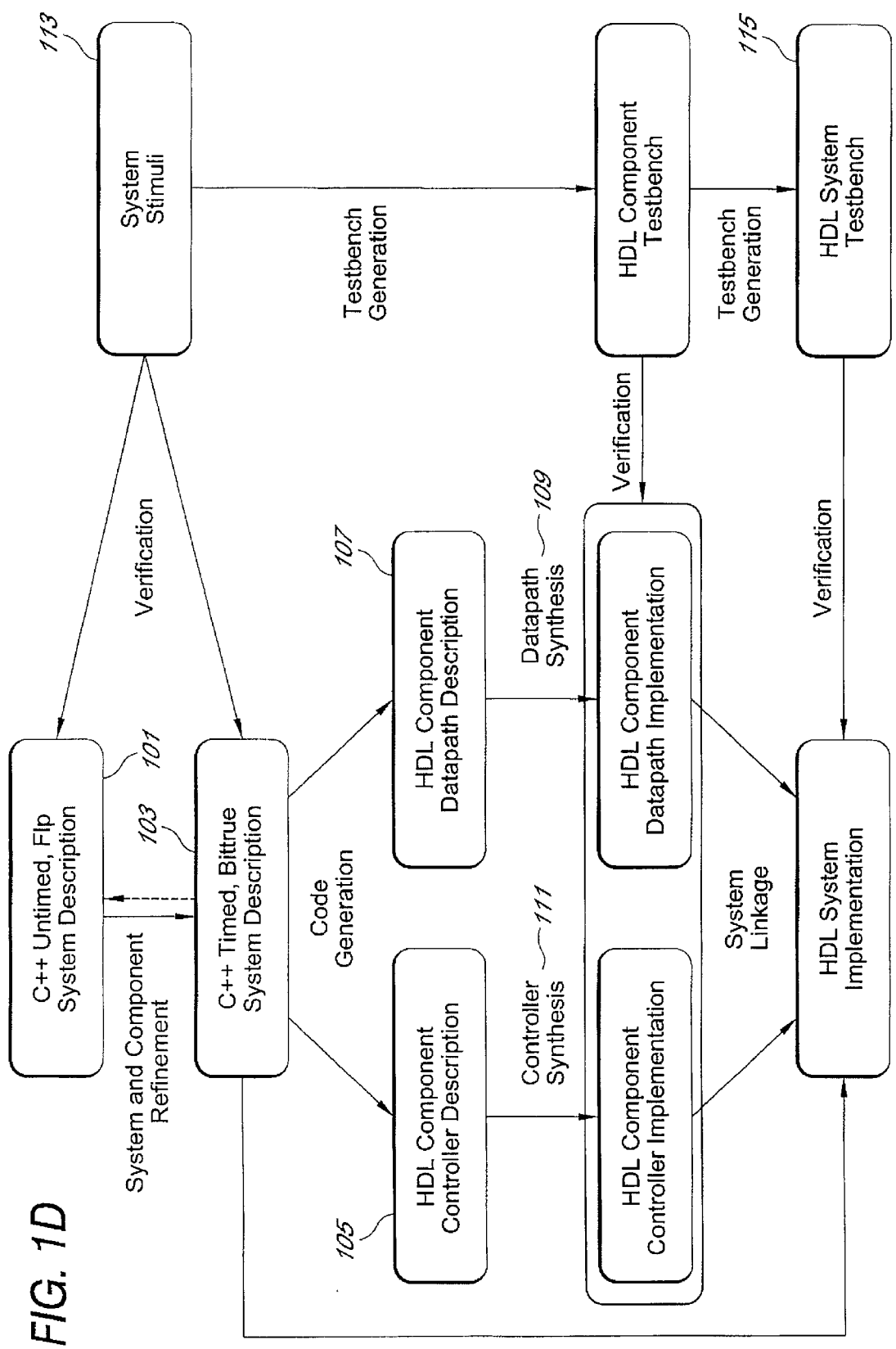

The design flow according to an embodiment of the present invention, as shown in FIG. 1D, starts off with an untimed, floating point C++ system description 101. Since data-processing intensive applications such as all-digital transceivers are targeted, this description uses data-flow semantics. The system is described as a network of communicating components.

At first, the design is refined, and in each component, features expressing hardware implementation are introduced, including time (clock cycles) and bittrue rounding effects. The use of C++ allows to express this in an elegant way. Also, all refinement is done in a single environment, which greatly speeds up the design effort.

Next, the timed, bittrue C++ description 103 is translated into an equivalent HDL description by code generation. For each component, a controller description 105 and a datapath description 107 can be generated. Also for each component a single HDL description can be generated, this description preferably jointly representing the control processing and data processing of the component. This is done because OCAPI relies on separate synthesis tools for both parts, each one optimized towards controller or else datapath synthesis tasks. Through the use of an appropriate object modeling hierarchy the generation of datapath and controller HDL can be done fully automatic.

For datapath synthesis 109, OCAPI relies on the Cathedral-3 datapath synthesis tools, that allow to obtain a bitparallel hardware implementation starting from a set of signal flowgraphs. Controller synthesis 111 on the other hand is done by the logic synthesis of Synopsys DC. This divide and conquer strategy towards synthesis allows each tool to be applied at the right place.

During system simulation, the system stimuli 113 are also translated into testbenches that allow to verify the synthesis result of each component. After interconnecting all synthesized components into the system netlist, the final implementation can also be verified using a generated system testbench 115.

The System Model

The system machine model that is used is a set of concurrent processes. Each process translates to one component in the final system implementation.

At the system level, processes execute using data flow simulation semantics. That is, a process is described as an iterative behavior, where inputs are read in at the start of an iteration, and outputs are produced at the end. Process execution can start as soon as the required input values are available.

Inside of each process, two types of description are possible. The first one is an untimed description, and can be expressed using any C++ constructs available. A firing rule is also added to allow dataflow simulation. Untimed processes are not subject to hardware implementation but are needed to express the overal system behavior. A typical example is a channel model used to simulate a digital transceiver.

The second flavor of processes is timed. These processes operate synchronously to the system clock. One iteration of such a process corresponds to one clock cycle of processing. Such a process falls apart in two pieces: a control description and a data processing description.

The control description is done by means of a finite state machine, while the data description is a set of instructions. Each instruction consists of a series of signal assignments, and can also define process inputs and outputs. Upon execution, the control description is evaluated to select one or more instructions for execution. Next, the selected instructions are executed. Each instruction thus corresponds to one clock cycle of RT behavior.

For system simulation, two schedulers are available. A dataflow scheduler is used to simulate a system that contains only untimed blocks. This scheduler repeatedly checks process firing rules, selecting processes for execution as their inputs are available. When the system also contains timed blocks, however, a cycle scheduler is used. The cycle scheduler manages to interleave execution of multi-cycle descriptions, but can incorporate untimed blocks as well.

The Standard Program

The library of OCAPI has been developed with the g++ C++ GNU compiler. The best mode embodiment uses the g++ 2.8.1 compiler, and has been successfully compiled and run under the HPUX 10 (HPUX10) operating system platform. It is also possible to use a g++ 2.7.2 compiler, allowing for compilation and run under operating system platforms such as HPUX-9 (HPRISC), HPUX-10 (HPUX10), SunOS (SUN4), Solaris (SUN5) and Linux 2.0.0 (LINUX).

The layout of the 'standard' g++ OCAPI program will be explained, including compilation and linking of this program.

First of all, g++ is a preferred standard compilation environment. On Linux, this is already the case after installation. Other operating system vendors however usually have their own proprietary C++ compiler. In such cases, the g++ compiler should be installed on the operating system, and the PATH variable adapted such that the shell can access the compiler.

The OCAPI library comes as a set of included files and a binary lib. All of these are put into one directory, which is called the BASE directory.

The 'standard program' is the minimal contents of an OCAPI program. It has the following layout.

```
include "qlib.h"
int main( )
{
// your program goes here
}
```

The include "qlib.h" includes everything you need to access all classes within OCAPI.

If this program is called "standard.cxx", then the following makefile will transform the source code into an executable for you:

```
HOSTTYPE = HPUX10
BASE = /imec/vsdm/OCAPI/release/v0.9
CC = g++
QFLAGS = -c -g -Wall -I${BASE}
LIBS = -lm
%.o: %.cxx
    $(CC) $(QFLAGS) $< -o $@
TARGET = standard
all: $(TARGET)
define lnkqlib
$(CC) $^ -o $@ $(LIBS)
endef
OBJS = standard.o
standard:${OBJS} $(BASE)/lib$(HOSTTYPE)qlib.a
    ${lnkqlib}
clean:
rm -f *.o $(TARGET)
```

This is a makefile for GNU's "make"; other "make" programs can have a slightly different syntax, especially for the definition of the "lnkqlib" macro. It is not the shortest possible solution for a makefile, but it is one that works on different platforms without making assumptions about standard compilation rules.

The compilation flags, "QFLAGS" mean the following: "-c" selects compilation-only, "-g" turns on debugging information, and "-Wall" is the warning flag. The debugging flag allows you to debug your program with "gdb", the GNU debugger.

Even if you don't like a debugger and prefer "printf( )" debugging, "gdb" can at least be of great help in the case the program core dumps. Start the program under "gdb" (type "gdb standard" at the shell prompt), type "run" to let "standard" crash again, and then type "bt". One now see the call trace.

Calculation

OCAPI processes both floating point and fixed point values. In contrast to the standard C++ data types like "int" and "double", a "hybrid" data type class is used, that simulates both fixed point and floating point behavior.

The dfix Class

This class is called "dfix". The particular floating/fixed point behavior is selected by the class constructor. The standard format of this constructor is:

```
dfix a;      // a floating point value
dfix a(0.5);// a floating point value with initial value
dfix a(0.5, 10, 8);
             // a fixed point value with initial value,
             // 10 bits total word-length, 8 fractional bits
```

A fixed point value has a maximal precision of the mantissa precision of a C++ "double". On most machines, this is 53 bits.

A fixed point value can also select a representation, an overflow behavior, and a rounding behavior. These flags are, in this order, optional parameters to the "dfix" constructor. They can have the following values.

Representation flag: "dfix::tc" for two's complement signed representation, "dfix::ns" for unsigned representation.

Overflow flag: "dfix::wp" for wrap-around overflow, "dfix::st" for saturation.

Rounding flag: "dfix::fl" for truncation (floor), "dfix::rd" for rounding behavior.

Some examples are

```
dfix a(0.5, 10, 8);
    // the default is two's complement, wrap-around,
    // truncated quantisation
dfix a(0.5, 10, 8, dfix::tc, dfix::st, dfix::rd);
    // two's complement, saturation, rounding quantisation
dfix a(0.5, 10, 8, dfix::ns);
    // unsigned, wrap-around, truncated quantisation
```

When working with fixed point "dfix"es, it is important to keep the following rule in mind: "quantisation occurs only when a value is defined or assigned". This means that a large expression with several intermediate results will never have these intermediate values quantised. Especially when writing code for hardware implementation, this should be kept in mind. Also intermediate results are stored in finite hardware and therefore, will have some quantisation behavior. There is however a "cast" operator that will come at help here.

The dfix Operators

The operators on "dfix" are shown below

+, −, *, /
  Standard addition, subtraction (including unary minus), multiplication and division.

+=, −=, *=, /=
  In-place versions of previous operators.

abs
  Absolute value.

<<, >>
  Left and right shifts.

<<=, >>=
  In place left and right shifts.

msbpos
  Most-significant bit position.

&, |, ^, ~
  Bitwise and, or, exor, and not operators.

frac( ) (member call)
  Fractional part.

==, !=, <=, >=, <, >
  Relational operators: equal, different, smaller then or equal to, greater then or equal to, smaller then, greater then. These return an "int" instead of a "dfix".

All operators with exception of the bitwise operators work on the maximal fixed point precision (53 points). The bitwise operators have a precision of 32 bits (a C++ "long"). Also, they assume the fixed point representation contains no fractional bits.

In addition to the arithmetic operators, several utility methods are available for the "dfix" class.

```
dfix a,b;
// cast a to another type
b = cast(dfix(0, 12, 10), a);
// assign b to a, retaining the quantisation of a
a = b;
// assign b to a, including the quantisation
a.duplicate(b);
// return the integer part of b
int c = (int) b,
// retrieve the value of b as a double
double d,e:
d = b.Val( );
e = Val(b);
// return quantisation characteristics of a
a.TypeW( );           // returns the number of bits
a.TypeL( );           // returns the number of fractional bits
a.TypeSign( );        // returns dfix::tc or dfix::ns
a.TypeOverflow( );    // returns dfix::wp or dfix::st
a.TypeRound( );       // returns dfix::fl or dfix::rd
// check if two dfixes are identical in value and
quantisation
identical(a,b);
// see wether a is floating or fixed point
a.TypeMode( ); // returns dfix::fixpoint or dfix::floatpoint
a.isDouble( );
a.isFix( );
// write a to cout
cout << a;
// write a to stdout, in float format,
// on a field of 10 characters
write(cout, a, 'f', 10);
// now use a fixed-format
write(cout, a, 'g', 10);
// next assume a is a fixed point number, and write out an
// integer representation (considering the decimal point at
// the lsb of a) use a hexadecimal format
write(cout, a, 'x', 10);
// use a binary format
write(cout, a, 'b', 10);
// use a decimal format
write(cout, a, 'd', 10);
// read a from stdin
cin >> a;
```

Communication

Apart from values, OCAPI is concerned with the communication of values in between blocks of behavior. The high level method of communication in OCAPI is a FIFO queue, of type "dfbfix". This queue is conceptually infinite in length. In practice it is bounded by a sysop phonecall telling that you have wasted up all the swap space of the system.

The dfbfix Class

A queue is declared as dfbfix a("a");

This creates a queue with name a. The queue is intented to pass value objects of the type "dfix". There is also an alias type of "dfbfix", known as "FB" (flow buffer). So you can also write FB a("a");

The dfbfix operations

The basic operations on a queue allow to store and retrieve "dfix " objects. The operations are
```
dfix k;
dfix j(0.5);
dfbfix a("a");
// insert j at the front of a
a.put(j)
// operator format for an insert
a << j;
// insert j at position 5, with position 0 corresponding to
// the front of a.
a.putIndex(j,5);
// read one element from the back of a
k = a.get( );
// operator format for a read
a >> j;
// peek one element at position 1 of a
k = a.getIndex(1);
// operator format for peek
```

-continued

The dfbfix operations

```
k = a.getIndex(1);
// retrieve one element from a and throw it
a.pop( );
// throw all elements, if any, from a
a.clear( );
// return the number of elements in a as an int
int n = a.getSize( );
// return the name of the queue
char *p = a.name( );
```

Whenever you perform an access operation that reads past the end of a FIFO, a runtime error results, showing Queue Underflow @ get in queue a Utility Calls for dfbfix Besides the basic operations on queues, there are some additional utiliy operations that modify a queue behavior

```
// make a queue of length 20. The default length of a queue
// is 16. Whenever this length is exceeded by a put, the
// storage in the queue is dynamically expanded by a factor
// of 2.
dfbfix a("a", 20);
// After the asType( ) call, the queue will have an input
// "quantizer" that will quantize each element inserted
// into the queue to that of the quantizer type
dfix q(0, 10, 8);
a.asType(q);
// After an asDebug( ) call, the queue is associated with a
// file, that will collect every value written into the
// queue. The file is opened as the queue is initialized
// and closed when the queue object is destroyed.
a.asDebug("thisfile.dat");
// Next makes a duplicate queue of a, called b. Every write
// into a will also be done on b. Each queue is allowed to
// have at most ONE duplicate queue.
dfbfix b ("b");
a.asDup(b);
// Thus, when another duplicate is needed, you write it as
dfbfix c("c");
b.asDup(c);
```

During the communication of "dfix" objects, the queues keep track of some statistics on the values that are passed through it. You can use the "<<" operator and the member function "stattitle( )" to make these statistics visible.

The next program demonstrates these statistics

```
include "qlib.h"
void main( )
{
dfbfix a("a");
a << dfix(2);
a << dfix(1);
a << dfix(3);
a.stattitle(cout);
cout << a;
}
```

When running this program, the following appears on screen

| Name | put | get | MinVal | @idx | MaxVal | @idx | Max# | @idx |
|------|-----|-----|--------|------|--------|------|------|------|
| A | 3 | 0 | 1.0000e+00 | 2 | 3.0000e+00 | 3 | 3 | 3 |

The first line is printed by the "stattitle( )" call as a mnemonic for the fields printed below. The next line is the result of passing the queue to the standard output stream object. The fields mean the following:

| | |
|---|---|
| Name | The name of the queue |
| put | The total number of elements "put( )" into the queue |
| get | The total number of elements "get( )" from the queue |
| MinVal | The lowest element put onto the queue |
| @idx | The put sequential number that passed this lowest element |
| MaxVal | The highest element put onto the queue |
| @idx | The put sequential number that passed this highest element |
| Max# | The maximal queue length that occurred |
| @idx | The put sequential number that resulted in this maximal queue length |

Globals and Derivatives for dfbfix

There are two special derivates of "dfbfix". Both are derived classes such that you can use them wherever you would use a "dfbfix". Only the first will be discussed here, the other one is related to cycle-true simulation and is discussed in section "Faster Communications".

The "dfbfix_nil" object is like a "/dev/null" drain. Every "dfix" written into this queue is thrown. A read operation from such a queue results in a runtime error.

There are two global variables related to queues. The "listOfFB" is a pointer to a list of queues, containing every queue object you have declared in your program. The member function call "nextFB( )" will return the successor of the queue in the global list. For example, the code snippet

```
dfbfix *r;
for ( r = listOfFB ; r ; r = r->nextFB( ) )
{
     . . .
}
``` will walk trough all the queues present in the OCAPI program.

The other global variable is "nilFB", which is of the type "dfbfix_nil". It is intended to be used as a global trashcan.

The Basic Block

OCAPI supports the dataflow simulation paradigm. In order to define the actors to the system, one "base" class is used, from which all actors will inherit. In order to do untimed simulations, one should follow a standard template to which new actor classes must conform. In this section, the standard template will be introduced, and the writing style is documented.

Basic Block Include and Code File

Each new actor in the system is defined with one header file and one source code C++ file. We define a standard block, "add", which performs an addition.

The include file, "add.h", looks like

```
#ifndef ADD_H
#define ADD_H
#include "qlib.h"
class add : public base
{
  public:
    add(char *name, FB & _in1, FB & _in2, FB & _o1);
    int run( );
  private:
    FB *in1;
    FB *in2;
    FB *o1;
};
#endif
```

This defines a class "add", that inherits from "base". The "base" object is the one that OCAPI likes to work with, so you must inherit from it in order to obtain an OCAPI basic block.

The private members in the block are pointers to communication queues. Optionally, the private members should also contain state, for example the tap values in a filter. The management of state for untimed blocks is entirely the responsibility of the user; as far as OCAPI is concerned, it does not care what you use as extra variables.

The public members include a constructor and an execution call "run". The constructor must at least contain a name, and a list of the queues that are used for communication. Optionally, some parameters can be passed, for instance in case of parametrized blocks (filters with a variable number of taps and the like).

The contents of the adder block will be described in "add.cxx".

```
#include "add.cxx"
add::add(char *name, FB & _in1, FB & _in2, FB & _o1) :
base(name)
{
                in1 = _in1.asSource(this);
                in2 = _in2.asSource(this);
                o1 = _o1.asSink (this);
}
int add::run( )
{
                // firing rule
                if (in1 ->getSize( ) < 1)
                   return 0;
                if (in2 ->getSize( ) < 1)
                   return 0;
                o1 ->put(in1 ->get ( ) + in2 ->get( ));
                return 1;
}
```

The constructor passes the name of the object to the "base" class it inherits from. In addition, it initializes private members with the other parameters. In this example, the communication queue pointers are initialized. This is not done through simple pointer assignment, but through function calls "asSource" and "asSink". This is not obligatory, but allows OCAPI to analyze the connectivity in between the basic blocks. Since a queue is intended for point-to-point communication, it is an error to use a queue as input or ouput more then once. The function calls "asSource" and "asSink" keep track of which blocks source/sink which queues. They will return a runtime error in case a queue is sourced or sinked more then once. The constructor can optionally also be used to perform initialization of other private data (state for instance). The "run( )" method contains the operations to be performed when the block is invoked. The behavior is described in an iterative way. The "run" function must return an integer value, 1 if the block succeeded in performing the operation, and 0 if this has failed.

This behavior consists of two parts: a firing rule and an operative part. The firing rule must check for the availability of data on the input queues. When no sufficient data is present (checked with the "getSize( )" member call), it stops execution and returns 0. When sufficient data is present, execution can start. Execution of an untimed behavior can use the different C++ control constructs available. In this example, the contents of the two input queues is read, the result is added and put into the ouput queue. After execution, the value 1 is returned to signal the behavior has completed.

Predefined Standard Blocks: File Sources and Sinks

The OCAPI library contains three predefined standard blocks, which is a file source "src", a file sink "snk", and a ram storage block "ram".

The file sources and sinks define operating system interfaces and allow you to bring file data into an OCAPI simulation, and to write out resulting data to a file. The examples below show various declarations of these blocks. Data in these files is formatted as floating point numbers separated by white space. For output, newlines are used as whitespace.

```
// define a file source block, with name a, that will read
// data from the file "in.dat" and put it into the queue k
dfbfix k("k");
src a("a", k, "in.dat");
// an alternative definition is
dfbfix k("k");
src a("a", k);
a.setAttr(src::FILENAME, "in.dat");
// which also gives you a complex version
dfbfix k1("k1");
dfbfix k2("k2");
src a("a", k1, k2);
a.setAttr(src::FILENAME, "in.dat");
// define a sink block b, that will put data from queue o
// into a file "out.dat".
dfbfix o ("o");
snk b("b", o, "out.dat");
// an alternative definition is
dfbfix o("o");
snk b("b", o);
b.setAttr(snk::FILENAME, "out.dat");
// which gives one also a complex version
dfbfix o1("o1");
dfbfix o2("o2");
snk b("b", o1, o2);
b.setAttr(snk::FILENAME, "out.dat");
// the snk mode has also a matlab-goodie which will format
// output data into a matrix A that can be read in directly
// by Matlab.
dfbfix o("o");
snk b("b", o, "out.m");
b.setAttr(snk::FILENAME, "out.m");
b.setAttr(snk::MATLABMODE, 1);
```

Predefined Standard Blocks: RAM

The ram untimed block is intended to simulate single-port storage blocks at high level. By necessity, some interconnect assumptions had to be made on this block. On the other hand, it is supported all the way through code generation.

OCAPI does not generate RAM cells. However, it will generate appropriate connections in the resulting system netlist, onto which a RAM cell can be connected.

The declaration of a ram block is as follows.

```
// make a ram a, with an address bus, a data input bus, a
// data output bus, a read command line, a write command
// line, with 64 locations
dfbfix address("address");
dfbfix data_in("data_in");
dfbfix data_out("data_out");
dfbfix read_c("read_c");
dfbfix write_c("write_c");
ram a("a",address,data_in,data_out,write_c,read_c,64);
// clear the ram
a.clear();
// fill the ram with the linear sequence data = k1+address
// * k2;
a.fill(k1, k2)
// dump the contents of a to cout
a.show();
```

The execution semantics of the ram are as follows. For each read or write, an address, a read command and a write command must be presented. If the read command equals "dfix(1)", a read will be performed, and the value stored at the location presented through "address" will be put on "data_out". If the read command equals any other value, a dummy byte will be presented at "data_out". If no read command was presented, no data will be presented on "data_out". For writes, an identical story holds for reads on the "data_in" input: whenever a write command is presented, the data input will be consumed. When the write command equals 1, then the data input will be stored in the location provided through "address". When a read and write command are given at the same time, then the read will be performed before the write. The ram also includes an online "purifier" that will generate a warning message whenever data from an unwritten location is read.

Untimed Simulations

Given the descriptions of one or more untimed blocks, a simulation can be done. The description of a simulation requires the following to be included in a standard C++ "main( )" procedure:

The instantiation of one or more basic blocks.

The instantiation of one or more communication queues that interconnect the blocks The setup of stimuli. Either these can be included at runtime by means of the standard file source blocks, or else dedicated C++ code can be written that fills up a queue with stimuli.

A schedule that drives the execution methods of the basic blocks.

A schedule, in general, is the specification of the sequence in which block firing rules must be tested (and fired if necessary) in order to run a simulation. There has been quite some research in determining how such a schedule can be constructed automatically from the interconnection network and knowledge of the block behavior. Up to now, an automatic mechanism for a general network with arbitrary blocks has not been found. Therefore, OCAPI relies on the designer to construct such a schedule.

Layout of an Untimed Simulation

In this section, the template of the standard simulation program will be given, along with a description of the "scheduler" class that will drive the simulation. A configuration with the "adder" block (described in the section on basic blocks) is used as an example.

```
include qlib.h"
include add.h"
void main()
{
    dfbfix i1("i1");
    dfbfix i2("i2");
    dfbfix o1("o1");
    src SRC1("SRC1", i1,"SRC1");
    src SRC2("SRC2", i2,"SRC2");
    add ADD ("ADD1", i1, i2, o1);
    snk SNK1("SNK1", o1,"SNK1");
    schedule S1("S1");
    S1.next(SRC1);
    S1.next(SRC2)
    S1.next(ADD );
    S1.next(SNK1)
    while (S1.run());
    i1.stattitle(cout)
    cout << i1;
    cout << i2;
    cout << o1;
}
```

The simulation above instantiates three communication buffers, that interconnect four basic blocks. The instantiation defines at the same time the interconnection network of the simulation. Three of the untimed blocks are standard file sources and sinks, provided with OCAPI. The "add" block is a user defined one.

After the definition of the interconnection network, a schedule must be defined. A simulation schedule is constructed using "schedule" objects. In the example, one schedule object is defined, and the four blocks are assigned to it by means of a "next( )" member call.

The order in which "next( )" calls are done determines the order in which firing rules will be tested. For each execution of the schedule object "Si", the "run( )" methods of "SRC1", "SRC2", "ADD" and "SNK1" are called, in that order. The execution method of a scheduler object is called "run( )". This function returns an integer, equal to one when at least on block in the current iteration has executed (i.e. the "run( )" of the block has returned one). When no block has executed, it returns zero.

The while loop in the program therefore is an execution of the simulation. Let us assume that the directory of the simulator executable contains the two required stimuli files, "SRC1" and "SRC2". Their contents is as follows

| SRC1 | SRC2 | |
|---|---|---|
| — | — | — not present in the file |
| 1 | 4 | — not present in the file |
| 2 | 5 | |
| 3 | 6 | |

When compiling and running this program, the simulator responds:

\* \* \* INFO: Defining block SRC1

\* \* \* INFO: Defining block SRC2

\* \* \* INFO: Defining block ADD

\* \* \* INFO: Defining block SNK1

| Name | put | get | MinVal | @idx | MaxVal | @idx | Max# | @idx |
|---|---|---|---|---|---|---|---|---|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 | and in addition has created a file "SNK1", containing

SNK1—not present in the file

. . . —not present in the file 5.000000e+00

7.000000e+00

9.000000e+00

The "INFO" message appearing on standard output are a side effect of creating a basic block. The table at the end is produced by the print statements at the end of the program.

More on Schedules

If you would examine closely which blocks are fired in which iteration, (for instance with a debugger) then you would find iteration 1
      run SRC1=>i1 contains 1.0
      run SRC2=>i2 contains 4.0
      run ADD=>o1 contains 5.0
      run SNK1=>write out o1
   schedule.run( ) returns 1
   iteration 2
      run SRC1=>i1 contains 2.0
      run SRC2=>i2 contains 5.0
      run ADD=>o1 contains 7.0
      run SNK1=>write out o1
   schedule.run( ) returns 1
   iteration 3
      run SRC1=>i1 contains 3.0
      run SRC2=>i2 contains 6.0
      run ADD=>o1 contains 9.0
      run SNK1=>write out o1
   schedule.run( ) returns 1
   iteration 4
      run SRC1=>at end-of-file, fails
      run SRC2=>at end-of-file, fails
      run ADD=>no input tokens, fails
      run SNKA=>no input tokens, fails
   schedule.run( ) returns 0=>end simulation There are two schedule member functions, "traceOn( )" and "traceOff( )", that will produce similar information for you. If you insert S.traceOn( );

just before the while loop, then you see

* * * INFO: Defining block SRC1
   * * * INFO: Defining block SRC2
   * * * INFO: Defining block ADD
   * * * INFO: Defining block SNK1
   S1 [SRC1 SRC2 ADD SNK1]
   S1 [SRC1 SRC2 ADD SNK1]
   S1 [SRC1 SRC2 ADD SNK1]
   S1 [ ]

| Name | put | get | MinVal | @idx | MaxVal | @idx | Max# | @idx |
|---|---|---|---|---|---|---|---|---|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 | appearing on the screen. This trace feature is convenient during schedule debugging.

In the simulation ouput, you can also notice that the maximum number of tokens in the queues never exceeds one. When you had entered another schedule sequence, for example schedule S1("S1");
      S1.next(ADD);
      S1.next(SRC2);
      S1.next(SRC1);
      S1.next(SNK1);

then you would notice that the maximum number of tokens on the queues would result in different figures. On the other hand, the resulting data file, "SNK1", will contain exactly the same results. This demonstrates one important property of dataflow simulations: any arbitrary but consistent schedule yields the same results. Only the required amount of storage will change from schedule to schedule.

In multirate systems, it is convenient to have different schedule objects and group all blocks working on the same rate in one schedule.

Profiling in Untimed Simulations

Untimed simulations are not targeted to circuit implementation. Rather, they have an explorative character. Besides the queue statistics, OCAPI also enables you to do precise profiling of operations. The requirement for this feature is that You use "schedule" objects to construct the simulation You describe block behavior with "dfix" objects Profiling is by default enabled. To view profiling results, you send the schedule object under consideration to the standard output stream. In the "main" example program given above, you can modify this as

```
include qlib.h"
include add.h"
void main()
{
    . . .
    schedule S1("S1");
    . . .
    cout << S1;
}
```

When running the simulation, you will see the following appearing on stdout:

* * * INFO: Defining block SRC1
   * * * INFO: Defining block SRC2

\* \* \* INFO: Defining block ADD
\* \* \* INFO: Defining block SNK1

| Name | put | get | MinVal | @idx | MaxVal | @idx | Max# | @idx |
|------|-----|-----|--------|------|--------|------|------|------|
| i1 | 3 | 3 | 1.0000e+00 | 1 | 3.0000e+00 | 3 | 1 | 1 |
| i2 | 3 | 3 | 4.0000e+00 | 1 | 6.0000e+00 | 3 | 1 | 1 |
| o1 | 3 | 3 | 5.0000e+00 | 1 | 9.0000e+00 | 3 | 1 | 1 |

Schedule S1 ran 4 times:

| | |
|---|---|
| SRC1 | 3 |
| SRC2 | 3 |
| ADD | 3 |
| + | 3 |
| SNK1 | 3 |

For each schedule, it is reported how many times it was run. Inside each schedule, a firing count of each block is given. Inside each block, an operation execution count is given. The simple "add" block gives the rather trivial result that there were three additions done during the simulation.

The gain in using operation profiling is to estimate the computational requirement for each block. For instance, if you find that you need to do 23 multiplications in a block that was fired 5 times, then you would need at least five multipliers to guarantee the block implementation will need only one cycle to execute. Finally, if you want to suppress operation profiling for some blocks, then you can use the member function call "noOpsCnt( )" for each block. For instance, writing ADD.noOpsCnt( );

suppresses operation profiling in the ADD block.

Implementation

The features presented in the previous sections contain everything you need to do untimed, high level simulations. These kind of simulations are useful for initial development. For real implementation, more detail has to be added to the descriptions.

OCAPI makes few assumptions on the target architecture of your system. One is that you target bitparallel and synchronous hardware. Synchronicity is not a basic requirement for OCAPI. The current version however constructs single-thread simulations, and also assumes that all hardware runs at the same clock. If different clocks need to be implemented, then a change to the clock-cycle true simulation algorithm will have to be made. Also, it is assumed that one basic block will eventually be implemented into one processor.

One question that comes to mind is how hardware sharing between different basic blocks can be expressed. The answer is that you will have to construct a basic block that merges the two behaviors of two other blocks. Some designers might feel reluctant to do this. On the other hand, if you have to write down merged behavior, you will also have to think about the control problems that are induced from doing this merging. OCAPI will not solve this problem for you, though it will provide you with the means to express it.

Before code generation will translate a description to an HDL, one will have to take care of the following tasks:

One will have to specify wordlengths. The target hardware is capable of doing bitparallel, fixed point operations, but not of doing floating point operations. One of the design tasks is to perform the quantisation on floating point numbers. The "dfix" class discussed earlier contains the mechanisms for expressing fixed point behavior.

One will have to construct a clock-cycle true description. In constructing this description, one will not have to allocate actual hardware, but rather express which operations one expects to be performed in which clock cycle. The semantical model for describing this clock cycle true behavior consists of a finite state machine, and a set of signal flow graphs. Each signal flow graph expresses one cycle of implemented behavior. This style of description splits the control operations from data operations in your program. In contrast, the untimed description you have used before has a common representation of control and data.

OCAPI does not force an ordering on these tasks. For instance, one might first develop a clock cycle true description on floating point numbers, and afterwards tackle the quantization issues. This eases verification of the clock-cycle true circuit to the untimed high level simulation.

The final implementation also assumes that all communication queues will be implemented as wiring. They will contain no storage, nor they will be subject to buffer synthesis. In a dataflow simulation, initial buffering values can however be necessary (for instance in the presence of feedback loops). In OCAPI, such a buffer must be implemented as an additional processor that incorporates the required storage. The resulting system dataflow will become deadlocked because of this. The cycle scheduler however, that simulates timed descriptions, is clever enough to look for these 'initial tokens' inside of the descriptions.

In the next sections, the classes that allow you to express clock cycle true behavior are introduced.

Signals and Signal Flowgraphs

Some initial considerations on signals are introduced first.

Hardware Versus Software

Software programs always use memory to store variables. In contrast, hardware programs work with signals, which might or might not be stored into a register. This feature can be expressed in OCAPI by using the "_sig" class. Simply speaking, a "_sig" is a "dfix" for which one has indicated whether is needs storage or not.

In implementation, a signal with storage is mapped to a net driven by a register, while an immediate signal is mapped to a net driven by an operator.

Besides the storage issue, a signal also departs from the concept of "scope" one uses in a program. For instance, in a function one can use local variables, which are destroyed (i.e. for which the storage is reclaimed) after one has executed the function. In hardware however, one controls the signal-to-net mapping by means of the clock signal.

Therefore one have to manage the scope of signals. The signal scope is expressed by using a signal flowgraph object, "sfg". A signal flowgraph marks a boundary on hardware behavior, and will allow subsequent synthesis tools to find out operator allocation, hardware sharing and signal-to-net mapping.

The _sig Class and Related Operations

Hardware signals can expressed in three flavors. They can be plain signals, constant signals, or registered signals. The following example shows how these three can be defined.

```
// define a plain signal a, with a floating point dfix
// inside of it.
_sig a("a");
// define a plain signal b, with a fixed point dfix inside
// of it.
_sig b("b", dfix(0,10,8));
// define a registered signal c, with an initial value k
// and attached to a clock ck.
dfix k(0.5);
clk ck;
_sig c("c", ck, k);
// define a constant signal d, equal to the value k
_sig d(k);
```

The registered signals, and more in particular the clock object, are explained more into detail when signal flowgraphs and finite state machines are discussed. This section concentrates on operations that are available for signals.

Using signals and signal operations, one can construct expressions. The signal operations are a subset of the operations on "dfix". This is because there is a hardware operator implementation behind each of these operations.

+, −, *
    Standard addition, subtraction (including unary minus), multiplication &, |, ^,
    Bitwise and, or, exor, and not operators ==, !=, <=, >=, <, >
    Relational operators <<, >>
    Left and right shifts s.cassign(s1,s2)
    Conditional assignment with s1 or s2 depending on s cast(T,s)
    Convert the type of s to the type expressed in "dfix" T lu(L,s)
    Use s as in index into lookuptable L and retrieve msbpos(s)
    Return the position of the msb in s Precision considerations are the same as for "dfix". That is, precision is at most the mantissa precision of a double (53 bits). For the bitwise operations, 32 bits are assumed (a long). "cast", "lu" and "msbpos" are not member but friend functions. In addition, "msbpos" expects fixed-point signals.

```
_sig a("a");
_sig b("b");
_sig c("c");
// some simple operations
c = a + b;
c = a − b;
c = a * b;
// bitwise operations works only on fixed point signals
_sig e(dfix(0xff, 10, 0));
_sig d("d",dfix(0,10,0));
_sig f("f",dfix(0,10,0))
f = d & e;
f = d | e;
f = ~d;
f = d ^ _sig(dfix(3,10,0));
// shifting
// a dfix is automatically promoted to a constant _sig
f = d << dfix(3,8,0);
// conditional assignment
f = (d < dfix(2,10,0)).cassign(e,d)
// type conversion is done with cast
```

```
_sig g("g",dfix(0,3,0))
g = cast(dfix(0,3,0) , d)
// a lookup table is an array of unsigned long
unsigned long j = {1, 2, 3, 4, 5};
// a lookuptable with 5 elements, 3 bits wide
lookupTable j_lookup("j_lookup", 5, dfix(0,3,0)) = j;
// find element 2
g = lu(j_lookup, dfix(2,3,0));
```

If one is interested in simulation only, then one should not worry too much about type casting and the like. However, if one intends implementation, then some rules are at hand. These rules are induced by the hardware synthesis tools. If one fails to obey them, then one will get a runtime error during hardware synthesis.

All operators, apart from multiplication, return a signal with the same wordlength as the input signal.

Multiplication returns a wordlength that is the sum of the input wordlengths.

Addition, subtraction, bitwise operations, comparisons and conditional assignment require the two input operands to have the same wordlength.

Some common pitfalls that result of this restriction are the following.

Intermediate results will, by default, not expand wordlength. In contrast, operations on dfix do not loose precision on intermediate results. For example, shifting an 8 bit signal up 8 positions will return you the value of zero, on 8 bits. If you want too keep up the precision, then you must first cast the operation to the desired output wordlength, before doing the shift.

The multiplication operator increases the wordlength, which is not automatically reduced when you assign the result to a signal of smaller with. If you want to reduce wordlength, then you must do this by using a cast operation.

For complex expressions, these type promotion rules look a bit tedious. They are however used because they allow you to express behavior precisely downto the bit level. For example, the following piece of code extracts each of the bits of a three bit signal:

```
_sig threebits(dfix(6,3,0))
dfix bit(0,1,0);
_sig bit2("bit2"), bit1("bit1"), bit0("bit0");
bit2 = cast(bit, threebits <<dfix(2));
bit1 = cast(bit, threebits <<dfix(1));
bit0 = cast(bit, threebits)
```

These bit manipulations were not possible without the given type promotion rules.

For hardware implementation, the following operators are present.

Addition and subtraction are implemented on ripple-carry adder/subtractors.

Multiplication is implemented with a booth multiplier block.

Casts are hardwired.

Shifts are either hardwired in case of constant shifts, or else a barrel shifter is used in case of variable shifts.

Comparisons are implemented with dedicated comparators (in case of constant comparisons), or subtractions (in case of variable comparisons).

Bitwise operators are implemented by their direct gate equivalent at the bit level.

Lookup tables are implemented as PLA blocks that are mapped using two-level or multi-level random logic.

Conditional assignment is done using multiplexers.

Msbit detection is done using a dedicated msbit-detector.

Globals and Utility Functions for Signals

There are a number of global variables that directly relate to the "_sig" class, as well as the embedded "sig" class. In normal circumstances, you do not need to use these functions.

The variables "glbNumberOf_Sig" and "glbNumberOf-Sig" contain the number of "_sig" and "sig" that your program has defined. The variable "glbNumberOfReg" contains the number of "sig" that are of the register type. This represents the word-level register count of your design. The "glbSigHashConflicts" contain the number of hash conflicts that are present in the internal signal data structure organization. If this number is more then, say 5% of "glbNumberOf_Sig", then you might consider knocking at OCAPIs complaint counter. The simulation is not bad if you exceed this bound, only it will go slower.

The variable "glbListOfSig" contains a global list of signals in your system. You can go through it by means of

```
sig *run;
for (run = glbListOfSig; run; run = run->nextsig())
{
   ...
}
```

For each such a "sig", you can access a number of utility member functions.

"isregistero" returns 1 when a signal is a register.

"isconstanto" returns 1 when a signal is a constant value.

"isterm( )" returns 1 when you have defined this signal yourself. These are signals which are introduced through "_sigo" class constructors. OCAPI however also adds signals of its own.

"getname( )" returns the "char *" name you have used to define the signal.

"get_showname( )" returns the "char *" name of the signal that is used for code generation. This is equal to the original name, but with a unique suffix appended to it.

The sfg Class

In order to construct a timed (clocked) simulation, signals and signal expressions must be assigned to a signal flowgraph. A signal flowgraph (in the context of OCAPI) is a container that collects all behavior that must be executed during one clock cycle.

The sfg behavior contains

A set of expressions using signals

A set of inputs and outputs that relate signals to output and input queues

Thus, a signal flowgraph object connects local behavior (the signals) to the system through communications queues. In hardware, the indication of input and output signals also results in ports on your resulting circuit.

A signal flowgraph can be a marker of hardware scope. This is also demonstrated by the following example.

```
_sig a("a");
_sig b("b");
_sig c(dfix(2));
dfbfix A("A");
dfbfix B("B");
// a signal flowgraph object is created
sfg add_two, add_three;
// from now on, every signal expression written down will
// be included in the signal flowgraph add_two
add_two.starts();
a = b + c;
// You must also give a name to add_two, for code
// generation
add_two << "add_two";
// also, inputs and ouputs have to be indicated.
// you use the input and ouput objects ip and op for this
add_two << ip(b, B);
add_two << op(a, A);
// next expression will be part of add_three
add_three.starts();
a = b + dfix(3);
add_three << "add_three";
add_three << ip(b,B);
add_three << op(a,A);
// you can also to semantical checks on signal flowgraphs
add_two.check();
add_three.check();
```

The semantical check warns you for the following specification errors:

Your signal flowgraph contains a signal which is not declared as a signal flowgraph input and at the same time, it is not a constant or a register. In other words, your signal flowgraph has a dangling input.

You have written down a combinatorial loop in your signal flowgraph. Each signal must be ultimately dependent on registered signals, constants, or signal flowgraph inputs. If any other dependency exists, you have written down a combinatorial loop for which hardware synthesis is not possible.

Execution of a signal flowgraph

A signal flowgraph defines one clock cycle of behavior. The semantics of a signal flowgraph execution are well defined.

At the start of an execution, all input signals are defined with data fetched from input queues.

The signal flowgraph output signals are evaluated in a demand driven way. That is, if they are defined by an expression that has signal operands with known values, then the ouput signal is evaluated. Otherwise, the unknown values of the operands are determined first. It is easily seen that this is a recursive process. Signals with known values are: registered signals, constant signals, and signals that have already been calculated in the current execution.

The execution ends by writing the calculated output values to the output queues.

Signal flowgraph semantics are somewhat related to untimed blocks with firing rules. A signal flowgraph needs one token to be present on each input queue. Only, the firing rule on a signal flowgraph is not implemented. If the token is missing, then the simulation crashes. This is a crude way of warning you that you are about to let your hardware evaluate a nonsense result.

The relation with untimed block firing rules will allow to do a timed simulation which consist partly of signal flowgraph descriptions and partly of untimed basic blocks. The section "Timed simulations will treat this more into detail.

Running a Signal Flowgraph by Hand

A signal flowgraph is only part of a timed description. The control component (an FSM) still needs to be introduced. There can however be situations in which you would like to run a signal flowgraph directly. For instance, in case you have no control component, or if you have not yet developed a control description for it.

The "sfg" member function "run( )" performs the execution of the signal flowgraph as described above. An example is used to demonstrate this.

```
include "qlib.h"
void main( )
{
        _sig a("a")
        sig b("b")
        _sig c(dfix(2));
        dfbfix A("A")
        dfbfix B("B")
        sfg add_two;
        add_two.starts( );
        a = b + c;
        add_two << "add_two";
        add_two << ip(b, B);
        add_two << op(a, A);
        add_two.check( );
        B << dfix(1) << dfix(2);
        // running silently
        add_two.eval( );
        cout << A.get( ) << "\n";
        // running with debug information
        add_two.eval(cout);
        cout << A.get( ) << "\n";
        add_two.eval(cout);
}
```

When running this simulation, the following appears on the screen.

```
3.000000e+00
add_two(      b     2)
        :     a     4
        =>    a     4
4.000000e+00
add_two(Queue Underflow @ get in queue B
```

The first line shows the result in the first "eval( )" call. When this call is given an output stream as argument, some additional information is printed during evaluation. For each signal flowgraph, a list of input values is printed. Intermediate signal values are printed after the ":" at the beginning of the line. The output values as they are entered in the ouput queues are printed after the "=>". Finally, the last line shows what happens when "eval( )" is called when no inputs are available on the input queue "B".

For signal flowgraphs with registered signals, you must also control the clock of these signals. An example of an accumulator is given next.

```
#include "qljb.h"
void main( )
{
        clk ck;
        _sig a("a",ck,dfix(0));
        dfbfix A("A")
        sfg accu;
        accu.starts( )
```

```
a = a + b;
accu << "accu";
accu << ip(b, B);
accu << op(a, A);
accu.check( );
B << dfix(1) << dfix(2) << dfix(3);
while (B.getSize( ))
{
    accu.eval (cout)
    accu.tick(ck);
}
{
```

The simulation is controlled in a while loop that will consume all input values in queue "B". After each run, the clock attached to registered signal "a" is triggered. This is done indirectly through the "sfg" member call "tick( )", that updates all registered signals that have been assigned within the scope of this "sfg". Running this simulation results in the following screen ouput

| accu | ( | b  | 1) |   |
|------|---|----|----|---|
|      | : | a  | 0/ | 1 |
|      | => | a | 0/ | 1 |
| accu | ( | b  | 2) |   |
|      | : | a  | 1/ | 3 |
|      | => | a | 1/ | 3 |
| accu | ( | b  | 3) |   |
|      | : | a  | 3/ | 6 |
|      | a | 3/ | 6  |   |

The registered signal "a" has two values: a present value (shown left of "/"), and a next value (shown right of "/"). When the clock ticks, the next value is copied to the present value. At the end of the simulation, registered signal "a" will contain 6 as its present value. The ouput queue "A" however will contain the 3, the "present value" of "a" during the last iteration.

Finally, if you want to include a signal flowgraph in an untimed simulation, you must make shure that you implement a firing rule that guards the sfg evaluation.

An example that incorporates the accumulator into an untimed basic block is the following.

```
include "qlib.h"
class accu : public base
{
        public:
            accu(char *name, dfbfix &i; dfbfix &o);
            int run( );
        private:
            dfbfix *ipq;
            dfbfix *opq;
            sfg _accu;
            clk ck;
}
accu::accu(char *name, dfbfix &i, dfbfix &o) : base(name)
{
        ipq = i.asSource(this);
        opq = o.asSink(this);
        _sig a("a",ck,dfix(0));
        _sig b("b");
        _accu.starts( );
        a = a + b;
        _accu << "accu";
        _accu << ip(b, *ipq);
        _accu << op(a, *opq);
```

-continued

```
            _accu.check( );
}
int accu::run( )
{
            if (ipq->getSize( ) < 1)
            return 0;
            _accu.eval( );
            _accu.tick(ck);
}
```

In this example, the signal flowgraph _accu is included into the private members of class _accu.
Globals and Utility Functions for Signal Flowgraphs The global variable "glbNumberOfSfg" contains the number of "sfg" objects that you have constructed in your present OCAPI program. Given an "sfg( )" object, you have also a number of utility member function calls.

"getname( )" returns the "char *" name of the signal flowgraph.

"merge( )" joins two signal flowgraphs.

"getisig(int n)" returns a "sig *" that indicates which signal corresponds to input number "i" of the signal flowgraph. If 0 is returned, this input does not exist.

"getiqueue(int n)" returns the queue ("dfbfix *") assigned to input number "i" of the signal flowgraph. If 0 is returned, then this input does not exist.

"getosig(int n)" returns a "sig *" that indicates which signal corresponds to output number "i" of the signal flowgraph. If 0 is returned, this output does not exist.

"getoqueue(int n)" returns the queue ("dfbfix *") assigned to output number "i" of the signal flowgraph. If 0 is returned, then this output does not exist.

You should keep in mind that a signal flowgraph is a data structure. The source code that you have written helps to build this data structure. However, a signal flowgraph is not executed by running your source code. Rather, it is interpreted by OCAPI. You can print this data structure by means of the "cg(ostream)" member call.

For example, if you appended accu.cg(cout);

to the "running-an-sfg-by-hand" example, then the following output would be produced:

```
sfg accu
            inputs     { b_2 }
            outputs    { a_1 }
            code       {
                       a_1 = a_1_at1 + b_2;
            };
```

Finite State Machines

With the aid of signals and signal flowgraphs, you are able to construct clock-cycle true data processing behavior. On top of this data processing, a control sequencing component can be added. Such a controller allows to execute signal flowgraphs conditionally. The controller is also the anchoring point for true timed system simulation, and for hardware code generation. A signal flowgraph embedded in an untimed block cannot be translated to a hardware processor: you have to describe the control component explicitly.
The ctlfsm and State Classes The controller model currently embedded in OCAPI is a Mealy-type finite state machine. This type of FSM selects the transition to the next state based on the internal state and the previous output value.

In an OCAPI description, you use a "ctlfsm" object to create such a controller. In addition, you make use of "state" objects to model controller states. The following example shows the use of these objects.

```
include "qlib.h"
void main( )
{
            sfg dummy;
            dummy << "dummy";
            // create a finite state machine
            ctlfsm f;
            // give it a name
            f << "theFSM";
            // create 2 states for it
            state rst;
            state active;
            // give them a name
            rst    << "rst";
            active << "active ";
            // identify rst as the initial state of
            // ctlfsm f
            f << dflt (rst);
            // identify active as a plain state of ctlfsm
            // f
            f << active;
            // create an unconditional transition from
            // rst to active
            rst << allways << active;
            // always' is a historical typo and will be
            // replaced by "always" in the future
            // create an unconditional transition from
            // active to active, executing the dummy sfg.
            active << allways << dummy << active;
            // show what's inside f
            cout << f;
}
```

There are two states in this fsm, "rst" and "active". Both are inserted in the fsm by means of the "<<" operator. In addition, the "rst" state is identified as the default state of the fsm, by embedding it into the "deflt" object. An fsm is allowed to have one default state. When the fsm is simulated, then the state at the start of the first clock cycle will be "rst". In the hardware implementation, a "reset" pin will be added to the processor that is used to initialize the fsm's state register with this state.

Two transitions are defined. A transition is written according to the template: starting state, conditions, actions, target state, all of this separated by the "<<" operator. The condition "allways" is a default condition that evaluates to true. It is used to model unconditional transitions.

The last line of the example shows a simple operation you can do with an fsm. By relating it to the output stream, the following will appear on the screen when you compile and execute the example.

```
digraph g
{
                       rst [shape=box];
                       rst->active;
                       active->active;
}
```

This output represent a textual format of the state transition diagram. The format is that of the "dotty" tool, which produces a graphical layout of your state transition diagram. "dotty" is commercial software available from AT&T.

You cannot simulate a "ctlfsm" object on itself. You must do this indirectly through the "sysgen" object, which is introduced in the section "Timed Simulations".

The cnd Class

Besides the default condition "allways", you can use also boolean expressions of registered signals. The signals need to be registered because we are describing a Mealy-type fsm. You construct conditions through the "cnd" object, as shown in the next example.

```
include "qlib.h"
void main( )
{
    clk ck;
    _sig a("a",ck, dfix(0));
    _sig b("b",ck, dfix(0));
    _sig a_input("a");
    _b_input("a");
    dfbfix A("A");
    dfbfix B("B");
    sfg some_operation;
    // some operations go here . . .
    sfg readcond;
    readcond.starts( );
    a = a_input;
    b = b_input;
    readcond << "readcond";
    readcond << ip(a_input,A);
    readcond << ip(binput,B);
    readcond.check( );
    // create a finite state machine
    ctlfsm f;
    f << "theFSM";
    state rst;
    state active;
    state wait;
    rst    << "rst";
    active << "active";
    wait   << "wait";
    f << deflt(rst);
    f << active;
    f << wait;
    rst    << allways << readcond << active;
    active << _cnd(a) << readcond << some_operation
           << wait;
    wait   << (_cnd(a) && _cnd(b)) << readcond
           << wait;
    wait   << (!_cnd(a)||!_cnd(b))<< readcond<< active;
}
```

A FAQ is why condition signals must be registers, and whether they can be plain signals also. The answer is simple: no, they can't. The fsm control object is a stand-alone machine that must be able to 'boot' every clock cycle. During one execution cycle, it will first select the transition to take (based on conditions), and then execute the signal flowgraphs that are attached to this transition. If "immediate" transition conditions had to be expressed, then the signals should be read in before the fsm transition is made, which is not possible: the execution of an sfg can only be done when a transition is selected, in other words: when the condition signals are known. Besides this semantical consideration, the registered-condition requirement will also prevent you from writing combinatorial control loops at the system level.

The first signal flowgraph "readcond" takes care of reading in two values "a" and "b" that are used in transition conditions. The sfg reads the signals "a" and "b" in through the intermediate signals 'a_input" and "b_input". This way, "a" and "b" are explicitly assigned in the signal flowgraph, and the semantical check "readcond.check( )" will not complain about unassigned signals.

The fsm below it defines three states. Besides an initial state "rst" and an operative state "active" and a wait state "wait" is defined, that is entered when the input signal "a" is high. This is expressed by the "_cnd(a)" transition condition in the second fsm transition. You must use "_cnd( )" instead of "cnd( )" because of the same reason that you must use "_sig( )" instead of "sig( )": The underscore-type classes are empty boxes that allocate the objects that do the real work for you. This allocation is dynamic and independent of the C++ scope.

Once the wait state is entered, it can leave it only when the signals "a" or "b" go low. This is indicated in the transition condition of the third fsm transition. A "&&" operator is used to express the and condition. If the signals "a" and "b" remain high, then the wait state is not left. The transition condition of the last transition expresses this. It uses the logical not "!" and logical or "||" operators to express this.

The "readcond" signal flowgraph is executed at all transitions. This ensures that the signals "a" and "b" are updated every cycle. If you fail to do this, then the value of "a" and "b" will not change, potentially creating a deadlock.

To summarize, you can use either "always" or a logical expression of "_cnd( )" objects to express a transition condition. The signals use in the condition must be registers. This results in a Mealy-type fsm description Utility Functions for fsm Objects A number of utility functions on the "ctlfsm" and "state" classes are available for query purposes. This is only minimal: The objects are intended to be manipulated by the cycle scheduler and code generators.

```
sfg action;
ctlfsm f;
state s1;
state s2;
f << deflt(s1);
f << s2;
s1 << allways << s2;
s2 << allways << action << s1;
// run through all the state in f
statelist *r;
for (r = f.first; r; r = r->next)
{
. . .
}
// print the nuymber of states in f,
// print the number of transitions in f,
// print the name of f,
// print the number of sfg's in f
cout << f.numstates( ) << "\n";
cout << f.numtransitions( ) << "\n";
cout << f.getname( ) << "\n";
cout << f.numactions( ) << "\n";
// print the name of a state
cout << s1.getname( ) << "\n";
```

The Basic Block for Timed Simulations

Using signals, signal flowgraphs, finite state machines and states, you can construct a timed description of a block. Having obtained such a description, it is convenient to merge it with the untimed description. This way, you will have one class that allows both timed and untimed simulation. Of course, this merging is a matter of writing style, and nothing forces you to actually have both a timed and untimed description for a block.

The basic block example, that was introduced in the section "The basic block", will now be extended with a timed version. As before, both an include file and a code file will be defined. The include file, "add.h", looks like the following code.

```
#ifndef ADD_H
#define ADD_H
#include "qlib.h"
class add : public base
{
    public:
        add(char *name, FB & _in1, FB & _in2, FB & _o1);
        // untimed
        int run( );
        // timed
        void  define( );
        ctlfsm &fsm( ) {return _fsm};
    private:
        FB *in1;
        FB *in2;
        FB *o1;
        ctlfsm _fsm;
        sfg _add;
        state _go;
};
#endif
```

The private members now also contain a control fsm object, in addition to signal flowgraph objects and states. If you feel this is becoming too verbose, you will find help in the section "Faster description using macros", that defines a macro set that significantly accelerates description entry.

In the public members, two additional member functions are declared: the "define( )" function, which will setup the timed description data structure, and the "fsm( )", which returns a pointer to the fsm controller. Through this pointer, OCAPI accesses everything it needs to do simulations and code generation.

The contents of the adder block will be described in "add.cxx".

```
#include "add.h"
add::add(char *name, FB & _in1, FB & _in2, FB &
    _o1):
                base(name)
{
                in1 = _in1.asSource(this);
                in2 = _in2.asSource(this);
                o1 = _o1.asSink (this);
                define( );
}
int add::run( )
{
                ...
}
void add::define( )
{
                _sig i1("i1");
                _sig i2("i2");
                _sig ot("ot");
                _add << "add";
                _add.starts( );
                ot = i1 + i2;
                _add << ip(i1, *in1);
                _add << ip(i2, *in2);
                _add << op(ot, *o1);
                _fsm << "fsm";
                _go << "go";
                _fsm << deflt (_go);
                _go << allways << _add << _go;
}
```

If the timed description uses also registers, then a pointer to the global clock must also be provided (OCAPI generates single-clock, synchronous hardware). The easiest way is to extend the constructor of "add" with an additional parameter "clk &ck", that will also be passed to the "define" function.

Timed Simulations

By obtaining timed descriptions for your untimed basic block, you are now ready to proceed to a timed simulation. A timed simulation differs from an untimed one in that it proceeds clock cycle by clock cycle. Concurrent behavior between different basic blocks is simulated on a cycle-by-cycle basis. In contrast, in an untimed simulation, this concurrency is present on an iteration by iteration basis.

The Sysgen Class

The "sysgen" object is for timed simulations the equivalent of a "scheduler" object for untimed simulations. In addition, it also takes care of code and testbench generation, which explains the name.

The sysgen class is used at the system level. The timed "add" class, defined in the previous section, is used as an example to construct a system which uses untimed file sources and sinks, and a timed "add" class.

```
include "qlib.h"
#include "add.h"
void main( )
{
                dfbfix i1("i1");
                dfbfix i2("i2");
                dfbfix o1("o1");
                src SRC1("SRC1", i1, "SRC1");
                src SRC2("SRC2", i2, "SRC2");
                add ADD ("ADD" , i1, i2, o1);
                snk SNK1 ("SNK1", o1, "SNK1");
                sysgen S1("S1");
                S1 << SRC1;
                S1 << SRC2;
                S1 << ADD.fsm( )
                S1 << SNK1;
                S1.setinfo (verbose);
                clk ck;
                int i;
                for (i=0; i<3; i++)
                {
                    S1.run(ck);
                }
}
```

The simulation is set up as before with queue objects and basic blocks. Next, a "sysgen" object is created, with name "S1". All basic blocks in the simulation are appended to the "sysgen" objects by means of the $<<$ operator. If a timed basic block is to be used, as for instance in case of the "add" object, then the "fsm( )" pointer must be presented to "sysgen" rather then the basic block itself. A "sysgen" object knows how to run and combine both timed and untimed objects. For the description shown above, untimed versions of the file sources and sink "src" and "snk" will be used, while the timed version of the "add" object will be used.

Next, three clock cycles of the system are run. This is done by means of the "run(ck)" member function call of "sysgen". The clock object "ck" is, because this simulation contains no registered signals, a dummy object. When running the simulator executable with stimuli file contents

| SRC1 | SRC2 |                         |
|------|------|-------------------------|
| ---- | ---- | -- not present in the file |
|      |      | -- not present in the file |
| 1    | 4    |                         |
| 2    | 5    |                         |
| 3    | 6    |                         | you see the following appearing on the screen.

\* \* \* INFO: Defining block SRC1

\* \* \* INFO: Defining block SRC2

\*\*\* INFO: Defining block ADD
\*\*\* INFO: Defining block SNK1
fsm fsm: transition from go to go
add#0
add#1

| | | |
|---|---|---|
| in | i1 | 1 |
| in | i2 | 4 |
| sig | ot | 5 |
| out' | ot | 5 | fsm fsm: transition from go to go
add#0
add#1

| | | |
|---|---|---|
| in | i1 | 2 |
| in | i2 | 5 |
| sig | ot | 7 |
| out' | ot | 7 | fsm fsm: transition from go to go
add#0
add#1

| | | |
|---|---|---|
| in | i1 | 3 |
| in | i2 | 6 |
| sig | ot | 9 |
| out' | ot | 9 |

The debugging output produced is enabled by the "setinfo( )" call on the "sysgen" object. The parameter "verbose" enables full debugging information. For each clock cycle, each fsm responds which transition it takes. The fsm of the "add" block is called "fsm", and as is seen it makes transitions from the single state "go" to the obvious destination. Each signal flowgraph during this simulation is executed in two phases (below it is indicated why). During simulation, the value of each signal is printed.
Selecting the Simulation Verbosity
The "setinfo" member function call of "sysgen" selects the amount of debugging information that is produced during simulation. Four values are available:
  "silent" will cause no output at all. This can significantly speed up your simulation, especially for large systems containing several hundred of signal flowgraphs.
  "terse" will only print the transitions that fsm's make.
  "verbose" will print detailed information on all signal updates.
  "regcontents" will print a list the values of registered signals that change during the current simulation. This is by far the most interesting option if you are debugging at the system level: when nothing happens, for instance when all your timed descriptions are in some "hold" mode, then no ouput is produced. When there is a lot of activity, then you will be able to track all registered signals that change.
This example is part of a simulation containing 484 registerd signals and 483 signal flowgraphs. Using "setinfo (verbose)" here might require a good text editor to see what is happening—if anything will happen before your quota is exceeded.

For Instance, the Code Fragment
sysgen S("S");
S.setinfo(regcontents);
int cycle;

```
for (cycle=0; cycle < 100; cycle++)
{
    cout << "> Cycle " << cycle << "\n";
    S.run(ck);
}
``` can produce an output as shown below.

| | | | |
|---|---|---|---|
| > Cycle 18 | | | |
| | coef_ram_ir_2 | 0 | 1 |
| | copy_step_flag | 1 | 0 |
| | ext_ready_out | 1 | 0 |
| | pc | 15 | 16 |
| | step_flag | 1 | 0 |
| > Cycle 19 | | | |
| | coef_ram_ir_2 | 1 | 0 |
| | coef_wr_adr | 12 | 13 |
| | hold_pc | 0 | 16 |
| | pc | 16 | 17 |
| | pc_ctl_ir_1 | 1 | 0 |
| > Cycle 20 | | | |
| | step_clock | 0 | 1 |
| > Cycle 21 | | | |
| | copy_step_flag | 0 | 1 |
| | prev_step_clock | 0 | 1 |
| | step_flag | 0 | 1 |

Three Phases are Better
  Although you will be saved from the details behind two-phase simulation, it is worthwhile to see the motivation behind it.
  When you run an "sfg" "by hand" using the "run( )" method of an "sfg", the simulation proceeds in one phase: read inputs, calculate, produce ouput. The "sysgen" object, on the other hand, uses a two-phase simulation mechanism.
  The origin is the following. In the presence of feedback loops, your system data flow simulation will need initial values on the communication queues in order to start the simulation. However, the code generator assumes the communication queues will translate to wiring. Therefore, there will never be storage in the implementation of a communication queue to hold these intitial values. OCAPI works around this by producing these initial values at runtime. This gives rise to a three-phase simulation: in the first phase, initial values are produced, while in the second phase, they are consumed again. This process repeats every clock cycle.
  The three-phase simulation mechanism is also able to detect combinatorial loops at the system level. If there exists such a loop, then the first phase of the simulation will not produce any initial value on the system interconnect. Consequently, in the last phase there will be at least one signal flowgraph that will not be able to complete execution in the current clock cycle. In that case, OCAPI will stop the simulation. Also, you get a list of all signal flowgraphs that have not completed the current clock cycle, in addition to the queue statistics that are attached to these signal flowgraphs.

Hardware Code Generation
  OCAPI allows you to translate all timed descriptions to a synthesizable hardware description.
  For each timed description, you get a datapath ".dsfg" file, that can be entered into the Cathedral-3 datapath synthesis environment, converted to VHDL and postprocessed by Synopsys-dc logic synthesis.

For each timed description, you also get a controller ".dsfg" file, which is synthesized through the same environment.

You also get a glue cell, that interconnects the resulting datapath and controller VHDL file.

You get a system interconnect file, that integrates all glue cells in your system. For this system interconnect file, you optionally can specify system inputs and outputs, scan chain interconnects, and RAM interconnects. The file is VHDL.

Finally, you also get debug information files, that summarize the behavior of and ports on each processor.

Untimed blocks are not translated to hardware. The use of the actual synthesis environments will not be discussed in this section. It is assumed to be known by a person skilled in the art.

The Generate( ) Call

The member call "generate( )" performs the code generation for you. In the adder example, you just have to add S1.generate( );

at the end of the main function. If you would compile this description, and run it, then you would see things are not quite OK:

\* \* \* INFO: Generating Systen Link Cell
\* \* \* INFO: Component generation for S1
\* \* \* INFO: C++ currently defines 5 sig, 4 _sig, 1 sfg.
\* \* \* INFO: Generating FSMD fsm
\* \* \* INFO: FSMD fsm defines 1 instructions
DSFGgen: signal i1 has no wordlength spec.
DSFGgen: signal i2 has no wordlength spec.
DSFGgen: signal to has no wordlength spec.
DSFGgen: not all signals were quantized. Aborting.
\* \* \* INFO: Auto-cleanup of sfg Indeed, in the adder example up to now, nothing has been entered regarding wordlengths. During code generation, OCAPI does quite some consistency checking. The general advice in case of warnings and errors is: If you see an error or warning message, investigate it. When you synthesize code that showed a warning or error during generation, you will likely fail in the synthesis process too.

The "add" description is now extended with wordlengths. 8 bit wordlengths are chosen. You modify the "add" class to include the following changes.

```
void add::define()
{
    dfix w1(0,8,0);
    _sig i1(``i1'',w1);
    _sig i2(``i2'',w1);
    _sig ot(``ot'',w1);
    ...
}
```

After recompiling and rerunning the OCAPI program, you now see:

\* \* \* INFO: Generating Systen Link Cell
\* \* \* INFO: Component generation for S1
\* \* \* INFO: C++ currently defines 5 sig, 4 _sig, 1 sfg.
\* \* \* INFO: Generating FSMD fsm
\* \* \* INFO: FSMD fsm defines 1 instructions
\* \* \* INFO: C++ currently defines 31 Sig, 21 Sig, 3 sfg.

\* \* \* INFO: Auto-cleanup of sfg

In the directory where you ran this, you will find the following files:

"fsm_dp.dsfg", the datapath description of "add"

"fsm_fsm.dsfg", the controller description of "add"

"fsm.vhd", the glue cell description of add

"S1.vhd", the system interconnect cell

"fsm.ports", a list of the I/O ports of "add".

The glue cell "fsm.vhd" has the following contents (only the entity declaration part is shown).

```
-- Cath3 Processor for FSMD design fsm
library IEEE;
use IEEE.std_logic_1164.all;
entity fsm is
    port (
        reset:  in std_logic;
        clk: in std_logic;
        i1: in std_logic_vector ( 7 downto 0 );
        i2: in std_logic_vector ( 7 downto 0 );
        ot: out std_logic_vector ( 7 downto 0 )
    );
end fsm;
```

Each processor has a reset pin, a clock pin, and a number of I/O ports, depending on the inputs and ouputs defined in the signal flowgraphs contained in this processor. All signals are mapped to "std_logic" or "std_logic_vector". The reset pin is used for synchronous reset of the embedded finite state machine. If you need to initialize registered signals in the datapath, then you have to describe this explicitly in a signal flowgraph, and execute this upon the first transition out of the initial state.

The "fsm.ports" file, indicates which ports are read in each transition. In the example of the "add" class, there is only one transition, which results in the following ".ports" file

| ********* SFG fsmgogo0 ********* | | | |
|---|---|---|---|
| Port # | I/O | Port | Q |
| 1 | I | i1 | i1 |
| 2 | I | i2 | i2 |
| 1 | O | ot | o1 |

The name of an input or output signal is used as a port name, while the name of the queue associated to it relates to the system net name that will be connected to this port.

System Cell Refinements

The system link cell incorporates all glue cells of your current timed system description. These glue cells are connected if they read/write from the same system queue. There are some refinements possible on the "sysgen" object that will also allow you to indicate system level inputs and ouputs, scan chains, and RAM connections.

System inputs and ouputs are indicated with the "inpad( )" and "outpad( )" member calls of "sysgen". In the example, this is specified as

```
        sysgen S1("S1");
        dfix b8(0,8,0);
        S1.inpad(i1, b8);
        S1.inpad(i2, b8);
        S1.outpad(o1, b8);
```

Making these connections will make the "i1", "i2", "o1" signals appear in the entity declaration of the system cell "S1". The entity declaration inside of the file "S1.vhd" thus looks like

```
entity S1 is
        port (
                reset:  in std_logic;
                clk: in std_logic;
                i1: in std_logic_vector ( 7 downto 0 );
                i2: in std_logic_vector ( 7 downto 0 );
                o1: out std_logic_vector ( 7 downto 0 )
                );
end S1;
```

Scan chains can be added at the system level, too. For each scan chain you must indicate which processors it should include. Suppose you have three basic blocks (including a timed description and registers) with names "BLOCK1", "BLOCK2", "BLOCK3". You attach the blocks to two scan chains using the following code.

scanchain SCAN1("scan1");

scanchain SCAN2("scan2");

SCAN1.addscan(& BLOCK1. fsm( ));

SCAN1.addscan(& BLOCK2. fsm( ));

SCAN2.addscan(& BLOCK3. fsm( ));

The "sysgen" object identifies the required scan chain connections through the "fsm" objects that are assigned to it. In order to have reasonable circuit test times, you should not include more then 300 flip-flops in each scan chain. If you have a processor that contains more then 300 flip-flops, then you should use another scan chain connection strategy.

Finally, you can generate code for the standard untimed block RAM. There are two possible interconnection mechanisms: the first will include the untimed RAM blocks in "sysgen" as internal components of the system link cell. The second will include the RAM blocks as external components. This latter method requires you to construct a new "system-system link cell", that includes the RAM entities and the system link cell in a larger structure. However, it might be required in case you have to remap the standard RAM interface, or introduce additional asynchronous timing logic.

An example of the two methods is shown next ram RAM1("ram1", addr1, di1, do1, wr, rd, 128);

ram RAM2("ram2", addr2, di2, do2, wr, rd, 128);

```
        // types of address and data bus
        dfix addrtype(0, 7, 0);
        dfix dattype (0, 4, 0);
        sysgen S1(`S1'');
        // define an external ram
        S1.extern_ram(RAM1, addrtype, dattype);
```

```
        // define an internal ram
        S1.intern_ram(RAM2, addrtype, dattype);
```

Pitfalls for Code Generation

As always, there are a number of pitfalls when things get complex. You should watch the following when diving into code generation.

OCAPI generates nicely formatted code, that you can investigate. To help you in this process, also the actual signal names that you have specified are regenerated in the VHDL and DSFG code. This implies that you have to stay away from VHDL and DSFG keywords, or else you will get an error from either Cathedral-3 or Synopsys.

The mapping of the fixed point library to hardware is, in the present release, minimal. First of all, although registered signals allow you to specify an initial value, you cannot rely on this for the hardware circuit. Registers, when powered on, take on a random state. Therefore, make sure that you specify the initialization sequence of your datapath. A second fixed point pitfall is that the hardware support for the different quantization schemes is lacking. It is assumed that you finally will use truncated quantization on the lsb-side and wrap-around quantization on the msb-side of all signals. The other quantization schemes require additional hardware to be included. If you really need, for instance, saturated msb quantization, then you will have to describe it in terms of the default quantization.

Finally, the current set of hardware operators in Cathedral-3 is designed for signed representations. They work with unsigned representations also as long as you do no use relational operations (<, > and the like). In this last case, you should implement the unsigned operation as a signed one with one extra bit.

Verification and Testbenches

Once you have obtained a gate level implementation of your circuit, it is necessary to verify the synthesis result. OCAPI helps you with this by generating testbenches and testbench stimuli for you while you run timed simulations and do code generations.

The example of the "add" class introduced previously is picked up again, and testbench generation capability is included to the OCAPI description.

Generation of Testbench Vectors

The next example performs a three cycle simulation of the "add" class and generates a testbench vectors for it.

```
include "qlib.h"
void main()
{
    dfbfix i1("i1");
    dfbfix i2("i2");
    dfbfix o1("o1");
    src SRC1("SRC1", i1,"SRC1");
    src SRC2("SRC2", i2,"SRC2");
    add ADD ("ADD" , i1, i2, o1);
    snk SNK1("SNK1", o1,"SNK1");
    sysgen S1("S1");
    S1 << SRC1;
    S1 << SRC2;
    S1 << ADD.fsm();
    S1 << SNK1;
    ADD.fsm().tb_enable();
    clk ck;
```

-continued

```
    int i;
    for (i=0; i<3; i++)
    S1.run(ck);
    ADD.fsm().tb_data();
}
```

Just before the timed simulation starts, you enable the generation of testbench vectors by means of a "tb_enable( )" member call for each fsm that requires testbench vectors.

During simulation, the values on the input and ouput ports of the "add" processor are recorded. After the simulation is done, the testbenches are generated using a "tb\_data( )" member function call.

Testbench generation leaves three data files behind:

"fsm_tb.dat" contains binary vectors of all inputs of the "add" processor. It is intended to be read in by the VHDL simulator as stimuli.

"fsm_tb.dat_hex" contains hexadecimal vectors of all inputs and outputs of the "add" processor. It contains the output that should be produced by the VHDL simulator when the synthesis was successful.

"fsm_tb.dat_info" documents the contents of the stimuli files by saying which stimuli vector corresponds to which signal When compiling and running this OCAPI program, the following appears on screen.
* * * INFO: Defining block SRC1
* * * INFO: Defining block SRC2
* * * INFO: Defining block ADD
* * * INFO: Defining block SNK1
* * * INFO: Creating stimuli monitor for testbench of FSMD fsm
* * * INFO: Generating stimuli data file for testbench fsm_tb.
* * * INFO: Testbench fsm_tb has 3 vectors.

Afterwards, you can take a look at each of the three generated testbenches.

```
-- file: fsm_tb.dat
00000001 00000100
00000010 00000101
00000011 00000110
-- file: fsm_tb.dat_hex
01 04 05
02 05 07
03 06 09
-- file: fsm_tb.dat_info
Stimuli for fsm_tb contains 3 vectors for
        i1_stim      read
        i2_stim      read
```

Next columns occur only in _hex.dat file and are outputs
o1_stimwrite

You can now use the vectors in the simulator. But first, you must also generate a testbench driver in VHDL.

Generation of Testbench Drivers

To generate a testbench driver, simply call the "tb_enable( )" member function of the "add" fsm before you initiate code generation. You will end up with a VHDL file "fsm_tb.vhd" that contains the following driver.

```
-- Test Bench for FSMD design fsm
library IEEE;
use IEEE.std_logic_1164.all;
use IEEE.std_logic_textio.all;
use std.textio.all;
library clock;
use clock.clock.all;
entity fsm_tb is
end fsm_tb;
architecture rtl of fsm_tb is
    signal reset:   std_logic;
    signal clk: std_logic;
    signal i1: std_logic_vector ( 7 downto 0 );
    signal i2: std_logic_vector ( 7 downto 0 );
    signal ot: std_logic_vector ( 7 downto 0 );
    component fsm
        port (
            reset:  in std_logic;
            clk: in std_logic;
            i1: in std_logic_vector ( 7 downto 0 );
            i2: in std_logic_vector ( 7 downto 0 );
            ot: out std_logic_vector ( 7 downto 0 )
        );
    end component;
begin
crystal (clk, 50 ns);
fsm_dut: fsm
    port map  (
        reset =>    reset,
        clk => clk,
        i1 => i1,
        i2 => i2,
        ot => ot
    );
ini: process
    begin
    reset <= '1';
    wait until clk'event and clk = '1';
    reset <= '0';
    wait;
    end process;
input: process
    file stimuli : text is in "fsm_tb.dat";
    variable aline : line;
    file stimulo : text is out "fsm_tb.sim_out";
    variable oline : line;
    variable v_i1: std_logic_vector ( 7 downto 0 );
    variable v_i2: std_logic_vector ( 7 downto 0 );
    variable v_ot: std_logic_vector ( 7 downto 0 );
    variable v_i1_hx: std_logic_vector ( 7 downto 0 );
    variable v_i2_hx: std_logic_vector ( 7 downto 0 );
    variable v_ot_hx: std_logic_vector ( 7 downto 0 );
    begin
    wait until reset'event and reset = '0';
    loop
        if (not(endfile(stimuli))) then
            readline(stimuli, aline);
            read(aline,    v_i1);
            read(aline,    v_i2);
        else
            assert false
            report "End of input file reached"
            severity warning;
        end if;
        i1 <= v_i1;
        i2 <= v_i2;
        wait for 50 ns;
        v_ot := ot;
        v_i1_hx := v_i1;
        v_i2_hx := v_i2;
        v_ot_hx := v_ot;
        hwrite(oline, v_i1_hx);
        write(oline, ' ');
        hwrite(oline, v_i2_hx);
        write(oline, ' ');
        hwrite(oline, v_ot_hx);
        write(oline, ' ');
        writeline(stimulo, oline);
        wait until clk'event and clk = '1';
```

```
        end loop;
      end process;
end rt1;
configuration tbc_rt1 of fsm_tb is
for rt1
    for all : fsm
        use entity work.fsm(structure);
    end for;
end for;
end tbc_rt1;
```

The testbench uses one additional library, "clock", which contains the "crystal" component. This component is a simple clock generator that drives a 50% duty cycle clk.

This testbench will generate a file "fsm_tb.sim_out". After running the testbench in VHDL, this file should be exactly the same as the "fsm_tb.dat_hex". You can use the unix "diff" command to check this. The only possible differences can occur in the first few simulation cycles, if the VHDL simulator initializes the registers to "X".

Using automatic testbench generation greatly speedups the verification process. You should consider using it whenever you are into code generation.

Compiled Code Simulations

For large designs, simulation speed can become prohibitive. The restricting factor of OCAPI is that the signal flowgraph data structures are interpreted at runtime. In addition, runtime quantization (fixed point simulation) takes up quite some CPU power.

OCAPI allows you to generate a dedicated C++ simulator, that runs compiled code instead of interpreted code. Also, additional optimizations are done on the fixed point simulation. The result is a simulator that runs one to two orders of magnitude faster then the interpreted OCAPI simulation. This speed increase adds up to the order of magnitude that interpreted OCAPI already gains over event-driven VHDL simulation.

As an example, a 75 Kgate design was found to run at 55 cycles per second (on a HP/9000). This corresponds to "4.1 million" gates per second, and motivates why C++ is the way to go for system synthesis.

Generating a Compiled Code Simulator

The compiled code generator is integrated into the "sysgen" object. There is one member function, "compiled( )", that will generate this simulator for you.

```
#include ``qlib.h''
#include ``add.h''
void main()
{
    dfbfix i1("i1");
    dfbfix i2("i2");
    dfbfix o1("o1");
    add ADD ("ADD" , i1, 12, o1);
    sysgen S1("S1");
    S1 << ADD.fsm();
    S1.compiled();
}
```

In this simple example, a compiled code generator is made for a design containing only one FSM. The generator allows to include several fsm blocks, in addition to untimed blocks.

When this program is compiled and run, it leaves behind a file "S1_ccs.cxx", that contains the dedicated simulator.

For the OCAPI user, the simulator defines one procedure, "one_cycle( )", that simulates one cycle of the system.

When calling this procedure, it also produces debugging ouput similar to the "setinfo(regcontents)" call for "ctlfsm" objects. This procedure must be linked to a main program that will execute the simulation.

If an untimed block is present in the system, then it will be included in the dedicated simulator. In order to declare it, you must provide a member function "CCSdecl(ofstream &)" that generates the required C++ declaration. As an example, the basic RAM block declares itself as follows:

```
-- file: ram.h
class ram : public base
{
public:
    ...
    ram (char * name,
        FB& _address,
        FB& _data_in,
        FB& _data_out,
        FB& _w,
        FB& _r,
        int _size);
    void CCSdecl (ofstream &os);
    ...
private:
    ...
};
-- file: ram.cxx
void ram::CCSdecl(ofstream &os)
{
    os << " #include \"ram.h\"\n";
    os << " ram " << typeName() << "(";
    os << "\"" << typeName() << "\", ";
    os << address.name() << ", ";
    os << data_in.name() << ", ";
    os << data_out.name() << ", ";
    os << w.name() << ", ";
    os << r.name() << ", ";
    os << size << ");\n";
}
```

This code enables the ram to reproduce the declaration by which it was originally constructed in the interpreted OCAPI program. Every untimed block that inherits from "base", and that you whish to include in the compiled code simulator must use a similar "CCSdecl" function.

Compiling and Running a Compiled Code Simulator

The compiled code simulator is compiled and linked in the same way as a normal OCAPI program. You must however also provide a "main" function that drives this simulator.

The following code contains an example driver for the "add" compiled code simulator.

```
include "qlib.h"
void one_cycle();
extern FB i1;
extern FB i2;
extern FB o1;
void main()
{
    i1 << dfix(1) << dfix(2) << dfix(3);
    i2 << dfix(4) << dfix(5) << dfix(6);
    one_cycle();
    one_cycle();
    one_cycle();
```

-continued

```
    while (o1.getSize())
        cout << o1.get() << "\n";
}
```

When run, this program will produce the same results as before. In contrast to the compiled simulaton of your MPEG-4 image processor, you will not be able to notice any speed increase on this small example.

Faster Communications

OCAPI uses queues as a means to communicate during simulation. These queues however take up CPU power for queue management. To save this power, there is an additional queue type, "wireFB", which is used for the simulation of point-to-point wiring connections.

The dfbfix_wire Class

A "wireFB" does not move data. In contrast, it is related to a registered driver signal. At any time, the value read of this queue is the value defined by the registered signal. Because of this signal requirement, a "wireFB" cannot be used for untimed simulations. The following example of an accumulator shows how you can use a "wireFB", or the equivalent "dfbfix_wire".

```
include "qlib.h"
void main()
{
    clk ck;
    _sig a("a",ck,dfix(0));
    _sig b("b");
    dfbfix_wire A("A",a);
    dfbfix B("B");
    sfg accu;
    accu.starts();
    a = a + b;
    accu << "accu";
    accu << ip(b, B);
    accu << op(a, A);
    accu.check();
    B << dfix(1) << dfix(2) << dfix(3);
    while (B.getSize())
    {
        accu.eval(cout);
        accu.tick(ck);
    }
}
```

A "wireFB" is identical in use as a normal "FB"}. Only, for each "wireFB", you indicate a registered driver signal in the constructor.

Interconnect Strategies

The "wireFB" object is related to the interconnect strategy that you use in your system. An interconnect strategy includes a decision on bus-switching, bus-storage, and bus-arbitration. OCAPI does not solve this problem for you: it depends on your application what the right interconnection strategy is.

One default style of interconnection provided by OCAPI is the point-to-point, register driven bus scheme. This means that every bus carries only one signal from one processor to another. In addition, bus storage in included in the processor that drives the bus.

More complex interconnect strategies, like the one used in Cathedral-2, are also possible, but will have to be described in OCAPI explicitly. Thus, the freedom of target architecture is not without cost. In the section "Meta-code generation", a solution to this specification problem is presented.

Meta-code Generation

OCAPI internally uses meta-code generation. With this, it is meant that there are code generators that generate new "fsm", "sfg" and "sig" objects which in turn can be translated to synthesizable code.

Meta-code generation is a powerful method to increase the abstraction level by which a specification can be made. This way, it is also possible to make parametrized descriptions, eventually using conditions. Therefore, it is the key method of soft-chip components, which are software programs that translate themselves to a wide range of implementations, depending on the user requirements.

The meta-code generation mechanism is also available to the user. To demonstrate this, a class will be presented that generates an ASIP datapath decoder.

An ASIP Datapath Idiom

An ASIP datapath, when described as a timed description within OCAPI, will consist of a number of signal flowgraphs and a finite state machine. The signal flowgraphs express the different functions to be executed by the datapath. The fsm description is a degenerated one, that will use one transition per decoded instruction. The transition condition is expressed by the "instruction" input, and selects the appropriate signal flowgraph for execution.

Because the finite state machine has a fixed, but parametrizable structure, it is subject for meta-code generation. You can construct a "decoder" object, that generates the "fsm" for you. This will allow compact specification of the instruction set. First, the "decoder" object (which is present in OCAPI) itself is presented.

```
-- the include file
#define MAXINS 100
#include "qlib.h"
class decoder : public base
{
    public:
        decoder(char * _name, clk &ck, dfbfix &_insq);
        void dec(int _numinstr);
        ctlfsm &fsm();
        void dec(int _code, sfg &);
        void dec(int _code, sfg &, sfg &);
        void dec(int _code, sfg &, sfg &, sfg &);
    private:
        char *name;
        clk *ck;
        dfbfix *insq;
        int inswidth;
        int numinstr;
        int codes[MAXINS];
        ctlfsm _fsm;
        state active;
        sfg decode;
        _sigarray *ir;
        cnd * decend(int );
        void decchk(int );
};
-- the .cxx file
#include "decoder.h"
static int numbits(int w)
{
    int bits = 0;
    while (w)
    {
        bits++;
        w = w >> 1;
    }
    return bits;
}
int bitset(int bitnum, int n)
{
```

```
                    -continued
    return (n & (1 << bitnum));
}
decoder::decoder(char *_name, clk &_ck, dfbfix &_insq)
: base(_name)
{
    name = _name;
    insq = _insq.asSource(this);
    ck = &_ck;
    numinstr = 0;
    inswidth = 0;
    _fsm << _name;
    // active << strapp(name,"_go_");
    active << "go";
    _fsm << deflt(active);
}
void decoder::dec(int n)
{
    // define a decoder that decodes n instructions
    // instruction numbers are 0 to n-1
    // create also the instruction register
    if (!(n>0))
    {
        cerr << "*** ERROR: decoder " << name << " must
            have at least one instruction\n";
        exit(0);
    }
    inswidth = numbits(n-1);
    if (n > MAXINS)
    {
        cerr << "*** ERROR: decoder " << name << "
            exceeds decoding capacity\n";
        exit(0);
    }
    dfix bit(0,1,0,dfix::ns);
    ir = new _sigarray((char *) strapp(name,"_ir"),
        inswidth, ck, bit);
    decode.starts();
    int i;
    SIGW(irw, dfix(0, inswidth, 0, dfix::ns));
    for (i=0; i<inswidth; i++)
    {
        if (i)
            (*ir)[i]   =   cast(bit,   irw   >>
                _sig(dfix(i,inswidth,0,dfix::ns)));
        else
            (*ir)[i] = cast(bit, irw);
    }
    decode << strapp("decod", name);
    decode << ip(irw, *insq);
}
void decoder::decchk(int n)
{
    // check if the decoder can decode this instruction
    int i;
    if (!inswidth)
    {
        cerr << "*** ERROR: decoder " << name << " must
            first define an instruction width\n";
        exit (0);
    }
    if (n > ((1 << inswidth)-1))
    {
        cerr << "*** ERROR: decoder " << name << "
            cannot decode code " << n << "\n";
        exit(0);
    }
    for (i=0; i<numinstr; i++)
    {
        if (n == codes[i])
        {
            cerr << "*** ERROR: decoder " << name << "
                decodes code " << n << " twice\n";
            exit(0);
        }
    }
    codes[numinstr] = n;
    numinstr++;
}
cnd *decoder::deccnd(int n)
```

```
                    -continued
{
    // create the transition condition that corresponds
    // to the instruction number n
    int i;
    cnd *cresult = 0;
    if (bitset(0, n))
        cresult = &_cnd((*ir)[0]);
    else
        cresult = &(!_cnd((*ir)[0]));
    for (i = 1; i < inswidth; i++)
    {
        if (bitset(i, n))
            cresult = &(*cresult && _cnd((*ir)[i]));
        else
            cresult = &(*cresult && !_cnd((*ir)[i]));
    }
    return cresult;
}
void decoder::dec(int n, sfg &s)
{
    // enter an instruction that executes one sfg
    decchk(n);
    active << *deccnd(n) << decode << s << active;
}
void decoder::dec(int n, sfg &s1, sfg &s2)
{
    // enter an instruction that executes two sfgs
    decchk(n);
    active << *deccnd(n) << decode << s1 << s2 <<
        active;
}
void decoder::dec(int n, sfg &s1, sfg &s2, sfg &s3)
{
    // enter an instruction that executes three sfgs
    decchk(n);
    active << *deccnd(n) << decode << s1 << s2 << s3 <<
        active;
}
ctlfsm & decoder::fsm()
{
    return _fsm;
}
```

The main principles of generation are the following. Each instruction for the ASIP decoder is defined as a number, in addition to one to three signal flowgraphs that need to be executed when this instruction is decoded. The "decoder" object keeps track of the instruction numbers already used and warns you if you introduce a duplicate. When the instruction number is unique, it is split up into a number of instruction bits, and a fsm transition condition is constructed from these bits.

The ASIP Datapath at Work

The use of this object is quite simple. In a timed description where you want to use the decoder instead of a plain "fsm", you inherit from this decoder object rather than from the "base" class. Next, instead of the fsm description, you give the instruction list and the required signal flowgraphs to execute.

As an example, an add/subtract ASIP datapath is defined. We select addition with instruction number 0, and subtraction with instruction number 1. The following code (that also uses the supermacros) shows the specification. The inheritance to "decoder" also establishes the connection to the instruction queue.

```
-- include file
#ifndef ASIP_DP_H
#define ASIP_DP_H
class asip_dp : public decoder
```

-continued

```
{
public:
    asip_dp   (char *name,
        clk &ck,
        FB &ins,
        _PRT(in1),
        _PRT(in2),
        _PRT(o1));
private:
    PRT(in1);
    PRT(in2);
    PRT(o1 );
};
-- code file
#include "asip_dp.h"
dfix typ(0,8,0);
asip_dp::asip_dp   (char *name,
        clk &ck,
        FB &ins,
        _PRT(in1),
        _PRT(in2),
        _PRT(o1)) : decoder(name, ck, ins),
            IS_SIG(in1, typ),
            IS_SIG(in2, typ),
            IS_SIG(o1, typ)
{
    IS_IP(in1);
    IS_IP(in2);
    IS_OP(o1);
    SFG(add);
    GET(in1);
    GET(in2);
    o1 = in1 + in2;
    PUT(o1);
    SFG(sub);
    GET(in1);
    GET(in2);
    o1 = in1 - in2;
    PUT(o1);
    dec(2); // decode two instructions
    dec(0, SFGID(add));
    dec(1, SFGID(sub));
}
```

To conclude, one can note that meta-code generation allows reuse of design "idioms" (classes) rather then design "instances" (objects). Intellectual-property code generators are a direct consequence of this.

Description of a Design of Systems According to the Method of the Invention

In the design of a telecommunication system (FIG. 1A), we distinguish four phases: link design, algorithm design, architecture design and circuit design. These phases are used to define and model the three key components of a communication system: a transmitter, a channel model, and a receiver.

The link design (1) is the requirement capture phase. Based on telecommunication properties such as transmission bandwidth, power, and data throughput (the link requirements), the system design space is explored using small subsystem simulations. The design space includes all algorithms which can be used by a transmitter/receiver pair to meet the link requirements. Out of receiver and transmitter algorithms with an identical functionality, those with minimal complexity are preferred. Besides this exploration, any expected transmission impairment must also be modeled into a software channel model.

The algorithm design (2) phase selects and interconnects the algorithms identified in the link design phase. The output is a software algorithmic description in C++ of digital transmitter and receiver parts in terms of floating point operations. To express parallelism in the transmitter and receiver algorithms, a data-flow data model is used. Also, the transmission imperfections introduced by analog parts such as the RF front-ends are annotated to the channel model.

The architecture design (3) refines the data model of the transmitter or receiver. The target architectural style is optimized for high speed execution, uses distributed control semantics and pipeline mechanisms. The resulting description is a fixed point, cycle true C++ description of the algorithms in terms of execution on bit-parallel operators. The architecture design is finished with a translation of this description to synthesizable VHDL.

Finally, circuit design (4) refines the bit-parallel implementation to circuit level, including technology binding, the introduction of test hardware, and design rule checks.

Target Architecture

The target architecture (5), shown in FIG. 2, consists of a network of interconnected application specific processors. Each processor is made up of bit-parallel data-paths. When hardware sharing is applied, also a local control component is needed to perform instruction sequencing. The processors are obtained by behavioral synthesis tools or RT level synthesis tools. In either case, circuits with a low amount of hardware sharing are targeted. The network is steered by one or multiple clocks. Each clock signal defines a clock region. Inside a clock region the phase relations between all register clocks are manifest. Clock division circuits are used to derive the appropriate clock for each processor.

In between each processor, a hardware queue is present to transport data signals. They increase parallelism inside a clock region and maintain consistency between different streams of data arriving at one processor.

Across clock region boundaries, synchronization interfaces are used. These interfaces detect the presence of data at the clock region boundary and gate clock signals for the clock region that they feed. This way, non-manifest and variable data rates in between clock regions are supported.

The ensemble of clock dividers and handshake circuits forms a parallel scheduler in hardware, synchronizing the processes running on the bit-parallel processor.

Overview of the C++ Modeling Levels

An overview of the distinct C++ modeling levels used by OCAPI is given in FIG. 3. The C++ modeling spans three subsequent levels in the design flow (301): the link level (302), the algorithm level (303) and the architecture level (304). The transition to the last level, the circuit level (305), is made by automated means through code generation (306). Usually, VHDL is used as the design language in this lowest level.

The link level (302) is available through data-vector modeling (307). Using a design mechanism called parallelism scaling (308), this level is refined to the algorithm level (303). The algorithm level (303) uses data-flow semantics. Using two distinct refining mechanisms in the data-flow model (315), we can refine this level to a register transfer level.

The two refining mechanisms are clock cycle true modeling (309) and fixed point modeling (310). Clock cycle true modeling (309) is achieved by allocating cycle budgets (311) and operators for each algorithm. To help the designer in this decision, operation profiling (312) is used. Fixed point modeling (310) restricts the dynamic range of variables in the algorithms to a range for which a hardware operator can be devised by adding wordlength effects (313). Signal statistics (314) are returned by the design to help the designer with this.

The last level, the architecture model (316), uses a signal flowgraph to provide a behavioral description. Using this description, synthesizable code is generated (306). The resulting code then can be mapped onto gates using a -register-transfer design tool such as DC of Synopsis.

Data-vector Modeling

The upper level of representation of a communication system is the link level. It has the following properties:

- It uses pure mathematical manipulation of functions. Time is explicitly manipulated and results in irregular-flow descriptions.
- It uses abstraction of all telecommunication aspects that are not relevant to the problem at hand.

In this representation level, MATLAB® is used for simulation. MATLAB® uses the data-vector as the basic data object. To represent time functions in MATLAB®, they are sampled at an appropriate rate. Time is present as one of the many vector dimensions. For example, the MATLAB® vector addition a=b+c;

can mean both sequential addition in time (if b and c vectors are thought of as time-sequential), or parallel addition (if b and c happen to be defined at one moment in time). MATLAB® simply makes no distinction between these two cases.

Besides this time-space feature, MATLAB® has a lot of other properties that makes it the tool-of-choice within this design level The ease with which irregular flow of data is expressed with vector operations. For example, the operation max(vector), or std(vector).

The flexibility of operations. A maximum operation on a vector of 10 elements or 1000 elements looks identically: max(vector).

The interactivity of the tool, and the transparency of data object management.

The extended library of operations, that allow very dense description of functionality.

Graphics and simulation speed.

This data-vector restriction is to be refined to a data-flow graph representation of the system. Definition of the data-flow graph requires definition of all actors in the graph (actor contents as well as actor firing rules) and definition of the graph layout.

In order to design systems effectively with the SOC++ design flow, a smooth transition between the data-vector level and the data-flow level is needed. A script to perform this task is constructed as can be seen in the following example.

EXAMPLE 1

Design of a Telecommunication System Initial Data-vector Description

We consider a pseudonoise (PN) code correlator inside a direct sequence spread-spectrum (DS/SS) modem as an example (FIG. 4).

```
% input data
in = [1 2 1 3 3 4 1 2];
% spreading code
c = [1 -1 1 -1];
% correlate
ot = corr (in, c)
% find correlation peak
[max, maxpos] = max (ot) ;
```

A vector of input data in is defined containing 8 elements. These are subsequent samples taken from the chip demodulator in the spread spectrum modem. The dimension of in thus corresponds to the time dimension. The input vector in is in principle infinite in length. For simulation purposes, it is restricted to a data set which has the same average properties (distribution) as the expected received data.

The samples of in are correlated with the PN-code vector of length 4, c. The output vector to thus contains 5 samples, corresponding to the five positions of in at which c can be aligned to. The max function locates the maximum value and position inside the correlated data. The position maxpos is subsequently used to synchronize the PN-code vector with the incoming data and thus is the desired output value of the algorithm.

This code is an elegant and compact specification, yet it offers some open questions for the PN-correlator designer:

The algorithm has an implicit startup-effect. The first correlation value can only be evaluated after 4 input samples are available. From then on, each input sample yields an additional correlation value.

The algorithm misses the common algorithmic iteration found in digital signal processing applications: each statement is executed only once.

For the implementation, no statement is made regarding the available cycle budget. This is however an important specification for the attainable acquisition speed of the modem.

All of these questions are caused by the parallelism of the data-vector description.

We now propose a way to make the parallelism of the operations more visible. Each of the MATLAB® operations is easily interpreted. Inside the MATLAB® simulation, the length of the operands will first be determined in order to select the correct operation behavior. For example,

[max, maxpos]=max(ot)

determines the maximum on a vector of length 5 (which is the length of the operand ot). It needs at least 4 scalar comparisons to evaluate the result. If ot would for example have a longer length, more scalar comparisons would be needed. To indicate this in the description, we explicitly annotate each specific instance of the generic operations with the length of the input vectors.

```
% input data
in =   [1 2 1 3 3 4 1 2] ;
     8
% spreading code
c =   [1 -1 1 -1] ;
     4
% correlate
ot =   corr  (in, c)
     5      8,4
% find correlation peak
[max, maxpos] = max (ot) ;
        1    5
```

This little annotation helps us to see the complexity of the operations more clearly. We will use this when considering implementation of the description in hardware. It is of course not the intention to force a user to do this (MATLAB® does this already for him/her).

When thinking about the implementation of this correlator, one can imagine different realizations each having a different amount of parallelism, that is, the mapping of all the operations inside corr( ) and max( ) onto a time/space axis. This is the topic of the next section.

Scaled Description

Consider again the definition of the PN code, as in:

```
% spreading code
c =   [1 -1 1 -1] ;
     4
```

This MATLAB® description defines the variable c to be a data-vector containing 4 different values. This vector assignment corresponds to 4 concurrent scalar assignments. We therefore say that the maximal attainable parallelism in this statement is 4.

In order to achieve this parallelism in the implementation, there must be hardware available to perform 4 concurrent scalar assignments. Since a scalar assignment in hardware corresponds to driving a data bus to a certain state, we need 4 busses in the maximal parallel implementation. If only one bus would be desired, then we would have to indicate this. For each of the statements inside the MATLAB® description, a similar story can be constructed. The indication of the amount of parallelism is an essential step in the transition from data-vectors to data-flow. We call this the scaling of parallelism. It involves a restriction of the unspecified communication bandwidth in the MATLAB® description to a fixed number of communication busses. It is indicated as follows in the MATLAB® description.

In order to achieve this parallelism in the implementation, there must be hardware available to perform 4 concurrent scalar assignments. Since a scalar assignment in hardware corresponds to driving a data bus to a certain state, we need 4 busses in the maximal parallel implementation. If only one bus would be desired, then we would have to indicate this. For each of the statements inside the MATLAB description, a similar story can be constructed. The indication of the amount of parallelism is an essential step in the transition from data-vectors to data-flow. We call this the scaling of parallelism. It involves a restriction of the unspecified communication bandwidth in the MATLAB description to a fixed number of communication busses. It is indicated as follows in the MATLAB description.

```
% input data
in =   [1 2 1 3 3 4 1 2] ;
     8@1
% spreading code
c =   [1 -1 1 -1] ;
     4@4
% correlate
ot =   corr  (in, c)
     5@1      8,4
% find correlation peak
[max, maxpos] = max    (ot) ;
          1@1    5
```

As is seen, each assignment is extended with a @i annotation, that indicates how the parallelism in the data vectors is ordened onto a time axis. For example, the 8 input values inside in are provided sequentially by writing 8@1. The 4 values of c on the other hand, are provided concurrently. We see that, whatever implementation of the corr operation we might use, at least 8 iterations will be required, simply to provide the data to the operation.

At this moment, the description is getting closer to the data-flow level, that uses explicit iteration. One more step is required to get to the data flow graph level. This is the topic of the next section.

Data Flow Graph Definition

In order to obtain a graph, the actors and edges inside this graph must be defined. Inside the annotated MATLAB(® description, data precedences are already present through the presence of the names of the vectors. The only thing that is missing is the definition of actor boundaries; edges will then be defined automatically by the data precedences going across the actor boundaries.

This can be done by a new annotation to the MATLAB(® description. Three actors will be defined in the DS/SS correlator.

```
actor1 {
% input data
in =   [1 2 1 3 3 4 1 2] ;
     8@1
}
actor2 {
% spreading code
c =   [1 -1 1 -1] ;
     4@4
% correlate
ot =   corr  (in, c)
     5@1      8,4
}
actor3 {
% find correlation peak
[max, maxpos] = max    (ot) ;
          1@1    5
}
```

Again the annotation should be seen as purely conceptual; it is not intended for the user to write this code. Given these annotations, a data flow graph can be extracted from the scaled MATLAB® description in an unambiguous way.

actor1 is an actor with no input, and one output, called in.

actor2 is an actor with 1 input in and one output to.

actor3 is an actor with 1 input to and outputs maxpos and max.

Furthermore, the simulation uses queues to transport signals in between the actors. We need three queues, called in, to and maxpos.

The missing piece of information for simulation of this dataflow graph are the firing rules (or equivalently the definition of productions and consumptions on each edge). A naive data flow model is shown in FIG. 4: actor1 (10) produces 8 values, which are correlated by actor2 (11), while the maximum is selected inside actor3 (12).

This would however mask the parallelism scaling operation inside the MATLAB® description. For example, it was chosen to provide the 8 values of the in vector in a sequential way over a parallel bus. It is believed that the multi-rate SDF model therefore is not a good container for the annotated MATLAB® description.

Another approach is a cyclostatic description. In this case we have a graph as in FIG. 5. We see that the determination of production patterns involves examining the latencies of operations internal to the actor. This increases the complexity of the design script. It is simpler to perform a demand driven scheduling of all actors. The firing rule only has to examine the availability of input tokens.

The desired dataflow format as in FIG. 6 is thus situated in between the multirate SDF level and the cyclostatic SDF level. It is proposed to annotate consumptions and productions in the same way as it was written down in the matlab description:

8@1 is the production of actorl. It means: 8 samples are produced one at a time.

8@1 and 5@1 is the consumption and production of actor2 respectively.

5@1 and 1@1, 1@1 are the consumption and productions for actor3.

Data-flow Simulation

Given an annotated metlab description, a simulation can now be constructed by writing a high-level model for each actor, interconnecting these with queues and constructing a system schedule. OCAPI provides both a static scheduler and a demand-driven scheduler.

Out of this simulation, several statistics are gathered:

On each queue, put and get counts are observed, as well as signal statistics (minimum and maximum values). The signal statistics provide an idea of the required buswidths of communication busses.

The scheduler counts the firings per actor, and operation executions (+, −, *, . . . ) per actor. This profiling helps the designer in deciding cycle budgets and hardware operator allocation for each actor.

These statistics are gathered through a C++ operator overloading mechanism, so the designer gets them for free if he uses the appropriate C++ objects (schedule, queue and token class types) for simulation.

We are next interested in the detailed clock-cycle true behavior of the actors and the required storage and handshake protocol circuits on the communication busses. This is the topic of the next step, the actor definition.

Actor Definition

The actor definition is based on two elements:

Signal-flowgraph representation of behavior.

Time-verification of the system.

The two problems can be solved independently using the annotated MATLAB® code as specification. In OCAPI:

The actor RT modeling proceeds in C++ and can be freely intermixed with high level descriptions regarding both operator wordlength effects and clock-cycle true timing.

The time-verification approach allows the system feasibility to be checked at all times by warning the designer for deadlock and/or causality violations of the communication.

Signal Flowgraph Definition

Within the OCAPI design flow, a class library was developed to simulate behavior at RT-level. It allows To express the behavior of an algorithm with arbitrary implementation parallelism by setting up an signal flow graph (SFG) data structure.

To simulate the behavior of an actor at a clock-cycle true level by interpreting this SFG data structure with instantiated token values.

To specify wordlength characteristics of operations regarding sign, overflow and rounding behavior. Through explicit modeling of the quantization characteristic rather than the bit-vector representation (as in SPW), efficient simulation runtimes are obtained.

To generate C++ code for this actor, and hence perform the clock cycle true simulation with compiled code.

To generate VHDL code for this actor, and synthesize an implementation with Synopsys DC.

To generate DSFG code for this actor, and synthesize an implementation with Cathedral-3. It was observed that Cathedral-3 performs a better job with relation to both critical path and area of the obtained circuits than Synopsys DC. The best synthesis results are obtained by first using Cathedral-3 to generate a circuit at gate level and then Synopsys-DC to perform additional logic optimization as a postprocessing.

An important observation was made regarding simulation speed. For equivalent descriptions at different granularities, the following relative runtimes were found:

1 for the MATLAB® simulation.

2 for the untimed, high level C++ data flow description.

4 for the timed, fixed point C++ description (compiled code).

40 for the procedural, word-level VHDL description.

It is thus concluded that RT-modeling of systems within OCAPI is possible within half an order of magnitude of the highest level of description. VHDL modeling however, is much slower. Currently the figure of 40 times MATLAB® is even considered an under-estimate. Future clock-cycle based VHDL simulators can only solve half of this problem, since they still use bit-vector based simulation of tokens rather than quantization based simulation.

Next, the modeling issues in C++ are shown in more detail. The C++ signal-flowgraph representation uses a signal data-type, that can be either a registered or else an immediate value. With this data-type, expressions are formed using the conventional scalar operations. (+, −, *, shifts and logical operations). Expressions are grouped together in a signal flowgraph. A signal flowgraph interfaces with the system through the data-flow simulation queues. Several signal-flowgraphs can be grouped together to a SFG-sequence. A SFG sequence is an expression of behavior that spans several cycles. The specification is done through a finite state machine model, for which transition conditions can be expressed. The concept of SFG modeling is pictured in FIG. 7.

The combination of different SFG's (701, 702, 703) in combination with a finite state machine (704) make up the clock-cycle true actor model (705). Within the actor, SFG communication proceeds through registered signals. Communication over the boundaries of an actor proceeds through simulation queues (706, 707, 708, 709).

When the actor is specified in this way, and all signal wordlengths are annotated to the description, an automated path to synthesis is available. Several different SFG's can be assigned to one datapath (710). Synthesizable code is generated in such a way that hardware sharing between different sfg's is possible. A finite state machine (FSM) description is first translated to SFG format to generate synthesizable code in the same way. There is an implicit hierarchy available with this method: by assigning different FSM-SFG's to one datapath (711), an overall processor architecture (712) is obtained that again has a mode port and therefore looks like a (multicycle) datapath. For macro control problems (such as acquisition/tracking algorithm switching in modems), this is a necessity.

Although the distance between the annotated MATLAB® level and this RT-level SFG seems large, it is reasonable on the actor level. Consider for example

```
actor3 {
% find correlation peak
[max, maxpos] =    max   (ot) ;
         1@1   5
}
```

We are asked here to write time the max( ) operation with an SFG. actor2 has scaled the parallelism of to to 5@1. A solution is presented in actual C++ code.

```
{
FB qin("qin") ;              //input queue
FB q1out("qout") ;           //output queue
FB q2out("qout") ;           //output queue
FB start("start") ;          //the start pin of the
                             processor
clock ck ;
_sig currmax(ck,dfix(0)) ;   //registry holding current
                             maximum
_sig maxpos(ck,dfix(0)) ;    //registry holding position
                             of max
_sig currpos(ck,dfix(0)) ;   // current.position
_sig inputvalue ;            //holds input values
_sig maxout ;
_sig maxposout ;
_sig one(dfix(1)) ;          //a constant
SFG sfg0, sfg1,sfg2 ;        //we use 3 sfg's
sfg0.starts() ;              //code after this is for sfg0
currmax = inputvalue ;
maxpos = one ;
currpos = one ;
                             //next, give sfg0 a mode and
                             an input queue
sfg0 <<"m0"<<ip(inputvalue,qin) ;
sfg1.starts() ;              //code after this is for sfg1
                             //this is a conditional
                             assignment
currmax=(inputvalue>currmax).cassign(inputvalue,currmax);
maxpos = (inputvalue > currmax).cassign(currpos, maxpos) ;
currpos = currpos + 1 ;
sfg1 <<"m1"<<ip(inputvalue,qin) ;
sfg2.starts() ;              //the last SFG
maxposout=(inputvalue>currmax).cassign(_sig(dfix(4)),maxpos);
maxout=(inputvalue>currmax).cassign(inputvalue, currmax) ;
sfg2 <<"m2"<< op(maxout,qout) << op(maxposout,q2out) ;
state s0("s0"), s1("s1"), s2("s2"), s3("s3") ;
s0 >> !cnd(start)     >>            s0 ;
s0 >> cnd(start)     >> sfg0        s1 ;
s1 >> allways        >> sfg1 >>     s2 ;
```

-continued
```
s2 >> allways        >> sfg1 >>     s3 ;
s3 >> allways        >> sfg2 >>     s0 ;
}
```

As an aid to interpret the C++ code, the equivalent behavior is shown in FIG. 8. The behavior is modeled as a 4-cycle description. Three SFG's (13,14,15) are needed, in addition to a 4-state controller (16). The controller is modeled as a Mealy machine.

As shown in FIG. 8, Sfg0 (13) stores an input value in currmax (17) and sets maxpos (18) and currpos (19) to one. Sfg1 (14) shows currmax (20) is set to the greater of inputvalue or currmax (20). Maxpos (21) is set to the greater of inputvalue or maxpos (21). Currpos (22) is set to currpos (22)+1. Sfg2 (15) shows maxout set to the greater of inputvalue or currmax (24). Maxposout is determined by maxpos (25), inputvalue and a function (26).

The C++ description also illustrates some of the main contributions of OCAPI: register-transfer level aspects (signals, clocks, registers), as well as dataflow aspects simulation queues) are freely intermixed and used as appropriate. By making use of C++ operator overloading and classes, these different design concepts are represented in a compact syntax format. Compactness is a major design issue.

Having this specification, we have all information to proceed with the detailed architectural design of the actor. This is however only part of the system design solution: we are also interested in how to incorporate the cycle-true result in the overall system.

Time Verification

The introduction of time (clock cycles) in the simulation uses an expectation-based approach. It allows to use either a high level or else an SFG-type description of the actor, and simulate the complete system clock-cycle true. The simulation helps the designer in finding whether his 'high-level' description matches the SFG description, and secondly, whether the system is realizable.

A summary of the expectation based simulation is given in FIG. 10 and is used to illustrate the ideas mentioned below.

This is a different approach than when analysis is used (e.g. the evaluation of a compile-time schedule and token lifetimes) to force restrictions onto the actor implementation. This traditional approach gives the designer no clue on whether he is actually writing down a reasonable description.

Each token (1001) in the simulation is annotated with a time when it is created: the token age. Initial tokens are born at age 0, and grow older as they proceed through the dataflow graph.' The unit of time is the clock cycle.

Additionally, each queue (1002) in the simulation holds a queue age (say, 'the present') that is used to check the causality of the simulation: a token (1001) entering a queue (1002) should not be younger than this boundary. A queue is only able to delay tokens (registers), and therefore can only work with tokens that are older than the queue age.

If such a consistency violation is detected, a warning message is issued and the token age is adapted to that of the queue. Otherwise, the time boundary of the queue is updated with the token age after the token is installed on the queue.

The queue age is steered by the actor that drives it. For each actor (1003) the designer formulates an iteration time.

The iteration time corresponds the cycle budget that the designer expects to need for the detailed actor description. This is shown in three stages by the text boxes in FIG. 10. As Stage One describes, upon each actor firing, the queues driven by the actor are aged with the iteration time.

At the same time, the actor operations also increase the age of the tokens they process, described in Stage Two. For normal operations, the resulting token age is equal to the maximum of the operand token ages. For registered signals (only present in SFG-level actor descriptions), the token age is increased by one. Besides aging by operation, aging inside of the queues is also possible by attaching a travel delay to each queue.

Like the high-level actor description, a queue is also annotated with a number of expectations. These annotations reflect what the implementation of the queue as a set of communication busses should look like.

A communication bus contains one or more registers to provide intermediate storage, and optionally also a handshake-protocol circuit. A queue then maps to one or more (for parallel communication) of these communication busses.

The expectations for a simulation queue are:

The token concurrency, that expresses how many tokens of the same age can be present on one queue. To communicate a MATLAB® vector annotated with 8@2 for example requires two communication busses. This is reflected in the high level queue model by setting the token concurrency to two.

In case the token concurrency is 1, it can be required that subsequent tokens are separated by a determined number of clock cycles. In combination with the travel delay, this determines how many registers are needed on a communication bus. This expectation is called the token latency.

Figure 9A:
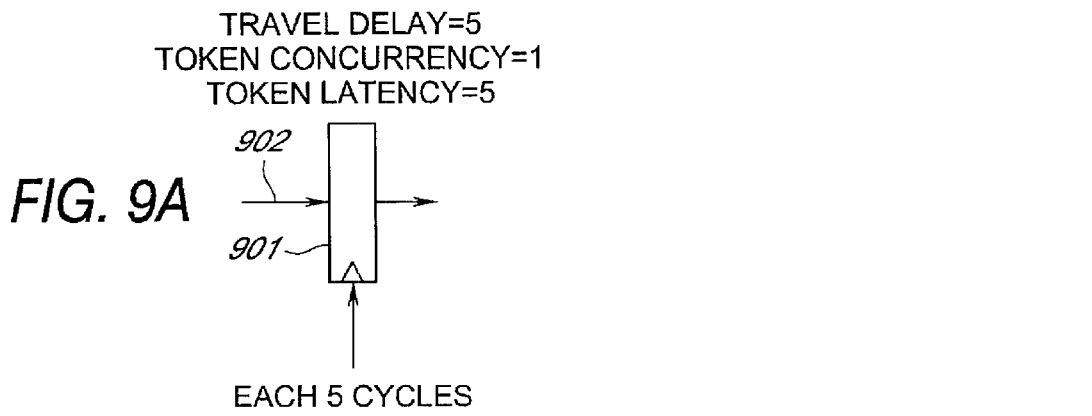
Figure 9B:
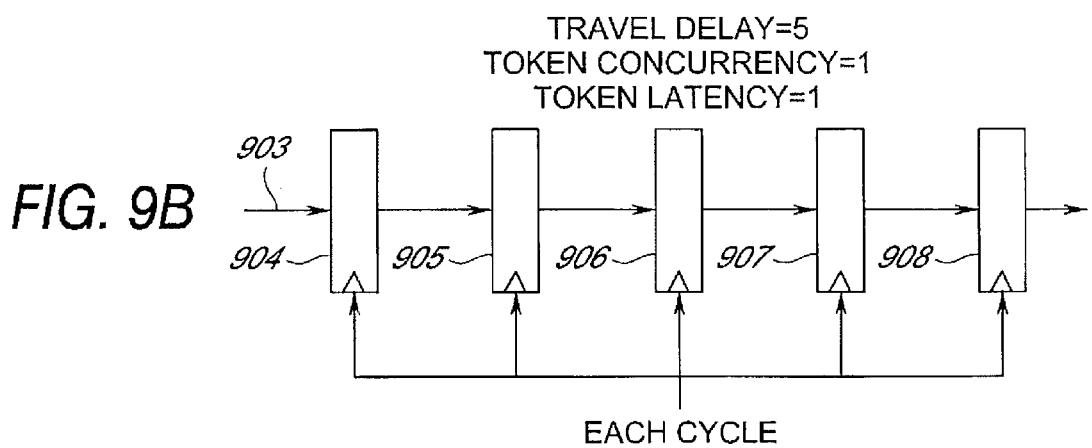
Figure 9C:
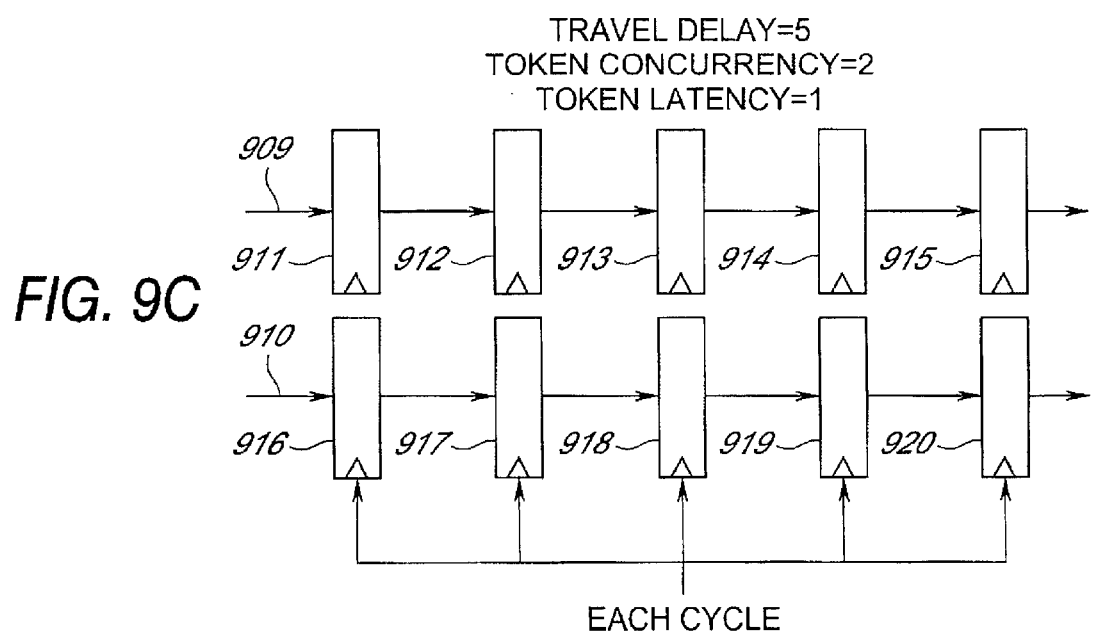

Example implementations for different expectations are shown in FIGS. 9A, 9B and 9C.

FIG. 9A shows a queue using register (901) on a communication bus (902), a token concurrency equal to one, a token latency equal to five, and a travel delay equal to five. FIG. 9B shows another example queue implemented using five registers (904, 905, 906, 907 and 908) on one communication bus (903) with a token concurrency equal to one, a token latency equal to one and a travel delay equal to five. FIG. 9C is an example of a queue implemented using a token latency equal to one, a travel delay equal to five, and a token concurrency equal to two, requiring two busses (909 and 910). This implementation requires five registers (911–915) on communication bus (909) and five registers (916–920) on communication bus (910).

When the token concurrency is different from one, the token latency cannot be bigger than one. If it would, then the actor that provides the tokens can be designed more effectively using hardware sharing, and thus reducing the token concurrency.

A summary of the expectation based simulation is described as follows. First, there are several implicit adaptations to token ages and queue ages.

An actor description increases the queue age upon each actor iteration with the iteration time.

A queue increases the age of communicated tokens with the travel delay.

An SFG description increases token ages through the operations. The token age after a register is increased by one, all other operations generate a token with age equal to the maximum of the operand ages.

The set of operations that modify the token age are referred to as token aging rules.

Next, in Stage Three, a number of checks are active to verify the consistency of the simulation.

A token age cannot be younger (smaller) then a queue age.

The token concurrency on a queue cannot be exceeded.

The token latency on a queue cannot be exceeded.

A successful clock-cycle true simulation should never fail any of these checks. In the case of such success, the expectations on the queue can be investigated more closely to devise a communication bus for it. In this description we did not mention the use of handshake protocol circuits. A handshake protocol circuit can be used to synchronize tokens of different age at the input of an actor.

Implementation

The current library of OCAPI allows to describe a system in C++ by building on a set of basic classes.

A simulation queue class that transports a token class and allows to perform expectation-checks.

An SFG/FSM class that allows clock cycle true specification, simulation and code generation.

A token class that allows to simulate both floating point-type representation and fixed point type representation.

One can simulate the MATLAB& d ata-vector data-type with C++ simulation queues. For the common MATLAB® operations, one can develop a library of SFG descriptions that reflect different flavors of parallelism. For instance, a C++ version of the description.

```
% input data
in = [1 2 1 3 3 4 1 2];
% spreading code
c = [1 -1 1 -1];
% correlate
ot = corr (in, c)
% find correlation peak
[max, maxpos] = max (ot);
``` looks, after scaling of the parallelism and defining the actor boundaries, like

```
FB in, ot, maxp;
in.delay(1,0);        //iteration time, travel delay
ot.delay(1,0);
maxp.delay(4,0);
in.expect(1,1);       //travel time, concurrency,
                      latency
ot.expect(1,1);
maxp.expect(1,4);
in = vector(1, 2, 1, 3, 3, 4, 1, 2);
ot = corr(8, 4, in, vector(1, -1, 1, -1))
maxp = maxpos(4, ot);
```

This C++ description contains all information necessary to simulate the system in mind at clock cycle true level and to generate the synthesizable code for the system and the individual actors.

Thus, the data-flow level has become transparent—it is not explicitly seen by the designer but rather it is implied through the expectations (pragma's) and the library.

EXAMPLE 2

Design of a 4-tap Correlator Processor

An example of processor design is given next to experience hardware design when using OCAPI.

The task is to design a 4-tap correlator processor that evaluates a correlation value each two cycles. One coefficient of the correlation pattern needs to be programmable and needs to be read in after a control signal is asserted. The listing in FIG. 11 gives the complete FSMD model of this processor.

The top of the listing shows how types are declared in OCAPI. For example, the type T_sample is 8 bits wide and has 6 bits beyond the binary point.

For such a type declaration, a signed, wrap-around and truncating representation is assumed by default. This can be easily changed, as for instance in

```
// floating point
dfix T_sample ;
//unsigned
dfix T_sample(8, 6, ns) ;
//unsigned, rounding
dfix T_sample(8, 6, ns, rd) ;
```

Below the type declarations we see coefficient declarations. These are specified as plain double types, since they will be automatically quantized when read in into the coefficient registers. It is possible to intermix existing C/C++ constructs and types with new ones.

Following the coefficients, the FSMD definition of the correlator processor is shown. This definition requires: the specification of the instruction set that is processed by this processor, and a specification of the control behavior of the processor. For each of these, OCAPI uses dedicated objects. First, the instruction set is defined. Each instruction performs data processing on signals, which must be defined first. The definitions include plain signals (sample_in, and corr_out), registers (accu), and register arrays (coef[ ] and sample[ ]).

Next, each of the instructions are defined. A definition is started by creating a SFG object. All signal expressions that come after such an SFG definition are considered to make up part of it. A SFG definition is closed simply by defining a new SFG object.

The first instruction, initialize_coefs, initializes the coefficient registers coef[ ]. The for loop allows to express the initialization in a compact way. Thus, the initialize_coefs instruction is also equivalent to

```
coef[0] = W(T_coef, hardwired_coef[0]) ;
coef[1] = W(T_coef, hardwired_coef[1]) ;
coef[2] = W(T_coef, hardwired_coef[2]) ;
coef[3] = W(T_coef, hardwired_coef[3]) ;
```

The second instruction programs the value of the first coefficient. The new value, coef_in, is read from an input port of the FSMD with the same name. Beyond this port, we are 'outside' of the timed FSMD description and use dataflow semantics, and communicate via queues.

The third and fourth instruction, correl_1 and correl_2 describe the two phases of the correlation. It is very-easy to express complex expressions just by using C++ operators. Also, a cast operation is included that limits the precision of the intermediate expression result. Although this is for minor importance for simulation, it has strong influence on the hardware synthesis result.

The instruction read_sample shifts the data delay line. In addition to a for loop, an if expression is used to express the boundary value for the delay line. Use of simple C++ constructs such as these allow to express signal flow graph structure in a compact and elegant way. It is especially useful in parametric design.

The last instruction, read_control, reads in the control value that will decide whether the first correlation coefficient needs to be refreshed.

Below all SFG definitions, the control behavior of the correlator processor is described. An FSM with tree states is defined, using one initial state rst, and two normal states phase_1 and phase_2. Next, four transitions are defined between those three states. Each transition specifies a start state, the transition condition, a set of instructions to execute, and a target state. For a designer used to finite state machine specification, this is a very compact and efficient notation.

The transition condition always is always true, while a transition condition like cnd(load) will be true whenever the register load contains a one.

The resulting fsm description is returned to OCAPI by the last return statement. The simulator and code generator can now process the object hierarchy in order to perform semantical checks, simulation, and code generation.

The translation to synthesizable VHDL and Cathedral-3 code is automatic and needs no extra designer effort. The resulting circuit for datapath (1201) and controller (1202) is shown in FIG. 12. The hierarchy of the generated code that is provided by OCAPI is also indicated. Each controller and datapath are interlinked using a link cell (1203). The link cell itself can be embedded into an automatically generated testbench or also in the system link cell that interconnects all components.

EXAMPLE 3

Design of Complex High Speed ASICs

The design of a 75 Kgate DECT transceiver is used as another example (FIG. 13).

The design consists of a digital radiolink transceiver ASIC, residing in a DECT base station (20)(figure 13). The chip processes DECT burst signals, received through a radio frequency front-end RF (21). The signals are equalized (22) to remove the multipath distortions introduced in the radio link. Next, they are passed to a wire-link driver DR (23), that establishes communication with the base station controller BSC (24). The system is also controlled locally by means of a control component CTL (25).

The specifications that come with the design of the digital transceiver ASIC in this system are as follows:

The equalization involves complex signal processing, and is described and verified inside a high level design environment such as MATLAB(&.

The interfacing towards the control component CTL and the wire-link- driver DR on the other hand is described as a detailed clock-cycle true protocol.

The allowed processing latency is, due to the real time operation requirements, very low: a delay of only 29 DECT symbols (25.2 $\mu$seconds) is allowed. The complexity of the equalization algorithm, on the other hand, requires up to 152 data multiplies per DECT symbol to be performed. This implies the use of parallel data processing, and introduces a severe control problem.

The scheduled design time to arrive from the heterogeneous set of specifications to the verified gate level netlist, is 18 person-weeks.

The most important degree of freedom in this design process is the target architecture, which must be chosen such that the requirements are met. Due to the critical design time, a maximum of control over the design process is required. To achieve this, a programming approach to implementation is used, in which the system is modelled in C++. The object oriented features of this language allows to mix high-level descriptions of undesigned components with detailed clock-cycle true, bit-true descriptions. In addition, appropriate object modelling allows the detailed descriptions to be translated to synthesizable HDL automatically. Finally, verification testbenches can be generated automatically in correspondence with the C++ simulation.

The result of this design effort is a 75 Kgate chip with a Very Long Instruction Word (VLIW) architecture, including 22 datapaths, each decoding between 2 and 57 instructions, and including 7 RAM cells. The chip has a 194 die area in 0.7 CMOS technology.

The C++ programming environment allows results to be obtained faster than in other existing approaches. Related to register transfer design environments, it will be shown that C++ allows more compact, and consequently less error prone descriptions of hardware. High level synthesis environments could solve this problem but have to fix the target architecture beforehand. As will be described in the case of the DECT transceiver design, sudden changes in target architecture can occur due to hard initial requirements, that can be verified only at system implementation.

First, the system machine model is introduced. This model includes two types of description: high-level untimed ones and detailed timed blocks. Using such a model, a simulation mechanism is constructed. It will be shown that the proposed approach outperforms current synthesis environments in code size and simulation speed. Following this, HDL code generation issues and hardware synthesis strategies are described.

System Machine Model

Due to the high data processing parallelism, the DECT transceiver is best described with a set of concurrent processes. Each process translates to one component in the final system implementation.

At the system level, processes execute using data flow simulation semantics. That is, a process is described as an iterative behavior, where inputs are read in at the start of an iteration, and outputs are produced at the end. Process execution can start as soon as the required input values are available.

Inside of each process, two types of description are possible. The first one is a high level description, and can be expressed using procedural C++ constructs. A firing rule is also added to allow dataflow simulation The second flavour of processes is described at register transfer level. These processes operate synchronously to the system clock. One iteration of such a process corresponds to one clock cycle of processing.

For system simulation, two schedulers are available. A dataflow scheduler is used to simulate a system that contains only untimed blocks. This scheduler repeatedly checks process firing rules, selecting processes for execution as their inputs are available.

When the system also contains timed blocks, a cycle scheduler is used instead. The cycle scheduler manages to interleave execution of multi-cycle descriptions, but can incorporate untimed blocks as well.

FIG. 14 shows the front-end processing of the DECT transceiver, and the difference between data-flow and cycle scheduling. At the top, the front-end processing is seen. The received signals are sampled by an A/D connector (1401), and correlated with a unique header pattern in the header correlator HCOR (1402). The resulting correlations are detected inside a header detector block HDET (1403). A simulation with high level descriptions uses the dataflow scheduler. An example dataflow schedule is seen in the middle of the figure. The A/D high level description produces 3 tokens (1404), which are put onto the interconnect communication queue. Next, the correlator high level description, can be fired three times (1405), followed by the detector processing (1406).

When a cycle true description of the A/D and header correlator on the other hand is available, this system can be simulated with the cycle scheduler as shown on the bottom of the figure. This time, behavior of the A/D block (1407) and correlator block (1408) are interleaved. As shown for the HCOR block (1409), executions can take multiple cycles to perform. The remaining high level block, the detector, contains a firing rule and is executed as required. Related to the global clock grid, it appears as a combinatorial function.

Detailed process descriptions reflect the hardware behavior of a component at the same level of the implementation. To gain simulation performance and coding effort, several abstractions are made.

Finite Wordlength effects are simulated with a C++ fixed point library. It has been shown that the simulation of these effects is easy in C++. Also, the simulation of the quantization rather than the bitvector representation allows significant simulation speedups.

The behavior is modelled with a mixed control/data processing description, under the form of a finite state machine coupled to a datapath. This model is common in the synthesis community. In high throughput telecommunications circuits such as the ones in the DECT transceiver ASIC, it most often occurs that the desired component architecture is known before the hardware description is made. The FSMD model works well for these type of components.

The two aspects, wordlength modelling and cycle true modelling, are available in the programming environment as separate class hierarchies. Therefore, fixed point modelling can be applied equally well to high level descriptions.

As an illustration of cycle true modelling, a part of the central VLIW controller description for the DECT transceiver ASIC is shown in FIG. 15. The top shows a Mealy type finite state machine (30). As actions, the signal flowgraph descriptions (31) below it are executed. The two states execute and hold correspond to operational and idle states of the DECT system respectively. The conditions are stored in registers inside the signal flowgraphs. In this case, the condition holdrequest is related to an external pin.

As shown in FIG. 15, in execute state, instructions are distributed to the datapaths (1501). Instructions are retrieved out of a lookup table (1502), addressed by a program counter (1503). When holdrequest is asserted, the current instruction is delayed for execution, and the program counter PC (1507) is stored in an internal register (1508). During a hold, a nop instruction (1509) is distributed to the datapaths (1504) to freeze the datapath state. As soon as holdrequest is removed, the stored program counter holdpc (1510) addresses the lookup table (1511), and the interrupted instruction is issued to the datapaths (1505) for execution.

Signals and Signal Flow Graphs

Signals are the information carriers used in construction of a timed description. Signals are simulated using C++ sig objects. These are either plain signals or else registered signals. In the latter case the signals have a current value and next value, which is accessed at signal reference and assignment respectively. Registered signals are related to a clock object clk that controls signal update. Both types of signals can be either floating point values or else simulated fixed point values.

Using operations, signals are assembled to expressions. By using the overloading mechanism as shown in FIG. 16, the parser of the C++ compiler is reused to construct the signal flowgraph data structure.

An example of this is shown in FIG. 17. The top of the figure shows a C++ fragment (40). Executing this yields the data structure (41) shown below it. It is seen that the signal flowgraph consists both of user defined nodes and operation nodes. Operation nodes keep track of their operands through pointers. The user defined signals are atomic and have null operand pointers.

The assignment operations use reversed pointers allowing to find the start of the expression tree that defines a signal.

A set of sig expressions can be assembled in a signal flow graph (SFG). In addition, the desired inputs and outputs of the signal flowgraph have to be indicated. This allows semantical checks such as dangling input and dead code detection, which warn the user of code inconsistency.

An SFG has well defined simulation semantics and represents one clock cycle of behavior.

Finite State Machines

After all instructions are described as SFG objects, the control behavior of the component has to be described. We use a Mealy-type FSM model to do this.

Again, the use of C++ objects allows very compact and efficient descriptions. FIG. 18 shows a graphical (1801) and C++-textual description (1802) of the same FSM. The correspondence is obvious. To describe an equivalent FSM in an event driven HDL, one usually has to follow the HDL simulator semantics, and for example use multi-process modelling. By using C++ on the other hand, the semantics can be adapted depending on the type of object processed, all within the same piece of source code.

Architectural Freedom

An important property of the combined control/data model is the architectural freedom it offers. As an example, the final system architecture of the DECT transceiver is shown in FIG. 19. It consists of a central (VLIW) controller (50), a program counter controller (51), a header correlator (1901), a header detector (1902) and 22 datapath blocks. Each of these are modelled with the combined control/data processing shown above. They exchange data signals that, depending on the particular block, are interpreted as instructions, conditions or. signal values. By means of these interconnected FSMD machines, a more complex machine is constructed.

It is now explained why this architectural freedom is necessary. For the DECT transceiver, there is a severe latency requirement. Originally, a dataflow target architecture was chosen (FIG. 20) that included a header correlator (2001) and a header detector (2002), which is common for this type of telecommunications signal processing. In such an architecture, the individual components are controlled locally and data driven. For example, the header detector processor signals a DECT header start (a correlation maximum), as soon as it is sure that a global maximum is reached.

Because of the latency requirement however, extra delay in this component cannot be allowed, and it must signal the first available correlation maximum as a valid DECT header. In case a new and better maximum arrives, the header detector block must then raise an exception to subsequent blocks to indicate that processing should be restarted. Such an exception has global impact. In a data driven architecture however, such global exceptions are very difficult to implement. This is far more easy in a central control architecture, where it will take the form of a jump in the instruction ROM. Because of these difficulties, the target architecture was changed from data driven to central control. The FSMD machine model allowed to reuse the datapath descriptions and only required the control descriptions to be reworked. This architectural change was done during the 18-week design cycle.

The Cycle Scheduler

Whenever a timed description is to be simulated, a cycle scheduler is used instead of a dataflow scheduler. The cycle scheduler creates the illusion of concurrency between components on a clock cycle basis.

The operation of the cycle scheduler is best illustrated with an example. In FIG. 21, the simulation of one cycle in a system with three components is shown. The first two, components 1 (60) and 2 (61), are timed descriptions constructed using fsm and sfg objects. Component 3 (62) on the other hand is decribed at high level using a firing rule and a behavior. In the DECT transceiver, such a loop of detailed (timed) and high level (untimed) components occurs for instance in the RAM cells that are attached to the datapaths. In that case, the RAM cells are described at high level while the datapaths are described at clock cycle true level.

The simulation of one clock cycle is done in three phases. Traditional RT simulation uses only two; the first being an evaluation phase, and the second being a register update phase.

As shown in FIG. 21, the three phases used by the cycle scheduler are a token production phase (2101), an evaluation phase (2102) and a register update phase (2103).

The three-phase simulation mechanism is needed to avoid apparent deadlocks that might exist at the system level. Indeed, in the example there is a circular dependency in between components 1, 2, and 3, and a dataflow scheduler can no longer select which of the three components should be executed first. In dataflow simulation, this is solved by introducing initial tokens on the data dependencies. Doing so would however require us to devise a buffer implementation for the system interconnect, and introduce an extra code generator in the system.

The cycle scheduler avoids this by creating the required initial tokens in the token production phase. Each of the phases operates as follows.

[0] At the start of each clock cycle, the sfg descriptions to be executed in the current clock cycle are selected. In each fsm description, a transition is selected, and the sfg related to this transition are marked for execution.

[1] Token production phase. For each marked sfg, look into the dependency graph, and identify the outputs that solely depend on registered signals and/or constant signals. Evaluate these outputs and put the obtained tokens onto the system interconnect.

[2] (a) Evaluation phase (case a). In the second phase, schedule marked sfg and untimed blocks for execution until all marked sfg have fired. Output tokens are produced if they are directly dependent on input tokens for timed sfg descriptions, or else if they are outputs of untimed blocks.

[2] (b) Evaluation phase (case b). Outputs that are however only dependent on registered signals or constants will not be produced in the evaluation phase.

[3] Register update phase. For all registered signals in marked sfg, copy the next-value to the current-value.

The evaluation phase of the three-phase simulation is an iterative process. If a pre-set amount of iterations have passed, and there are still unfired components, then the system is declared to be deadlocked. This way, the cycle scheduler identifies combinatorial loops in the system.

Code Generation and Simulation Strategy

The clock-cycle true, bit-true description of system components serves a dual purpose. First, the descriptions have to be simulated in order to validate them. Next, the descriptions have also to be translated to an equivalent, synthesizable HDL description.

In view of these requirements, the C++ description (2201 in FIG. 22) itself can be treated in two ways in the programming environment. In the case of a compiled code approach, the C++ description is translated to directly executable code. In the case of an interpreted approach, the C++ description is preprocessed by the design system and stored as a data structure in memory.

Both approaches have different advantages and uses. For simulation, execution speed is of primary importance. Therefore, compiled code simulation is needed. On the other hand, HDL code generation requires the C++ description to be available as a data structure that can be processed by a code generator. Therefore, a code generator requires an interpreted approach.

We solve this dual goal by using a strategy as shown in FIG. 22. The C++ High Level System Description (2201) is first refined. Then, the clock-cycle true and bit-true description of the system (2202) is compiled and executed (2203). The description uses C++ objects such as signals and finite state machine descriptions which translate themselves to a control/data flow data structure (2204).

This data structure (2204) can next be interpreted by a simulator (2205) for quick verification purposes. The same data structure is also processed by a code generator to yield two different descriptions.

A C++ description (2206) can be regenerated to yield an application-specific and optimized compiled code simulator (2207). This simulator is used for extensive verification of the design because of the efficient simulation runtimes. A synthesizable HDL description (2208) can also be generated to arrive at a gate-level implementation (2209).

The simulation performance difference between these three formats (interpreted C++ objects, compiled C++, and HDL) is illustrated in table 1. Simulation results are shown for the DECT header correlator processor, and also the complete DECT transceiver ASIC.

The C++ modelling gains a factor of 5 in code size (for the interpreted-object approach) over RT-VHDL modeling. This is an important advantage given the short design cycle for the system. Compiled code C++ on the other hand provides faster simulation and smaller process size than RT-VHDL.

For reference, results of netlist-level VHDL and Verilog simulations are given.

TABLE 1

| Design | Size (Gates) | Type | Source Code (# lines) | Simulation Speed (cycles/s) | Process Size (Mb) |
|---|---|---|---|---|---|
| HCOR | 6K | C++(interpreted obj) | 230 | 69 | 3.8 |
|  |  | C++ (compiled) | 1700 | 819 | 2.7 |
|  |  | VHDL (RT) | 1600 | 251 | 11.9 |
|  |  | VHDL (Netlist) | 77000 | 2.7 | 81.5 |
| DECT | 75K | C++(interpreted obj) | 8000 | 2.9 | 20 |
|  |  | C++ (compiled) | 26000 | 60 | 5.1 |
|  |  | Verilog (Netlist) | 59000 | 18.3 | 100 |

Synthesis Strategy

Finally, the synthesis approach that was used for the DECT transceiver is documented. As shown in FIG. 1D, the clock-cycle true, bit-true C++ description can be translated from within the programming environment into equivalent HDL.

For each component, a controller description and a datapath description is generated, in correspondence with the C++ description. This is done because we rely on separate synthesis tools for both parts, each one optimized towards controller or else datapath synthesis tasks.

For datapath synthesis, we rely on the Cathedral-3 back-end datapath synthesis tools, that allow to obtain a bitparallel hardware implementation starting from a set of signal flowgraphs. These tools allow operator sharing at word level, and result in run times less than 15 minutes even for the most complex, 57-instruction data path of the DECT transceiver.

Controller synthesis on the other hand is done by logic synthesis such as Synopsys DC™. For pure logic synthesis such as FSM synthesis, this tool produces efficient results. The combined netlists of datapath and controller are also post-optimized by Synopsys DC to perform gate-level netlist optimizations. This divide and conquer strategy towards synthesis allows each tool to be applied at the right place.

During system simulation, the system stimuli are also translated into testbenches that allow to verify the synthesis result of each component. After interconnecting all synthesized components into the system netlist, the final implementation can also be verified using a generated system testbench.

EXAMPLE 4

Design of a QAM Transmission System with OCAPI (FIG. 23)

A QAM transmission system, that includes a transmitter, a channel model, and a receiver is designed.

System Specification

A system specification in OCAPI is an executable model: an executable file, that can be run as a software program on a computer. The principle of executable specification, as it is called, is very important for system design. It allows one to check your specification using simulations. In this case, we are designing a QAM transmission system. A full communications system contains a transmitter, a channel model, and a receiver. The ensemble of the transmitter, channel model and receiver organized as an executable specification is also called an end-to-end executable specification. The term end-to-end clearly indicates that the simulation starts with a user message, and ends with a (received) user message. In between, the complete digital transmission is modeled, as shown in FIG. 23. In this text, the complete transmission system will be developed. The development of a component in such a system is never a one-shot process. Rather, development proceeds through a design flow: a collection of subsequent design levels connected by 'natural' design tasks. For a modem, the typical design levels are:

- a statistical level, to do high level explorations of algorithms. In OCAPI; this level is called the link level.
- a functional level, to assemble selected algorithms into a single operational modem. In OCAPI, this level is called the algorithm level.
- a structural level, to represent the modem as a machine that executes a functional description. In OCAPI, this level is called the architecture level. Each of these levels has an own set of requirements. Statistical requirements can be for example a bit error rate or a cell loss ratio. Functional requirements are for instance the set of modulation schemes to support. Finally, structural requirements are requirements like type of interfaces, or preselected architectures.

Arranging the requirements besides the design levels yields the design flow, as shown in FIG. 1B. The dashed box contains the levels that will be coded in C++-OCAPI. The upper level (the statistical one) is described in a language like MATLAB®. It is not included in this text: We will start from a complete functional specification. The functional specification is given herebelow in part A.

Design Flow in OCAPI-C++

Overall Design Flow

A design flow with OCAPI looks, from a high level point of view, as shown in FIG. 1C. The initial specification is an architecture model, constructed in C++. Through the use of refinement, we will construct an architecture model out of it. Next, relying on code generation, we obtain a synthesizable architecture model. This model can be converted to a technology-mapped architecture in terms of gates. OCAPI is concerned with the C++ layers of this flow, and in addition takes care of code generation issues.

Algorithmic Models

The algorithmic models in OCAPI use the dataflow computational model. The construction of this code by small examples selected out of Part B (below) is discussed.

First, we consider the construction of an actor. An actor is a subalgorithm out of a dataflow system model. In OCAPI, each actor is defined by one class. As an example of actor definition, we take the diffenc block out of the transmitter. The include file (3.3) defines a class diffenc (line 10) that inherits from a base class. This inheritance defines the class under definition as a dataflow actor. The dataflow actor defines a constructor, a run method and a reset method. The run method (line 25) is the method that is called when the actor should be executed. This method takes along parameters that include the name (name), the I/O ports __sym 1, __symb2) and other attributes (__qpsk, __diff__mode). The type FB (Flow-Buffer) is the type of a FIFO queue. Looking at the implementation of run (include file 3.4, line 26), we distinguish a firing rule in lines 29–30. The getSize( ) method of a queue returns the number of elements in that queue. The firing rule expresses that the run( ) method should return whenever there is no data available in the queue. Otherwise, processing continues as described beyond line 32 (this processing is the implementation of the spec as described in Part A).

A dataflow system is constructed out of such actors. The system code in 5.3 shows how the diffenc actor is instantiated (lines 57–61). Besides actors, the system code also creates interconnect queues (lines 42–48). By giving these as parameters in the constructor of actors, the required communication links are established. Besides the interconnection of actors, the system code also needs to create a scheduler. This scheduler will repeatedly test firing rules in the actors (by calling their run( ) method). The system scheduler that steers the differential encoder is shown on line 77 of 5.3. After this object is created, all dataflow actors that should be under control of it are "shifted into" it. The scheduler object has a method, run( ), that tries firing all of the actors associated with the schedule just once.

Architecture Models

An architecture model expresses the behavior of the algorithmic model in terms of operations onto hardware. The kind of hardware features that affect this depend of course on the target architectural style. OCAPI is intended for a bit-parallel, synchronous style. For this kind of style, two kinds of refinements are necessary: First, the data types need to be expressed in terms of fixed point numbers. Second, the execution needs to proceed in terms of clock cycles. The first kind of refinement is called fixed point modeling. The second kind is called cycle true modeling. These two refinements can be done in any order; for a complete architecture model, both are needed. We first give an example on how fixed point numbers are expressed in C++. Consider the ad block of the transmitter (3.2, line 24–27). The purpose of this block is to introduce a quantization effect, such as for instance would be encountered when the signal passes through an analog-digital or digital-analog converter. In this case, the high level algorithmic model is constructed with a fixed point number in order to perform this quantization. On line 32, an object of type dfix (called indfix) is created. This object represents a fixed point value. The constructor uses three parameters. The first, '0', provides an initial value. The following two (W and L) are parameters that represent the wordlength and fractional wordlength respectively. The operation of the ad block is as follows. When there is information in the input queue, the value read is assigned to the fixed point number indfix. At the moment of assignment, quantization happens, whether or not the input value was a floating point value. (The FIFO buffers are actually passing along objects of type dfix, so that floating as well as fixed point numbers can be passed from one block to the other).

A next example will show how cycle true modeling is done. We consider the derandomizer function of the receiver (6.4). First, looking at the algorithmic model (line 69–102), we see that the block reads two inputs (byte__in and syncro) and writes one output (byte__out). In between, it performs some algorithmic processing (line 89–97). The architecture model is shown in the define( ) function starting at line 116. The first few lines are type definitions and signal declarations. Next, four instructions are defined (line 143–179), and a controller which sequences these instructions is specified (line 184-195). The architecture model makes heavy use of macros to ease the job of writing code. All of these are explained above. The goal of the define( ) function is to define an object hierarchy consisting of signals, expressions, states, etc. . . . that represents the cycle true behavior of a processor. At the top of the hierarchy is a finite state machine object. The member function fsm( ) (line 106) returns this object (which is a data member of the derandomizer class). The system integration of the derandomizer (5.3, line 169–176) is the same for the algorithmic and architecture model. The selection between algorithmic and architecture model is done by giving a system scheduler either a base object (as in line 186) or else the fsm object for simulation (as in line 206). Remember that the algorithmic model creates a class that derives from the base object; while an architecture model defines a finite state machine object.

Code Generation

Finally we indicate the output of the code generation process. When an architecture model is constructed, several code generators can be used. OCAPI currently can generate RT-VHDL code directly, or else also Cathedral-3 dsfg code. When the member function generate( of a system scheduler is called, Cathedral-3 code will be produced, along with the required system link cells. The member function vhdlook( ) on the other hand produces RT-VHDL code. In this example, we have used the vhdlook( ) method (5.2, line 401). We consider the derandomizer block in the receiver. The first place where this appears in the generated code is in the system netlist (6.13, line 70 and line 143). Next, we can find the definitions of the block itself: its entity declaration (6.14), the RTL code (6.15), and a mapping cell from the fixed-point VHDL type FX to the more common VHDL type std_logic (6.16). By using this last mapping cell, we can also hook up the VHDL code for derand in a generated testbench (6.17). This testbench driver reads stimuli recorded during the C++ simulation and feeds them into the VHDL simulation.

Part A: System Specification

System Contents

The end-to-end model of the QAM transmission system under consideration is shown in FIG. 23. It consists of four main components:

A byte generator GEN (201)

A transmitter TX.(203)

A channel model CHAN.(205)

A receiver RX.(207)

The byte generator (201) generates a sequence of random bytes. These are modulated inside of the transmitter (203) to a QAM signal. The channel model (205) next introduces distortions in the signal, similar to those occurring in a real channel. Finally, the receiver (207) demodulates the signal, returning a decoded byte sequence. If no bit errors occur, then this sequence should be the same as the one created by the byte generator (201).

Next, the detailed operation of the transmitter, the channel and the receiver is discussed as shown in FIG. 24.

Transmitter Specification

The Transmitter includes rnd: A randomizer (209), which transforms a byte sequence into a pseudorandom byte sequence. This is done because of the more regular spectral properties of a randomized (or 'whitened') byte sequence.

tuple: A tuplelizer (210), which chops the transmitted bytes into QAM/QPSK symbols.

diffenc: A differential encoder (211) which applies differential encoding to the symbols.

map: A QAM symbol mapper (212), which translates QAM symbols to I/Q pulse sequences.

shape: A pulse shaper (213), which transforms the pulse sequences to a continuous wave. In digital implementation, the temporal 'continuity' is achieved by applying oversampling.

da: Finally, there is a block (214) which applies quantization to the signal. This block (214) simulates the effect of a digital-to-analog converter.

The transmitter (215) reads in a byte sequence from the byte generator (216), and randomizes this with a pseudorandom byte sequence. The sequence contains a synchronization word to align the receiver derandomizer to the transmitter randomizer (209). The pseudorandom sequence is generated by xoring a bitstream with a bitstream produced by a linear feedback shift register (LFSR). The LFSR produces a bitstream according to the polynomial $g(x)=1+x^5+x^6$. It next feeds the bytes to a tuplelizer (210) that generates symbols out of the byte sequence according to the following scheme. Given bits b7 b6 b5 b4 b3 b2 b1 b0,

| Bit position | QAM16 | QPSK |
|---|---|---|
| b7 | I symbol 0 | I[1] symbol 0 |
| b6 | Q symbol 0 | I[0] symbol 0 |
| b5 | I symbol 1 | Q[1] symbol 0 |
| b4 | Q symbol 1 | Q[0] symbol 0 |
| b3 | I symbol 2 | I[1] symbol 1 |
| b2 | Q symbol 2 | I[0] symbol 1 |
| b1 | I symbol 3 | Q[1] symbol 1 |
| b0 | Q symbol 3 | Q[0] symbol 1 |

The symbols values are next fed to the differential encoder (211) that generates a diff encoded symbol sequence:

i=(((~(a^b)) & (a^glbIstate))|((a^b) & (b^AglbQstate))) &1;

q=(((~(a^b)) & (b^glbQstate))|((a^b) & (a^AglbIstate))) &1;

with i and q the output msbs of the differentially encoded symbol; glbIstate, glbQstate the previous values of i and q; and a and b the inputs msbs of the input symbol. The lsbs are left untouched (only for qam16). The differentially encoded symbol sequence is next mapped by the QAM symbol mapper (212) to the actual symbol value using the following constellation for QPSK.

| QVal/Ival | −3 | +3 |
|---|---|---|
| +3 | 2 | 0 |
| −3 | 3 | 1 |

For QAM16, the following constellation will be used

| QVal/Ival | −3 | −1 | 1 | +3 |
|---|---|---|---|---|
| +3 | 11 | 9 | 2 | 3 |
| +1 | 10 | 8 | 0 | 1 |
| −1 | 14 | 12 | 4 | 6 |
| −3 | 15 | 13 | 5 | 7 |

After mapping, the resulting complex sequence is pulse shaped (213). A RRC shaping filter with oversampling n=4 is taken, with the rolloff factor set at r=0.3. After pulse shaping, the sequence is upconverted to fc=fs/4 in the multiplexer block (included in the shaper).

Channel Model Specification

The Channel Model contains

FIR filter (217) with programmable taps. The filter is used to simulate linear distortions such as multipath effects.

Noise injection block (218). The incoming signal is fed into a 20 tap filter. The second, third, fourth and 21th tap of the filter are programmable. Next a noise signal is added to the sequence. The noise distribution is gaussian;

$$X1=\text{sqrt}(-2\ln*(U1))* \cos(2*pi*U2)$$

$$X2=\text{sqrt}(-2\ln*(U1))* \sin(2*pi*U2)$$

U1, U2 are independent and uniform [0,1],
X1 and X2 are independent and N(0,1)
Receiver Specification
The Receiver includes

| | |
|---|---|
| lmsff (219) | A feed forward, T/4 spaced LMS Equalizer |
| demap (220) | A demapper, translating a complex signal back to a QAM symbol. |
| detuple (221) | A detupler, glueing individual symbols back to bytes |
| derand (222) | A derandomizer, translating the pseudonoise sequence back to an unrandomized sequence. |

The symbols values are next fed to the differential encoder that generates a diff encoded symbol sequence:

i=(((~(a^b)) & (a^glbIstate))|((a^b) & (b^glbQstate))) &1;
q=(((~(a^b)) & (b^glbQstate))|((a^b) & (a^glbIstate))) &1;

with i and q the output msbs of the differentially encoded symbol; glbistate, glbQstate (the previous values of i and q) and a and b the inputs msbs of the input symbol. The lsbs are left untouched (only for qam16). The differentially encoded symbol sequence is next mapped to the actual symbol value using the following constellation for QPSK:

| QVal/Ival | −3 | +3 |
|---|---|---|
| +3 | 2 | 0 |
| −3 | 3 | 1 |

For QAM16, the following constellation will be used:

| QVal/Ival | −3 | −1 | 1 | +3 |
|---|---|---|---|---|
| +3 | 11 | 9 | 2 | 3 |
| +1 | 10 | 8 | 0 | 1 |
| −1 | 14 | 12 | 4 | 6 |
| −3 | 15 | 13 | 5 | 7 |

After mapping, the resulting complex sequence is pulse shaped. A RRC shaping filter with oversampling n=4 is taken, with the rolloff factor set at r=0.3. After pulse shaping, the sequence is upconverted to fc=fs/4 in the multiplexer block (included in the shaper).
Channel Model Specification
It is not difficult to see that this signal processing corresponds to the reverse processing that was applied at the transmitter. The incoming signal is fed into an equalizer block. The 4 tap oversampled FF equalizer is initialized with a downconverting RRC sequence. This way, the equalizer will act at the same time as a matched filter, a symbol timing recovery loop, a phase recovery loop, and an intersymbol-interference removing device. It is a simple solution of the physical synchronization problem in QAM.

The equalizer is initialized as follows. Given the complex RRC:

| | tap0 | tap1 | tap2 | tap3 |
|---|---|---|---|---|
| I | i0 | i1 | i2 | i3 |
| Q | q0 | q1 | q2 | q3 | then the LMS should be initialized with:

| | tap0 | tap1 | tap2 | tap3 |
|---|---|---|---|---|
| I | i0 | 0 | −i2 | 0 |
| Q | 0 | q1 | 0 | −q3 |

The coefficient adaption algorithm of the equalizer is of the Least Mean Square type. This algorithm is decision directed; such algorithms are able to do tracking in a synchronization loop, but not to do acquisition (initialization) of the same loops. For simplicity in this example, we will however make abstraction of this acquisition problem. Next, the inverse operations of the transmitter are performed: the demodulated complex signal is converter to a QAM symbol in the demapper. The resulting QAM symbol stream is differentially decoded and assembled to a byte sequence in the detupler. The differential decoding proceeds according to a=(((~(i^q)) & (i^glbIstate))|((i^q) & (q^glbQstate))) &1;
b=(((~(i^q)) & (q^glbQstate))|((i^q) & (i^glbIstate))) &1;

Finally, the pseudorandom encoding of the sequence is removed in the derandomizer.

Part B: C++ Code of the QAM System

3 Transmitter Code 3.1 tx/ad.h

```
 1  // ad.h
 2  // All rights reserved -- Imec 1998
 3  // @(#)ad.h1.2 03/20/98
 4
 5  #infdef AD_H
 6  #define AD_H
 7
 8  #include "qlib.h"
 9
10  class ad : public base{
11      FB *in;
```

```
 12    FB *ot;
 13    double*W;
 14    double*L; ;
 15
 16 public:
 17    ad(char *name, FB & _in,FB & _ot, double& _W,double &_L);
 18    int run();
 19    int reset();
 20 };
 21
 22 #endif
```
3.2 tx/ad.cxx
```
  1 // ad.cxx
  2 // All rights reserved -- Imec 1998
  3 // @(#)ad.cxx 1.4 03/31/98
  4
  5 #include "ad.h"
  6
  7 ad::ad(char*name,
  8      FB & _in,
  9      FB & _ot,
 10      double & _W,
 11      double & _L): base(name)
 12 {
 13    in = _in.asSource(this);
 14    ot = _ot.asSink(this);
 15    W = &_W;
 16    L = &_L;
 17 }
 18
 19 int ad::reset() {
 20    //return to initial state
 21    return 1;
 22 }
 23
 24 intad::run() {
 25
 26    //firing rule
 27    if(in—>getSize() < 1) {
 28    return 0;
 29 }
 30
 31    //core functionality
 32    dfix indfix(0,(int)(*W),(int)(*L));
 33    indfix= in—>get( ) ; // inputting+ quantization assignment
 34    ot—>put(indfix) ; // outputting
 35
 36    return 1;
 37 }
 38
```
3.3 tx/diffenc.h
```
  1 // diffenc.h
  2 // All rights reserved -- Imec 1998
  3 // @(#)diffenc.h 1.7 98/03/31
  4
  5 #infdef DIFFENC_H
  6 #define DIFFENC_H
  7
  8 #include "qlib.h"
  9
 10 class diffenc: public base{
 11
 12    FB *symb1;
 13    FB *symb2;
 14    double *qpsk;
 15    double *diff_mode;
 16    int iState;
 17    int qState;
 18
 19 public:
 20    diffenc(char *name,
 21      FB & _symb1,
 22      FB & _symb2,
 23      double &_qpsk,
 24      double &_diff_mode);
 25    int run();
 26    int reset();
```

-continued

```
27 };
28
29 #endif
```

3.4 tx/diffenc.cxx

```
 1 // diffenc.cxx
 2 // All rights reserved -- Imec 1998
 3 // @(#)diffenc.cxx 1.8 98/03/31
 4
 5 #include "diffenc.h"
 6
 7 diffenc::diffenc(char*name,
 8       FB & __symb1,
 9       FB & __symb2,:
10       double & __qpsk,
11       double &__diff __mode) : base(name)
12 {
13    symb1 = __symb1.asSource(this);
14    symb2 = __symb2.asSink(this);
15    qpsk = &__qpsk;
16    diff __mode= &__diff __mode;
17    reset();
18 }
19
20 int diffenc::reset() {
21    iState= 0;
22    qState= 0;
23    return 1;
24 }
25
26 int diffenc::run() {
27
28    //firing rule
29    if(symb1—>getSize() < 1)
30    return 0;
31
32    //core func
33    intsymb = (int)Val(symb1—>get( ) ) ;
34
35    if((int)*diff __mode) {
36    int a = ((int)*qpsk) ? (symb>> 1) & 1 : (symb>> 3) & 1 ; // get msb's only
37    int b = ((int)*qpsk) ? (symb>> 0) & 1 : (symb>> 2) & 1 ;
38
39    int i = ((("(aˆb)) & (aˆiState))|(aˆb) &bˆqState))) &1; // encodemsb
40    int q = ((("(aˆb)) & (bˆqState))|(aˆb) &aˆiState))) &1;
41
42    iState= i;
43    qState= q;
44
45    symb = ((int)*qpsk)?(i<< 1)|q : (i<< 3)|(q<< 2)|(symb& 3);
46 }
47
48    symb2—>put(symb);
49    return 1;
50 }
51
```

3.5 tx/map.h

```
 1 //----------------------------------------------------
 2 // COPYRIGHT
 3 // =========
 4 //
 5 // Copyright1996 IMEC, Leuven,Belgium
 6 //
 7 // Allrights reserved.
 8 //
 9 //----------------------------------------------------
10 // Module:
11 // MAP
12 //
13 // Purpose:
14 // Mapping of QAM16 constellations to symbols and back
15 //
16 // Author:
17 // Patrick Schaumont
18 //----------------------------------------------------
19
20 #infdef MAP__H
21 #define MAP__H
```

```
22
23  #include "qlib.h"
24
25  classmap : public base{
26     double *qpsk;
27
28     FB * sIn;
29     FB * qOut;
30     FB * iOut;
31
32     dfix immediateQ(dfix v);
33     dfix immediateI(dfix v);
34
35  public:
36     map(char *name, FB& _sIn,FB & _iOut, FB& _qOut,double &_qpsk);
37     int run();
38
39  };
40
41  #endif
```

3.6 tx/map.cxx

```
 1  //-----------------------------------------------------
 2  // COPYRIGHT
 3  // =========
 4  //
 5  // Copyright1996 IMEC, Leuven,Belgium
 6  //
 7  // Allrights reserved.
 8  //
 9  //-----------------------------------------------------
10  // Module:
11  // MAP
12  //
13  // Purpose:
14  // Mapping of QAM16 constellationsto symbolsand back
15  //
16  // Author:
17  // Patrick Schaumont
18  //-----------------------------------------------------
19
20
21  #include "map.h"
22
23  // #     #    ##    #####
24  // ##   ##   #  #   #    #
25  // #### #   #    #  #
26  // #  # #   ######  #####
27  // #    #   #    #  #   #
28  // #    #   #    #  #   #
29
30
31  // QAM16
32  static double vQMap16[]={
33     ( 0.0),
34     (+1 .0), (+1.0), (+3.0), (+3.0),
35     (−1 .0), (−3.0), (−1.0), (−3.0),
36     (+1 .0), (+3.0), (+1.0), (+3.0),
37     (−1 .0), (−3.0), (−1.0), (−3.0)
38  };
39
40  static double vIMap16[] = {
41     ( 0.0),
42     (+1 .0), (+3.0), (+1.0), (+3.0),
43     (+1 .0), (+1.0), (+3.0), (+3.0),
44     (−1 .0), (−1.0), (−3.0), (−3.0),
45     (−1 .0), (−1.0), (−3.0), (−3.0)
46  };
47
48  // QPSK
49  static double vQMap4[]={
50     ( 0.0),
51     (+3 .0), (−3.0), (+3.0), (−3.0),
52  };
53  static double vIMap4[] = {
54     ( 0.0),
55     (+3 .0), (+3.0), (−3.0), (−3.0),
56  };
57
```

```
58   map::map(char*name, FB& _sIn,FB& _iOut,FB& _qOut,double& _qpsk) : base(name) {
59     sIn = & _sIn;
60     qOut = & _qOut;
61     iOut= & _iOut;
62     qpsk= & _qpsk;
63   }
64
65   dfix map::immediateQ(dfixv) {
66     if((int)*qpsk) {
67        return dfix(vQMap4[(int)Val(v+1) ] ) ;
68     } else{
69        return dfix(vQMap16[(int)Val(v+1) ] ) ;
70     }
71   }
72
73   dfix map::immediateI(dfixv) {
74     if((int)*qpsk) {
75        return dfix(vIMap4[(int)Val(v+1) ] ) ;
76     } else{
77        return dfix(vIMap16[(int)Val(v+1) ] ) ;
78     }
79   }
80
81   intmap::run() {
82     if(sIn—>getSize() < 1)
83        return 0;
84     dfix v = sIn—>get();
85     *iOut << immediateI(v);
86     *qOut << immediateQ(v);
87        return 1;
88   }
89
```

3.7 tx/rnd.h

```
 1  // rnd.h
 2  // All rights reserved -- Imec1998
 3  // @(#)rnd.h 1.5 03/31/98
 4
 5  #infdef RND_H
 6  #define RND_H
 7
 8  #include "qlib.h"
 9
10  #define SYNCPERIOD 54
11  #define SYNCWORD1 0x00
12  #define SYNCWORD2 0x55
13  #define SYNCWORD3 0x00
14  #define SYNCWORD4 0x55
15
16  class rnd : public base{
17     FB *input;
18     FB *output;
19     int synccntr;
20
21  public:
22     rnd(char *name, FB& _input, FB& _output);
23     int run();
24     int reset();
25  };
26
27  #endif
```

3.8 tx/rnd.cxx

```
 1  // rnd.cxx
 2  // All rights reserved -- Imec 1998
 3  // @(#)rnd.cxx 1.6 03/20/98
 4
 5  #include "rnd.h"
 6
 7  int glbRandom = 1;
 8
 9  int glbRandState;
10
11  rnd::rnd(char *name,
12       FB & _input,
13       FB & _output) :base(name)
14  {
15     input = _input.asSource(this);
16     output= _output.asSink(this);
```

```
17    synccntr= 0;
18    reset();
19 }
20
21
22 #define BIT(k, n) ((k>> (n−1)) & 1)
23 #define MASK(k, n) (k & ((l<< (n+1))−1))
24
25 int randbit() {
26    int r;
27
28    r= BIT(glbRandState, 5) ^ BIT(glbRandState, 6 );
29    glbRandState= MASK(r | (glbRandState<< 1) , 6);
30
31    if(glbRandom)
32       return r;
33    else
34       return 0;
35 }
36
37
38    // =========================================MEMBER FUNCTIONS
39
40 int rnd::reset() {
41    //return to initial state
42    glbRandState= (1<< 7) −1;
43    return 1;
44 }
45
46 int rnd::run() {
47    //firing rule
48    if(input—>getSize() < 1) {
49       return 0;
50    }
51
52
53    //core func
54    int i;
55    int outbyte = 0;
56    int inbyte = (int)Val(input—>get( ) ) ;
57    for (i=7; i>=0; i−−) {
58       outbyte= (outbyte<<1) | (randbit( ) ^ (inbyte>>i & 1));
59 }
60    synccntr++;
61    if(synccntr == SYNCPERIOD) {
62       // cerr << "*** INFO:randomizer sends SYN\n";
63       output—>put(outbyte);
64       output—>put(SYNCWORD1);
65       output—>put(SYNCWORD2);
66       output—>put(SYNCWORD3);
67       output—>put(SYNCWORD4);
68       synccntr= 0;
69       reset();
70    }
71    else {
72       output—>put(outbyte);
73    }
74    return 1;
75 }
76
77
```

3.9 tx/shape.h

```
 1 // shape.h
 2 // All rights reserved -- Imec 1998
 3 // @(#)shape.h 1.3 03/18/98
 4
 5 #infdef SHAPE_H
 6 #define SHAPE_H
 7
 8 #include "qlib.h"
 9
10 #define MAXLEN 33
11
12 class shape : public base{
13    FB * i_in;
14    FB * q_in;
15    FB * s_out;
16    double c[MAXLEN] ; // RC coefficients
```

```
17
18  public:
19    shape(char *name, FB& _i_in, FB& _q_in, FB& _s_out);
20    int run();
21    int run_old();
22    int reset();
23    void makecoeffs();
24  };
25
26  #endif
```
3.10 tx/shape.cxx

```
 1  // shape.cxx
 2  // All rights reserved -- Imec 1998
 3  // @(#)shape.cxx 1.7 06/26/98
 4
 5  #include "shape.h"
 6
 7  shape::shape(char *name,
 8         FB & _i_in,
 9         FB & _q_in,
10         FB & _s_out) :base(name)
11  {
12    i_in = _i_in.asSource(this);
13    q_in = _q_in.asSource(this);
14    s_out = _s_out.asSink(this);
15    makecoeffs( ) ;//RRC coeff generation
16    reset();
17  }
18
19  int shape::reset() {
20    //return to initial state
21    while(i_in—>getSize() >0)
22        i_in—>pop();
23    while(q_in—>getSize() >0)
24        q_in—>pop();
25
26    return 1;
27  }
28
29  void shape::makecoeffs() {
30    c[0] = 2.725985e-02;
31    c[1] = 2.079339e-01;
32    c[2] = 4.002601e-01;
33    c[3] = 5.241213e-01;
34    c[4] = 5.241213e-01;
35    c[5] = 4.002601e-01;
36    c[6] = 2.079339e-01;
37    c[7] = 2.725985e-02;
38  }
39
40  int shape::run() {
41    int i ,j;
42    #define NF 8
43    #define SPS 4
44
45    static double deli[NF] ;
46    static double delq[NF] ;
47
48    if((i_in—>getSize() <1) ||
49       (q_in—>getSize() <1)) {
50    return 0;
51  }
52
53    for (j = 1; j <= SPS; j++) {
54
55      for (i = NF-1; i>= 1; i--) {
56        deli[i] = deli[i-1] ;
57        delq[i] = delq[i-1] ;
58      }
59      if(j == 1) {
60        deli[0] = Val(i_in—>get( ) ) ;
61        delq[0] = Val(q_in—>get( ) ) ;
62      }
63      else{
64        deli[0] =0;
65        delq[0] = 0;
66      }
67
```

```
68      double acci = 0;
69      double accq = 0;
70      for(i = 0; i < NF; i++) {
71         acci += deli[i]*c[i] ;
72         accq += delq[i]*c[i] ;
73      }
74
75      switch (j) {
76         case 1: s_out—>put(acci);break;
77         case 2: s_out—>put(-accq);break;
78         case 3: s_out—>put(-acci);break;
79         case 4: s_out—>put(accq);break;
80      }
81
82   } //end for j
83
84   return 1;
85 }
86
87
88
89 // 5.9502848187909857e-03
90 // 7.1303339418111898e-03
91 // -9.0376125958858652e-04
92 // -1.2842591240125096e-02
93 // -1.6560488829370935e-02
94 // -3.1424796453581099e-03
95 // 2.2511451978267195e-02
96 // 4.0465840802261004e-02
97 // 2.8302892670230756e-02
98 // -1.9056064440367836e-02
99 // -7.6814040516083981e-02
100 // -9.7464875081018337e-02
101 // -3.7506670742425155e-02
102 // 1.1136091774729967e-01
103 // 3.0772091871906165e-01
104 // 4.7526468799142091e-01
105 // 5.4107108989550989e-01
106 // 4.7526467788525789e-01
107 // 3.0772090304860350e-01
108 // 1.1136090307335493e-01
109 // -3.7506679314098741e-02
110 // -9.7464876235465986e-02
111 // -7.6814036683689066e-02
112 // -1.9056059903703605e-02
113 // 2.8302895170883653e-02
114 // 4.0465840334864417e-02
115 // 2.2511449901436539e-02
116 // -3.1424813892788860e-03
117 // -1.6560489169667160e-02
118 // -1.2842590440175973e-02
119 // -9.0376032591496101e-04
120 // 7.1303342199545879e-03
121 // 5.9502844100395589e-03
122
```

3.11 tx/tuplelize.h

```
1  // tuplelize.h
2  // All rights reserved -- Imec 1998
3  // @(#)tuplelize.h 1.4 98/03/31
4
5
6  #infdef TUPLELIZE_H
7  #define TUPLELIZE_H
8
9  #include "qlib.h"
10
11 class tuplelize : public base{
12    FB *byte;
13    FB *symb;
14    double *qpsk;
15
16 public:
17    tuplelize(char* name,
18       FB & _byte,
19       FB & _symb,
20       double &_qpsk);
21    int run();
22    int reset();
```

```
23 };
24
25 #endif
```
3.12 tx/tuplelize.cxx

```
 1 // tuplelize.cxx
 2 // All rights reserved-- Imec 1998
 3 // @(#)tuplelize.cxx 1.698/03/31
 4
 5 #include "tuplelize.h"
 6
 7
 8 tuplelize::tuplelize(char *name,
 9      FB & _byte,
10      FB & _symb,
11         double &_qpsk) :base(name)
12 {
13    byte = _byte.asSource(this);
14    symb = _symb.asSink(this);
15    qpsk = &_qpsk;
16 }
17
18 //-------------------------------------
19
21 int tuplelize::reset() {
21    return 1;
22 }
23
24 int tuplelize::run() {
25
26    //firing rule
27    if(byte—>getSize() < 1)
28      return 0;
29
30    //core func
31    int us, msk, sym;
32
33    if((int)*qpsk) {
34      us= 2; msk = 0x03;
35    } else{
36      us= 4; msk = 0x0F;
37    }
38
39    int tuple = (int)Val(byte—>get( ) ) ;
40
41    for (int k = 1; k<= 8/us;k++) {
42      sym = (tuple >> (8-us) ) & msk;
43      tuple= (tuple << us) & 0xff;
44      symb—>put(sym);
45    }
46
47    return 1;
48 }
49
50
51
```
4 Channel Model Code 4.1 chan/fir.h

```
 1 // fir.h
 2 // All rights reserved -- Imec 1998
 3 // @(#)fir.h 1.2 03/31/98
 4
 5 #infdef FIR_H
 6 #define FIR_H
 7
 8 #define NRTAPS 20
 9
10 #include "qlib.h"
11
12 class fir : public base{
13    FB *input;
14    FB *output;
15    double x[NRTAPS] ; // filtertaps: 0,1,...,NRTAPS-1
16    double *t1, *t2, *t3, *t20;
17
18 public:
19    fir (char *name,FB & _input,FB & _output,
```

```
20      double &_t1, double &_t2,double &_t3, double &_t20);
21      int run();
22      int reset();
23   };
24
25   #endif
```
4.2 chan/fir.cxx

```
 1   // fir.cxx
 2   // All rights reserved -- Imec 1998
 3   // @(#)fir.cxx 1.3 03/31/98
 4
 5   #include "fir.h"
 6
 7   fir::fir(char *name,
 8      FB & _input,
 9      FB & _output,
10      double &_t1, double &_t2,double &_t3, double &_t20):base(name)
11   {
12      input = _input.asSource(this);
13      output= _output.asSink(this);
14
15      for(int i=0; i<NRTAPS; i++) {
16      x [i] =0;
17      }
18      t1 = &_t1;
19      t2 = &_t2;
20      t3 = &_t3;
21      t20= &_t20;
22   }
23
24   int fir::reset() {
25      //return to initial state
26      for(int i=0; i<NRTAPS; i++) {
27      x [i] =0;
28      }
29      return 1;
30   }
31
32   int fir::run() {
33      //firing rule
34      if(input—>getSize() < 1) {
35      return 0;
36      }
37
38      dfix in = input—>get();
39
40      int i;
41      for (i=NRTAPS-1; i>=1; i--) {
42      x [i] =x[i-1] ;
43      }
44      x[0] =Val(in);
45
46      //core func
47      double out = x[0] + x[1]*(*t1) +x[2]*(*t2) + x[3]*(*t3) + x[20]*(*t20);
48      output—>put(out);
49
50   return 1;
51   }
52
53
```
4.3 chan/noise.h

```
 1   // noise.h
 2   // All rights reserved -- Imec 1998
 3   // @(#)noise.h 1.2 03/20/98
 4
 5   #infdef NOISE_H
 6   #define NOISE_H
 7
 8   #include "qlib.h"
 9   #include "pseudorn.h"
10
11   class noise: public base{
12      FB * in;
13      FB * out;
14      double *n;
15      pseudorn RN;
16
```

```
17 public:
18   noise (char *name, FB & in,FB & out, double & _n);
19   int reset();
20   int run();
21 };
22
23 #endif
```

4.4 chan/noise.cxx

```
 1 // noise.cxx
 2 // All rights reserved -- Imec 1998
 3 // @(#)noise.cxx 1.3 03/20/98
 4
 5 #include "noise.h"
 6 #include <math.h>
 7
 8 noise::noise(char *name,FB & _in,FB & _out, double & _n):base(name) {
 9   in = _in.asSource(this);
10   out= _out.asSink(this);
11   n= &_n;
12 }
13
14
15 int noise::run() {
16   //firing rule
17   if(in—>getSize() < 1) {
18   return 0;
19   }
20
21   //core function
22   double U1 = (double) (RN.out())/(double)PRNMAX + 1/(double) PRNMAX;
23   double U2 = (double) (RN.out())/(double)PRNMAX + 1/(double) PRNMAX;
24
25   double X = sqrt(-2.*log(U1)) *cos(2.*M_PI*U2);
26
27   out—>put(Val(in—>get()) +X*(*n) ) ;
28
29   return 1;
30
31 }
```

4.5 chan/pseudorn.h

```
 1 // pseudorn.h
 2 // All rights reserved -- Imec 1998
 3 // @(#)pseudorn.h 1.2 03/31/98
 4
 5 #infdef pseudorn_H
 6 #define pseudorn_H
 7
 8 #define MULT 0x015a4e35L
 9 #define INCR 1
10 #define PRNMAX 32767 // =2^15-1
11
12 #include <time.h>
13
14 class pseudorn {
15   long seed;
16   unsigned range;
17 public:
18   pseudorn() {
19     range= PRNMAX;
20     seed= time(0);
21   }
22   pseudorn(unsigned s, unsigned r) {
23     seed= s;
24     range= r;
25   }
26   pseudorn(unsigned r) {
27     range= r;
28     seed = time(0);
29   }
30   unsigned out(void ) {
31     seed= MULT * seed+ INCR;
32     return ((unsigned) (seed>> 16) & 0x7fff) % range;
33   }
34   long getSeed() {return seed;}
35   void setSeed(long s) {seed= s;}
36 };
37
```

-continued

```
38
39 #include "qlib.h"
40
41 class pseudorn __gen: publicbase {
42     pseudorn RN;
43     FB *out;
44 public:
45     pseudorn__gen(char *name, FB&__out) :
46         base(name),
47     RN(255) {
48         out= __out.asSink(this);
49     }
50     int run() {
51         out—>put(RN.out( ) ) ;
52         return 1;
53     }
54 };
55
56 #endif
57
58
```

4.6 chan/pseudorn.cxx

```
1 // pseudorn.cxx
2 // All rights reserved -- Imec 1998
3 // @(#)pseudorn.cxx1.1 03/17/98
4
5 #include "pseudorn.h"
6
7 // inlinedstuff
8
```

5 System Code 5.1 driver/driver.h

```
1 #infdef DRIVER_H
2 #define DRIVER_H
3
4 // @(#)driver.h1.2 98/03/20
5
6 #include "qlib.h"
7 #include "Callback2wRet.h"
8
9 class interpreter{
10 public:
11     interpreter ( ) ;
12     void add (sysgen &s ) ;
13     void observe(double &v,char *name);
14     void obsAttr(Callback2wRet < int,double,int> cb,int,char *name);
15     friend interpreter & operator<<(interpreter &p,sysgen &s);
16     friend interpreter & operator<<(interpreter &p,clk &c);
17     void go (int argc,char **argv);
18 };
19
20
21
22
23
24 #endif
```

5.2 driver/driver.cxx

```
1 #include "tcl.h"
2 #include <iostream.h>
3
4 #define MAKE_WISH
5
6 #ifdef MAKE_WISH
7 #include "tk.h"
8 #endif
9
10 // @(#)driver.cxx 1.3 98/03/27
11
12 #include "qlib.h"
13 #include "qtb.h"
14 #include "driver.h"
15 #include "Callback2wRet.h"
16
17 //------------interpreter OCAPI-related datastructures--------//
18
```

-continued

```
19  Callback2wRet<int,double,int>functorlist[100];
20  int numfunctors= 0;
21
22  int graphLines= 0;
23
24  FBQ (trace0);
25  FBQ (trace1);
26  FBQ (trace2);
27  FBQ (trace3);
28  FBQ (trace4);
29  FBQ (trace5);
30  FBQ (trace6);
31  FBQ (trace7);
32  dfbfix *traces[8] ;
33  dfbfix *tracedqueue[8] ;
34
35  Tcl_HashTable queue_hash;
36
37  #define IF_SUFFIX(A) if((strlen(r—>name()) > strlen(A)) && (!strcmp(r—>name() +strlen(r—>name()) – strlen(A) ,A)))
38
39
40  void create_queue_hash() {
41    Tcl_InitHashTable(&queue_hash,TCL_STRING_KEYS);
42
43    dfbfix *r;
44    for(r = listOfFB; r; r=, r—>nextFB()) {
45      int present;
46    IF_SUFFIX("_mark")
47    continue;
48    IF_SUFFIX("_stim")
49    continue;
50      Tcl_SetHashValue(Tcl_CreateHashEntry(&queue_hash,r—>name(),&present) ,(char *) r);
51    }
52  }
53
54  // next are created by the interpreter object itself
55  Tcl_HashTable sched_hash;
56  Tcl_HashTable doubles_hash;
57  Tcl_HashTable attr_hashfunc;
58  Tcl_HashTable attr_hashint;
59
60  clk* glbClk;// global (single)clock
61
62  //----------------------------------------------------------//
63    int ListQueue(ClientData, Tcl_Interp*interp,intargc,char**argv) {
64    if((argc > 2)) {
65      interp—>result= "Usage:_listq_?queue?\n";
66    return TCL_ERROR;
67    }
68
69    char *match = 0;
70    if(argc == 2) {
71    match = argv[1] ;
72    }
73
74    if(match) {
75    Tcl_HashEntry*p=Tcl_FindHashEntry(&queue_hash,argv[1] ) ;
76      if(p != 0) {
77      Tcl_AppendElement(interp, (d(fbfix*)Tcl_GetHashValue(p))—>name( ) ) ;
78      }
79    } else{
80      Tcl_HashSearch k;
81      Tcl_HashEntry *p=Tcl_FirstHashEntry(&queue_hash,k&);
82      while (p != 0) {
83      Tcl_AppendElement(interp, ((dfbfix *)Tcl_GetHashValue(p))—>name( ) ) ;
84      p = Tcl_NextHashEntry(&k);
85      }
86    }
87
88    return TCL_OK;
89  }
90
91  //----------------------------------------------------------//
92    int GetQueue(ClientData , Tcl _Interp * interp,intargc,char**argv) {
93    if(argc != 2) {
94      interp—>result= "Usage:_getq_queue\n";
95    return TCL_ERROR;
96    }
97
```

-continued

```
 98    Tcl_HashEntry*p = Tcl_FindHashEntry(&queue_hash,argv[1] ) ;
 99    if(p != 0) {
100       dfbfix *q = (dfbfix *) Tcl_GetHashValue(p);
101    while (q—>getSize()) {
102       strstream N;
103       N << Val(q—>get()) <<ends;
104       Tcl_AppendElement(interp,N.str( ) ) ;
105    }
106  }
107
108    return TCL_OK;
109  }
110
111  //----------------------------------------------------------//
112    intPutQueue(ClientData , Tcl _Interp * interp,intargc,char**argv) {
113    if(argc != 3) {
114       interp—>result= "Usage:_putq_queue_value\n";
115    return TCL_ERROR;
116  }
117
118    Tcl_HashEntry *p = Tcl_FindHashEntry(&queue_hash,argv[1] ) ;
119    if(p != 0) {
120       double v;
121         sscanf(argv[2] ,"%1f",v&);
122         dfbfix *q = (dfbfix *) Tcl_GetHashValue(p);
123       q—>put(v);
124    }
125
126    return TCL_OK;
127  }
128
129  //----------------------------------------------------------//
130    int TraceQueue(ClientData, Tcl _Interp * interp,intargc, char**argv) {
131
132    if((argc != 1)&&(argc!= 3 )) {
133    interp—>result="Usage:_traceq_?traceq_queuename?\n";
134    return TCL_ERROR;
135  }
136
137    if(argc == 1) {
138       intk;
139       for(k=0; k<8; k++) {
140          strstream N;
141       N << traces[k]—>name() <<"_";
142          if(tracedqueue[k] !=0)
143       N << tracedqueue[k]—>name();
144       N << ends;
145       Tcl_AppendElement(interp,N.str( ) ) ;
146    }
147  } else{
148    Tcl_HashEntry *p=Tcl_FindHashEntry(&queue_hash,argv[2] );
149    dfbfix *q = 0;
150    if(p != 0) {
151       q = (dfbfix *) Tcl_GetHashValue(p);
152    } else {
153       return TCL_OK;
154    }
155
156    int num;
157    for (num=0; num < 8;num++) {
158       if(!strcmp(argv[1] ,traces[num]—>name()))
159    break;
160    }
161
162    if(num > 7)
163       return TCL_OK;
164
165    if(tracedqueue[num] !=0) {
166       tracedqueue[num]—>asDup(nilFB);
167    }
168
169    tracedqueue[num] =q;
170    q—>asDup(*traces[num] ) ;
171    }
172    return TCL_OK;
173  }
174
175  //----------------------------------------------------------//
176  intReadQueue(ClientData , Tcl_Interp * interp,intargc,char**argv) {
```

```
177   if(argc != 2) {
178     interp—>result= "Usage:_readq_queue\n";
179     return TCL_ERROR;
180   }
181
182   Tcl_HashEntry *p = Tcl_FindHashEntry(&queue_hash,argv[1] );
183   if(p != 0) {
184     dfbfix *q = (dfbfix *) Tcl_GetHashValue(p);
185     int k;
186     for(k=0; k<q—>getSize( ); k++) {
187       strstream N;
188       N << Val((*q)[k]) << ends;
189       Tcl_AppendElement(interp,N.str( ) );
190     }
191   }
192
193   return TCL_OK;
194 }
195
196 //---------------------------------------------------------//
197 int Plot Queue(ClientData, Tcl_Interp * interp,intargc,char**argv) {
198    inti;
199    if(argc < 2) {
200      interp—>result= "Usage:_plotq_queue_? . . . ?\n";
201    return TCL_ERROR;
202   }
203
204    char *f = tmpnam(NULL);
205    ofstream PLOTBUF(f);
206
207 //------- headers
208 PLOTBUF << "TitleText:_";
209    for(i=1; i<argc; i++) {
210    Tcl_HashEntry *p=Tcl_FindHashEntry(&queue_hash,argv[i]);
211      if(p != 0)
212         PLOTBUF << ((dfbfix *) Tcl_GetHashValue(p))—>name()<<"_";
213 }
214 PLOTBUF << "\n";
215
215 PLOTBUF << "BackGround:_Black\n";
216
216 PLOTBUF << "BackGround:_Black\n";
217 PLOTBUF << "ForeGround:_White\n";
218 PLOTBUF << "XUnitText:____Sample\n";
219 PLOTBUF << "BoundBox:_____True\n";
220 PLOTBUF << "0.Color:_____Yellow\n";
221 PLOTBUF << "LabelFont:____-adobe-helvetica-*-r-*-*-16-*-*-*-*-*-*-*\n";
222 PLOTBUF << "Markers:_____True\n";
223    if( !graphLines)
224       PLOTBUF << "NoLines:_____True\n";
225
226 //------- data
227    for(i=1; i<argc; i++) {
228 PLOTBUF << "\n";
229    Tcl_HashEntry *p=Tcl_FindHashEntry(&queue_hash,argv[i]);
230      if(p != 0) {
231         int j;
232         PLOTBUF <<"\""<< (( dfbfix*) Tcl_GetHashValue(p))—>name()<<"\"\n";
233         for (j=0; j<((dfbfix*) Tcl_GetHashValue(p))—>getSize(); j++) {
234         PLOTBUF << j << "_"<< ((dfbfix*)Tcl_GetHashValue(p))—>getIndex(j) <<"\n";
235         }
236      }
237 }
238 PLOTBUF.close();
239
240    system(strapp(strapp("xgraph_",f),"_&"));
241    return TCL_OK;
242 }
243
244 //---------------------------------------------------------//
245 int ScatQueue(ClientData, Tcl _Interp * interp,intargc,char**argv) {
246    int i;
247    if(argc != 3) {
248      interp—>result= "Usage:_scatq_queuex_queuey\n";
249    return TCL_ERROR;
250 }
251
252    ofstream PLOTBUF(".plotbuf");
253
254 //------- headers
255 PLOTBUF << "TitleText:_";
```

-continued

```
256    for(i=1; i<argc; i++) {
257      Tcl_HashEntry *p=Tcl_FindHashEntry(&queue_hash,argv[i]);
258      if(p != 0)
259        PLOTBUF << ((dfbfix *) Tcl_GetHashValue(p))—>name()<<"_";
260    }
261  PLOTBUF << "\n";
262
263  PLOTBUF << "BackGround:__Black\n";
264  PLOTBUF << "ForeGround:__White\n";
265  PLOTBUF << "XUnitText:____Sample\n";
266  PLOTBUF << "BoundBox:_____True\n";
267  PLOTBUF << "0.Color:_____Yellow\n";
268  PLOTBUF << "LabelFont:____-adobe-helvetica-*-r-*-*-16-*-*-*-*-*-*-*\n";
269  PLOTBUF << "Markers:_____True\n";
270    if( !graphLines)
271      PLOTBUF << "NoLines:_____True\n";
272
273  //------- data
274  PLOTBUF << "\n";
275    Tcl_HashEntry * p1 = Tcl_FindHashEntry(&queue_hash,argv[1]) ;
276    Tcl_HashEntry * p2 = Tcl_FindHashEntry(&queue_hash,argv[2]) ;
277    if((p1 != 0)&&(p2 != 0)) {
278      int j;
279      int max = ((dfbfix *) Tcl_GetHashValue(p1))—>getSize();
280        if(((dfbfix *) Tcl_GetHashValue(p2))—>getSize()<max) {
281      max = (((dfbfix *) Tcl_GetHashValue(p2))—>getSize() ) ;
282    }
283      for(j=0; j<max; j++) {
284        PLOTBUFF << ((dfbfix *) Tcl_GetHashValue(p1))—>getIndex(j)
285        << "_"
286          << ((dfbfix *) Tcl_GetHashValue(p2))—>getIndex(j)<<"\n";
287      }
288  }
289  PLOTBUF.close();
290
291    system("xgraph_.plotbuf_&");
292    return TCL_OK;
293  }
294
295  //----------------------------------------------------------//
296  int StatQueue(ClientData, Tcl _Interp*interp,intargc,char**argv) {
297    if(argc > 2) {
298      interp—>result= "Usage:_statq_?queue?\n";
299      return TCL_ERROR;
300  }
301
302  char *match = 0;
303  if(argc == 2) {
304    match = argv[1] ;
305  }
306
307    dfbfix *r;
308    for(r = listOfFB; r; r= r—>nextFB()) {
309      IF_SUFFIX("_mark")
310        continue;
311      IF_SUFFIX("_stim")
312        continue;
313      if( !match || (s!trcmp(r—>name( ),match))) {
314        strstreamN;
315        N << *r << ends;
316        Tcl_AppendElement(interp,N.str( ) ) ;
317      }
318
319    }
320
321    return TCL_OK;
322  }
323
324  //----------------------------------------------------------//
325  int ClearQueue(ClientData, Tcl _Interp*interp,intargc,char**) {
326    if(argc > 1) {
327      interp—>result= "Usage:_clearq\n";
328    return TCL_ERROR;
329  }
330
331  dfbfix *r;
332  for(r = listOfFB; r; r= r—>nextFB())
333    while (r—>getSize() >0 )
334      r—>pop();
```

```
335
336     return TCL_OK;
337 }
338
339 //----------------------------------------------------------//
340     int ListSchedule(ClientData,Tcl _Interp*interp,intargc, char**argv) {
341     if((argc > 2)) {
342        interp—>result= "Usage:_lists_?schedule?\n";
343     return TCL_ERROR;
344 }
345
346     char *match = 0;
347     if(argc == 2) {
348        match = argv[1] ;
349 }
350
351     if(match) {
352        Tcl_HashEntry *p= Tcl_FindHashEntry(&sched_hash,argv[1]);
353        if(p != 0) {
354        Tcl_AppendElement(interp, ((sysgen *) Tcl_GetHashValue(p))—>getname( ) );
355        }
356 } else{
357     Tcl_HashSearchk;
358        Tcl_HashEntry * p= Tcl _FirstHashEntry(&sched_hash,k&);
359     while (p != 0) {
360        Tcl_AppendElement(interp, ((sysgen*) Tcl_GetHashValue(p))—>getname( ));
361     p = Tcl_NextHashEntry(&k);
362     }
363 }
364
365     return TCL_OK;
366 }
367
368 //----------------------------------------------------------//
369 int RunSchedule(ClientData, Tcl _Interp*interp,intargc,char**argv) {
370
371     if((argc != 3)) {
372     interp—>result="Usage:_runs_schedule_clock_iterations\n";
373     return TCL_ERROR;
374 }
375
376        Tcl_HashEntry *p = Tcl_FindHashEntry(&sched_hash,argv[1] ) ;
377     if(p != 0) {
378     unsigned v;
379        sscanf(argv[2] ,"%d",&v);
380        sysgen *sys = (sysgen *) Tcl_GetHashValue(p);
381
382     while (v--)
383        sys—>run(*glbClk);
384
385 }
386
387     return TCL_OK;
388 }
389
390 //----------------------------------------------------------//
391     int VhdlSchedule(ClientData,Tcl _Interp *interp,intargc, char**argv) {
392
393     if((argc != 2)) {
394        interp—>result= "Usage:_vhdls_schedule\n";
395     return TCL_ERROR;
396 }
397
398     Tcl_HashEntry*p = Tcl_FindHashEntry(&sched_hash,argv[1] ) ;
399     if(p != 0) {
400        sysgen *sys = (sysgen *) Tcl_GetHashValue(p);
401        sys—>vhdlook();
402 }
403
404     return TCL_OK;
405 }
406
407 //----------------------------------------------------------//
408     int ListParameter(ClientData,Tcl_Interp*interp,intargc, char**argv) {
409     if((argc > 2)) {
410        interp—>result= "Usage:_listp_?parameter?\n";
411     return TCL_ERROR;
412 }
413
```

```
414    char *match = 0;
415    if(argc == 2) {
416        match = argv[1] ;
417    }
418
419    if(match) {
420    Tcl_HashEntry *p=Tcl_FindHashEntry(&doubles_hash,argv[1]);
421    if(p != 0) {
422    Tcl_AppendElement(interp,Tcl_GetHashKey(&doubles_hash,p));
423    }
424    } else{
425        Tcl_HashSearchk;
426    Tcl_HashEntry *p=Tcl_FirstHashEntry(&doubles_hash,k&);
427    while (p != 0) {
428    Tcl_AppendElement(interp,Tcl_GetHashKey(&doubles_hash,p));
429        p = Tcl_NextHashEntry(&k);
430    }
431    }
432
433    return TCL_OK;
434    }
435    //----------------------------------------------------------//
436    int SetParameter(ClientData,Tcl _Interp *interp, intargc, char**argv) {
437    if((argc != 3)) {
438        interp—>result= "Usage:_setp_parameter_value\n";
439    return TCL_ERROR;
440    }
441
442    Tcl_HashEntry *p = Tcl_FindHashEntry(&doubles_hash,argv[1]);
443    if(p != 0) {
444    double v;
445    sscanf(argv[2] ,"%lf",&v);
446    double *q = (double *) Tcl_GetHashValue(p);
447    *q = v;
448    }
449
450    return TCL_OK;
451    }
452
453    //----------------------------------------------------------//
454    int ReadParameter(ClientData,Tcl_Interp *interp,intargc, char**argv) {
455    if(argc != 2) {
456        interp—>result= "Usage:_readp_parameter\n";
457    return TCL_ERROR;
458    }
459
460    Tcl_HashEntry *p = Tcl_FindHashEntry(&doubles_hash,argv[1]);
461    if(p != 0) {
462    double *q = (double *) Tcl_GetHashValue(p);
463        strstreamN;
464    N << *q << ends;
465        Tcl_AppendElement(interp,N.str( ) ) ;
466    }
467
468    return TCL_OK;
469    }
470
471    //----------------------------------------------------------//
472    int ListAttribute(ClientData,Tcl _Interp *interp,intargc,char**argv) {
473    if((argc > 2)) {
474        interp—>result= "Usage:_lista_?attribute?\n";
475    return TCL_ERROR;
476    }
477
478    char *match = 0;
479    if(argc == 2) {
480        match = argv[1] ;
481    }
482
483    if(match) {
484    Tcl_HashEntry *p=Tcl_FindHashEntry(&attr_hashfunc,argv[1]);
485    if(p != 0) {
486    Tcl_AppendElement(interp,Tcl_GetHashKey(&attr_hashfunc,p));
487    }
488    } else{
489    Tcl_HashSearchk;
490    Tcl_HashEntry *p= Tcl _FirstHashEntry(&attr_hashfunc,&k);
491    while (p != 0) {
492    Tcl_AppendElement(interp,Tcl_GetHashKey(&attr_hashfunc,p));
```

-continued

```
493     p = Tcl_NextHashEntry(&k);
494     }
495 }
496
497     return TCL_OK;
498 }
499
500 //----------------------------------------------------------//
501     int SetAttribute(ClientData,Tcl_Interp *interp,intargc, char**argv) {
502     if((argc != 3)) {
503         interp—>result= "Usage:_seta_attribute_value\n";
504     return TCL_ERROR;
505 }
506
507     Tcl_HashEntry *pf=Tcl_FindHashEntry(&attr_hashfunc,argv[1]);
508     Tcl_HashEntry *pi=Tcl_FindHashEntry(&attr_hashint,argv[1]);
509
510     if(pf != 0) {
511         int n = (int) Tcl_GetHashValue(pi);
512     double v;
513         sscanf(argv[2] ,"%lf",&v);
514         //call member func
515         functorlist[(int)Tcl_GetHashValue(pf)](n,v);
516 }
517
518     return TCL_OK;
519 }
520
521 //----------------------------------------------------------//
522     int SetLineStyle(ClientData,Tcl_Interp *interp,intargc, char**argv) {
523     if((argc != 2)) {
524         interp—>result= "Usage:_lines_1/0\n";
525     return TCL_ERROR;
526 }
527
528     int v;
529     sscanf(argv[1] ,"%d", &v);
530     if(v != 0)
531         graphLines= 1;
532     else
533         graphLines= 0;
534
535     return TCL_OK;
536 }
537
538 //----------------------------------------------------------//
539 int Testbenches(ClientData, Tcl_Interp *interp,intargc,char
        **argv) {
540 if((argc != 2)) {
541     interp->result= "Usage:_testb_1/0\n";
542 return TCL_ERROR;
543 }
544
545 int v;
546 sscanf(argv[1] , "%d", &v);
547 if(v != 0)
548     qtb::glbDisableTestbenches=0;
549 else
550     qtb::glbDisableTestbenches=1;
551
552 return TCL_OK;
553 }
554
555 //----------------------------------------------------------//
556 int OCAPIHelp(ClientData, Tcl_Interp *interp,int, char**) {
557 Tcl_AppendElement(interp,"Available_OCAPI-related_commands:\n");
558 Tcl_AppendElement(interp,"listq_?queue_name?_____List_queue(s)\n");
559 Tcl_AppendElement(interp,"statq_?queue_name?_____Queue(s)_statistics\n");
560 Tcl_AppendElement(interp,"readq_queue_name_____Return _queue_contents\n");
561 Tcl_AppendElement(interp,"getq_queue_name_____Return _and_empty_queue_contents\n");
562 Tcl_AppendElement(interp,"putq_queue_name_value_____Add_value_to_queue\n");
563 Tcl_AppendElement(interp,"plotq_queue_name_?...?_____Display_queue_contents_graphically\n");
564 Tcl_AppendElement(interp,"scatq_queue_name_queue_name_____Display_queue_contents_graphically\n");
565 Tcl_AppendElement(interp,"traceq_?tracenum_queue_name?_____Trace_writes_to_the_queue\n");
566 Tcl_AppendElement(interp,"clearq_____Clear_contents_of_queues\n");
567 Tcl_AppendElement(interp,"lists_?schedule_name?_____List_available_schedules\n");
568 Tcl_AppendElement(interp,"runs_schedule_name_iter_____Runs_iter_iterations_of_a_schedule\n");
569 Tcl_AppendElement(interp,"vhdls_schedule_name_____Dumps_VHDL_code_for_a_schedule\n");
570 Tcl_AppendElement(interp,"listp_?parameter_name?_____List_parameters\n");
```

```
571 Tcl_AppendElement(interp,"setp_parameter_name_value          List_parameters\n");
572 Tcl_AppendElement(interp,"readp_parameter_name          Return_Variable_Contents\n");
573 Tcl_AppendElement(interp,"lista_?attribute_name?          List_attributes\n");
573 Tcl_AppendElement(interp,"seta_attribute_name_value          Set_attribute\n");
574 Tcl_AppendElement(interp,"lines_1/0          Turns_on/off_line_drawing\n");
575 Tcl_AppendElement(interp,"testb_1/0          Disables_test_benches\n");
577 return TCL_OK;
578 }
579
580 //------------------------------------------------------//
581 // initalization and command definition
582 int AppInit(Tcl_Interp * interp) {
583
584 if( Tcl_Init(interp) ==TCL_ERROR)
585 return TCL_ERROR;
586
587 #ifdef MAKE_WISH
588 if(Tk_Init(interp) ==TCL_ERROR)
589 return TCL_ERROR;
590 #endif
591
592 create_queue_hash( );
593
594 Tcl_CreateCommand(interp,"listq",ListQueue, NULL, NULL);
595 Tcl_CreateCommand(interp,"statq",StatQueue, NULL, NULL);
596 Tcl_CreateCommand(interp,"readq",ReadQueue, NULL, NULL);
597 Tcl_CreateCommand(interp,"getq", GetQueue, NULL, NULL);
598 Tcl_CreateCommand(interp,"putq", PutQueue, NULL, NULL);
599 Tcl_CreateCommand(interp,"plotq",PlotQueue, NULL, NULL);
600 Tcl_CreateCommand(interp,"scatq",ScatQueue, NULL, NULL);
601 Tcl_CreateCommand(interp,"traceq",TraceQueue, NULL, NULL);
602 Tcl_CreateCommand(interp,"clearq",ClearQueue, NULL, NULL);
603
604 Tcl_CreateCommand(interp,"lists",ListSchedule, NULL, NULL);
605 Tcl_CreateCommand(interp,"runs", RunSchedule, NULL, NULL);
606 Tcl_CreateCommand(interp,"vhdls",VhdlSchedule, NULL, NULL);
607
608 Tcl_CreateCommand(interp,"listp",ListParameter, NULL, NULL);
609 Tcl_CreateCommand(interp,"setp", SetParameter, NULL, NULL);
610 Tcl_CreateCommand(interp,"readp",ReadParameter, NULL, NULL);
611
612 Tcl_CreateCommand(interp,"lista",ListAttribute, NULL, NULL);
613 Tcl_CreateCommand(interp,"seta", SetAttribute, NULL, NULL);
614
615 Tcl_CreateCommand(interp,"testb",Testbenches, NULL, NULL);
616 Tcl_CreateCommand(interp,"lines",SetLineStyle, NULL, NULL);
617 Tcl_CreateCommand(interp,"OCAPI",OCAPIHelp, NULL, NULL);
618
619 return TCL_OK;
620 }
621
622
623 //---------------------------------------------------------//
624
625 interpreter & operator<<( interpreter &p, sysgen &s ) {
626 p.add(s);
627 return p;
628 }
629
630 interpreter & operator<<( interpreter &p, clk &ck) {
631 glbClk= &ck;
632 return p;
633 }
634
635 void interpreter::observe(double &v,char *name) {
636 int present;
637 Tcl_SetHashValue(Tcl_CreateHashEntry(&doubles_hash,name, &present),(char*) &v);
638 }
639
640 void interpreter::obsAttr(Callback2wRet<int,double, int>f,int n, char *name) {
641 int present;
642 functorlist [numfunctors++]=f;
643 if(numfactors<< 100) {
644    cerr>"***_ERROR:_max_num_functors_exceeded\n";
645    exit(0);
646 }
647 Tcl_SetHashValue(Tcl_CreateHashEntry(&attr_hashfunc,name, &present),(char *)numfunctors-1);
648 Tcl_SetHashValue(Tcl_CreateHashEntry(&attr_hashint,name, &present),(char *)n);
649 }
```

```
650
651  interpreter::interpreter( ) {
652  Tcl _InitHashTable(&sched_hash,TCL_STRING_KEYS);
653  Tcl _InitHashTable(&doubles_hash,TCL_STRING_KEYS);
654  Tcl _InitHashTable(&attr_hashfunc,TCL_STRING_KEYS);
655  Tcl _InitHashTable(&attr_hashint,TCL_STRING_KEYS);
656  numfunctors= 0;
657  traces[0] = &trace0, tracedqueue[0] = &nilFB;
658  traces[1] = &trace1, tracedqueue[1] = &nilFB;
659  traces[2] = &trace2, tracedqueue[2] = &nilFB;
660  traces[3] = &trace3, tracedqueue[3] = &nilFB;
661  traces[4] = &trace4, tracedqueue[4] = &nilFB;
662  traces[5] = &trace5, tracedqueue[5] = &nilFB;
663  traces[6] = &trace6, tracedqueue[6] = &nilFB;
664  traces[7] = &trace7, tracedqueue[7] = &nilFB;
665  }
666
667  void interpreter::add(sysgen &s) {
668  int present;
669  Tcl_SetHashValue(Tcl_CreateHashEntry(&sched_hash, s.get name( ), &present), (char *) &s);
670  }
671
672  void interpreter::go(intargc,char **argv) {
673  #ifdef MAKE_WISH
674  Tk_Main(argc,argv, AppInit);
675  #else
676  Tcl_Main(argc,[001b][001b][001b]argv, AppInit);
677  #endif
678
679  }
680
681
```

5.3 driver/sys.cxx

```
 1  // sys.cxx
 2  // All rights reserved -- Imec 1998
 3  // @(#)sys.cxx 1.5 98/03/31
 4
 5  #include "qlib.h"
 6  #include "hshake.h"
 7  #include "driver.h"
 8  #include "sys.h"
 9
10  double glbQPSK = 0. ; // for QPSK -> 1
11  double glbDiff = 0. ; // for Diff Enc-> 1
12  double glbT1 = 0. ;
13  double glbT2 = 0. ;
14  double glbT3 = 0. ;
15  double glbT20 = 0. ;
16  double glbNoiseLevel= 0. ;
17  double glbADWbits = 10. ;
18  double glbADLbits = 6. ;
19
20  int main(int argc, char **argv) {
21
22  LOADTYPES( ../rx/TYPEDEF);
23
24  //global synchronous clock
25  clkck;
26
27  //--------------------------------------------------
28  //
29  //byte source
30  //
31  FBQ( tx _bytes ) ;
32  pseudorn _gen GEN_RN("gen_rx",
33      tx_bytes);
34
35  sysgen GEN("GEN");
36  GEN << GEN_RN;
37
38  //--------------------------------------------------
39  //
40  //transmitter
41  //
42  FBQ( tx_rnd_bytes) ;
43  FBQ(tx_symbols ) ;
44  FBQ( tx_dif_symbols);
45  FBQ( tx_ival ) ;
```

```
 46  FBQ( tx_qval ) ;
 47  FBQ( tx_sig ) ;
 48  FBQ( tx_sig_quant) ;
 49
 50  rnd TX_RND ("tx_derandm",
 51       tx_bytes,
 52       tx_rnd_bytes);
 53  tuplelize TX_TUPLE("tx_tuple",
 54       tx_rnd_bytes,
 55       tx_symbols,
 56       glbQPSK);
 57  diffenc TX_DIFFE("tx_diffe",
 58       tx_symbols,
 59       tx_dif_symbols,
 60       glbQPSK,
 61       glbDiff);
 62  map TX_MAP ("tx_map",
 63       tx_dif_symbols,
 64       tx_ival,
 65       tx_qval,
 66       glbQPSK);
 67  shape TX_SHAPE("tx_shape",
 68       tx_ival,
 69       tx_qval,
 70       tx_sig);
 71  ad TX_AD ("tx_ad",
 72       tx_sig,
 73       tx_sig_quant,
 74       glbADWbits,
 75       glbADLbits);
 76
 77  sysgen TX("TX");
 78  TX << TX_RND;
 79  TX << TX_TUPLE;
 80  TX << TX_DIFFE;
 81  TX << TX_MAP;
 82  TX << TX_SHAPE;
 83  TX << TX_AD;
 84
 85  //-----------------------------------------------------
 86  //
 87  //channel
 88  //
 89  FBQ( chan_isi);
 90  FBQ(chan_out);
 91
 92  fir CHAN_FIR("chan_fir",
 93       tx_sig_quant,
 94       chan_isi,
 95       glbT1,
 96       glbT2,
 97       glbT3,
 98       glbT20);
 99
100  noise CHAN_NOISE("chan_noise",
101       chan_isi,
102       chan_out,
103       glbNoiseLevel);
104
105  sysgen CHAN("CHAN");
106  CHAN << CHAN_FIR;
107  CHAN << CHAN_NOISE;
108
109  -----------------------------------------------------
110  //
111  //receiver
112  //
113  FBQ(rx_constel_mode);
114  FBQ(rx_lms_i);
115  FBQ(rx_lms_q);
116  FBQ(rx_symtype);
117  lmsff RX_LMSFF("lmsff",
118       ck,
119       rx_constel_mode,
120       chan_out,
121
122       rx_lms_i,
123       rx_lms_q,
124       rx_symtype
```

```
125        );
126
127 RX_LMSFF.setAttr (lmsff::FWLENGTH, 8 ) ;
128 RX_LMSFF.setAttr (lmsff::STEP_PAR, 4 ) ;
129 RX_LMSFF.setAttr (lmsff::P0, -0.2*2.0);
130 RX_LMSFF.setAttr (lmsff::P1, 0.7*2.0);
131 RX_LMSFF.setAttr (lmsff::P2, 0.7*2.0);
132 RX_LMSFF.setAttr (lmsff::P3, -0.2*2.0);
133 RX_LMSFF.setAttr (lmsff::REF, 3.0 ) ;
134 RX_LMSFF.setAttr (lmsff::INIT ) ;
135 RX_LMSFF.setAttr (lmsff::SPS_PAR, 4 ) ;
136
137 FBQ(rx_symtype_at);
138 FBQ( rx_diff_mode);
139 FBQ(rx_symbol);
140 demap RX_DEMAP("demap",
141        ck,
142        rx_symtype,
143        rx_diff_mode,
144        rx_lms_i,
145        rx_lms_q,
146
147        rx_symtype_at,
148        rx_symbol
149        ) ;
150
151 RX_DEMAP.setAttr (demap::DEBUGMODE,0);
152 RX_DEMAP.setAttr (demap::REF,3.0);
153
154 FBQ( rx_syncro);
155 FBQ( rx_byte _rnd);
156 detupleRX_DETUPLE("detuple",
157        ck,
158        rx_symbol,
159        rx_symtype _at,
160
161        rx_byte _rnd,
162        rx_syncro
163        ) ;
164
165 RX_DETUPLE.setAttr (detuple:D:EBUGMODE,0);
166
167 FBQ( rx_byte_out);
168 FBQ( rx_sync_out);
169 derandRX_DERAND("derand",
170        ck,
171        rx_byte_rnd,
172        rx_syncro,
173
174        rx_byte_out,
175        rx_sync_out
176        ) ;
177
178 RX_DERAND.setAttr (derand::DEBUGMODE,0 ) ;
179 RX_DERAND.setAttr (derand::SEED, 0x3f);
180 RX_DERAND.setAttr (derand::BYPASS, 0 ) ;
181
182 sysgen RX_UT("RX_UT");
183 RX_UT << RX_LMSFF;
184 RX_UT << RX_DEMAP;
185 RX_UT << RX_DETUPLE;
186 RX_UT << RX_DERAND;
187
188 //-----------------------clocktrue definition
189 handshake hsk1("h1",ck);
190 handshake hsk2("h2",ck);
191 handshake hsk3("h3",ck);
192
193 rx_lms_i.sethandshake(hsk1);
194 rx_symbol.sethandshake(hsk2);
195 rx_byte_rnd.sethandshake(hsk3);
196
197 RX_LMSFF .define( );
198 RX_DEMAP .define( );
199 RX_DETUPLE.define( );
200 RX_DERAND .define( );
201
202 sysgen RX_TI("RX_TI");
203 RX_TI << RX_LMSFF .fsm( );
```

```
204 RX_TI << RX_DEMAP .fsm( );
205 RX_TI << RX_DETUPLE.fsm( );
206 RX_TI << RX_DERAND .fsm( );
207
208 //--- iopad definition
209 defix T_byte(0,8,0);
210 RX_TI.inpad(chan_out, T(T_sample_lms));
211 RX_TI.inpad(rx_diff_mode, T_bit);
212 RX_TI.inpad(rx_constel_mode,T_bit);
213 RX_TI.outpad(rx_byte_out, T_byte);
214 RX_TI.outpad(rx_sync_out, T_bit);
215
216 //--- insert clear registersstate
217 RX_LMSFF .fsm( ).clear_regs( );
218 RX_DEMAP .fsm( ).clear_regs( );
219 RX_DETUPLE.fsm( ).clear_regs( );
220 RX_DERAND .fsm( ).clear_regs( );
221
222 //---- testbench generator for this clocktrue model
223 RX_LMSFF .fsm( ).tb _enable( );
224 RX_DEMAP .fsm( ).tb _enable( );
225 RX_DETUPLE.fsm( ).tb _enable( );
226 RX_DERAND .fsm( ).tb _enable( );
227 RX_TI .tb _enable( );
228 RX_TI .generate( );
229
230 //--------------------------------------------------------
231 //
232 //interpreter
233 //
234 interpreter P;
235 P << GEN;
236 P << TX;
237 P << CHAN;
238 P << RX_UT;
239 P << RX_TI;
240 P << ck;
241
242 P.observe(glbQPSK,"QPSK" ) ;
243 P.observe(glbT1,"T1" ) ;
244 P.observe(glbT2,"T2" ) ;
245 P.observe(glbT3,"T3" ) ;
246 P.observe(glbT20, "T20" ) ;
247 P.observe(glbNoiseLevel,"NoiseLevel");
248 P.observe(glbADWbits,"ADWbits" ) ;
249 P.observe(glbADLbits,"ADLbits" ) ;
250 P.observe(glbDiff,"DiffEnc" ) ;
251
252 P.ATTRIBUTE(lmsff,RX_LMSFF,FWLENGTH,lmsff_fwlen) ;
253 P.ATTRIBUTE(lmsff,RX_LMSFF,STEP_PAR,lmsff_step) ;
254 P.ATTRIBUTE(lmsff,RX_LMSFF,P0,lmsff_p0 ) ;
255 P.ATTRIBUTE(lmsff,RX_LMSFF,P1,lmsff_p1 ) ;
256 P.ATTRIBUTE(lmsff,RX_LMSFF,P2,lmsff_p2 ) ;
257 P.ATTRIBUTE(lmsff,RX_LMSFF,P3,lmsff_p3 ) ;
258 P.ATTRIBUTE(lmsff,RX_LMSFF,INIT,lmsff_init) ;
259 P.ATTRIBUTE(derand,RX_DERAND,SEED,derand_seed) ;
260 P.ATTRIBUTE(derand,RX_DERAND,BYPASS,derand_bypass);
261
262 P.go(argc,argv);
263
264 }
265
```

5.4 driver/sys.h

```
 1 #indef SYS_H
 2 #define SYS_H
 3
 4
 5 // @(#)sys.h 1.3 98/03/27
 6
 7 #include "Callback2wRet.h"
 8
 9 #define ATTRIBUTE(CLASS,INST,PARM,NAME) \
10 obsAttr(make_callback((Callback2wRet<int,double,int>0*), &INST,CLASS::setAttr), CLASS::PARM,#NAME)
11
12
13 // P.obsAttr(make_callback((Callback2wRet<int,double,int> *), &RX_LMSFF,lmsff::setAttr),lmsff::FWLENGTH,"lmsff_fwlen");
14
15 #define DEBUGQ(A) FBQ(A) ;FBQ(db_##A) ;A.asDup(db_##A);
```

```
16
17  #include "../tx/rnd.h"
18  #include "../tx/tuplelize.h"
19  #include "../tx/diffenc.h"
20  #include "../tx/map.h"
21  #include "../tx/shape.h"
22  #include "../tx/ad.h"
23  #include "../chan/fir.h"
24  #include "../chan/noise.h"
25  #include "../rx/lmsff.h"
26  #include "../rx/demap.h"
27  #include "../rx/detuple.h"
28  #include "../rx/derand.h"
29
30  #endif
```

6 Receiver Code

6.1 rx/demap.h

```
 1  //--------------------------------------------------------
 2  // COPYRIGHT
 3  // =========
 4  //
 5  // Copyright 1996 IMEC, Leuven,Belgium
 6  //
 7  // All rights reserved.
 8  //
 9  //--------------------------------------------------------
10  // Module:
11  // MAP
12  //
13  // Purpose:
14  // Mapping of QAM16/QPSK constellations to symbols @(#)demap.h 1.5 98/03/30
15  //
16  // Author:
17  // Patrick Schaumont/ Radim Cmar
18  //--------------------------------------------------------
19
20  #infdef DEMAP_H
21  #define DEMAP_H
22
23  #include "qlib.h"
24  #ifdef I2C
25  #include "i2c_master.h"
26  #include "i2c_slave.h"
27  #endif
28  #include "macros.h"
29  #include "typedefine.h"
30
31  classdemap : public base{
32  public:
33
34      clk&  _ck;
35  #ifdef I2C
36      i2c_slave _slave;
37  #endif
38      PRT(symtype_in);
39      PRT(diff_mode);
40      PRT(i_in);
41      PRT(q_in);
42      PRT(symtype_out);
43      PRT(symbol_out);
44      ctlfsm _fsm;
45
46  public:
47  enum {DEBUGMODE, REF};
48  enum {QAM16, QPSK};
49      intdebug_mode;
50      double ref;
51
52  demap(char *name,
53        clk& clk,
54        _PRT(symtype_in),
55        _PRT(diff_mode),
56        _PRT(i_in),
57        _PRT(q_in),
58        _PRT(symtype_out),
59        _PRT(symbol_out) ) ;
60
```

```
61    "demap( );
62    int setAttr(intAttr, double v=0);
63    int decide(dfix constel, dfixest);
64    int run( );
65    void define( );
66    ctlfsm & fsm( );
67 #ifdef I2C
68    i2c_slave&slave( );
69 #endif
70
71 };
72
73 #endif
```

6.2 rx/demap.cxx

```
 1 //--------------------------------------------------------
 2 // COPYRIGHT
 3 // =========
 4 //
 5 // Copyright1996 IMEC, Leuven,Belgium
 6 //
 7 // Allrights reserved.
 8 //
 9 //--------------------------------------------------------
10 // Module:
11 // MAP
12 //
13 // Purpose:
14 // Mapping of QAM16/QPSKconstellations to symbols @(#)demap.cxx 1.8 98/0* *4/07
15 //
16 // Author:
17 // Radim Cmar
18 //--------------------------------------------------------
19
20
21 #include "demap.h"
22 #include "trans.h"
23
24 // QAM16
25 static int vIQMap16[4] [4] = {
26 { 15, 14, 10, 11},
27 { 13, 12, 8, 9},
28 { 5, 4, 0, 2},
29 { 7, 6, 1, 3}};
30
31 // QPSK
32 static int vIQMap4 [2] [2] = {
33 { 3, 2}, {1, 0}};
34
35 demap::demap(char *name,
36       clk& clk,
37       _PRT(symtype_in),
38       _PRT(diff_mode),
39       _PRT(i_in),
40       _PRT(q_in),
41       _PRT(symtype_out),
42       _PRT(symbol_out)
43       ) : base(name),
44    _ck(clk),
45 #ifdef I2C
46    _slave(strapp(name,"_i2c_host")),
47 #endif
48    IS_SIG(symtype_in,T_bit),
49    IS_SIG(diff_mode,T_bit),
50    IS_SIG(i_in,T_float),
51    IS_SIG(q_in,T_float),
52    IS_REG(symtype_out,_ck, T_bit),
53    IS_REG(symbol_out,_ck, T_float)
54 {
55    IS _IP(symtype_in);
56    IS _IP(diff_mode);
57    IS _IP(i_in);
58    IS _IP(q_in);
59    IS_OP(symtype_out);
60    IS_OP(symbol_out);
61
62    debug_mode= 0;
63 }
64
```

```
65  demap::"demap( ) {
66  }
67
68  int demap::setAttr(intAttr,double v) {
69     switch(Attr) {
70     case REF:
71     ref=v; break;
72     case DEBUGMODE:
73     debug_mode = (int) v; break;
74     }
75     return 1;
76  }
77
78  //--------------------------------------------------------
79
80  int demap::run( ) {
81
82     int thissym;
83     int ik, qk;
84     int n_ik,n_qk;
85     static int ik_at= 1;
86     static int qk_at= 1;
87
88     if( (FBID(i_in).getSize( ) <1) ||
89        (FBID(q_in).getSize( ) <1) ||
90        (FBID(symtype_in).getSize( ) <1) ||
91        (FBID(diff_mode).getSize( ) <1)
92     )
93     return 0;
94
95  dfix vi = FBID(i_in).get( );
96  dfix vq = FBID(q_in).get( );
97  dfix constel = FBID(symtype_in).get( );
98  dfix diffdec= FBID(diff_mode).getIndex(0);
99
100 int indi = decide(constel,vi);
101 int indq = decide(constel,vq);
102
103 if( constel== QAM16) {
104    thissym= vIQMap16[indi] [indq] ;
105 } else{
106    thissym= vIQMap4[indi] [indq] ;
107 }
108 int thissym0 = thissym;
109
110
111 if( diffdec== 1) {
112    if(conste1 == QAM16) {
113       ik = (thissym>> 3) &1;
114       qk = (thissym>> 2) &1;
115 n_ik=((("(ik^qk))&(ik^ik_at))|((ik^qk)&(qk^qk_at)))&1;
116 n_qk=((("(ik^qk))&(qk^qk_at))|((ik^qk)&(ik^ik_at)))&1;
117    ik_at= ik;
118    qk_at= qk;
119    thissym = (n_ik<<3 ) + (n_qk<< 2) + (thissym & 3);
120
121 } else {
122    ik = (thissym>> 1) &1;
123    qk = (thissym ) & 1;
124 n_ik=((("(ik^qk))&(ik^ik_at))|((ik^qk)&(qk^qk_at)))&1;
125 n_qk=((("(ik^qk))&(qk^qk_at))|((ik^qk)&(ik^ik_at)))&1;
126    ik_at= ik;
127    qk_at= qk;
128    thissym = (n_ik<<1 ) + (n_qk ) ;
129    }
130 }
131
132 if(debug_mode)
133 cout<< "_constel:_"<<constel
134      << "_i:_"<<vi
135      << "_q:_"<<vq
136      << "_thissym0:_"<<thissym0
137      << "_ik:_"<<ik
138      << "_qk:_"<<qk
139      << "_n_ik:_"<<n_ik
140      << "_n_qk:_"<<n_qk
141      << "_thissym:_"<<thissym<<end1;
142
143 FBID(symbol_out) << (thissym);
```

```
144 FBID(symtype_out) << (constel);
145
146 return 1;
147 }
148
149 int demap::decide(dfix constel,dfix est) {
150    double c = ref/3;
151 if(constel== QAM16) {
152    if(est > dfix(2*c))
153    return 3;
154    else if (est > dfix(0))
155    return 2;
156    else if (est > dfix(-2*c))
157    return 1;
158    else
159    return 0;
160 } else{
161    if(est > dfix(0.))
162    return 1;
163    else
164    return 0;
165 }
166 }
167
168 //--------------------------------------------------------
169
170 ctlfsm & demap::fsm( ) {
171    return _fsm;
172 }
173
174 #ifdef I2C
175 i2c_slave & demap::slave( ) {
176    return _slave;
177 }
178 #endif
179
180 void demap::define( ) {
181    int i;
182
183    dfixT_2bit(0,2,0,dfix::tc);
184    dfixT_cnt(0,3,0,dfix::ns) ; // symbol counter upto 4
185    dfixT_symb(0,4,0,dfix::ns) ; // symbol type 0..15
186
187    PORT_TYPE(i_in,T(T_sample_demap) );//user type
188    PORT_TYPE(q_in,T(T_sample_demap) );//user type
189    PORT_TYPE(symbol_out,T_symb);
190
191    FSM(_fsm);
192    INITIAL(rst);
193    STATE(phase1);
194    STATE(phase2);
195    STATE(phase3);
196
197    SIGCK(constelqam, _ck, T_bit);
198    SIGCK(diffdecod, _ck, T_bit);
199    SIGCK(i_inp,_ck, T(T_sample_demap));
200    SIGCK(q_inp,_ck, T(T_sample_demap));
201    SIGW(indi, T_2bit);
202    SIGW(indq, T_2bit);
203    SIGCK(start_frame,_ck, T_bit);
204    _sigarraymaps16("maps",16, &_ck, T_symb);
205    _sigarraymaps4("maps",4, &_ck, T_symb);
206    SIGW(symb0, T_symb);
207    SIGW(symb1, T_symb);
208    SIGW(ik, T_bit);
209    SIGW(qk, T_bit);
210    SIGW(ik _1,T_bit);
211    SIGW(qk_1, T_bit);
212    SIGCK(ik_at,_ck, T_bit);
213    SIGCK(qk_at,_ck, T_bit);
214    SIGW(ak, T_bit);
215    SIGW(bk, T_bit);
216
217 #ifdef I2C
218 for(i = 0; i < 16; i++)
219    _slave.put(&maps16[i] ) ;
220 for(i = 0; i < 4; i++)
221    _slave.put(&maps4[i] ) ;
222 #endif
```

-continued

```
223
224
225 SFG(demap_allways);
226 GET(diff_mode);
227    diffdecod= diff_mode;
228
229
230 SFG(demap_reset);
231    for(i = 0; i < 16; i++)
232    maps16[i] = W(T_symb,vIQMap16[i/4] [i%4] ) ;
233    for(i = 0; i < 4; i++)
234    maps4[i] = W(T_symb,vIQMap4[i/2] [i%2] ) ;
235
236    setv(start_frame,0);
237    setv(ik_at,0);
238    setv(qk_at,0);
239
240
241 SFG(demap_qam16);
242    double c = ref/3;
243    indi= (i_inp<= C(i_inp,-2*c) )c.assign(C(indi,0),
244      (i_inp<= C(i_inp,0.0) ) c.assign(C(indi,1),
245 (i_inp<=C(i_inp,+2*c))c.assign(C(indi,2),C(indi,3))));
246
247    indq= (q_inp<= C(q_inp,-2*c) )c.assign(C(indq,0),
248      (q_inp<= C(q_inp,0.0) )c.assign(C(indq,1),
249 (q_inp<=C(q_inp,+2*c))c.assign(C(indq,2),C(indq,3))));
250
251 symb0=((indi==W(T_2bit, 0))&(indq==W(T_2bit, 0))).cassign(maps16[0],
252 ((indi==W(T_2bit,0))&(indq==W(T_2bit,1))).cassign(maps16[1],
253 ((indi==W(T_2bit,0))&(indq==W(T_2bit,2))).cassign(maps16[2],
254 ((indi==W(T_2bit,0))&(indq==W(T_2bit,3))).cassign(maps16[3],
255 ((indi==W(T_2bit,1))&(indq==W(T_2bit,0))).cassign(maps16[4],
256 ((indi==W(T_2bit,1))&(indq==W(T_2bit,1))).cassign(maps16[5],
257 ((indi==W(T_2bit,1))&(indq==W(T_2bit,2))).cassign(maps16[6],
258 ((indi==W(T_2bit,1))&(indq==W(T_2bit,3))).cassign(maps16[7],
259 ((indi==W(T_2bit,2))&(indq==W(T_2bit,0))).cassign(maps16[8],
260 ((indi==W(T_2bit,2))&(indq==W(T_2bit,1))).cassign(maps16[9],
261 ((indi==W(T_2bit,2))&(indq==W(T_2bit,2))).cassign(maps16[10],
262 ((indi==W(T_2bit,2))&(indq==W(T_2bit,3))).cassign(maps16[11],
263 ((indi==W(T_2bit,3))&(indq==W(T_2bit,0))).cassign(maps16[12],
264 ((indi==W(T_2bit,3))&(indq==W(T_2bit,1))).cassign(maps16[13],
265 ((indi==W(T_2bit,3))&(indq==W(T_2bit,2))).cassign(maps16[14],
266 maps16[15]
267 )))))))))))))) ;
268
269 ik_1= (start_frame).cassign(W(T_bit,0)i,k_at);
270 qk_1= (start_frame).cassign(W(T_bit,0)q,k_at);
271
272 ik = cast(T_bit,symb0>> W(T_cnt,3) ) ;
273 qk = cast(T_bit,symb0>> W(T_cnt,2) ) ;
274 ak = (("(ik ^ qk)) & (ik ^ ik_1) ) | ((ik^qk) & (qk^qk_1));
275 bk = (("(ik ^ qk)) & (qk ^ qk_1) ) | ((ik^qk) & (ik^ik_1));
276    ik_at=ik;
277    qk_at=qk;
278
279    symb1 = (symb0 &W (T_symb,3) ) |
280      ((cast(T_symb,ak) <<W(T_symb,3)) &W(T_symb,8) ) |
281      ((cast(T_symb,bk) <<W(T_symb,2)) &W(T_symb,4) ) ;
282    symbol_out= (diffdecod).cassign(symb1,symb0);
283
284
285 SFG(demap_qpsk);
286    indi= (i_inp< C(i_inp,0))c.assign(C(indi,0), C(indi,1) ) ;
287    indq= (q_inp< C(q_inp,0))c.assign(C(indq,0), C(indq,1) ) ;
288
289 symb0=((indi==W(T_2bit,0))&(indq==W(T_2bit,0))).cassign(maps4[0],
290 ((indi==W(T_2bit,0))&(indq==W(T_2bit,1))).cassign(maps4[1],
291 ((indi==W(T_2bit,1))&(indq==W(T_2bit,0))).cassign(maps4[2],
292 maps4[3]
293    ))) ;
294
295    ik_1= (start_frame).cassign(W(T_bit,0),ik_at);
296    qk_1= (start_frame).cassign(W(T_bit,0),qk_at);
297
298    ik= cast(T_bit,symb0>> W(T_bit,1) ) ;
299    qk = cast(T_bit,symb0);
300    ak = (("(ik ^ qk)) & (ik ^ ik_1) ) | ((ik^qk) & (qk^qk_1));
301    bk = (("(ik ^ qk)) & (qk ^ qk_1) ) | ((ik^qk) & (ik^ik_1));
```

-continued

```
302    ik_at=ik;
303    qk_at=qk;
304
305       symb1 = ((cast(T_symb,ak) <<W(T_symb,1)) & W(T_symb,2) ) |
306       (cast(T_symb,bk) &W(T_symb,1) ) ;
307    symbol_out= (diffdecod).cassign(symb1,symb0);
308
309
310  SFG(demap_in);
311  GET(i_in);
312  GET(q_in);
313  GET(symtype_in);
314  i_inp=i_in;
315  q_inp=q_in;
316  constelqam= "symtype_in;
317  symtype_out= symtype_in;
318
319  SFG(demap_out);
320  PUT(symbol_out);
321  PUT(symtype_out);
322
323
324  //--------------------------------------------------
325
326  DEFAULTDO(demap_allways);
327  AT (rst) ALLWAYS
328  DO(demap_reset)
329  GOTO(phase1);
330
331  AT (phase1)ALLWAYS
332  DO(demap_in)
333  GOTO(phase2);
334
335  AT (phase2) ON (_cnd(constelqam))
336  DO(demap_qam16)
337  GOTO(phase3);
338
339  AT (phase2)ON ( !_cnd(constelqam))
340  DO(demap_qpsk)
341  GOTO(phase3);
342
343  AT (phase3)ALLWAYS
344  DO(demap_out)
345  GOTO(phase1);
346
347
348  #ifdef I2C
349  _slave.attach(_fsm, *state_phase2,_ck);
350  #endif
351
352  _fsm.setinfo(verbose);
353  ofstream F0("demap_trans0.dot");
354  F0<<_fsm;
355  F0.close( );
356
357  transform TRANSF(_fsm);
358  TRANSF.fsm_handshake1(_ck);
359
360  ofstream F("demap_trans.dot");
361  F << _fsm;
362  F .close( );
363  _fsm.setinfo(silent);
364
365  FSMEXP(typeName( ) ) ;
366  }
367
```

6.3 rx/derand.h

```
 1  //--------------------------------------------------
 2  // COPYRIGHT
 3  // =========
 4  //
 5  // Copyright 1996 IMEC, Leuven,Belgium
 6  //
 7  // All rights reserved.
 8  //
 9  //--------------------------------------------------
10  // Module:
11  // PRBS
```

```
12 //
13 // Purpose:
14 // De-randomises data usinga 6-bit or 15-bit
15 // Pseudo Random Binary Sequence. @(#)derand.h1.2 98/03/30
16 //
17 // Author:
18 // r cmar
19 //
20 //----------------------------------------------------------
21
22 #include "qlib.h"
23 #ifdef I2C
24 #include "i2c_master.h"
25 #include "i2c_slave.h"
26 #endif
27 #include "macros.h"
28 #include "typedefine.h"
29
30 #indef DERAND_H
31 #define DERAND_H
32
33 class derand : public base
34 {
35
36 public:
37    clk & _ck;
38 #ifdef I2C
39    i2c_slave_slave;
40 #endif
41    PRT(byte_in);
42    PRT(syncro);
43    PRT(byte_out);
44    PRT(sync_out);
45    ctlfsm_fsm;
46
47    enum {SEED, BYPASS,DEBUGMODE};
48
49    derand(char *name,
50       clk& clk,
51       _PRT(byte_in),
52       _PRT(syncro),
53       _PRT(byte_out),
54       _PRT(sync_out)
55    ) ;
56
57    setAttr(int Attr, double v=0);
58    int run( );
59    void define( );
60    ctlfsm & fsm( );
61 #ifdef I2C
62    i2c_slave &slave( );
63 #endif
64
65 public;
66 int bypass;
67 int seed;
68 int debug;
69 };
70
71 #endif
```

6.4 rx/derand.cxx

```
1 //----------------------------------------------------------
2 // COPYRIGHT
3 // =========
4 //
5 // Copyright 1996 IMEC, Leuven,Belgium
6 //
7 // Allrights reserved.
8 //
9 //----------------------------------------------------------
10 // Module:
11 // PRBS
12 //
13 // Purpose:
14 // De-randomises data usinga 6-bit or 15-bit
15 // Pseudo Random Binary Sequence.@(#)derand.cxx1.8 98/04/07
16 //
17 // Authors:
```

-continued

```
18 // r cmar
19 //
20 //--------------------------------------------------------
21
22 #include "derand.h"
23 #include "trans.h"
24
25 derand::derand(char *name,
26       clk& clk,
27       _PRT(byte_in),
28       _PRT(syncro),
29       _PRT(byte_out),
30       _PRT(sync_out)
31       ) : base(name),
32    _ck(clk),
33 #ifdef I2C
34    _slave(strapp(name,"_i2c_host")),
35 #endif
36    IS_SIG(byte_in,T_8bit),
37    IS_SIG(syncro,T_bit),
38    IS_REG(byte_out,clk,T_8bit),
39    IS_REG(sync_out,clk,T_bit)
40 {
41    IS_IP(byte_in);
42    IS_IP(syncro);
43    IS_OP(byte_out);
44    IS_OP(sync_out);
45
46    bypass= 0;
47    seed= 0x3f;
48    debug= 0;
49 }
50
51 //--------------------------------------------------------
52
53 int derand::setAttr(int Attr,double v)
54 {
55    switch(Attr)
56    {
57    case SEED:
58    seed= (int)v; break;
59    case BYPASS:
60    bypass = (int)v; break;
61    case DEBUGMODE:
62    debug = (int)v; break;
63    }
64    return 1;
65 }
66
67 //--------------------------------------------------------
68
69 int derand::run( )
70 {
71 static unsigned shiftreg= 0;
72
73 #define BiT(k, n) ((k>> (n-1)) & 1)
74 #define MaSK(k, n) (k & ((1<< (n+1))-1))
75
76 if((FBID(byte_in).getSize( )<1)||F(BID(syncro).getSize( )<1))
77    return 0;
78
79 dfix data _in=FBID(byte _in).get( );
80 dfix sync = FBID(syncro).get( );
81
82 unsigned data = unsigned(data_in.Val( ) ) ;
83
84 if(bypass == 0) {
85
86    if(sync == dfix(1))
87    shiftreg= seed;
88
89    unsigned mask = 0;
90    int xbit;
91    for(int k=0; k<8; k++) {
92    xbit = BiT(shiftreg,5) ^ BiT(shiftreg,6 );
93    shiftreg= MaSK(xbit | (shiftreg<< 1) ,6);
94    mask = (mask<< 1) |xbit;
95    }
96
```

-continued

```
 97     data ^= mask;
 98  }
 99
100  FBID(byte_out) <<dfix((double) (data) ) ;
101  return 1;
102 }
103
104 //--------------------------------------------------------
105
106 ctlfsm & derand::fsm( ) {
107  return _fsm;
108 }
109
110 #ifdef I2C
111 i2c_slave & derand::slave( ) {
112  return _slave;
113 }
114 #endif
115
116 void derand::define( ) {
117
118  dfix T_byte(0,8,0,dfix::ns);
119  dfix T_sreg(0,16,0,dfix::ns);
120  dfix T_num(0,4,0,dfix::ns) ; // to express constants 0..15
121
122  PORT_TYPE(byte_in,T_byte) ; // 8 bits
123  PORT_TYPE(byte_out,T_byte) ; // 8 bits
124
125  SIGW(mask, T_byte) ; // 8 bits
126  SIGCK(shiftreg, _ck, T_sreg) ; // 16 bits
127  SIGCK(seed, _ck, T_sreg) ; // 16 bits
128  SIGCK(bypass, _ck, T_bit);
129  _sigarray xbits("xbits",8+1, T_bit);
130  _sigarray shifts("shifts",8+1,T_sreg);
131  _sigarry masks("masks",8+1, T_byte);
132
133 #ifdef I2C
134  _slave.put(&seed);
135  _slave.put(&bypass);
136 #endif
137
138  FSM( _fsm);
139  INITIAL(rst);
140  STATE(phase1);
141  STATE(phase2);
142
143  SFG( rnd_reset);
144  byte_out=W(T_byte,0);
145  seed = W(T_sreg,0x3f);
146  sync_out=W(T_bit,0);
147  bypass = W(T_bit,0);
148  shiftreg= W(T_sreg,0);
149
150
151  SFG(rnd_read);
152  GET(byte_in);
153  GET(syncro);
154
155
156 #define BIT(s,k) cast(T_bit,s>> W(T_num,k-1))
157 #define MASK(s,n) (s& W (T_sreg,(1<< (n+1))-1))
158
159  SFG(rnd_prbs6);
160
161  shifts[0]= (syncro==W(T_bit,1)).cassign(seed,shiftreg);
162
163  masks[0] =W(T_byte,0);
164  for(int k=0; k<8; k++) {
165    xbits[k] = BIT(shift[k]s,5) ^ BIT(shifts[k],6);
166  shifts[k+1]=MASK((cast(T_sreg,xbits[k])&W(T_sreg,1))|shifts[k]W<<(T_num,1)),6);
167  masks[k+1]=(masks[k]<<W(T_byte,1))|(cast(T_byte,xbits[k])&W(T_byte,1));
168  }
169  shiftreg= shifts[8] ;
170  mask = masks[8] ;
171
172  byte_out= (bypass).cassign(byte_in,byte_in^mask);
173  sync_out=W(T_bit,1);
174
175
```

-continued

```
176 SFG( rnd __write);
177 PUT(byte__out);
178 PUT(sync__out);
179 sync__out=W(T__bit,0);
180
181
182 //---------------------------------------------------------
183
184 AT (rst)ALLWAYS
185 DO( rnd__reset)
186 GOTO(phase1);
187
188 AT (phase1)ALLWAYS //state << cond <<sfg <<sfg <<state
189 DO(rnd__read) //phase1<<allways<<rnd__read <<rnd__prb6<<phase2
190 DO(rnd__prbs6)
191 GOTO(phase2);
192
193 AT (phase2)ALLWAYS
194 DO rnd__write)
195 GOTO(phase1);
196
197 #ifdef I2C
198 __slave.attach(__fsm, *state__phase2,__ck);
199 #endif
200
201 __fsm.setinfo(verbose);
202 ofstream F0("derand__trans0.dot");
203 F0<< __fsm;
204 F0.close( );
205
206 transform TRANSF(__fsm);
207 TRANSF.fsm__handshake1(__ck);
208
209 ofstream F("derand__trans.dot");
210 F << __fsm;
211 F .close( );
212 __fsm.setinfo(silent);
213
214 FSMEXP(typeName( ) ) ;
215 }
216
```

6.5 rx/detuple.h

```
 1 //---------------------------------------------------------
 2 // COPYRIGHT
 3 // =========
 4 //
 5 // Copyright 1996 IMEC, Leuven,Belgium
 6 //
 7 // All rights reserved.
 8 //
 9 //---------------------------------------------------------
10 // Module:
11 // TUPLE
12 //
13 // Purpose:
14 //header detection + detuplelization @(#)detuple.h 1.2 8/03/30
15 //
16 // Author:
17 // Radim Cmar
18 //---------------------------------------------------------
19
20 #infdef DETUPLE__H
21 #define DETUPLE__H
22
23 #include "qlib.h"
24 #include "macros.h"
25 #include "typedefine.h"
26
27 class detuple : public base{
28 public:
29
30 clk& __ck;
31 PRT(symbol);
32 PRT(symtype);
33 PRT(byte);
34 PRT(syncro);
35 ctlfsm__fsm;
36
```

```
37  int debug_mode;
38
39 public:
40  enum {DEBUGMODE};
41  enum {QAM16, QPSK};
42
43  detuple(char *name,
44      clk& clk,
45      _PRT(symbol),
46      _PRT(symtype),
47      _PRT(byte),
48      _PRT(syncro)
49      ) ;
50
51  "detuple( );
52  int setAttr(intAttr, doublev=0);
53  int run( );
54  void define( );
55  ctlfsm & fsm( );
56 };
57
58 #endif
```

6.6 rx/detuple.cxx

```
 1 //----------------------------------------------------------
 2 // COPYRIGHT
 3 // =========
 4 //
 5 // Copyright 1996 IMEC, Leuven,Belgium
 6 //
 7 // All rights reserved.
 8 //
 9 //----------------------------------------------------------
10 // Module:
11 // TUPLE
12 //
13 // Purpose:
14 //header detection + detuplelization @(#)detuple.cxx1.3 98/04/07
15 //
16 // Author:
17 // Radim Cmar
18 //----------------------------------------------------------
19
20
21 #include "detuple.h"
22 #include "trans.h"
23
24 detuple::detuple(char *name,clk& clk,
25      _PRT(symbol),
26      _PRT(symtype),
27      _PRT(byte),
28      _PRT(syncro)
29      ) : base(name),
30   _ck(clk),
31   IS_SIG(symbol,T_4bit),
32   IS_SIG(symtype,T_bit),
33   IS_REG(byte,_ck, T_8bit),
34   IS_REG(syncro,_ck, T_bit)
35 {
36   IS_IP(symbol),
37   IS_IP(symtype);
38   IS_OP(byte);
39   IS_OP(syncro);
40
41   debug_mode= 0;
42 }
43
44
45 detuple::"detuple( ) {
46 }
47
48
49 int detuple::setAttr(intAttr,double v) {
50   switch(Attr) {
51   case DEBUGMODE:
52   debug_mode = (int)v; break;
53   }
54   return 1;
55 }
```

```
56
57
58  static int QAM16_sync[ ] = {0,0,5,5,0,0,5,5 };
59       static int QPSK_sync[ ]= {0,0,0,0,1,1,1,1,0,0,0,0,1,1,1,1};
60  static int QAM16_headlen= 8 ;
61  static int QPSK_headlen= 16;
62
63
64  int detuple:r:un( ) {
65      int i;
66
67      static int tuplcnt= 0;
68      static int corrcnt= 0;
69      static int sync = 0;
70      static dfix oldstype= 0;
71      static dfix corrarr[16] ;
72      static dfix tuplarr[4] ;
73
74      int headlen;
75      int symbcount;
76      dfix tuple;
77
78  if((FBID(symbol).getSize( )<1)||(FBID(symtype).getSize( ) <1))
79      return 0;
80
81      dfix symb = FBID(symbol).get( );
82      dfix stype = FBID(symtype).get( );
83
84      if(stype == QAM16){ //length of header depends on QAM16/APSK constel
85      headlen= QAM16_headlen;
86      symbcount= 2;
87  }
88  else{
89      headlen= QPSK_headlen;
90      symbcount= 4;
91  }
92
93      if( corrcnt== headlen) {
94
95      int equal = 1; // search for header
96      for(i = 0; i < headlen;i++) {
97      if(stype == QAM16)
98      equal = equal &( corrarr[i] ==QAM16_sync[headlen-1-i]);
99      else
100 equal = equal &( corrarr[i] ==QPSK_sync[headlen-1-i]);
101 }
102
103 if(equal) { // header appeared
104
105 if(stype == QAM16) //flush tuplarr (evenif not complete)
106 tuple = tuplarr[0] + tuplarr[1]*16;
107 else
108 tuple=tuplarr[0]+tuplarr[1]*4+tuplarr[2]*16+tuplarr[3]*64;
109 FBID(byte) << (tuple);
110 FBID(syncro) << (sync);
111
112 sync = 1; // indicates start of frame
113 corrcnt= 1;
114 tuplcnt= 0;
115 }
116 else{ // normal processing
117
118 if(tuplcnt== symbcount) {
119 if (stype== QAM16)
120 tuple = tuplarr[0] +tuplarr[1]*16;
121 else
122 tuple=tuplarr[0]+tuplarr[1]*4+tuplarr[2]*16+tuplarr[3]*64;
123 FBID(byte) << (tuple);
124 FBID(syncro) << (sync);
125
126     sync = 0;
127     tuplcnt = 1;
128     }
129     else
130     tuplcnt++;
131     }
132 }
133 else
134     corrcnt++;
```

```
135
136 for(i = symbcount-1; i> 0 ;i--)
137     tuplarr[i] =tuplarr[i-1] ;
138 tuplarr[0] =corrarr[headlen-1]; //shift out the oldest symbol
139
140 for(i = headlen-1; i> 0 ;i--) // shift in new symbol
141     corrarr[i] =corrarr[i-1] ;
142 corrarr[0] =symb;
143
144 if( oldstype?= stype) { //QPSK/QAM16 change
145     corrcnt= 0;
146     tuplcnt= 0;
147 }
148 oldstype= stype;
149
150 return 1;
151 }
152
153
154 //--------------------------------------------------------
155
156 ctlfsm & detuple::fsm( ) {
157 return __fsm;
158 }
159
160 void detuple:d:efine( ) {
161 int i;
162
163 int headlen__qam = 8;
164 int headlen __qpsk= 16;
165 int symbcount__qam = 2;
166 int symbcount__qpsk= 4;
167 #define max(a,b) ((a> b) !a : b)
168
169 dfix T__cnt(0,5,0,dfix: :ns) ; // symbol counter upto 32
170 dfix T__symb(0,4,0,dfix: :ns) ; // symbol type 0..15
171 dfix T__tuple(0,8,0,dfix:n:s);
172
173 FSM( __fsm);
174 INITIAL(rst);
175 STATE(phase1);
176 STATE(phase2);
177 STATE(phase3);
178 STATE(phase4);
179
180 SIGCK(qamtype, __ck, T__bit);
181 SIGCK(old__qamtype, __ck, T__bit);
182 SIGCK(symbol __reg,__ck, T__symb);
183
184 SIGCK(iniphase, __ck, T__bit);
185 SIGCK(correlated, __ck, T__bit);
186 SIGCK(tuple__ready,__ck, T__bit);
187
188 SIGCK(corrcnt, __ck, T__cnt) ;
189 SIGCK(tuplcnt, __ck, T__cnt) ;
190
191 SIGCK(byte, __ck, T__tuple) ;
192 SIGW(tuple__qam, T__tuple) ;
193 SIGW(tuple__qpsk, T__tuple) ;
194
195 __sigarray tuplarr("tarr",max(symbcount__qam,symbcount__qpsk), &__ck,T__symb) ;
196 __sigarray corrarr("carr",max(headlen__qam,headlen__qpsk), &__ck,T__symb) ;
197 __sigarray ref("ref", max(headlen__qam,headlen__qpsk)T,__symb) ;
198 __sigarray equal("equal",max(headlen__qam,headlen__qpsk),T__bit) ;
199
200 //--------------------------------------------------------
201
202 SFG( tupler__reset) ;
203     setv(corrcnt,0) ;
204     setv(tuplcnt,0) ;
205     setv(old__qamtype,1) ;
206     setv(syncro,0) ;
207
208 SFG( tupler__read) ;
209     GET(symbol) ;
210     GET(symtype) ;
211     symbol__reg=symbol;
212     qamtype = "symtype;
213
```

-continued

```
214
215 SFG( tupler_test) ;
216 iniphase= ((qamtype) & (corrcnt!=W(T_cnt, headlen_qam)))
217 | (("qamtype") & (corrcnt!=W(T_cnt,headlen_qpsk))) ;
218
219 tuple_ready=(qamtype).cassign(tuplcnt==W(T_cnt,symbcount_qam),
220 tuplcnt==W(T_cnt,symbcount_qpsk)) ;
221
222
223 SFG( tupler _corr) ;
224    for(i= 0; i < max(headlen_qam,headlen_qpsk) ; i++) {
225    int iqam = (headlen_qam-1-i< 0) ? 0 : headlen_qam-1-i;
226    int iqpsk = headlen _qpsk-1-i;
227 ref[i] = (qamtype).cassign(W(T_symb,QAM16_sync[iqam]) ,
228 W(T_symb, QPSK_sync[iqpsk] ) ) ;
229    if(i == 0)
230       equal[i] = (corrarr[i] ==ref[i] ) ;
231    else
232       equal[i] = equal [i-1] & (corrarr[i] ==ref[i] ) ;
233 }
234 correlated=(qamtype).cassign(equal[headlen_qam-1],equal[headlen_qpsk-1] ) ;
235
236
237
238 SFG(tupler_compose) ;
239    tuple_qam= (cast(T_tuple,tuplarr[0] ) &W(T_tuple,15))
240       |((cast(T_tuple,tuplarr[1] )W&(T_tuple,15))<<W(T_cnt,4) ) ;
241
242    tuple_qpsk=(cast(T_tuple,tuplarr[0] & W(T_tuple,3))
243       | ((cast(T_tuple,tuplarr[1] )& W(T_tuple,3))<<W(T_cnt,2))
244       | ( (cast(T_tuple,tuplarr[2] )& W(T_tuple,3))<<W(T_cnt,4))
245 |( ( cast(T_tuple,tuplarr[3] )& W(T_tuple,3))<<W(T_cnt,6)) ;
246
247    byte= (qamtype).cassign(tuple_qam,tuple_qpsk) ;
248
249    tuplcnt= (correlated).cassign(W(T_cnt,0-1),
250       (tuple_ready).cassign(W(T_cnt,1-1),
251       tuplcnt)) ;
252
253    corrcnt= (correlated).cassign(W(T_cnt, 1-1),
254       corrcnt) ;
255
256
257 SFG(tupler_out) ;
258    PUT(byte) ;
259    PUT(syncro) ;
260    syncro= correlated;
261
262
263 SFG(tupler_shiftin ) ;
264       for(i = 1; i < max(symbcount_qam,symbcount_qpsk) ;i++)
265       tuplarr[i] =tuplarr[i-1] ;
266    tuplarr[0]=(qamtype).cassign(corrarr[headlen_qam-1],corrarr[headlen_qpsk-1] ) ;
267
268    for(i = max(headlen_qam,headlen_qpsk)-1;i> 0 ;i--)
269       corrarr[i] =corrarr[i-1];
270    corrarr[0] =symbol_reg;
271
272
273
274 SFG(tupler_finish_qam) ;
275    corrcnt= (old_qamtype!= qamtype).cassign(W (T_cnt,0),
276    (corrcnt== W(T_cnt,headlen_qam)).cassign(corrcnt,
277       corrcnt+ W(T_cnt,1) ) ) ;
278    tuplcnt= (old_qamtype!= qamtype).cassign(W (T_cnt,0),
279       (correlated).cassign(W(T_cnt,0),
280       (corrcnt !=W(T_cnt,headlen_qam)).cassign(tuplcnt,
281 (tuplcnt==W(T_cnt,symbcount_qam)).cassign(W(T_cnt,1),
282    tuplcnt+ W (T_cnt,1) ) ) ) ) ;
283    old_qamtype= qamtype;
284
285 SFG( tupler_finish_qpsk) ;
286    corrcnt= (old_qamtype!= qamtype).cassign(W (T_cnt,0),
287 (corrcnt==W(T_cnt,headlen_qpsk)).cassign(corrcnt,
288    corrcnt+W (T_cnt,1) ) ) ;
289    tuplcnt= (old_qamtype!= qamtype).cassign(W (T_cnt,0),
290       (correlated).cassign(W(T_cnt,0),
291 (corrcnt !=W(T_cnt,headlen_qpsk)).cassign(tuplcnt,
292 (tuplcnt==W(T_cnt,symbcount_qpsk)).cassign(W(T_cnt,1),
```

-continued

```
293        tuplcnt+ W (T_cnt,1) ) ) ) ) ;
294     old_qamtype= qamtype;
295
296 //--------------------------------------------------------
297
298  AT (rst)ALLWAYS
299     DO(tupler_reset)
300     GOTO(phase1) ;
301
302  AT (phase1)ALLWAYS
303     DO(tupler_read)
304     DO( tupler_test)
305     DO( tupler_corr)
306     GOTO(phase2) ;
307
308  AT (phase2)ON(_cnd(iniphase)||(_!cnd(correlated)&& !_cnd(tuple_ready)))
309     GOTO(phase4) ;
310
311  AT (phase2)ON ( !_cnd(iniphase) && _cnd(correlated))
312     DO(tupler_compose)
313  GOTO(phase3) ;
314
315  AT (phase2)ON ( !_cnd(iniphase) && _cnd(tuple_ready) && !_cnd(correlated) )
316     DO(tupler_compose)
317     GOTO(phase3) ;
318
319  AT (phase3)ALLWAYS
320     DO(tupler_out)
321     GOTO(phase4) ;
322
323  AT (phase4)ON (_cnd(qamtype))
324     DO(tupler_shiftin)
325     DO(tupler_finish_qam)
326     GOTO(phase1) ;
327
328  AT (phase4)ON (!_cnd(qamtype) )
329     DO(tupler_shiftin)
330     DO(tupler_finish_qpsk)
331     GOTO(phase1) ;
332
333     _fsm.setinfo(verbose) ;
334     ofstream F0("detuple_trans0.dot") ;
335     F0<< _fsm;
336     F0.close( ) ;
337
338     transform TRANSF(_fsm) ;
339  TRANSF.fsm_handshake1(_ck) ;
340
341     ofstream F("detuple_trans.dot") ;
342  F << _fsm;
343  F .close( ) ;
344  _fsm.setinfo(silent) ;
345
346  FSMEXP(typeName( ) ) ;
347
348  }
349
6.7 rx/lmsff.h 1
  2  // Author:Radim Cmar
  3  // Purpose:ADAPTIVE EQUALIZER(LMS) @(#)lmsff.h 1.4 98/03/30
  4
  5  #infdef LMS_H
  6  #define LMS_H
  7
  8  #include "qlib.h"
  9  #ifdef I2C
 10  #include "i2c_master.h"
 11  #include "i2c_slave.h"
 12  #endif
 13  #include "macros.h"
 14  #include "typedefine.h"
 15
 16  class lmsff: public base{
 17
 18  public:
 19     clk & _ck;
 20  #ifdef I2C
```

```
21    i2c_slave _slave;
22 #endif
23    PRT(constel_mode) ;
24    PRT(in_sample) ;
25    PRT(out_i) ;
26    PRT(out_q) ;
27    PRT(symtype) ;
28    ctlfsm _fsm;
29
30    int constel _type; //QAM16or QPSK
31    intSPS: // samples per symbol
32    intCPS; // cycles per sample
33    intNF; // forward taps
34    intSTEP; // step adaptation constant
35    double p0,p1,p2,p3;
36    double ref;
37
38 public;
39       enum { SPS_PAR, FWLENGTH,STEP_PAR, INIT, P0,P1,P2,P3,REF };
40       enum { QAM16, QPSK };
41
42    lmsff(char *name,
43       clk & clk,
44       _PRT(constel_mode),
45       _PRT(in_sample),
46       _PRT(out_i),
47       _PRT(out_q),
48       _PRT(symtype)
49       ) ;
50
51    int setAttr(int Attr, double v=0) ;
52    int run( ) ;
53    void define( ) ;
54    ctlfsm &fsm( ) ;
55 #ifdef I2C
56    i2c_slave &slave( ) ;
57 #endif
58
59    //untimed mode
60    dfix decide(dfix constel, dfix est) ;
61    dfix coefi [111] ;
62    dfix coefq [111] ;
63    dfix sample [111] ;
64
65 };
66
67 #endif
6.8 rx/lmsff.cxx 1
2 // Author:Radim Cmar
3 // Purpose:ADAPTIVE EQUALIZER(LMS) @(#)lmsff.cxx 1.18 98/04/07
4
5 #include "lmsff.h"
6 #include <math.h>
7 #include "trans.h"
8
9 lmsff::lmsff(char *name,
10       clk & clk,
11       _PRT(constel_mode),
12       _PRT(in_sample),
13       _PRT(out_i),
14       _PRT(out_q),
15       _PRT(symtype)
16       ) : base(name),
17    _ck(clk),
18 #ifdef I2C
19       _slave(strapp(name,"_i2c_host")),
20 #endif
21       IS_SIG (constel_mode, T_bit),
22       IS_SIG (in_sample, T_float),
23       IS_REG (out_i,_ck, T_float),
24       IS_REG (out_q, _ck, T_float),
25       IS_REG (symtype, _ck, T_bit)
26 {
27    IS_IP(constel_mode) ;
28    IS_IP(in_sample) ;
29    IS_OP(out_i) ;
30    IS_OP(out_q) ;
```

```
31    IS_OP(symtype) ;
32
33    SPS = 4;
34    STEP = 4;
35    NF = 8;
36    ref = 3.0;
37 }
38
39 int lmsff::setAttr(int Attr,double v) {
40    switch(Attr) {
41    case SPS_PAR : // parametrizable only for untimed model
42    SPS = (int) v;
43    break;
44    case FWLENGTH :
45    NF = (int) v;
46    break;
47    case STEP_PAR :
48    STEP = (int) v;
49    break;
50    case P0:
51    p0 = v;
52    break;
53    case P1:
54    p1 = v;
55    break;
56    case P2:
57    p2 = v;
58    break;
59    case P3:
60    p3 = v;
61    break;
62    case REF:
63    ref= v;
64    break;
65    case INIT :
66       cerr<< "***_INFO:_LMSFF_equalizer_reset\n";
67       for(int i =0; i< NF; i++) {
68       sample[i] = dfix(0) ;
69       coefi[i] = dfix(0) ;
70       coefq[i] = dfix(0) ;
71    }
72       int offs = (NF−4)/2;
73       coefq[offs+ 0] = p0;
74       coefi[offs+ 1] = p1;
75       coefq[offs+ 2] = p2;
76       coefi[offs+ 3] = p3;
77    break;
78 }
79    return 1;
80 }
81
82 //-------------------------------------------------------
83
84 int lmsff::run( ) {
85 int i;
86 dfix acci,accq, equali, equalq,esti, estq, erri,errq;
87
88 if((FBID(in_sample).getSize( )<SPS) || (FBID(constel_mode).getSize( )1<))
89    return 0;
90
91 dfix constel= FBID(constel_mode).getIndex(0) ;
92 dfix step = 1.0/pow(2.0,STEP) ;
93
94 // ---ff filtering---
95 acci= 0;
96 accq= 0;
97 for(i = 0; i < NF ; i++) {
98    acci= acci + sample[i] * coefi[i] ;
99    accq= accq + sample[i] * coefq[i] ;
100 }
101 equali= acci;
102 equalq= accq;
103
104 // ---output---
105 FBID(out_i) << (equali) ;
106 FBID(out_q) << (equalq) ;
107 FBID(symtype) << (constel) ;
108
109 // ---slicing---
```

```
110  esti= decide(constel, equali) ;
111  estq= decide(constel, equalq) ;
112
113  // ---error evaluation---
114  erri= esti - equali;
115  errq= estq - equalq;
116
117  // ---coefficient adaptation---
118  for(i = 0; i < NF; i++) {
119     coefi[i] =coefi[i] + step* erri * sample[i] ;
120     coefq[i] =coefq[i] + step* errq * sample[i] ;
121  }
122
123  // ---reading in samples---
124  for(i = NF-1; i>= SPS; i--)
125     sample[i] =sample[i-SPS] ;
126  for(i = SPS-1; i>= 0; i--)
127     sample[i] =FBID(in_sample).get( ) ;
128
129  return 1;
130  }
131
132  dfix lmsff::decide(dfix constel,dfix est) {
133     double c = ref/3;
134     if( constel== QAM16) {
135        if(est > dfix(2*c))
136        return dfix(3*c) ;
137        else if (est > dfix(0))
138        return dfix (1*c) ;
139        elseif (est > dfix(-2*c))
140        return dfix (-1*c) ;
141        else
142        return dfix (-3*c) ;
143     } else{
144        if(est > dfix (0.))
145        return dfix (3*c) ;
146        else
147        return dfix (-3*c) ;
148     }
149  }
150
151  //--------------------------------------------------------
152
153  ctlfsm & lmsff::fsm( ) {
154     return _fsm;
155  }
156
157  #ifdef I2C
158  i2c_slave &lmsff::slave( ) {
159     return _slave;
160  }
161  #endif
162
163
164  #define CC(a) cast(accu _type,a)
165     void adder_tree(_sigarray & ops,int 1, int h, _sig&res) {
166     if(h-l+1 > 5) {
167     cerr<< "lmsff_error:_maximum_5_operands_suported\n";
168     exit(1) ;
169  }
170     dfix& accu_type= res.Rep( ) —>getVal ( ) ;
171     switch(h-1+1) {
172        case 0: res = C(res,0) ;break;
173        case 1: res = CC(ops[l] ) ;break;
174        case 2: res = CC(ops[l] +ops[l+1] ) ;break;
175        case 3: res = CC(ops[l] +ops[l+1] ) + CC(ops[l+2] ) ;break;
176        case 4: res = CC( ops[l] +ops[l+1] ) + CC( ops[l+2] +ops[l+3] ) ;break;
177        case 5: res = CC( ops[l] +ops[l+1] ) + CC(CC(ops[l+2] + ops[l+3] ) +CC(ops[l+4] ) ) ;break;
178     }
179  }
180
181     void balance_coefs2(int numcoefs,int numcycles,int*l,int* h){
182     int i,j,k;
183
184     int orig_numcycles=numcycles;
185     if(numcoefs < numcycles)
186        numcycles= numcoefs;
187
188     int paral = numcoefs/numcycles;
```

```
189    int incs= numcoefs-( numcoefs/numcycles) *numcycles;
190
191    for(k = 1; k <= numcycles;k++)
192        l[k] = (k-1)*paral;
193
194    for(i = 1; i <= incs; i++)
195        for(j = i+1; j<= numcycles;j++)
196            l[j]++;
197
198    for(k = 1; k <= numcycles-1;k++)
199        h [k] =l[k+1]-1;
200    h[numcycles] =numcoefs-1;
201
202    for(k = numcycles+1; k<= orig_numcycles;k++) {
203        l[k] =0;
204        h [k] = -1;
205    }
206
207    if(1) {
208    cout<< "lmsff_info:_filter_balancing\n";
209    for(k = 1; k <= orig _numcycles;k++)
210        cout<< l[k] << ":"<< h [k] <<"_";
211    cout<< endl;
212    }
213 }
214
215
216 void lmsff::define( ) {
217
218    if(NF < 6) {
219        cerr<< "lmsff_error:_minimum_6_coefs_required\n";
220        exit(1) ;
221    }
222
223    int i,k,p;
224
225    //SPS . . . . samples per symbolparameter
226    //CPS . . . . cycles per sample(every CPS-phase read sample)
227    //NCYC . . . cycle budget in the loop
228    // F _max_delay . . . extra delay line positions due to read_sample within filtering
229 SPS = 4;
230 CPS = 2;
231    int F_max_delay = 7;
232    int NCYC = SPS*CPS;
233
234    //==distribute filtering operation slices into NCYC-2 cycles =
235
236    int l_f[i1l00] ;
237    int h_f[i1l00] ;
238    int l_upd[100] ;
239    int h_upd[100] ;
240
241    //budget is fixed : 8-2=6cycles
242    //let's have 8 coefs
243    //can be more elaborate(e.g. interleaved slicing)
244    int start_fil = 1 //for filtering to know to store first time
245    int end_fil = 6 ; //for filtering to know to store to I_equal
246 l_fil[1]=0;l_fil[2]=2;l_fil[3]=4;l_fil[4]=5;l_fil[5]=6;l_fil[6]=7;
247 h_fil[1]=1;h_fil[2]=3;h_fil[3]=4;h_fil[4]=5;h_fil[5]=6;h_fil[6]=7;
248 l_upd[1]=0;l_upd[2]=2;l_upd[3]=4;l_upd[4]=5;l_upd[5]=6;l_upd[6]=7;
249 h_upd[1]=1;h_upd[2]=3;h_upd[3]=4;h_upd[4]=5;h_upd[5]=6;h_upd[6]=7;
250        //was example what input we need for parametrizable filter definition
251
252    balance_coefs2(NF,6,l_fil,h_fil) ;
253    balance_coefs2(NF,6,l_upd,h_upd) ;
254
255    // =======definition of signals=======
256
257 PORT_TYPE(in_sample,T(T_sample_lms)) ;
258 PORT_TYPE(out_i,T(T_sample_lms)) ;
259 PORT_TYPE(out_q,T(T_sample_lms)) ;
260
261    dfix T_step(0,5,0,dfix::ns) ;// shifts 0—> 31
262
263    _sigarray Fi_coef("Fi_coef",NF,&_ck,T(T_Fcoef_lms)) ;
264    _sigarray Fq_coef("Fq_coef",NF,&_ck,T(T_Fcoef_lms)) ;
265    _sigarray I_sample("I_sample",NF+F_max_delay, &_ck,T(T_sample_lms)) ;
266    _sigarray Fi_mult ("Fi_mult",NF,T(T_accu_lms)) ;
267    _sigarray Fq_mult ("Fq_mult",NF,T(T_accu_lms)) ;
```

```
268    _sig Fi_sum("Fi_sum",T (T_accu_lms)) ;
269    _sig Fq_sum("Fq_sum",T (T_accu_lms)) ;
270    _sigarray fm_i("fm_i",NF,T(T_accu_lms)) ;
271    _sigarray fm_q("fm_q",NF ,T(T_accu_lms)) ;
272    _sigarray fmult_i("fmult_i",NF,T(T_Fcoef _lms)) ;
273    _sigarray fmult_q("fmult_q",NF,T(T_Fcoef _lms) ) ;
274  SIGCK(I_accu,_ck, T(T_accu_lms) ) ;
275  SIGCK(Q_accu, _ck, T(T_accu_lms)) ;
276  SIGW(I_equal, T(T_accu_lms) ) ;
277  SIGW(Q_equal, T(T_accu_lms)) ;
278  SIGCK(I_error,_ck, T(T_accu_lms)) ;
279  SIGCK(Q_error,_ck, T(T_accu_lms)) ;
280  SIGW( I_slice,T(T_equal _lms)) ;
281  SIGW(Q_slice, T(T_equal _lms)) ;
282  SIGCK(step, _ck, T_step) ;
283  SIGCK(constel, _ck, T_bit) ;
284
285  #ifdef I2C
286    _slave.put(&step) ;
287    for(i = 0; i < NF; i++)
288       _slave.put(&Fi_coef[i] ) ;
289    for(i = 0; i < NF; i++) ;
290       _slave.put(&Fq_coef[i] ) ;
291  #endif
292
293
294  //------------------ definitionof states------------------
295
296    cfsm= &_fsm; // controller handle
297
298    int phi;
299    state* loop_cycle[100] ;
300    state* rst_cycle;
301
302    rst_cycle=new state; // define the state
303  * rst_cycle <<"rst"; // name the state
304  * cfsm<< deflt(*rst_cycle) ;// assign the state to the controller
305
306    for(phi = 1; phi<= NCYC ;phi++) {
307    loop_cycle[phi] =newstate;
308  * loop_cycle[phi] <<strapp("cycle_",phi) ;
309  * cfsm<< *loop_cycle[phi] ;
310  }
311
312  //------------------ definition of sfg's------------------
313
314    sfg* _lms_filt[100] ;
315    sfg* _lms _update _coefs[100] ;
316
317
318  SFG( lms_read_allways) ;
319    GET(constel_mode) ;
320       constel= constel_mode;
321
322
323  SFG( lms_initialize_coefs) ;
324    int offs= (NF-4)/2;
325    Fq_coef[offs+0] =W (T(T_Fcoef_lms) ,p0) ;
326    Fq_coef[offs+1] =W (T(T_Fcoef_lms) ,0) ;
327    Fq_coef[offs+2] =W (T(T_Fcoef_lms) ,p2) ;
328    Fq_coef[offs+3] =W (T(T_Fcoef_lms) ,0) ;
329
330    Fi_coef[offs+0] =W (T(T_Fcoef_lms) ,0) ;
331    Fi_coef[offs+1] =W (T(T_Fcoef_lms) ,p1) ;
332    Fi_coef[offs+2] =W (T(T_Fcoef_lms) ,0) ;
333    Fi_coef[offs+3] =W (T(T_Fcoef_lms) ,p3) ;
334
335    for(i = 0; i < NF; i++) {
336      if((i < offs) && (i> offs+3)) {
337        Fi_coef[i] =W(T(T_Fcoef_lms) ,0) ;
338        Fq_coef[i] =W(T(T_Fcoef_lms) ,0) ;
339      }
340    }
341
342
343  SFG( lms_reset) ;
344    for(i = 0; i < NF+F_max_delay;i++) {
345      I_sample[i] =W(T(T_sample_lms) 0,) ;
346    }
```

-continued

```
347    setv(I_error,0) ;
348    setv(Q_error,0) ;
349    setv(step,STEP) ;
350
351
352  //************ FILTER(1.cycle to 8.cycle) --------*---
353    int delay = 0; int cnt= 0 ;
354    int L,H;
355
356    //no filtering in 1st clockcycle
357    cnt++;if (cnt == CPS) { cnt= 0; delay++; }
358
359
360    for(p = 1; p <= NCYC-2;p++) {
361       REGISTER_SFG(lms_filt,p) ;
362       cnt++; if (cnt== CPS) {cnt = 0; delay++; }
363
364       //---- filter feedforward
365       L = l_fil[p] ;H= h_fil[p] ;
366  for (k = L; k<= H; k++)
367  Fi_mult[k] =cast(T(T_accu_lms) ,Fi_coef[k]I*_sample[k+delay] ) ;
368       if(H >= 0) adder_tree(Fi_mult,L,H,Fi_sum) ;
369
370       for (k = L; k<= H; k++)
371  Fq_mult[k]=cast(T(T_accu_lms) ,Fq_coef[k]*I_sample[k+delay] ) ;
372       if(H >= 0) adder_tree (Fq_mult,L,H,Fq_sum) ;
373
374
375       //---- sum I over start_ff—> end_ff
376       if(p == start_fil) {
377       I_accu= Fi_sum;
378       Q_accu = Fq_sum;
379       }
380       else if ((p > start_fil) && (p< end_fil)) {
381       I_accu= I_accu+ Fi_sum;
382       Q_accu = Q_accu+ Fq_sum;
383       }
384       else if (p == end_fil) {
385       I_accu= I_accu+ Fi_sum;
386       Q_accu = Q_accu+ Fq_sum;
387       I_equal= I_accu+ Fi_sum;
388       Q_equal = Q_accu+ Fq_sum;
389       }
390  } //end for
391
392    //compensate for 1 clockcycle vacancy
393    cnt++;if (cnt == CPS) { cnt= 0; delay++; }
394
395
396    //---------------- UPDATE (1.cycle to 8.cycle) ---------------
397  int STEPSAFE = 4; // safety region for downshifting
398    for(p = 1; p <= NCYC-2;p++) {
399       REGISTER_SFG(lms_update_coefs,p) ;
400       cnt++; if (cnt== CPS) {cnt = 0; delay++; }
401
402       L = l_upd[p] ;H=h_upd[p] ;
403       for (k=L; k<= H; k++)
404       {
405  fm_i[k]=cast(T(T_accu_lms) ,I_sample[k+delay] *I_error) ;
406       vshr(fmult_i[k] ,fm_i[k],step,STEPSAFE) ;
407       Fi_coef[k] =Fi_coef[k] + fmult_i[k] ;
408
409  fm_q[k]=cast(T(T_accu_lms) ,I_sample[k+delay]*Q_error) ;
410       vshr(fmult_q[k],fm_q[k],step,STEPSAFE) ;
411       Fq_coef[k] =Fq_coef[k] +fmult_q[k] ;
412       }
413    }
414
415  SFG(lms_outready) ;
416    out_i=cast(T(T_sample_lms) ,I_equal) ;
417    out_q= cast(T(T_sample_lms) ,Q_equal) ;
418    symtype= constel;
419
420
421  //-----------------------SLICER-----------------------------
422  SFG( lms_slice_and_error) ;
423    double c = ref/3;
424    I_equal=I_accu;
425    Q_equal= Q_accu;
```

```
426
427    I_slice =(constel==W(T_bit,0) )c.assign(
428
429  (I_equal>C(I_equal,+2*c)).cassign(C(I_slice,+3*c),
430  (I_equal>C(I_equal,0*c)).cassign(C(I_slice,+1*c),
431  (I_equal> C(I_equal,-2*c)).cassign(C(I_slice,-1*c),
432  C(I_slice,-3*c))))
433
434  (I_equal> C(I_equal,0*c)).cassign(C(I_slice,+3*c),
435  C(I_slice,-3*c))
436     ) ;
437
438    Q_slice= (constel==W (T_bit,0) )c.assign(
439
440  (Q_equal > C(Q_equal,+2*c)).cassign(C(Q_slice,+3*c),
441  (Q_equal > C(Q_equal,0*c)).cassign(C(Q_slice,+1*c),
442  (Q_equal > C(Q_equal,-2*c)).cassign(C(Q_slice,-1*c),
443  C(Q_slice,-3*c))))
444     ,
445  (Q_equal > C(Q_equal,0*c)).cassign(C(Q_slice,+3*c),
446  C(Q_slice,-3*c))
447     ) ;
448
449    I_error=cast(T(T_accu_lms) , I_slice)-I_equal;
450    Q_error=cast(T(T_accu_lms) , Q_slice)-Q_equal;
451
452
453  //----------------------IO definition------------------------
454  SFG(lms_in) ;
455    GET(in_sample) ;
456      I_sample[0] =in_sample;
457      for(i = NF+F_max_delay-1;i > 0; i--) {
458      I_sample[i] =I_sample[i-1] ;
459      }
460
461  SFG(lms_out) ;
462    PUT(out_i) ;
463    PUT(out_q) ;
464    PUT(symtype) ;
465
466
467  //=======define the fsmfor fixed 8 cycle timebudget=======
468
469    DEFAULTDO(lms_read_allways) ;
470    * rst_cycle ALLWAYS
471      DO(lms_reset)
472      DO(lms_initialize_coefs)
473      << *loop_cycle[1] ;
474
475    * loop_cycle[1]ALLWAYS
476      DO(lms_in)
477      << *_lms_update_coefs[1]
478      << *loop_cycle[2] ;
479
480    * loop_cycle[2]ALLWAYS
481      << *_lms_filt[1]
482      << *_lms_update_coefs[2]
483      << *loop_cycle[3] ;
484
485    * loop_cycle[3]ALLWAYS
486      DO(lms_in)
487      << *_lms_filt[2]
488      << *_lms_update_coefs[3]
489      << *loop_cycle[4] ];
490
491    * loop_cycle[4]ALLWAYS
492      << *_lms_filt[3]
493      << *_lms_update_coefs[4]
494      << *loop_cycle[5] ;
495
496    * loop_cycle[5]ALLWAYS
497      DO(lms_in)
498      << *_lms_filt[4]
499      << *_lms_update_coefs[5]
500      << *loop_cycle[6] ;
501
502    * loop_cycle[6]ALLWAYS
503      << *_lms_filt[5]
504      << *_lms_update_coefs[6]
```

-continued

```
505        << *loop_cycle[7] ;
506
507    * loop_cycle[7]ALLWAYS
508        DO(lms_in)
509        << *_lms_filt[6] // filtering finished—> ready to output
510        DO(lms_outready)
511        << *loop_cycle[8] ;
512
513    * loop_cycle[8]ALLWAYS
514        DO(lms_out)
515        DO(lms_slice_and_error)
516        << *loop_cycle[1] ;
517
518
519    #ifdef I2C
520        _slave.attach(_fsm, *loop_cycle[1],_ck) ;
521    #endif
522
523        _fsm.setinfo(verbose) ;
524        ofstream F0("lmsff_trans0.dot") ;
525        F0 << _fsm;
526        F0 .close( ) ;
527
528        transform TRANSF(_fsm) ;
529        TRANSF.fsm_handshake1(_ck) ;
530
531        ofstream F("lmsff_trans.dot") ;
532        F << _fsm;
533        F .close( ) ;
534        _fsm.setinfo(silent) ;
535
536        FSMEXP (typeName( ) ) ;
537
538    }
539
```

6.9 rx/macros.h

```
 1  // @(#)macros.h1.1 98/01/22
 2
 3  #infdef MACROS_H
 4  #define MACROS_H
 5
 6  // #define max(a,b) (a> b) ?a : b
 7
 8  #include "qlib.h"
 9
10  extern dfix T_bit;
11  extern dfix T_2bit;
12  extern dfix T_4bit;
13  extern dfix T_8bit;
14  extern dfix T_float;
15
16  extern dfix T_Cshift; // type for constant shifter
17  extern dfix* overcast;
18  extern dfix ycast;
19  exern strstream* gstr;
20
21
22  #define PRT(v) FB & _##v; _sigv
23  #define _PRT(v) FB & _##v
24  #define IS_SIG(v,t) _##v(_##v) ,v(#v,t)
25  #define IS_REG(v,c,t) _##v(_##v) ,v(#v,c,t)
26  #define GET(v) IN (v, _##v)
27  #define PUT(v) OUT(v, _##v)
28  #define IS_OP(v) _##v.asSink (this)
29  #define IS_IP(v) _##v.asSource (this)
30  #define FBID(v) _##v
31
32  #define C(y, x) W((y).Rep( )—>getVal( ),x)
33  #define acast (y, x) cast((y).Rep( )—>getVal ( ), ##x)
34
35  #define setv(y,x) y =W (y.Rep( )—>getVal ( ) ,x) ;
36
37  #define REGISTER_SFG(s,i) _##s[i] =new sfg; \
38      _##s[i]—>next= glbListOfSfg; \
39      glbListOfSfg = _##s[i] ; \
40      * _##s[i]<<strapp(strapp(#s,"_"),i) ; \
41      _##s[i]—>starts( ) ; \
42      csfg= _##s[i]
```

```
43
44  #define PORT_TYPE(v,t) v.Rep( )—>dupVal (t) ; \
45    if (v.Rep( )—>isregister( ))v.Rep( )—>dupRegVal (t)
46
47  #define DSIGW(s,n,w) s[n]=new_sig(strapp(strapp(#s,"_"),n),w)
48
49  //----------- constant right-shift (division) -----------
50  //-------------------------------------------------------
51  #define shr(y, x, b) \
52    overcast= new dfix(0, x.Rep( )—>getVal( ).TypeW( )+b,x.Rep( )—>getVal( ).TypeL( )+b) ; \
53    ycast.duplicate(y.Rep( )—>getVal( )) ; \
54    y= cast (ycast, cast(*overcast,x) >> W(T_Cshift,b) ) ; \
55    delete overcast;
56
57  //--------- constant left-shift (multiplication) ---------
58  //-------------------------------------------------------
59  #define shl (y, x, b) \
60    if(x.Rep( )—>getVal( ).isFix( )) \
61      overcast= new dfix(0,x .Rep( )—>getVal( ).TypeW( )+b,x.Rep( )—>getVal( ).TypeL( ) ) ; \
62    else\
63      overcast= new dfix(0) ; \
64    ycast.duplicate(y.Rep( )—>getVal( ) ) ; \
65    y= cast (ycast, cast(*overcast,x) << W(T_Cshift,b) ) ; \
66    delete overcast;
67
68  //----------- variable shifters with safety region --------
69  //-------------------------------------------------------
70  //
71  // description vshl(y,x,e,b) :=:y = x<<e (with 'b' as a safety region)
72  //
73  #define vshl(y, x, e, b) \
74    overcast= new dfix(0, x.Rep( )—>getVal( ).TypeW( )+b,x.Rep( )—>getVal( ).TypeL( ) ) ; \
75    y= acast (y, cast(*overcast,x) << e ) ; \
76    delete overcast;
77
78  #define vshr(y, x, e, b) \
79    if(x.Rep( )—>getVal( ).isFix( )) \
80      overcast= new dfix(0,x .Rep( )—>getVal( ).TypeW( )+b,x.Rep( )—>getVal( ).TypeL( )+b) ; \
81    else\
82      overcast= new dfix(0) ; \
83    y= acast (y, cast(*overcast,x) >> e ) ; \
84    delete overcast;
85
86
87  #endif
88
```

6.10 rx/macros.cxx

```
 1  #include "macros.h"
 2
 3  dfix T_bit(0,1,0,dfix::ns) ;
 4  dfix T_2bit(0,2,0,dfix::tc) ;
 5  dfix T_4bit(0,4,0,dfix::ns) ;
 6  dfix T_8bit(0,8,0,dfix::ns) ;
 7  dfix T_float(0) ;
 8
 9  dfix T_Cshift(0,4,0,dfix:n:s) ;//type for constantshifter 0..15
10  dfix* overcast;
11  dfix ycast;
12  strstream* gstr;
```

6.11 rx/typedefine.cxx

```
 1  #include "typedefine.h"
 2
 3  #include <fstream.h>
 4
 5  typedefine glbTypes;
 6
 7  typedefine::typedefine( ) {
 8    numt= 0;
 9  }
10
11  void typedefine::load(char *_name) {
12    ifstream IF(_name) ;
13
14    if(IF.fail( )) {
15      cerr<<"***_ERROR:_typedefine:_cannot_open_file_"<<_name<<"\n";
16      exit (0) ;
17  }
```

```
 18
 19    while(!IF.eof( ) && !IF.f a(i)l) {
 20    char buf[100] ;
 21    IF >> buf;
 22
 23    if(!strlen(buf))
 24    continue;
 25
 26      if(buf[0] == '/' && buf[1] == '/') {
 27      int endoftype = 0;
 28      while (!endoftype) {
 29    char c;
 30    IF.get(c) ;
 31    endoftype= (c == '\n' ) ;
 32      }
 33      continue;
 34    } else {
 35      name[numt] = new char[strlen(buf) +1] ;
 36      strcpy(name[numt] ,buf) ;
 37      int i;
 38      for (i=0; i<numt; i++)
 39      if(!strcmp(name[i],buf)) {
 40      cerr<<"***_ERROR:_typedefine:_type_"<<buf<<"_defined_twice\n";
 41      exit(0) ;
 42    }
 43    int W,L,repr=dfix::tc,overflow=dfix:e:rr,truncate=dfix:f:1;
 44
 45      IF >> buf;
 46      W = atoi(buf) ;
 47      if(W == 0) {
 48      cerr<<"***_ERROR:_typedefine:_bad_W_for_type_"<<name[numt]<<"\n";
 49      exit(0) ;
 50      }
 51
 52      int endcom = 0;
 53
 54      IF >> buf;
 55      L = atoi(buf) ;
 56      if(buf[strlen(buf)-1] == ';') {
 57    endcom = 1;
 58    buf[strlen(buf)-1] =0;
 59      }
 60      while (1) {
 61      if(endcom)
 62      break;
 63
 64    IF >> buf;
 65
 66      if(buf[strlen(buf)-1] == ';') {
 67      endcom = 1;
 68      buf[strlen(buf)-1] =0 ;
 69    }
 70
 71      if( !strcmp(buf,"ns"))
 72      repr = dfix::ns;
 73      else if (!strcmp(buf,"tc"))
 74      repr = dfix::tc;
 75      else if ( !strcmp(buf,";"))
 76      break;
 77      else if ( !endcom) {
 78    cerr<<"***_ERROR:_typedefine:_"<<name[numt]<<:_bad_repr_"<<buf<<"\n";
 79      exit(0) ;
 80    }
 81
 82
 83      if(endcom)
 84      break;
 85
 86      IF >> buf;
 87
 88      if(buf[strlen(buf)-1] == ';') {
 89      endcom = 1;
 90      buf[strlen(buf)-1] =0 ;
 91    }
 92
 93      if( !strcmp(buf,"wp"))
 94      overflow = dfix::wp;
 95      elseif ( !strcmp(buf,"st"))
 96      overflow = dfix::st;
```

```
 97     elseif ( !strcmp(buf,"er"))
 98       overflow = dfix::err;
 99     elseif ( !strcmp(buf,";"))
100       break;
101     elseif ( !endcom) {
102       cerr<<"***_ERROR:_typedefine:_"<<name[numt]"<<:_bad_ovf_"<<buf<<"\n";
103       exit(0) ;
104     }
105
106     if (endcom)
107       break;
108
109     IF >> buf;
110
111     if(buf[strlen(buf)-1] == ';') {
112       endcom = 1;
113       buf[strlen(buf)-1] =0 ;
114     }
115
116     if( !strcmp(buf,"rd"))
117       truncate = dfix::rd;
118     elseif ( !strcmp(buf,"fl"))
119       truncate = dfix::fl;
120     elseif ( !strcmp(buf,";"))
121       break;
122     elseif ( !endcom) {
123       cerr<<"***_ERROR:_typedefine:_"<<name[numt]"<<:_bad_rnd_"**<buf<<"\n";
124       exit(0) ;
125     }
126
127     if (endcom)
128       break;
129
130     int endoftype = 0;
131     while ( !endoftype) {
132       char c;
133       IF.get(c) ;
134       endoftype = (c== '\n') ;
135     }
136     break;
137   }
138   types[numt].duplicate(dfix(0,W,L,repr,overflow,truncate)) ;
139
140     numt++;
141     if(numt >= MAXT) {
142       cerr<< "***_ERROR:_typedefine_has_too_much_types._increase_MAXT\n";
143       exit(0) ;
144     }
145   }
146 }
147 }
148
149 void typedefine::list( ) {
150   int i;
151
152   for(i=0; i<numt; i++) {
153     cout.width(20) ;
154     cout<< name[i] ;
155
156     cout.width(5) ;
157     cout<< types[i] .TypeW( ) ;
158
159     cout.width(5) ;
160     cout<< types[i] .TypeL( ) ;
161
162     cout.width(4) ;
163     if(types[i] .TypeSign( ) ==dfix::ns)
164       cout << "ns";
165     else
166       cout << "tc";
167
168     cout.width(4) ;
169     if(types[i] .TypeOverflow( ) ==dfix::wp)
170       cout << "wp";
171     elseif (types[i] .TypeOverflow( ) ==dfix::st)
172       cout << "st";
173     else
174       cout << "err";
175
```

```
176       cout.width(4) ;
177       if(types[i] .TypeRound( ) ==dfix::fl)
178         cout << "fl";
179       else
180         cout << "rd";
181
182       cout<< "\n";
183     }
184 }
185
186 static dfix dummy(0) ;
187
188 dfix &typedefine::find(char *_name) {
189     int i;
190     if( !numt)
191     return dummy;
192     for(i=0; i<numt; i++)
193       if( !strcmp(name[i] ,_name))
194       return types[i] ;
195     cerr<<"***_WARNING:_typedefine:_type_"<<_name<<"_was_not_found\n";
196     return dummy;
197 }
198
199 dfix &typedefine::find(char *_name, dfix& v) {
200     int i;
201     if( !numt)
202     return v;
203     for(i=0; i<numt; i++)
204       if( !strcmp(name[i] ,_name))
205       return types[i] ;
206     cerr<< "***_WARNING:_typedefine:_type_"<<_name<<"_was_not_found\n";
207     return v;
208 }
209
```

6.12 rx/typedefine.h

```
 1 #infdef TYPEDEFINE_H
 2 #define TYPEDEFINE_H
 3
 4 #define MAXT 100
 5
 6 #include "qlib.h"
 7
 8
 9 class typedefine{
10     char *name[100] ;
11     dfix types[MAXT] ;
12     int numt;
13 public:
14     typedefine( ) ;
15     void load(char *file) ;
16     void list ( ) ;
17     dfix &find(char *name) ;
18     dfix &find(char *name, dfix& v) ;
19 };
20
21 extern typedefine glbTypes;
22
23 #define LOADTYPES (a) glbTypes.load(#a) ;glbTypes.list( )
24 #define T(a) glbTypes.find(#a)
25 #define TT(a,b) glbTypes.find(#a,b)
26
27 #endif
```

Part C: Generated VHDL code of the QAM system 6.13 vhdl/RX_TI.vhd

```
 1 ----------------------------------------------------------
 2 --OCAPI - alpha release- generated Fri Jun 12 16:45:441998
 3 ----------------------------------------------------------
 4
 5 - System Link Cell for design RX_TI
 6
 7 library IEEE;
 8 use IEEE.std_logic_1164.all;
 9
10 entity RX_TI is
11   port (
12     reset: in std_logic;
13     clk: in std_logic;
```

```
14      chan_out: in std_logic_vector(11 downto0) ;
15      rx_diff_mode: in std_logic;
16      rx_constel_mode: in std_logic;
17      rx_byte_out: out std_logic_vector(7 downto0) ;
18      rx_sync_out: out std_logic
19    ) ;
20 end RX_TI;
21
22 architecture structure of RX_TI is
23
24    component lmsff
25      port (
26      reset: in std_logic;
27      clk: in std_logic;
28      h1wack: in std_logic;
29      constel_mode: in std_logic;
30      in_sample: in std_logic_vector(11 downto0) ;
31      h1wreq: out std_logic;
32      out_i:out std_logic_vector(11 downto0) ;
33      out_q: out std_logic_vector(11 downto0) ;
34      symtype: out std_logic
35    ) ;
36    endcomponent;
37
38    component demap
39      port(
40      reset: in std_logic;
41      clk: in std_logic;
42      h2wack: in std_logic;
43      h1rack: in std_logic;
44      diff_mode: in std_logic;
45      i_in: in std_logic_vector(11 downto0) ;
46      q_in: in std_logic_vector(11 downto0) ;
47      symtype_in: in std_logic;
48      h2wreq: out std_logic;
49      h1rreq: out std_logic;
50      symbol_out: out std_logic_vector(3 downto0) ;
51      symtype_out: out std_logic
52    ) ;
53    endcomponent;
54
55    component detuple
56      port (
57      reset: in std_logic;
58      clk: in std_logic;
59      h3wack: in std_logic;
60      h2rack: in std_logic;
61      symbol: in std_logic_vector(3 downto0) ;
62      symtype: in std_logic;
63      h3wreq: out std_logic;
64      h2rreq: out std_logic;
65      byte: out std_logic_vector( 7 downto0) ;
66      syncro: out std_logic
67    ) ;
68    endcomponent;
69
70    component derand
71      port(
72      reset: in std_logic;
73      clk: in std_logic;
74      h3rack: in std_logic;
75      byte_in: in std_logic_vector(7 downto0) ;
76      syncro: in std_logic;
77      h3rreq: out std_logic;
78      byte_out:out std_logic_vector(7 downto0) ;
79      sync_out:out_std_logic
80    ) ;
81    endcomponent;
82
83    signal unused : std_logic;
84    signal h1_ffshk: std_logic;
85    signal rx_lms_i: std_logic_vector(11 downto 0) ;
86    signal rx_lms_q: std_logic_vector(11 downto 0) ;
87    signal rx_symtype : std_logic;
88    signal h2_ffshk: std_logic;
89    signal h1_fbshk: std_logic;
90    signal rx_symbol : std_logic_vector(3 downto 0) ;
91    signal rx_symtype_at:std_logic;
92    signal h3_ffshk: std_logic;
```

```
 93    signal h2_fbshk: std_logic;
 94    signal rx_byte_rnd: std_logic_vector(7 downto 0) ;
 95    signal rx_syncro: std_logic;
 96    signal h3_fbshk: std_logic;
 97
 98 begin
 99
100 lmsff_proc:lmsff
101    port map (
102    reset=>reset,
103    clk=>clk,
104    h1wack=>h1_fbshk,
105    constel_mode=>rx_constel_mode,
106    in_sample=>chan_out,
107    h1wreq=>h1_ffshk,
108    out_i=>rx_lms_i
109    out_q=>rx_lms_q
110    symtype=>rx_symtype
111    ) ;
112
113 demap_proc: demap
114    port map (
115    reset=>reset,
116    clk=>clk,
117    h2wack=>h2_fbshk,
118    h1rack=>h1_ffshk,
119    diff_mode=>rx_diff_mode,
120    i_in=>rx_lms_i
121    q_in=>rx_lms_q
122    symtype_in=>rx_symtype,
123    h2wreq=>h2_ffshk,
124    h1rreq=>h1_fbshk,
125    symbol_out=>rx_symbol,
126    symtype_out=>rx_symtype_at
127    ) ;
128
129      detuple_proc:detuple
130      port map (
131    reset =>reset,
132    clk=>clk,
133    h3wack=>h3_fbshk,
134    h2rack=>h2_ffshk,
135    symbol=>rx_symbol,
136    symtype=>rx_symtype_at,
137    h3wreq=>h3_ffshk,
138    h2rreq=>h2_fbshk,
139    byte=>rx_byte_rnd,
140    syncro=>rx_syncro
141    ) ;
142
143 derand_proc:derand
144    port map (
145    reset=>reset,
146    clk=>clk,
147    h3rack=>h3_ffshk,
148    byte_in=>rx_byte_rnd,
149    syncro=>rx_syncro,
150    h3rreq=>h3_fbshk,
151    byte_out=>rx_byte_out,
152    sync_out=>rx_sync_out
153    ) ;
154
155 end structure;
6.14 vhdl/derand_proc_ENT.vhd
 1 --------------------------------------------------------
 2 --OCAPI - alpha release- generated Thu Jun 11 14:57:23 1998
 3 -- -- includes sfg
 4 -- derandrstphase10
 5 -- derandphase1phase20
 6 -- derandphase1phase11
 7 -- derandphase2phase10
 8 -- derandinireg_derandrst0
 9 --------------------------------------------------------
10
11 library IEEE;
12 use IEEE.std_logic_1164.all;
13 useIEEE.std_logic_arith.all;
14 library FXT_PNT_LIB;
15 use FXT_PNT_LIB.pck_fixed_point.all;
```

```
16
17  entity derand_proc is
18    port (
19      clk: in std_logic;
20      reset: in std_logic;
21      h3rack: in FX (0 downto 0) ;
22      syncro: in FX (0 downto 0) ;
23      byte_in:in FX (7 downto 0) ;
24      h3rreq: out FX (0 downto 0 ) ;
25      h3rackreg_reg:outFX (0 downto 0) ;
26      byte_ouT_reg:outFX(7 downto 0) ;
27      sync_ouT_reg:outFX(0 downto 0)
28    ) ;
29  end derand_proc;
```
6.15 vhdl/derand_proc_RTL.vhd

```
 1  ---------------------------------------------------------
 2  --OCAPI - alpha release- generated Thu Jun 11 14:57:23 1998
 3  -- -- includes sfg
 4  -- derandrstphase10
 5  -- derandphase1phase20
 6  -- derandphase1phase11
 7  -- derandphase2phase10
 8  -- derandinireg_derandrst0
 9  ---------------------------------------------------------
10
11  library IEEE;
12  use IEEE.std_logic_1164.all;
13  useIEEE. std_logic_arith.all;
14  library FXT_PNT_LIB;
15  use FXT_PNT_LIB.pck_fixed_point.all;
16
17  architecture RTL of derand_proc is
18
19  -- State Declaration
20    signal seed_at1: FX (15 downto 0) ;
21    signal seed : FX (15 downto 0) ;
22    signal shiftreg_at1:FX (15 downto 0) ;
23    signal shiftreg : FX (15downto 0) ;
24    signal bypass_at1: FX(0 downto 0) ;
25    signal bypass : FX (0 downto 0) ;
26    signal h3rackreg_at1:FX (0 downto 0) ;
27    signal h3rackreg : FX(0 downto 0) ;
28    signal byte_out_at1:FX(7 downto 0) ;
29    signal byte_out: FX (7 downto0) ;
30    signal sync_out_at1:FX(0 downto 0) ;
31    signal sync_out: FX (0 downto0) ;
32    type STATE_TYPE is (
33      rst,
34      phase1,
35      phase2,
36      inireg_derand) ;
37    signal current_state,next_state:STATE_TYPE;
38
39    begin
40
41      h3rackreg_reg<=h3rackreg_at1;
42
43      byte_out_reg<=byte_out_at1;
44
45      sync_out_reg<=sync_out_at1;
46
47      -- Register clocking
48      SYNC : process (clk)
49
50      begin
51        if(clk'event and clk= '1' )then
52          -- state update
53          current_state<= next_state;
54          -- tick all registers
55          seed_at1<= seed;
56          shiftreg_at1<= shiftreg;
57          bypass_at1<= bypass;
58          h3rackreg_at1<= h3rackreg;
59          byte_out_at1<=byte_out;
60          sync_out_at1<=sync_out;
61        end if;
62      end process;
63
```

```
64      -- SFG evaluation
65      COMB : process (
66        current_state,
67        reset,
68        h3rack,
69        syncro,
70        seed_at1,
71        shiftreg_at1,
72        bypass_at1,
73        byte_in,
74        h3rackreg_at1,
75        byte_out_at1,
76        sync_out_at1 )
77
78        -- intermediate variables
79        variable shifts_0 : FX(15 downto 0) ;
80        variable xbits_0: FX (0 downto 0) ;
81        variable masks_0 :FX (7 downto 0) ;
82        variable shifts_1 : FX(15 downto 0) ;
83        variable xbits_1:FX (0 downto 0) ;
84        variable masks_1 :FX (7 downto 0) ;
85        variable shifts_2 : FX(15 downto 0) ;
86        variable xbits_2:FX (0 downto 0) ;
87        variable masks_2 :FX (7 downto 0) ;
88        variable shifts_3 : FX(15 downto 0) ;
89        variable xbits_3:FX (0 downto 0) ;
90        variable masks_3 :FX (7 downto 0) ;
91        variable shifts_4 : FX(15 downto 0) ;
92        variable xbits_4:FX (0 downto 0) ;
187
188 SIGCK(corrcnt, _ck, T_cnt) ;
189 SIGCK(tuplcnt, _ck, T_cnt) ;
190
191 SIGCK(byte, _ck, T_tuple) ;
192 SIGW(tuple_qam, T_tuple) ;
193 SIGW(tuple_qpsk, T_tuple) ;
194
195 _sigarray tuplarr("tarr",max(symbcount_qam,symbcount_qpsk), &_ck,T_symb) ;
196 _sigarray corrarr("carr",max(headlen_qam,headlen_qpsk), &_ck,T_symb) ;
197 _sigarray ref("ref", max(headlen_qam,headlen_qpsk)T,_symb) ;
198 _sigarray equal("equal",max(headlen_qam,headlen_qpsk),T_bit) ;
199
200 //---------------------------------------------------------
201
202 SFG( tupler_reset) ;
203   setv(corrcnt,0) ;
204   setv(tuplcnt,0) ;
205   setv(old_qamtype,1) ;
206   setv(syncro,0) ;
207
208 SFG( tupler_read) ;
209   GET(symbol) ;
210   GET(symtype) ;
211   symbol_reg=symbol;
212   qamtype = "symtype;
213
214
215 SFG( tupler_test) ;
216 iniphase= ((qamtype) & (corrcnt!=W(T_cnt, headlen_qam)))
217 | (("qamtype) & (corrcnt!=W(T_cnt,headlen_qpsk))) ;
218
219 tuple_ready=(qamtype).cassign(tuplcnt==W(T_cnt,symbcount_qam),
220 tuplcnt==W(T_cnt,symbcount_qpsk)) ;
221
222
223 SFG( tupler _corr) ;
224   for(i= 0; i < max(headlen_qam,headlen_qpsk) ; i++) {
225   int iqam = (headlen_qam-1-i< 0) ? 0 : headlen_qam-1-i;
226   int iqpsk = headlen _qpsk-1-i;
227 ref[i] = (qamtype).cassign(W(T_symb,QAM16_sync[iqam] ) ,
228 W(T_symb, QPSK_sync[iqpsk] ) ) ;
229   if(i == 0)
230     equal[i] = (corrarr[i] ==ref[i] ) ;
231   else
232     equal[i] = equal [i-1] & (corrarr[i] ==ref[i] ) ;
233 }
234 correlated=(qamtype).cassign(equal[headlen_qam-1],equal[headlen_qpsk-1] ) ;
235
236
```

```
237
238 SFG(tupler_compose) ;
239    tuple_qam= (cast(T_tuple,tuplarr[0] ) &W(T_tuple,15))
240       |((cast(T_tuple,tuplarr[1] )W&(T_tuple,15))<<W(T_cnt,4) ) ;
241
242    tuple_qpsk=(cast(T_tuple,tuplarr[0] & W(T_tuple,3))
243       | ((cast(T_tuple,tuplarr[1] )& W(T_tuple,3))<<W(T_cnt,2))
244       | ( ( cast(T_tuple,tuplarr[2] )& W(T_tuple,3))<<W(T_cnt,4))
245 | ( ( cast(T_tuple,tuplarr[3] )& W(T_tuple,3))<<W(T_cnt,6)) ;
246
247    byte= (qamtype).cassign(tuple_qam,tuple_qpsk) ;
248
249    tuplcnt= (correlated).cassign(W(T_cnt,0-1),
250       (tuple_ready).cassign(W(T_cnt,1-1),
251       tuplcnt)) ;
252
253    corrcnt= (correlated).cassign(W(T_cnt, 1-1),
254       corrcnt) ;
255
256
257 SFG(tupler_out) ;
258    PUT(byte) ;
259    PUT(syncro) ;
260    syncro= correlated;
261
262
263 SFG(tupler_shiftin ) ;
264    for(i = 1; i < max(symbcount_qam,symbcount_qpsk) ;i++)
265       tuplarr[i] =tuplarr[i-1] ;
266    tuplarr[0]=(qamtype).cassign(corrarr[headlen_qam-1],corrarr[headlen_qpsk-1] ) ;
267
268    for(i = max(headlen_qam,headlen_qpsk)-1;i> 0 ;i--)
269       corrarr[i] =corrarr[i-1];
270    corrarr[0] =symbol_reg;
271
272
273
274 SFG(tupler_finish_qam) ;
275    corrcnt= (old_qamtype!= qamtype).cassign(W (T_cnt,0),
276       (corrcnt== W(T_cnt,headlen_qam)).cassign(corrcnt,
277       corrcnt+ W(T_cnt,1) ) ) ;
278    tuplcnt= (old_qamtype!= qamtype).cassign(W (T_cnt,0),
279       (correlated).cassign(W(T_cnt,0),
280       (corrcnt !=W(T_cnt,headlen_qam)).cassign(tuplcnt,
281 (tuplcnt==W(T_cnt,symbcount_qam)).cassign(W(T_cnt,1),
282       tuplcnt+ W (T_cnt,1) ) ) ) ) ;
283    old_qamtype= qamtype;
284
285 SFG( tupler_finish_qpsk) ;
286    corrcnt= (old_qamtype!= qamtype).cassign(W (T_cnt,0),
287 (corrcnt==W(T_cnt,headlen_qpsk)).cassign(corrcnt,
288       corrcnt+W (T_cnt,1) ) ) ;
289    tuplcnt= (old_qamtype!= qamtype).cassign(W (T_cnt,0),
290       (correlated).cassign(W(T_cnt,0),
291 (corrcnt !=W(T_cnt,headlen_qpsk)).cassign(tuplcnt,
292 (tuplcnt==W(T_cnt,symbcount_qpsk)).cassign(W(T_cnt,1),
293       tuplcnt+ W (T_cnt,1) ) ) ) ) ;
294    old_qamtype= qamtype;
295
296 //-------------------------------------------------------
297
298 AT (rst)ALLWAYS
299    DO(tupler_reset)
300    GOTO(phase1) ;
301
302 AT (phase1)ALLWAYS
303    DO(tupler_read)
304    DO( tupler_test)
305    DO( tupler_corr)
306    GOTO(phase2) ;
307
308 AT (phase2)ON(_cnd(iniphase)||(_!cnd(correlated)&& !_cnd(tuple_ready)))
309    GOTO(phase4) ;
310
311 AT (phase2)ON ( !_cnd(iniphase) && _cnd(correlated))
312    DO(tupler_compose)
313 GOTO(phase3) ;
314
315 AT (phase2)ON ( !_cnd(iniphase) && _cnd(tuple_ready) && !_cnd(correlated) )
```

-continued

```
316    DO(tupler_compose)
317    GOTO(phase3) ;
318
319 AT (phase3)ALLWAYS
320    DO(tupler_out)
321    GOTO(phase4) ;
322
323 AT (phase4)ON (_cnd(qamtype))
324    DO(tupler_shiftin)
325    DO(tupler_finish_qam)
326    GOTO(phase1) ;
327
328 AT (phase4)ON (!_cnd(qamtype) )
329    DO(tupler_shiftin)
330    DO(tupler_finish_qpsk)
331    GOTO(phase1) ;
332
333    _fsm.setinfo(verbose) ;
334    ofstream F0("detuple_trans0.dot") ;
335    F0<< _fsm;
336    F0.close( ) ;
337
338    transform TRANSF(_fsm) ;
339 TRANSF.fsm_handshake1(_ck) ;
340
341    ofstream F("detuple_trans.dot") ;
342 F << _fsm;
343 F .close( ) ;
344 _fsm.setinfo(silent) ;
345
346 FSMEXP(typeName( ) ) ;
347
348 }
349
6.7 rx/lmsff.h 1
2 // Author:Radim Cmar
3 // Purpose:ADAPTIVE EQUALIZER(LMS) @(#)lmsff.h 1.4 98/03/30
4
5 #infdef LMS_H
6 #define LMS_H
7
8 #include "qlib.h"
9 #ifdef I2C
10 #include "i2c_master.h"
11 #include "i2c_slave.h"
12 #endif
13 #include "macros.h"
14 #include "typedefine.h"
15
16 class lmsff: public base{
17
18 public:
19    clk & _ck;
20 #ifdef I2C
21    i2c_slave_slave;
22 #endif
23    PRT(constel_mode) ;
24    PRT(in_sample) ;
25    PRT(out_i) ;
26    PRT(out_q) ;
27    PRT(symtype) ;
28    ctlfsm _fsm;
29
30    int constel _type; //QAM16or QPSK
31    intSPS: // samples per symbol
32    intCPS; // cycles per sample
33    intNF; // forward taps
34    intSTEP; // step adaptation constant
35    double p0,p1,p2,p3;
36    double ref;
37
38 public;
39       enum { SPS_PAR, FWLENGTH,STEP_PAR, INIT, P0,P1,P2,P3,REF };
40    enum { QAM16, QPSK };
41
42    lmsff(char *name,
43       clk & clk,
```

```
44      _PRT(constel_mode),
45      _PRT(in_sample),
46      _PRT(out_i),
47      _PRT(out_q),
48      _PRT(symtype)
49      ) ;
50
51      int setAttr(int Attr, double v=0) ;
52      int run( ) ;
53      void define( ) ;
54      ctlfsm &fsm( ) ;
55 #ifdef I2C
56      i2c_slave &slave( ) ;
57 #endif
58
59      //untimed mode
60      dfix decide(dfix constel, dfix est) ;
61      dfix coefi [111] ;
62      dfix coefq [111] ;
63      dfix sample [111] ;
64
65  };
66
67 #endif
```

6.8 rx/lmsff.cxx

```
 1
 2  // Author:Radim Cmar
 3  // Purpose:ADAPTIVE EQUALIZER(LMS) @(#)lmsff.cxx 1.18 98/04/07
 4
 5  #include "lmsff.h"
 6  #include <math.h>
 7  #include "trans.h"
 8
 9  lmsff::lmsff(char *name,
10       clk & clk,
11       _PRT(constel_mode),
12       _PRT(in_sample),
13       _PRT(out_i),
14       _PRT(out_q),
15       _PRT(symtype)
16       ) : base(name),
17    _ck(clk),
18 #ifdef I2C
19    _slave(strapp(name,"_i2c_host")),
20 #endif
21       IS_SIG (constel_mode, T_bit),
22       IS_SIG (in_sample, T_float),
23       IS_REG (out_i,_ck, T_float),
24       IS_REG (out_q, _ck, T_float),
25       IS_REG (symtype, _ck, T_bit)
26  {
27     IS_IP(constel_mode) ;
28     IS_IP(in_sample) ;
29     IS_OP(out_i) ;
30     IS_OP(out_q) ;
31     IS_OP(symtype) ;
32
33     SPS = 4;
34     STEP = 4;
35     NF = 8;
36     ref = 3.0;
37  }
38
39  int lmsff::setAttr(int Attr,double v) {
40     switch(Attr) {
41     case SPS_PAR : // parametrizable only for untimed model
42     SPS = (int) v;
43     break;
44     case FWLENGTH :
45     NF = (int) v;
46     break;
47     case STEP_PAR :
48     STEP = (int) v;
49     break;
50     case P0:
51     p0 = v;
52     break;
53     case P1:
```

```
 54      p1 = v;
 55      break;
 56    case P2:
 57      p2 = v;
 58      break;
 59    case P3:
 60      p3 = v;
 61      break;
 62    case REF:
 63      ref= v;
 64      break;
 65    case INIT :
 66      cerr<< "***_INFO:_LMSFF_equalizer_reset\n";
 67      for(int i =0; i< NF; i++) {
 68        sample[i] = dfix(0) ;
 69        coefi[i] = dfix(0) ;
 70        coefq[i] = dfix(0) ;
 71      }
 72      int offs = (NF-4)/2;
 73      coefq[offs+ 0] = p0;
 74      coefi[offs+ 1] = p1;
 75      coefq[offs+ 2] = p2;
 76      coefi[offs+ 3] = p3;
 77      break;
 78  }
 79    return 1;
 80  }
 81
 82  //------------------------------------------------------
 83
 84  int lmsff::run( ) {
 85  int i;
 86  dfix acci,accq, equali, equalq,esti, estq, erri,errq;
 87
 88  if((FBID(in_sample).getSize( )<SPS) || (FBID(constel_mode).getSize( )1<))
 89    return 0;
 90
 91  dfix constel= FBID(constel_mode).getIndex(0) ;
 92  dfix step = 1.0/pow(2.0,STEP) ;
 93
 94  // ---ff filtering---
 95  acci= 0;
 96  accq= 0;
 97  for(i = 0; i < NF ; i++) {
 98    acci= acci + sample[i] * coefi[i] ;
 99    accq= accq + sample[i] * coefq[i] ;
100  }
101  equali= acci;
102  equalq= accq;
103
104  // ---output---
105  FBID(out_i) << (equali) ;
106  FBID(out_q) << (equalq) ;
107  FBID(symtype) << (constel) ;
108
109  // ---slicing---
110  esti= decide(constel, equali) ;
111  estq= decide(constel, equalq) ;
112
113  // ---error evaluation---
114  erri= esti - equali;
115  errq= estq - equalq;
116
117  // ---coefficient adaptation---
118  for(i = 0; i < NF; i++) {
119    coefi[i] =coefi[i] + step* erri * sample[i] ;
120    coefq[i] =coefq[i] + step* errq * sample[i] ;
121  }
122
123  // ---reading in samples---
124  for(i = NF-1; i>= SPS; i--)
125    sample[i] =sample[i-SPS] ;
126  for(i = SPS-1; i>= 0; i--)
127    sample[i] =FBID(in_sample).get( ) ;
128
129  return 1;
130  }
131
132  dfix lmsff::decide(dfix constel,dfix est) {
```

-continued

```
133     double c = ref/3;
134     if( constel== QAM16) {
135       if(est > dfix(2*c))
136         return dfix(3*c) ;
137       else if (est > dfix(0))
138         return dfix (1*c) ;
139       elseif (est > dfix(-2*c))
140         return dfix (-1*c) ;
141       else
142         return dfix (-3*c) ;
143     } else{
144       if(est > dfix (0.))
145         return dfix (3*c) ;
146       else
147         return dfix (-3*c) ;
148     }
149 }
150
151 //--------------------------------------------------------
152
153 ctlfsm & lmsff::fsm( ) {
154     return _fsm;
155 }
156
157 #ifdef I2C
158 i2c_slave &lmsff::slave( ) {
159     return _slave;
160 }
161 #endif
162
163
164 #define CC(a) cast(accu _type,a)
165     void adder_tree(_sigarray & ops,int l, int h, _sig&res) {
166     if(h-l+1 > 5) {
167   cerr<< "lmsff_error:_maximum_5_operands_suported\n";
168   exit(1) ;
169 }
170     dfix& accu_type= res.Rep( ) —>getVal ( ) ;
171     switch(h-l+1) {
172       case 0: res = C(res,0) ;break;
173       case 1: res = CC(ops[l] ] ) ;break;
174       case 2: res = CC(ops[l] +ops[l+1] ) ;break;
175       case 3: res = CC(ops[l] +ops[l+1] ) + CC(ops[l+2] ) ;break;
176       case 4: res = CC( ops[l] +ops[l+1] ) + CC( ops[l+2] +ops[l+3] ) ;break;
177       case 5: res = CC( ops[l] +ops[l+1] ) + CC(CC(ops[l+2] + ops[l+3] ) +CC(ops[l+4] ) ) ;break;
178     }
179 }
180
181     void balance_coefs2(int numcoefs,int numcycles,int*l,int* h){
182     int i,j,k;
183
184     int orig_numcycles=numcycles;
185     if(numcoefs < numcycles)
186       numcycles= numcoefs;
187
188     int paral = numcoefs/numcycles;
189     int incs= numcoefs-( numcoefs/numcycles) *numcycles;
190
191     for(k = 1; k <= numcycles;k++)
192       l[k] = (k-1)*paral;
193
194     for(i = 1; i <= incs; i++)
195       for(j = i+1; j<= numcycles;j++)
196         l[j]++;
197
198     for(k = 1; k <= numcycles-1;k++)
199     h [k] =l[k+1]-1;
200     h[numcycles] =numcoefs-1;
201
202     for(k = numcycles+1; k<= orig_numcycles;k++) {
203       l[k] =0;
204     h [k] = -1;
205     }
206
207     if(1) {
208     cout<< "lmsff_info:_filter_balancing\n";
209     for(k = 1; k <= orig _numcycles;k++)
210       cout<< l[k] << ":"<< h [k] <<"_";
211     cout<< endl;
```

-continued

```
212     }
213   }
214
215
216   void lmsff::define( ) {
217
218     if(NF < 6) {
219        cerr<< "lmsff_error:_minimum_6_coefs_required\n";
220        exit(1) ;
221     }
222
223     int i,k,p;
224
225     //SPS . . . . samples per symbolparameter
226     //CPS . . . . cycles per sample(every CPS-phase read sample)
227     //NCYC . . . cycle budget in the loop
228     // F _max_delay . . . extra delay line positions due to read_sample within filtering
229   SPS = 4;
230   CPS = 2;
231     int F_max_delay = 7;
232     int NCYC = SPS*CPS;
233
234     //==distribute filtering operation slices into NCYC-2 cycles =
235
236     int 1_f[i1l00] ;
237     int h_f[i1l00] ;
238     int l_upd[100] ;
239     int h_upd[100] ;
240
241     //budget is fixed : 8-2=6cycles
242     //let's have 8 coefs
243     //can be more elaborate(e.g. interleaved slicing)
244     int start_fil = 1 //for filtering to know to store first time
245     int end_fil = 6 ; //for filtering to know to store to I_equal
246   l_fil[1]=0;l_fil[2]=2;l_fil[3]=4;l_fil[4]=5;l_fil[5]=6;l_fil[6]=7;
247   h_fil[1]=1;h_fil[2]=3;h_fil[3]=4;h_fil[4]=5;h_fil[5]=6;h_fil[6]=7;
248   l_upd[1]=0;l_upd[2]=2;l_upd[3]=4;l_upd[4]=5;l_upd[5]=6;l_upd[6]=7;
249   h_upd[1]=1;h_upd[2]=3;h_upd[3]=4;h_upd[4]=5;h_upd[5]=6;h_upd[6]=7;
250         //was example what input we need for parametrizable filter definition
251
252     balance_coefs2(NF,6,l_fil,h_fil) ;
253     balance_coefs2(NF,6,l_upd,h_upd) ;
254
255     // =======definition of signals=======
256
257   PORT_TYPE(in_sample,T(T_sample_lms)) ;
258   PORT_TYPE(out_i,T(T_sample_lms)) ;
259   PORT_TYPE(out_q,T(T_sample_lms)) ;
260
261     dfix T_step(0,5,0,dfix::ns) ;// shifts 0—> 31
262
263     _sigarray Fi_coef("Fi_coef",NF,&_ck,T(T_Fcoef_lms)) ;
264     _sigarray Fq_coef("Fq_coef",NF,&_ck,T(T_Fcoef_lms)) ;
265     _sigarray I_sample("I_sample",NF+F_max_delay, &_ck,T(T_sample_lms)) ;
266     _sigarray Fi_mult ("Fi_mult",NF,T(T_accu_lms)) ;
267     _sigarray Fq_mult ("Fq_mult",NF,T(T_accu_lms)) ;
268     _sig Fi_sum("Fi_sum",T (T_accu_lms)) ;
269     _sig Fq_sum("Fq_sum",T (T_accu_lms)) ;
270     _sigarray fm _i("fm_i",NF,T(T_accu_lms)) ;
271     _sigarray fm_q("fm_q",NF ,T(T_accu_lms)) ;
272     _sigarray fmult_i("fmult_i",NF,T(T_Fcoef _lms)) ;
273     _sigarray fmult_q("fmult_q",NF,T(T_Fcoef _lms) ) ;
274   SIGCK(I_accu,_ck, T(T_accu_lms) ) ;
275   SIGCK(Q_accu, _ck, T(T_accu_lms)) ;
276   SIGW(I_equal, T(T_accu_lms) ) ;
277   SIGW(Q_equal, T(T_accu_lms)) ;
278   SIGCK(I_error,_ck, T(T_accu_lms)) ;
279   SIGCK(Q_error,_ck, T(T_accu_lms)) ;
280   SIGW( I_slice,T(T_equal _lms)) ;
281   SIGW(Q_slice, T(T_equal _lms)) ;
282   SIGCK(step, _ck, T_step) ;
283   SIGCK(constel, _ck, T_bit) ;
284
285   #ifdef I2C
286     _slave.put(&step) ;
287     for(i = 0; i < NF; i++)
288        _slave.put(&Fi_coef[i] ) ;
289     for(i = 0; i < NF; i++) ;
290        _slave.put(&Fq_coef[i] ) ;
```

-continued

```
291  #endif
292
293
294  //------------------ definitionof states------------------
295
296      cfsm= &_fsm; // controller handle
297
298      int phi;
299      state* loop_cycle[100] ;
300      state* rst_cycle;
301
302      rst_cycle=new state; // define the state
303  * rst_cycle <<"rst"; // name the state
304  * cfsm<< deflt(*rst_cycle) ;// assign the state to the controller
305
306      for(phi = 1; phi<= NCYC ;phi++) {
307      loop_cycle[phi] =newstate;
308      * loop_cycle[phi] <<strapp("cycle_",phi) ;
309      * cfsm<< *loop_cycle[phi] ;
310  }
311
312  //------------------ definition of sfg's------------------
313
314      sfg* _lms_filt[100] ;
315      sfg* _lms _update _coefs[100] ;
316
317
318  SFG( lms_read_allways) ;
319     GET(constel_mode) ;
320        constel= constel_mode;
321
322
323  SFG( lms_initialize_coefs) ;
324     int offs= (NF-4)/2;
325     Fq_coef[offs+0] =W (T(T_Fcoef_lms) ,p0) ;
326     Fq_coef[offs+1] =W (T(T_Fcoef_lms) ,0) ;
327     Fq_coef[offs+2] =W (T(T_Fcoef_lms) ,p2) ;
328     Fq_coef[offs+3] =W (T(T_Fcoef_lms) ,0) ;
329
330     Fi_coef[offs+0] =W (T(T_Fcoef_lms) ,0) ;
331     Fi_coef[offs+1] =W (T(T_Fcoef_lms) ,p1) ;
332     Fi_coef[offs+2] =W (T(T_Fcoef_lms) ,0) ;
333     Fi_coef[offs+3] =W (T(T_Fcoef_lms) ,p3) ;
334
335     for(i = 0; i < NF; i++) {
336        if((i < offs) && (i> offs+3)) {
337        Fi_coef[i] =W(T(T_Fcoef_lms) ,0) ;
338        Fq_coef[i] =W(T(T_Fcoef_lms) ,0) ;
339        }
340     }
341
342
343  SFG( lms_reset) ;
344     for(i = 0; i < NF+F_max_delay;i++) {
345        I_sample[i] =W(T(T_sample_lms) 0,) ;
346     }
347     setv(I_error,0) ;
348     setv(Q_error,0) ;
349     setv(step,STEP) ;
350
351
352  //************* FILTER(1.cycle to 8.cycle) --------*---
353     int delay = 0; int cnt= 0 ;
354     int L,H;
355
356     //no filtering in 1st clockcycle
357     cnt++;if (cnt == CPS) { cnt= 0; delay++; }
358
359
360     for(p = 1; p <= NCYC-2;p++) {
361        REGISTER_SFG(lms_filt,p) ;
362        cnt++; if (cnt== CPS) {cnt = 0; delay++; }
363
364        //---- filter feedforward
365        L = l_fil[p] ;H= h_fil[p] ;
366  for (k = L; k<= H; k++)
367  Fi_mult[k] =cast(T(T_accu_lms) ,Fi_coef[k]I*_sample[k+delay] ) ;
368        if(H >= 0) adder_tree(Fi_mult,L,H,Fi_sum) ;
369
```

-continued

```
370      for (k = L; k<= H; k++)
371 Fq_mult[k]=cast(T(T_accu_lms) ,Fq_coef[k]*I_sample[k+delay] ) ;
372      if(H >= 0) adder_tree (Fq_mult,L,H,Fq_sum) ;
373
374
375      //---- sum I over start_ff—> end_ff
376      if(p == start_fil) {
377      I_accu= Fi_sum;
378      Q_accu = Fq_sum;
379      }
380      else if ((p > start_fil) && (p< end_fil)) {
381      I_accu= I_accu+ Fi_sum;
382      Q_accu = Q_accu+ Fq_sum;
383      }
384      else if (p == end_fil) {
385      I_accu= I_accu+ Fi_sum;
386      Q_accu = Q_accu+ Fq_sum;
387      I_equal= I_accu+ Fi_sum;
388      Q_equal = Q_accu+ Fq_sum;
389      }
390 } //end for
391
392      //compensate for 1 clockcycle vacancy
393      cnt++;if (cnt == CPS) { cnt= 0; delay++; }
394
395
396      //---------------- UPDATE (1.cycle to 8.cycle) ---------------
397 int STEPSAFE = 4; // safety region for downshifting
398    for(p = 1; p <= NCYC-2;p++) {
399      REGISTER_SFG(lms_update_coefs,p) ;
400      cnt++; if (cnt== CPS) {cnt = 0; delay++; }
401
402      L = l_upd[p] ;H=h_upd[p] ;
403      for (k=L; k<= H; k++)
404      {
405 fm_i[k]=cast(T(T_accu_lms) ,I_sample[k+delay] *I_error) ;
406      vshr(fmult_i[k] ,fm_i[k],step,STEPSAFE) ;
407      Fi_coef[k] =Fi_coef[k] + fmult_i[k] ;
408
409 fm_q[k]=cast(T(T_accu_lms) ,I_sample[k+delay]*Q_error) ;
410      vshr(fmult_q[k],fm_q[k],step,STEPSAFE) ;
411      Fq_coef[k] =Fq_coef[k] +fmult_q[k] ;
412      }
413    }
414
415 SFG(lms_outready) ;
416    out_i=cast(T(T_sample_lms) ,I_equal) ;
417    out_q= cast(T(T_sample_lms) ,Q_equal) ;
418    symtype= constel;
419
420
421 //------------------------SLICER-----------------------------
422 SFG( lms_slice_and_error) ;
423    double c = ref/3;
424    I_equal=I_accu;
425    Q_equal= Q_accu;
426
427    I_slice =(constel==W(T_bit,0) )c.assign(
428
429 (I_equal>C(I_equal,+2*c)).cassign(C(I_slice,+3*c),
430 (I_equal>C(I_equal,0*c)).cassign(C(I_slice,+1*c),
431 (I_equal> C(I_equal,-2*c)).cassign(C(I_slice,-1*c),
432 C(I_slice,-3*c))))
433        ,
434 (I_equal> C(I_equal,0*c)).cassign(C(I_slice,+3*c),
435 C(I_slice,-3*c))
436    ) ;
437
438    Q_slice= (constel==W (T_bit,0) )c.assign(
439
440 (Q_equal > C(Q_equal,+2*c)).cassign(C(Q_slice,+3*c),
441 (Q_equal > C(Q_equal,0*c)).cassign(C(Q_slice,+1*c),
442 (Q_equal > C(Q_equal,-2*c)).cassign(C(Q_slice,-1*c),
443 C(Q_slice,-3*c))))
444        ,
445 (Q_equal > C(Q_equal,0*c)).cassign(C(Q_slice,+3*c),
446 C(Q_slice,-3*c))
447    ) ;
448
```

-continued

```
449    I_error=cast(T(T_accu_lms) , I_slice)-I_equal;
450    Q_error=cast(T(T_accu_lms) , Q_slice)-Q_equal;
451
452
453 //---------------------IO definition------------------------
454 SFG(lms_in) ;
455    GET(in_sample) ;
456    I_sample[0] =in_sample;
457    for(i = NF+F_max_delay-1;i > 0; i--) {
458    I_sample[i] =I_sample[i-1] ;
459    }
460
461 SFG(lms_out) ;
462    PUT(out_i) ;
463    PUT(out_q) ;
464    PUT(symtype) ;
465
466
467 //=======define the fsmfor fixed 8 cycle timebudget=======
468
469    DEFAULTDO(lms_read_allways) ;
470    * rst_cycle ALLWAYS
471    DO(lms_reset)
472    DO(lms_initialize_coefs)
473    << *loop_cycle[1] ;
474
475  * loop_cycle[1]ALLWAYS
476    DO(lms_in)
477    << *_lms_update_coefs[1]
478    << *loop_cycle[2] ;
479
480  * loop_cycle[2]ALLWAYS
481    << *_lms_filt[1]
482    << *_lms_update_coefs[2]
483    << *loop_cycle[3] ;
484
485  * loop_cycle[3]ALLWAYS
486    DO(lms_in)
487    << *_lms_filt[2]
488    << *_lms_update_coefs[3]
489    << *loop_cycle[4] ];
490
491  * loop_cycle[4]ALLWAYS
492    << *_lms_filt[3]
493    << *_lms_update_coefs[4]
494    << *loop_cycle[5] ;
495
496  * loop_cycle[5]ALLWAYS
497    DO(lms_in)
498    << *_lms_filt[4]
499    << *_lms_update_coefs[5]
500    << *loop_cycle[6] ;
501
502  * loop_cycle[6]ALLWAYS
503    << *_lms_filt[5]
504    << *_lms_update_coefs[6]
505    << *loop_cycle[7] ;
506
507  * loop_cycle[7]ALLWAYS
508    DO(lms_in)
509    << *_lms_filt[6] // filtering finished—> ready to output
510    DO(lms_outready)
511    << *loop_cycle[8] ;
512
513  * loop_cycle[8]ALLWAYS
514    DO(lms_out)
515    DO(lms_slice_and_error)
516    << *loop_cycle[1] ;
517
518
519 #ifdef I2C
520    _slave.attach(_fsm, *loop_cycle[1],_ck) ;
521 #endif
522
523    _fsm.setinfo(verbose) ;
524    ofstream F0("lmsff_trans0.dot") ;
525    F0 << _fsm;
526    F0 .close( ) ;
527
```

-continued

```
528    transform TRANSF(_fsm) ;
529    TRANSF.fsm_handshake1(_ck) ;
530
531    ofstream F("lmsff_trans.dot") ;
532    F << _fsm;
533    F .close( ) ;
534    _fsm.setinfo(silent) ;
535
536    FSMEXP (typeName( ) ) ;
537
538  }
539
```

6.9 rx/macros.h

```
 1  // @(#)macros.h1.1 98/01/22
 2
 3  #infdef MACROS_H
 4  #define MACROS_H
 5
 6  // #define max(a,b) (a> b) ?a : b
 7
 8  #include "qlib.h"
 9
10  extern dfix T_bit;
11  extern dfix T_2bit;
12  extern dfix T_4bit;
13  extern dfix T_8bit;
14  extern dfix T_float;
15
16  extern dfix T_Cshift; // type for constant shifter
17  extern dfix* overcast;
18  extern dfix ycast;
19  exern strstream* gstr;
20
21
22  #define PRT(v) FB & _##v; _sigv
23  #define _PRT(v) FB & _##v
24  #define IS_SIG(v,t) _##v(_##v) ,v(#v,t)
25  #define IS_REG(v,c,t) _##v(_##v) ,v(#v,c,t)
26  #define GET(v) IN (v, _##v)
27  #define PUT(v) OUT(v, _##v)
28  #define IS_OP(v) _##v.asSink (this)
29  #define IS_IP(v) _##v.asSource (this)
30  #define FBID(v) _##v
31
32  #define C(y, x) W((y).Rep( )—>getVal( ),x)
33  #define acast (y, x) cast((y).Rep( )—>getVal ( ), ##x)
34
35  #define setv(y,x) y =W (y.Rep( )—>getVal ( ) ,x) ;
36
37  #define REGISTER_SFG(s,i) _##s[i] =new sfg; \
38       _##s[i]—>next= glbListOfSfg; \
39       glbListOfSfg = _##s[i] ; \
40     * _##s[i]<<strapp(strapp(#s,"_"),i) ; \
41       _##s[i]—>starts( ) ; \
42       csfg= _##s[i]
43
44  #define PORT_TYPE(v,t) v.Rep( )—>dupVal (t) ; \
45       if (v.Rep( )—>isregister( ))v.Rep( )—>dupRegVal (t)
46
47  #define DSIGW(s,n,w) s[n]=new_sig(strapp(strapp(#s,"_"),n),w)
48
49  //----------- constant right-shift (division) -----------
50  //------------------------------------------------------
51  #define shr(y, x, b) \
52       overcast= new dfix(0, x.Rep( )—>getVal( ).TypeW( )+b,x.Rep( )—>getVal( ).TypeL( )+b) ; \
53  ycast.duplicate(y.Rep( )—>getVal( )) ; \
54  y= cast (ycast, cast(*overcast,x) >> W(T_Cshift,b) ) ; \
55    delete overcast;
56
57  //--------- constant left-shift (multiplication) ---------
58  //------------------------------------------------------
59  #define shl (y, x, b) \
60    if(x.Rep( )—>getVal( ).isFix( )) \
61       overcast= new dfix(0,x .Rep( )—>getVal( ).TypeW( )+b,x.Rep( )—>getVal( ).TypeL( ) ) ; \
62    else\
63       overcast= new dfix(0) ; \
64  ycast.duplicate(y.Rep( )—>getVal( ) ) ; \
65  y= cast (ycast, cast(*overcast,x) << W(T_Cshift,b) ) ; \
```

-continued

```
66      delete overcast;
67
68  //----------- variable shifters with safety region --------
69  //--------------------------------------------------------
70  //
71  // description vshl(y,x,e,b) :=:y = x<<e (with 'b' as a safety region)
72  //
73  #define vshl(y, x, e, b) \
74      overcast= new dfix(0, x.Rep( )—>getVal( ).TypeW( )+b,x.Rep( )—>getVal( ).TypeL( ) ) ; \
75  y= acast (y, cast(*overcast,x) << e ) ; \
76      delete overcast;
77
78  #define vshr(y, x, e, b) \
79      if(x.Rep( )—>getVal( ).isFix( )) \
80      overcast= new dfix(0,x .Rep( )—>getVal( ).TypeW( )+b,x.Rep( )—>getVal( ).TypeL( )+b) ; \
81      else\
82      overcast= new dfix(0) ; \
83  y= acast (y, cast(*overcast,x) >> e ) ; \
84      delete overcast;
85
86
87  #endif
88
```

6.10 rx/macros.cxx

```
 1  #include "macros.h"
 2
 3  dfix T__bit(0,1,0,dfix::ns) ;
 4  dfix T__2bit(0,2,0,dfix::tc) ;
 5  dfix T__4bit(0,4,0,dfix::ns) ;
 6  dfix T__8bit(0,8,0,dfix::ns) ;
 7  dfix T__float(0) ;
 8
 9  dfix T__Cshift(0,4,0,dfix:n:s) ;//type for constantshifter 0..15
10  dfix* overcast;
11  dfix ycast;
12  strstream* gstr;
```

6.11 rx/typedefine.cxx

```
 1  #include "typedefine.h"
 2
 3  #include <fstream.h>
 4
 5  typedefine glbTypes;
 6
 7  typedefine::typedefine( ) {
 8      numt= 0;
 9  }
10
11  void typedefine::load(char *__name) {
12      ifstream IF(__name) ;
13
14      if(IF.fail( )) {
15  cerr<<"***__ERROR:__typedefine:__cannot__open__file__"<<__name<<"\n";
16      exit (0) ;
17  }
18
19      while(!IF.eof( ) && !IF.f a(i)l) {
20      char buf[100] ;
21      IF >> buf;
22
23      if(!strlen(buf))
24      continue;
25
26      if(buf[0] == '/' && buf[1] == '/') {
27      int endoftype = 0;
28      while (!endoftype) {
29      char c;
30      IF.get(c) ;
31      endoftype= (c == '\n') ;
32      }
33      continue;
34      } else {
35      name[numt] = new char[strlen(buf) +1] ;
36      strcpy(name[numt] ,buf) ;
37      int i;
38      for (i=0; i<numt; i++)
39      if(!strcmp(name[i],buf)) {
40      cerr<<"***__ERROR:__typedefine:__type__"<<buf<<"__defined__twice\n";
```

-continued

```
41      exit(0) ;
42    }
43    int W,L,repr=dfix::tc,overflow=dfix:e:rr,truncate=dfix:f:1;
44
45      IF >> buf;
46      W = atoi(buf) ;
47      if(W == 0) {
48      cerr<<"***__ERROR:__typedefine:__bad__W__for__type__"<<name[numt]"<<\n";
49      exit(0) ;
50      }
51
52      int endcom = 0;
53
54      IF >> buf;
55      L = atoi(buf) ;
56      if(buf[strlen(buf)-1] == ';') {
57    endcom = 1;
58    buf[strlen(buf)-1] =0;
59      }
60      while (1) {
61      if(endcom)
62      break;
63
64    IF >> buf;
65
66      if(buf[strlen(buf)-1] == ';') {
67      endcom = 1;
68      buf[strlen(buf)-1] =0 ;
69    }
70
71      if( !strcmp(buf,"ns"))
72      repr = dfix::ns;
73      else if (!strcmp(buf,"tc"))
74      repr = dfix::tc;
75      else if ( !strcmp(buf,";"))
76      break;
77      else if ( !endcom) {
78    cerr<<"***__ERROR:__typedefine:__"<<name[numt]"<<:__bad__repr__"<<buf<<"\n";
79      exit(0) ;
80    }
81
82
83      if(endcom)
84      break;
85
86      IF >> buf;
87
88      if(buf[strlen(buf)-1] == ';') {
89      endcom = 1;
90      buf[strlen(buf)-1] =0 ;
91    }
92
93      if( !strcmp(buf,"wp"))
94      overflow = dfix::wp;
95      elseif ( !strcmp(buf,"st"))
96      overflow = dfix::st;
97      elseif ( !strcmp(buf,"er"))
98      overflow = dfix::err;
99    elseif ( !strcmp(buf,";"))
100     break;
101   elseif ( !endcom) {
102     cerr<<"***__ERROR:__typedefine:__"<<name[numt]"<<:__bad__ovf__"<<buf<<"\n";
103     exit(0) ;
104   }
105
106   if (endcom)
107   break;
108
109   IF >> buf;
110
111   if(buf[strlen(buf)-1] == ';') {
112   endcom = 1;
113   buf[strlen(buf)-1] =0 ;
114   }
115
116   if( !strcmp(buf,"rd"))
117   truncate = dfix::rd;
118   elseif ( !strcmp(buf,"fl"))
119   truncate = dfix::fl;
```

-continued

```
120    elseif ( !strcmp(buf,";"))
121      break;
122    elseif ( !endcom) {
123      cerr<<"***_ERROR:_typedefine:_"<<name[numt]"<<:_bad_rnd_"**<<buf<<"\n";
124      exit(0) ;
125    }
126
127    if (endcom)
128      break;
129
130    int endoftype = 0;
131    while ( !endoftype) {
132      char c;
133      IF.get(c) ;
134      endoftype = (c== '\n') ;
135    }
136    break;
137      }
138    types[numt].duplicate(dfix(0,W,L,repr,overflow,truncate)) ;
139
140      numt++;
141      if(numt >= MAXT) {
142    cerr<< "***_ERROR:_typedefine_has_too_much_types._increase_MAXT\n";
143    exit(0) ;
144      }
145    }
146 }
147 }
148
149 void typedefine::list( ) {
150    int i;
151
152    for(i=0; i<numt; i++) {
153      cout.width(20) ;
154      cout<< name[i] ;
155
156      cout.width(5) ;
157      cout<< types[i] .TypeW( ) ;
158
159      cout.width(5) ;
160      cout<< types[i] .TypeL( ) ;
161
162      cout.width(4) ;
163      if(types[i] .TypeSign( ) ==dfix::ns)
164      cout << "ns";
165      else
166      cout << "tc";
167
168      cout.width(4) ;
169      if(types[i] .TypeOverflow( ) ==dfix::wp)
170      cout << "wp";
171      elseif (types[i] .TypeOverflow( ) ==dfix::st)
172      cout << "st";
173      else
174      cout << "err";
175
176      cout.width(4) ;
177      if(types[i] .TypeRound( ) ==dfix::fl)
178      cout << "fl";
179      else
180      cout << "rd";
181
182      cout<< "\n";
183    }
184 }
185
186 static dfix dummy(0) ;
187
188 dfix &typedefine::find(char *_name) {
189    int i;
190    if( !numt)
191    return dummy;
192    for(i=0; i<numt; i++)
193      if( !strcmp(name[i] ,_name))
194      return types[i] ;
195    cerr<<"***_WARNING:_typedefine:_type_"<<_name<<"_was_not_found\n";
196    return dummy;
197 }
198
```

```
199  dfix &typedefine::find(char *_name, dfix& v) {
200    int i;
201    if( !numt)
202    return v;
203    for(i=0; i<numt; i++)
204      if( !strcmp(name[i],_name))
205      return types[i] ;
206    cerr<< "***_WARNING:_typedefine:_type_"<<_name<<"_was_not_found\n";
207    return v;
208  }
209
```

6.12 rx/typedefine.h

```
 1  #infdef TYPEDEFINE_H
 2  #define TYPEDEFINE_H
 3
 4  #define MAXT 100
 5
 6  #include "qlib.h"
 7
 8
 9  class typedefine{
10    char *name[100] ;
11    dfix types[MAXT] ;
12    int numt;
13  public:
14    typedefine( ) ;
15    void load(char *file) ;
16    void list ( ) ;
17    dfix &find(char *name) ;
18    dfix &find(char *name, dfix& v) ;
19  };
20
21  extern typedefine glbTypes;
22
23  #define LOADTYPES (a) glbTypes.load(#a) ;glbTypes.list( )
24  #define T(a) glbTypes.find(#a)
25  #define TT(a,b) glbTypes.find(#a,b)
26
27  #endif
```

Part C: Generated VHDL code of the QAM system 6.13 vhdl/RX_TI.vhd

```
 1  --------------------------------------------------------
 2  --OCAPI - alpha release- generated Fri Jun 12 16:45:441998
 3  --------------------------------------------------------
 4
 5  - System Link Cell for design RX_TI
 6
 7  library IEEE;
 8  use IEEE.std_logic_1164.all;
 9
10  entity RX_TI is
11    port (
12      reset: in std_logic;
13      clk: in std_logic;
14      chan_out: in std_logic_vector(11 downto0) ;
15      rx_diff_mode: in std_logic;
16      rx_constel_mode: in std_logic;
17      rx_byte_out: out std_logic_vector(7 downto0) ;
18      rx_sync_out: out std_logic
19    ) ;
20  end RX_TI;
21
22  architecture structure of RX_TI is
23
24    component lmsff
25      port (
26        reset: in std_logic;
27        clk: in std_logic;
28        h1wack: in std_logic;
29        constel_mode: in std_logic;
30        in_sample: in std_logic_vector(11 downto0) ;
31        h1wreq: out std_logic;
32        out_i:out std_logic_vector(11 downto0) ;
33        out_q: out std_logic_vector(11 downto0) ;
34        symtype: out std_logic
35      ) ;
36    endcomponent;
```

```
37
38     component demap
39       port(
40         reset: in std_logic;
41         clk: in std_logic;
42         h2wack: in std_logic;
43         h1rack: in std_logic;
44         diff_mode: in std_logic;
45         i_in: in std_logic_vector(11 downto0) ;
46         q_in: in std_logic_vector(11 downto0) ;
47         symtype_in: in std_logic;
48         h2wreq: out std_logic;
49         h1rreq: out std_logic;
50         symbol_out: out std_logic_vector(3 downto0) ;
51         symtype_out: out std_logic
52       ) ;
53     endcomponent;
54
55     component detuple
56       port (
57         reset: in std_logic;
58         clk: in std_logic;
59         h3wack: in std_logic;
60         h2rack: in std_logic;
61         symbol: in std_logic_vector(3 downto0) ;
62         symtype: in std_logic;
63         h3wreq: out std_logic;
64         h2rreq: out std_logic;
65         byte: out std_logic_vector( 7 downto0) ;
66         syncro: out std_logic
67       ) ;
68     endcomponent;
69
70     component derand
71       port(
72         reset: in std_logic;
73         clk: in std_logic;
74         h3rack: in std_logic;
75         byte_in: in std_logic_vector(7 downto0) ;
76         syncro: in std_logic;
77         h3rreq: out std_logic;
78         byte_out:out std_logic_vector(7 downto0) ;
79         sync_out:out_std_logic
80       ) ;
81     endcomponent;
82
83     signal unused : std_logic;
84     signal h1_ffshk: std_logic;
85     signal rx_lms_i: std_logic_vector(11 downto 0) ;
86     signal rx_lms_q: std_logic_vector(11 downto 0) ;
87     signal rx_symtype : std_logic;
88     signal h2_ffshk: std_logic;
89     signal h1_fbshk: std_logic;
90     signal rx_symbol : std_logic_vector(3 downto 0) ;
91     signal rx_symtype_at:std_logic;
92     signal h3_ffshk: std_logic;
93     signal h2_fbshk: std_logic;
94     signal rx_byte_rnd: std_logic_vector(7 downto 0) ;
95     signal rx_syncro: std_logic;
96     signal h3_fbshk: std_logic;
97
98   begin
99
100  lmsff_proc:lmsff
101    port map (
102      reset=>reset,
103      clk=>clk,
104      h1wack=>h1_fbshk,
105      constel_mode=>rx_constel_mode,
106      in_sample=>chan_out,
107      h1wreq=>h1_ffshk,
108      out_i=>rx_lms,_i
109      out_q=>rx_lms,_q
110      symtype=>rx_symtype
111    ) ;
112
113  demap_proc: demap
114    port map (
115      reset=>reset,
```

```
116     clk=>clk,
117     h2wack=>h2_fbshk,
118     h1rack=>h1_ffshk,
119     diff_mode=>rx_diff_mode,
120     i_in=>rx_lms_i
121     q_in=>rx_lms_q
122     symtype_in=>rx_symtype,
123     h2wreq=>h2_ffshk,
124     h1rreq=>h1_fbshk,
125     symbol_out=>rx_symbol,
126     symtype_out=>rx_symtype_at
127     );
128
129     detuple_proc:detuple
130     port map (
131     reset =>reset,
132     clk=>clk,
133     h3wack=>h3_fbshk,
134     h2rack=>h2_ffshk,
135     symbol=>rx_symbol,
136     symtype=>rx_symtype_at,
137     h3wreq=>h3_ffshk,
138     h2rreq=>h2_fbshk,
139     byte=>rx_byte_rnd,
140     syncro=>rx_syncro
141     );
142
143  derand_proc:derand
144     port map (
145     reset=>reset,
146     clk=>clk,
147     h3rack=>h3_ffshk,
148     byte_in=>rx_byte_rnd,
149     syncro=>rx_syncro,
150     h3rreq=>h3_fbshk,
151     byte_out=>rx_byte_out,
152     sync_out=>rx_sync_out
153     );
154
155  end structure;
6.14 vhdl/derand_proc_ENT.vhd
  1  --------------------------------------------------------
  2  --OCAPI - alpha release- generated Thu Jun 11 14:57:23 1998
  3  -- -- includes sfg
  4  -- derandrstphase10
  5  -- derandphase1phase20
  6  -- derandphase1phase11
  7  -- derandphase2phase10
  8  -- derandinireg_derandrst0
  9  --------------------------------------------------------
 10
 11  library IEEE;
 12  use IEEE.std_logic_1164.all;
 13  useIEEE.std_logic_arith.all;
 14  library FXT_PNT_LIB;
 15  use FXT_PNT_LIB.pck_fixed_point.all;
 16
 17  entity derand_proc is
 18     port (
 19     clk: in std_logic;
 20     reset: in std_logic;
 21     h3rack: in FX (0 downto 0) ;
 22     syncro: in FX (0 downto 0) ;
 23     byte_in:in FX (7 downto 0) ;
 24     h3rreq: out FX (0 downto 0 ) ;
 25     h3rackreg_reg:outFX (0 downto 0) ;
 26     byte_ouT_reg:outFX(7 downto 0) ;
 27     sync_ouT_reg:outFX(0 downto 0)
 28     );
 29  end derand_proc;
6.15 vhdl/derand_proc_RTL.vhd 1  --------------------------------------------------------
  2  --OCAPI - alpha release- generated Thu Jun 11 14:57:23 1998
  3  -- -- includes sfg
  4  -- derandrstphase10
  5  -- derandphase1phase20
  6  -- derandphase1phase11
  7  -- derandphase2phase10
```

```
 8   -- derandinireg_derandrst0
 9   --------------------------------------------------------
10
11   library IEEE;
12   use IEEE.std_logic_1164.all;
13   useIEEE. std_logic_arith.all;
14   library FXT_PNT_LIB;
15   use FXT_PNT_LIB.pck_fixed_point.all;
16
17   architecture RTL of derand_proc is
18
19   -- State Declaration
20     signal seed_at1: FX (15 downto 0) ;
21     signal seed : FX (15 downto 0) ;
22     signal shiftreg_at1:FX (15 downto 0) ;
23     signal shiftreg : FX (15downto 0) ;
24     signal bypass_at1: FX(0 downto 0) ;
25     signal bypass : FX (0 downto 0) ;
26     signal h3rackreg_at1:FX (0 downto 0) ;
27     signal h3rackreg : FX(0 downto 0) ;
28     signal byte_out_at1:FX(7 downto 0) ;
29     signal byte_out: FX (7 downto0) ;
30     signal sync_out_at1:FX(0 downto 0) ;
31     signal sync_out: FX (0 downto0) ;
32     type STATE_TYPE is (
33       rst,
34       phase1,
35       phase2,
36       inireg_derand) ;
37     signal current_state,next_state:STATE_TYPE;
38
39   begin
40
41     h3rackreg_reg<=h3rackreg_at1;
42
43     byte_out_reg<=byte_out_at1;
44
45     sync_out_reg<=sync_out_at1;
46
47   -- Register clocking
48   SYNC : process (clk)
49
50   begin
51     if(clk'event and clk= '1' )then
52       -- state update
53       current_state<= next_state;
54       -- tick all registers
55       seed_at1<= seed;
56       shiftreg_at1<= shiftreg;
57       bypass_at1<= bypass;
58       h3rackreg_at1<= h3rackreg;
59       byte_out_at1<=byte_out;
60       sync_out_at1<=sync_out;
61     end if;
62   end process;
63
64   -- SFG evaluation
65   COMB : process (
66     current_state,
67     reset,
68     h3rack,
69     syncro,
70     seed_at1,
71     shiftreg_at1,
72     bypass_at1,
73     byte_in,
74     h3rackreg_at1,
75     byte_out_at1,
76     sync_out_at1 )
77
78     -- intermediate variables
79     variable shifts_0 : FX(15 downto 0) ;
80     variable xbits_0: FX (0 downto 0) ;
81     variable masks_0 :FX (7 downto 0) ;
82     variable shifts_1 : FX(15 downto 0) ;
83     variable xbits_1:FX (0 downto 0) ;
84     variable masks_1 :FX (7 downto 0) ;
85     variable shifts_2 : FX(15 downto 0) ;
86     variable xbits_2:FX (0 downto 0) ;
```

```
 87      variable masks_2 :FX (7 downto 0) ;
 88      variable shifts_3 : FX(15 downto 0) ;
 89      variable xbits_3:FX (0 downto 0) ;
 90      variable masks_3 :FX (7 downto 0) ;
 91      variable shifts_4 : FX(15 downto 0) ;
 92      variable xbits_4:FX (0 downto 0) ;
 93      variable masks_4 :FX (7 downto 0);
 94      variable shifts_5 : FX(15 downto 0);
 95      variable xbits_5:FX (0 downto 0);
 96      variable masks_5 :FX (7 downto 0);
 97      variable shifts_6 : FX(15 downto 0);
 98      variable xbits_6:FX (0 downto 0);
 99      variable masks_6:FX (7 downto 0);
100      variable shifts_7 : FX(15 downto 0);
101      variable xbits_7:FX (0 downto 0);
102      variable masks_7 :FX (7 downto 0);
103      variable shifts_8 : FX(15 downto 0);
104      variable masks_8 :FX (7 downto 0);
105      variable mask : FX(7 downto 0);
106
107 begin
108
109 -- update all registers and outputs
110 h3rreq <= CAST ("0. " ) ;
111 seed <= seed_at1;
112    shiftreg<= shiftreg_at1;
113 bypass <= bypass_at1;
114 h3rackreg <= h3rackreg_at1;
115 byte_out <= byte_out_at1;
116 sync_out<= sync_out_at1;
117
118
119 -- default update state register
120    next_state<=current_state;
121
122 case current_state is
123
124    when rst=>
125
126      byte_out<= CAST(|"00000000. " ) ;
127      seed <= CAST ("0000000000111111. " ) ;
128      sync_out<= CAST("0 . " ) ;
129      bypass <= CAST("0 . " ) ;
130      shiftreg<= CAST("0000000000000000. " ) ;
131      h3rackreg<= h3rack;
132      h3rreq <= CAST("1 . " ) ;
133      next_state<= phase1;
134
135
136    when phase1=>
137
138    if ((true) and ( ToBool(h3rackreg_at1)))then
139      shifts_0:= cassign(syncro=CAST("1. " ) ,
140      seed_at1;
141      shiftreg_at1);
142 masks_0 :=CAST ("00000000. " ) ;
143 xbits_0:= (CAST(0,0,SHR(shifts_0,4)))xor(CAST(0,0,SHR(shifts_0,5)));
144 shifts_1:=((CAST(15,0,xbits_0))and(CAST("0000000000000001." ))) or((SHL(shifts_0,1))and(CAST("0000000001111111. " ) ) ) ;
145 masks_1 :=(SHL(masks_0,1))or((CAST(7,0,xbits_0))and (CAST("00000001. " ) ) ) ;
146 xbits_1:= (CAST(0,0,SHR(shifts_1,4)))xor(CAST(0,0,SHR(shifts_1,5)));
147 shifts_2:=((CAST(15,0,xbits_1))and(CAST("0000000000000001." ))) or((SHL(shifts_1,1))and(CAST("0000000001111111. " ) ) ) ;
148 masks_2 SHL(masks_1,1))or((CAST(7,0,xbits_1))and (CAST("00000001. " ) ) ) ;
149 xbits_2:= (CAST(0,0,SHR(shifts_2,4)))xor(CAST(0,0,SHR(shifts_2,5)));
150 shifts_3:=((CAST(15,0,xbits_2))and(CAST("0000000000000001." ))) or((SHL(shifts_2,1))and(CAST("0000000001111111. " ) ) ) ;
151 masks_3 SHL(masks_2,1))or((CAST(7,0,xbits_2))and (CAST("00000001. " ) ) ) ;
152 xbits_3:= (CAST(0,0,SHR(shifts_3,4)))xor(CAST(0,0,SHR(shifts_3,5)));
153 shifts_4:=((CAST(15,0,xbits_3))and(CAST("0000000000000001." ))) or((SHL(shifts_3,1))and(CAST("0000000001111111. " ) ) ) ;
154 masks_4 := SHL(masks_3,1))or((CAST(7,0,xbits_3))and (CAST("00000001. " ) ) ) ;
155 xbits_4:= (CAST(0,0,SHR(shifts_4,4)))xor(CAST(0,0,SHR(shifts_4,5)));
156 shifts_5:=((CAST(15,0,xbits_4))and(CAST("0000000000000001." ))) or((SHL(shifts_4,1))and(CAST("0000000001111111. " ) ) ) ;
157 masks_5 := SHL(masks_4,1))or((CAST(7,0,xbits_4))and (CAST("00000001. " ) ) ) ;
158 xbits_5:= (CAST(0,0,SHR(shifts_5,4)))xor(CAST(0,0,SHR(shifts_5,5)));
159 shifts_6:=((CAST(15,0,xbits_5))and(CAST("0000000000000001." ))) or((SHL(shifts_5,1))and(CAST("0000000001111111. " ) ) ) ;
160 masks_6 := SHL(masks_5,1))or((CAST(7,0,xbits_5))and (CAST("00000001. " ) ) ) ;
161 xbits_6:=(CAST(0,0,SHR(shifts_6,4)))xor(CAST(0,0,SHR(shifts_6,5)));
162 shifts_7:=((CAST(15,0,xbits_6))and(CAST("0000000000000001." ))) or((SHL(shifts_6,1))and(CAST("0000000001111111. " ) ) ) ;
163 masks_7 := SHL(masks_6,1))or((CAST(7,0,xbits_6))and (CAST("00000001. " ) ) ) ;
164 xbits_7:= (CAST(0,0,SHR(shifts_7,4)))xor(CAST(0,0,SHR(shifts_7,5)));
165 shifts_8:=((CAST(15,0,xbits_7))and(CAST("0000000000000001." ))) or((SHL(shifts_7,1))and(CAST("0000000001111111. " ) ) ) ;
```

-continued

```
166     masks_8 := SHL(masks_7,1))or((CAST(7,0,xbits_7))and (CAST("00000001. " ) ) ) ;
167       shiftreg<= shifts_8;
168       mask := masks_8;
169       byte_out<= cassign(bypass_at1=CAST("1. " ),
170         byte_in,
171         (byte_in)xor(mask));
172       sync_out<=CAST ("1. " ) ;
173       h3rackreg<= h3rack;
174       h3rreq<= CAST("0 . " ) ;
175       next_state<= phase2;
176     end if;
177
178     if (not (ToBool(h3rackreg_at1)))then
179       h3rreq<= CAST("1 . " ) ;
180       h3rackreg<= h3rack;
181       next_state<= phase1;
182     end if;
183
184
185   when phase2=>
186
187     h3rackreg<= h3rack;
188     sync_out<= CAST("0 . " ) ;
189     h3rreq <= CAST("1 . " ) ;
190     next_state<= phase1;
191
192
193   when inireg_derand=>
194
195     seed <= CAST ("0000000000000000. " ) ;
196     shiftreg<= CAST("0000000000000000. " ) ;
197     bypass <= CAST("0 . " ) ;
198     byte_out<= CAST("00000000. " ) ;
199     sync_out<= CAST("0 . ") ;
200     next_state<= rst;
201
202
203   when others=>
204       next_state<= current_state;
205   end case;
206
207   if(reset = '1' )then
208       next_state<= inireg_derand;
209       seed <= CAST ("0000000000000000. " ) ;
210       shiftreg <= CAST(" 0000000000000000. " );
211       bypass <= CAST ("0. " ) ;
212       h3rackreg<= CAST ("0 . " );
213       byte_out<= CAST(" 00000000. " ) ;
214       sync_out<= CAST("0 . " ) ;
215   end if;
216
217
218   end process;
219
220 end RTL;
6.16 vhdl/derand_proc_STD.vhd 1  ---------------------------------------------------------
  2  --OCAPI - alpha release- generatedThu Jun 11 14:57:23 1998
  3  - includes sfg
  4  -- derandrstphase10
  5  -- derandphase1phase20
  6  -- derandphase1phase11
  7  -- derandphase2phase10
  8  -- derandinireg_derandrst0
  9  ---------------------------------------------------------
 10
 11 library IEEE;
 12 use IEEE.std_logic_1164.all;
 13 use IEEE.std_logic.arith.all;
 14 library FXT_PNT_LIB;
 15 use FXT_PNT_LIB.pck_fixed_point.all;
 16
 17 entity derand is
 18   port(
 19     clk : in std_logic;
 20     reset: in std_logic;
 21     h3rack : in std_logic;
 22     syncro: in std_logic;
```

```
23      byte_in: in std_logic_vector(7 downto 0);
24      h3rreq: out std_logic;
25      h3rackreg: out std_logic;
26      byte_out:out std_logic_vector(7 downto 0);
27      sync_out:out std_logic
28 );
29 end derand;
30
31 architecture structure of derand is
32
33    component derand_proc
34      port(
35      clk : in std_logic;
36      reset: in std_logic;
37      h3rack : in FX (0 downto 0);
38      syncro : in FX (0 downto 0);
39      byte_in : in FX (7 downto 0);
40      h3rreq : out FX (0 downto 0);
41      h3rackreg_reg:outFX (0 downto 0);
42      byte_out_reg:outFX(7 downto 0);
43      sync_out_reg:outFX(0 downto 0)
44 );
45 endcomponent;
46
47 signal FX_h3rack : FX( 0 downto 0);
48 signal FX_syncro : FX( 0 downto 0);
49 signal FX_byte_in : FX(7 downto 0);
50 signal FX_h3rreq : FX( 0 downto 0);
51 signal FX_h3rackreg :FX (0 downto 0);
52 signal FX_byte_out :FX (7 downto 0);
53 signal FX_sync_out :FX (0 downto 0);
54
55 begin
56
57    FX_h3rack(0) <=h3rack;
58    FX_syncro(0) <=syncro;
59    FX_byte_in<= FX(SIGNED(byte_in));
60    h3rreq<= FX_h3rreq(0);
61    h3rackreg<= FX_h3rackreg(0);
62    byte_out<=CONV_STD_LOGIC_VECTOR (ToSigned(FX_byte_out),byte_out'length);
63    sync_out<=FX_sync_out(0);
64
65    derand: derand_proc
66    port map (
67      clk => clk,
68      reset => reset,
69      h3rack => FX_h3rack,
70      syncro => FX_syncro,
71      byte_in=> FX_byte_in,
72      h3rreq => FX_h3rreq,
73      h3rackreg_reg=> FX_h3rackreg,
74      byte_out_reg=>FX_byte_out,
75      sync_out_reg=>FX_sync_out
76 );
77
78
79 end structure;
6.17 vhdl/derand_tb.vhd 1 ---------------------------------------------------------
2 --OCAPI-alpha release-generated Fri Jun 12 16:45:45 1998
3 ---------------------------------------------------------
4
5 -- TestBench for design derand
6
7 library IEEE;
8 use IEEE.std_logic_1164.all;
9
10 use IEEE.std_logic_textio.all;
11 use std.textio.all;
12
13 library clock;
14 use clock.clock.all;
15
16 entity derand_tb is
17 end derand_tb;
18
19 architecture rtl of derand_tb is
20
```

```
21 signal   reset : std_logic;
22 signal   clk : std_logic;
23 signal   h3rack : std_logic;
24 signal   byte_in : std_logic_vector(7 downto 0) ;
25 signal   syncro : std_logic;
26 signal   h3rreq : std_logic;
27 signal   h3rackreg : std_logic;
28 signal   byte_out : std_logic_vector(7 downto 0);
29 signal   sync_out: std_logic;
30
31 component derand
32 port(
33      reset : in std_logic;
34      clk : in std_logic;
35      h3rack: in std_logic;
36      byte_in: in std_logic_vector(7 downto 0);
37      syncro: in std_logic;
38      h3rreq: out std_logic;
39      byte_out: out std_logic_vector(7 downto 0);
40      sync_out: out std_logic
41 );
42 end component;
43
44
45 begin
46
47 crystal(clk,50 ns);
48
49 derand_dut: derand
50    port map (
51       reset=> reset,
52       clk=> clk,
53       h3rack=> h3rack,
54       byte_in=> byte_in,
55       syncro=> syncro,
56       h3rreq=> h3rreq,
57       byte_out=> byte_out,
58       sync_out=> sync_out ) ;
59 ini:process
60    begin
61    reset<= '1' ;
62    wait until clk'event and clk = '1' ;
63    reset<= '0' ;
64    wait;
65 end process;
66
67 input:process
68    file stimuli: text is in "derand_tb.dat";
69 variable aline : line;
70
71 file stimulo: text is out "derand_tb.sim_out";
72 variable oline : line;
73
74 variable   v_h3rack: std_logic;
75 variable   v_byte_in: std_logic_vector(7 downto 0);
76 variable   v_syncro: std_logic;
77 variable   v_h3rreq: std_logic;
78 variable   v_byte_out: std_logic_vector(7 downto 0);
79 variable   v_sync_out: std_logic;
80 variable   v_h3rack_hx: std_logic;
81 variable   v_byte_in_hx: std_logic_vector(7 downto 0);
82 variable   v_syncro_hx: std_logic;
83 variable   v_h3rreq_hx: std_logic;
84 variable   v_byte_out_hx: std_logic_vector(7 downto 0);
85 variable   v_sync_out_hx: std_logic;
86
87 begin
88    wait until reset'event and reset = '0' ;
89    loop
90    if (not(endfile(stimuli)))then
91       readline(stimuli, aline);
92       read(aline,  v_h3rack);
93       read(aline,  v_byte_in);
94       read(aline,  v_syncro);
95    else
96       assert false
97       report "End of inputfile reached"
98       severity warning;
99 end if;
```

-continued

```
100
101  h3rack <= v_h3rack;
102  byte_in<= v_byte_in;
103  syncro <= v_syncro;
104
105  wait for 50 ns;
106
107  v_h3rreq:= h3rreq;
108  v_byte_out:=byte_out;
109  v_sync_out:=sync_out;
110
111  v_h3rack_hx:v_h3rack;
112  v_byte_in_hx:=v_byte;_in
113  v_syncro_hx:v_syncro;
114  v_h3rreq_hx:=v_h3rreq;
115  v_byte_out_hx:=v_byte_out;
116  v_sync_out_hx:=v_sync_out;
117
118  write(oline, v_h3rack_hx);
119  write(oline, ' ');
120  hwrite(oline, v_byte_in)_hx;
121  write(oline, ' ') ;
122  write(oline, v_syncro_hx);
123  write(oline, ' ') ;
124  write(oline, v_h3rreq_hx);
125  write(oline, ' ') ;
126  hwrite(oline, v_byte_out)_hx;
127  write(oline, ' ') ;
128  write(oline, v_sync_out)_hx;
129      write(oline, ' ') ;
130
131      writeline(stimulo, oline);
132
133      wait until clk'event and clk = '1' ;
134
135  end loop;
136  end process;
137  end rtl;
138
139  configuration tbc_rtl of derand_tb is
140    for rtl
141    for all : derand
142    use entity work.derand(structure);
143    end for;
144    end for;
145  end tbc_rtl;
```

What is claimed is:

1. A design apparatus for generating from a behavioral description of a system comprising at least one digital system part, an implementable description for the system, the behavioral description being represented on the computer environment as a first set of objects with a first set of relations therebetween, the implementable description being represented on the computer environment as a second set of objects with a second set of relations therebetween, the first and second set of objects being part of a design environment.

2. The design apparatus of claim 1 wherein the first and second set of objects are part of a single design environment.

3. The design apparatus of claim 1, wherein the design environment comprises an Object Oriented Programming Language.

4. The design apparatus of claim 3, wherein the Object Oriented Programming Language is C++.

5. The design apparatus of claim 1, wherein the design environment is an open environment wherein new objects are created.

6. The design apparatus of claim 1, wherein at least part of the input signals and output signals of the first set of objects are at least part of the input signals and output signals of the second set of objects.

7. The design apparatus of claim 6, wherein at least part of the input signals and output signals of the behavioral description are at least part of the input signals and output signals of the implementable description.

8. The design apparatus of claim 1, wherein the first set of objects has first semantics and the second set of objects has second semantics.

9. The design apparatus of claim 8, wherein the first semantics is a data-vector model and/or a data-flow model.

10. The design apparatus of claim 8, wherein the second semantics is a signal flow graph (SFG) data structure.

11. The design apparatus of claim 1, wherein the impact in the implementable description of at least a part of the objects of the second set of objects is essentially the same as the impact in the behavioral description of at least a part of the objects of the first set of objects.

12. The design apparatus of claim 1, further comprising means for simulating the behavior of the system, the means simulating the behavior of the behavioral description, the implementable description or any intermediate description therebetween.

13. The design apparatus of claim 1, wherein at least part of the second set of objects is derived from objects belonging to the first set of objects.

14. The design apparatus of claim 1, wherein the implementable description is at least partly obtained by refining the behavioral description.

15. The design apparatus of claim 1, wherein the implementable description is an architecture description of the system.

16. The design apparatus of claim 15, further comprising means for translating the architecture description into a synthesizable description of the system, the synthesizable description being directly implementable in hardware.

17. The design apparatus of claim 16, wherein the hardware is a semiconductor chip.

18. The design apparatus of claim 1, further comprising means to derive the first set of objects from a vector description describing the system as a set of operations on data vectors.

19. The design apparatus of claim 18, wherein the vector description is a MATLAB description.

20. The design apparatus of claim 9, further comprising means for simulating statically or demand-driven scheduled dataflow on the data-flow description.

21. The design apparatus of claim 1, further comprising means for clock-cycle true simulating the digital system using a data-flow description and/or one or more of SFG data structures using an expectation-based simulation.

22. The design apparatus as recited in claim 1, wherein said objects comprise a function.

23. A method of designing a system comprising at least one digital part, the method comprising refining wherein a behavioral description of the system is transformed into an implementable description of the system, the behavioral description being represented as a first set of objects with a first set of relations therebetween and the implementable description being represented as a second set of objects with a second set of relations therebetween, wherein refining comprises a first refining wherein the behavioral description is a data-vector model and is at least partly transformed into a data-flow model.

24. The method of claim 23, wherein refining comprises translating behavioral characteristics at least partly into structural characteristics.

25. The method of claim 23, further comprising simulating the behavior of the behavioral description, wherein the implementable description and/or any intermediate description therebetween is simulated.

26. The method of claim 23, wherein refining comprises adding new objects, permitting interaction with existing objects, and adjusting existing objects allowing the interaction.

27. The method of claim 23, wherein refining is performed in an open environment and comprises expansion of existing objects.

28. The method of claim 22, wherein the data-flow model is an untimed floating point data-flow model.

29. The method of claim 22, wherein refining further comprises a second refining wherein the data-flow model is at least partly transformed into an SFG model.

30. The method of claim 23, wherein refining comprises a first refining comprising:
   determining the input vector lengths of input, output and intermediate signals;
   determining the amount of parallelism of operations that process input signals to output signals;
   determining actors, edges and tokens of the behavioral description; and
   determining the wordlength of the tokens.

31. The method of claim 29, wherein determining the amount of parallelism comprises determining the amount of parallelism for every data vector and reducing the unspecified communication bandwidth of the data-vector model to a fixed number of communication buses in the data-flow model.

32. The method of claim 29, wherein determining actors, edges and tokens of the behavioral description comprises defining one or a group of data vectors in the first data-vector model as actors; defining data precedences crossing actor bounds, as edges, the edges behaving like queues and transporting tokens between actors; and constructing a system schedule and running a simulation on a computer environment.

33. The method of claim 23, wherein the second set of objects with the second set of relations therebetween are at least partly derived from the first set of objects with the first set of relations therebetween.

34. The method of claim 23, wherein objects belonging to the second set of objects are new objects, identical with and/or derived by inheritance from objects from the first set of objects, or a combination thereof.

35. The method of claim 29, further comprising combining several of the SFG models with a finite state machine description resulting in an implementable description.

36. The method of claim 35, further comprising transforming the implementable description to synthesizable code.

37. The method of claim 36, wherein the synthesizable code is VHDL code.

38. A method of simulating a system, the method comprising transforming a description of a system into compilable C++ code that is suitable for simulating the system as software, wherein the description is an implementable description, wherein the implementable description is transformable into synthesizable code.

39. The method of claim 38, wherein the description is an SFG data structure and the compilable C++ code is used to perform clock-cycle true simulations.

40. A method of simulating a system, wherein a description of a system is transformed into compilable C++ code, wherein the description comprises the combination of several SFG data structures with a finite state machine description resulting in an implementable description, the implementable description being the compilable C++ code suitable for simulating the system as software.

41. A hardware circuit or a software simulation of a hardware circuit designed with the design apparatus of claim 1.

42. A hardware circuit or a software simulation of a hardware circuit designed with the method of claim 23.

43. The method as recited in claim 23, wherein said objects comprise a function.

44. The method as recited in claim 27, wherein said expansion includes the addition of functions to an existing object for creating a new object.

45. The method of claim 44, wherein the implementable description is automatically transformable.

* * * * *